(12) United States Patent
Ugajin et al.

(10) Patent No.: US 6,759,676 B2
(45) Date of Patent: Jul. 6, 2004

(54) MULTIPLY-COMPLEXED ONE-DIMENSIONAL STRUCTURE, MULTIPLY-TWISTED HELIX, MULTIPLY-LOOPED RING STRUCTURE AND FUNCTIONAL MATERIAL

(75) Inventors: Ryuichi Ugajin, Tokyo (JP); Shintaro Hirata, Kanagawa (JP); Masakazu Ukita, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/980,314
(22) PCT Filed: Mar. 29, 2001
(86) PCT No.: PCT/JP01/02625
§ 371 (c)(1),
(2), (4) Date: Feb. 26, 2002
(87) PCT Pub. No.: WO01/73851
PCT Pub. Date: Oct. 4, 2001

(65) Prior Publication Data
US 2003/0071239 A1 Apr. 17, 2003

(30) Foreign Application Priority Data

| Mar. 29, 2000 | (JP) | P2000-091217 |
| May 29, 2000 | (JP) | P2000-158231 |
| Aug. 7, 2000 | (JP) | P2000-238772 |
| Dec. 5, 2000 | (JP) | P2000-370690 |

(51) Int. Cl.[7] .............................................. H01L 51/00
(52) U.S. Cl. .............................. 257/40; 257/17; 257/22
(58) Field of Search ............................ 257/17, 22, 40

(56) References Cited

U.S. PATENT DOCUMENTS

| 5,646,420 A | * | 7/1997 | Yamashita | 257/17 |
| 5,828,090 A | * | 10/1998 | Ugajin | 257/183.1 |
| 6,538,262 B1 | * | 3/2003 | Crespi et al. | 257/40 |

FOREIGN PATENT DOCUMENTS

| JP | 2001-77479 | 3/2001 |
| JP | 2001-118379 | 4/2001 |
| WO | WO 0103263 | 1/2001 |

OTHER PUBLICATIONS

*Helix-based hierarchical structures* by Ryuichi Ugajin, Transworld Research Network, Recent Res. Devel. Physics, 3(2002): ISBN:81-7895-046-4, pp. 1-49.

* cited by examiner

*Primary Examiner*—Jerome Jackson
(74) *Attorney, Agent, or Firm*—Sonnenschein, Nath & Rosenthal LLP

(57) ABSTRACT

In a multiply-complexed one-dimensional structure having a hierarchical structure in which a linear structure as an element of a one-dimensional structure having a finite curvature is made of a thinner one-dimensional structure having a finite curvature, at least two layers of one-dimensional unit structures are bonded in at least one site. For example, in a multiply-twisted helix having a hierarchical structure in which a linear structure as an element of a spiral structure is made of a thinner spiral structure, at least two layers of the unit spiral structures are bonded in at least one site. Alternatively, in a multiply-looped ring structure having a hierarchical structure in which a linear structure as an element of a ring structure is made of a thinner ring structure, at least two layers of ring unit structures are bonded in at least one site.

78 Claims, 139 Drawing Sheets

MULTIPLY-COMPLEXED ONE-DIMENSIONAL STRUCTURE, MULTIPLY-TWISTED HELIX, MULTIPLY-LOOPED RING STRUCTURE AND FUNCTIONAL MATERIAL

BACKGROUND OF THE INVENTION

This invention relates to a multiply-complexed one-dimensional structure, multiply-twisted helix, multiply-looped ring structure and functional material, especially suitable for use as highly functional materials based on a novel principle.

BACKGROUND ART

For application of a solid material to electronic or optical devices, physical properties of the material may restrict its applications. For example, in case of using a semiconductor material in a light emitting device, it will be usable in a device of an emission wavelength corresponding to the band gap of the material, but some consideration will be necessary for changing the emission wavelength. Regarding physical properties related to semiconductor bands, controls by superlattices have been realized. More specifically, by changing the period of a superlattice, the bandwidth of its subband can be controlled to design an emission wavelength.

Targeting on controlling many-electron-state structures by material designs, the Inventor proposed many-body effect engineering by quantum dot-bonded structures and has continued theoretical analyses ((1) U.S. Pat. No. 5,430,309; (2) U.S. Pat. No. 5,663,571; (3) U.S. Pat. No. 5,719,407; (4) U.S. Pat. No. 5,828,090; (5) U.S. Pat. No. 5,831,294; (6) J. Appl. Phys. 76, 2833(1994); (7) Phys. Rev. B51, 10714 (1995); (8) Phys. Rev. B51, 11136(1995); (9) J. Appl. Phys. 77, 5509(1995); (10) Phys. Rev. B53, 6963(1996); (11) Phys. Rev. B53, 10141(1996); (12) Appl. Phys. Lett. 68, 2657(1996); (13) J. Appl. Phys. 80, 3893(1996); (14) J. Phys. Soc. Jpn. 65, 3952(1996); (15) Jpn. J. Appl. Phys. 36, 638(1997); (16) J. Phys. Soc. Jpn. 66, 425(1997); (17) J. Appl. Phys. 81, 2693 (1997); (18) Physica (Amsterdam) 229B, 146(1997); (19) Physica (Amsterdam) 237A, 220 (1997); (20) Surf. Sci. 375, 403(1997); (21) Physica (Amsterdam) 240B, 116(1997); (22) Physica (Amsterdam) 240B, 128(1997); (23) Physica (Amsterdam) IE, 226(1997); (24) Phys. Rev. Lett. 80, 572(1998); (25) Jpn. J. Appl. Phys. 37, 863(1998); (26) Physica (Amsterdam) 245B, 311(1998); (27) Physica (Amsterdam) 235B, 96(1998); (28) Phys. Rev. B59, 4952(1999); (29) Surf. Sci. 432, 1(1999); (30) International Journal of Modern Physics B. Vol. 13, No. 21, 22, pp.2689–2703, 1999). For example, realization of various correlated electronic systems is expected by adjusting a tunneling phenomenon between quantum dots and interaction between electrons in quantum dots. Let the tunneling transfer between adjacent quantum dots be written as t. Then, if quantum dots are aligned in form of a tetragonal lattice, the bandwidth of one electron state is $T_{eff}=4t$. If quantum dots form a one-dimensional chain, the bandwidth of one electron state is $T_{eff}=2t$. In case of a three-dimensional quantum dot array, $T_{eff}=6t$. That is, if D is the dimension of a quantum dot array, the bandwidth of one electron state has been $T_{eff}=2Dt$. Here is made a review about half-filled (one electron per each quantum dot) Mott transition (also called Mott-Hubbard transition or Mott metal-insulator transition). Let the effective interaction of electrons within a quantum dot be written as $U_{eff}$, then the Hubbard gap on the part of the Mott insulator is substantially described as $\Delta=U_{eff}-T_{eff}$, and the Mott transition can be controlled by changing $U_{eff}$ or t. As already proposed, the Mott-Hubbard transition can be controlled by adjusting $U_{eff}$ or t, using a field effect, and it is applicable to field effect devices (Literatures (5), (6), (11) and (14) introduced above).

On the other hand, reviewing the equation of $\Delta=U_{eff}-T_{eff}-2Dt$, it will be possible to control Mott-Hubbard transition by controlling the dimensionality D of-the system. For this purpose, the Applicant already proposed a fractal-bonded structure that can continuously change the dimensionality, and have exhibited that Mott-Hubbard transition is controllable by changing the fractal dimensions.

To enable designing of wider materials, it is desired to modify and control the dimension of materials by methods different from the fractal theory. For example, for the purpose of changing the nature of phase transition, it is first conceivable to control the number of nearest-neighbor elements among elements ago forming a material.

On the other hand, here is changed the attention to ferromagnetic phase transition taking place in the fractal-bonded structure. Of course, ferromagnetic materials are one of the most important magnetic storage materials. When using z as the number of nearest-neighbor atoms, $k_B$ as the Boltzmann constant, T as temperature, it is known that spontaneous magnetization M in the averaging theory describing ferromagnetic phase transition satisfies $$M=\text{Tanh}(zM/k_B T)$$

The highest among temperatures T leading to solutions of $M \neq 0$ of this equation is the critical temperature $T_c$. As readily understood from the equation, $T_c$ is proportional to z. When assuming a tetragonal lattice, since $z=2D$, it is expected that the critical temperature of ferromagnetic phase transition depends on the dimensionality of a material. The Inventor executed more exact Monte Carlo simulation, and showed that the critical temperature of ferromagnetic transition occurring in a fractal-bonded structure could be controlled by the fractal dimensions.

It is therefore an object of the invention to provide a multiply-twisted helix complementary with a fractal-shaped material and representing a new physical property, and a functional material using the multiply-twisted helix.

A further object of the invention is to provide a multiply-looped ring structure complementary with a fractal-shaped material and representing a new physical property, and a functional material using the multiply-looped ring structure.

A still further object of the invention is to provide a multiply-complexed one-dimensional structure complementary with a fractal-shaped material and representing a new physical property, and a functional material using the multiply-complexed one-dimensional structure.

SUMMARY OF THE INVENTION

The Inventor proposes a multiply-twisted helix as one of spatial filler structures. This is made by winding a spiral on a spiral structure as a base like a chromatin structure that a gene represents, and by repeating it to progressively fill a three-dimensional space. By adjusting the spiral pitch, the spatial filling ratio can be selected, and dimensionality of a material, i.e. the number of nearest-neighbor elements in this structure can be modified.

In other words, here is proposed a multiply-twisted helix in which spirals are made up by using a spiral structure as the base and using the spiral structure as an element. In this structure including hierarchically formed multiple spirals, one-dimensional vacancies penetrate the structure to form a structure as a porous material. However, by adjusting the turn pitch of the spirals, the number of nearest-neighbor elements can be changed. According to researches by the Inventor, the value of critical inter-electron interaction of Mott-Hubbard metal-insulator transition in this kind of structure can be controlled by the spiral pitch.

The multiply-twisted helical structure may be formed regularly; however, in case a multiply-twisted helical structure is actually made, bonding positions appearing among spiral layers possibly distribute randomly. The degree of the randomness can be new freedom of material designs. Taking it into consideration, for the purpose of clarifying the effect of the random distribution, exact simulation was conducted. As a result, introduction of randomness has been proved to increase the width of the Mott-Hubbard gap and enhance the Mott insulation. Therefore, the value of critical inter-electron interaction of Mott-Hubbard metal-insulator transition can be controlled not only by controlling the degree of randomness of the spiral turn pitch but also by controlling the degree of randomness regarding inter-layer bonding positions.

Still in the multiply-twisted helix, there is also the interlayer bonding position as a control parameter, in addition to the degree of randomness regarding the spiral turn pitch and inter-layer bonding positions. That is, by controlling inter-layer bonding positions, desired material designs are possible. More specifically, freedom of parallel movements of inter-layer bonding, that is in other words, simultaneous parallel movements of inter-layer bonding positions, can be used to control the value of critical inter-electron interaction of Mott-Hubbard metal-insulator transition occurring in the structure.

The multiply-twisted helix can be used as a magnetic material as well. That is, in the multiply-twisted helix, the critical temperature for ferromagnetic phase transition to occur can be controlled by adjusting the turn pitch.

The inventor also proposes a multiply-looped ring structure as another spatial filler structure, which is different in structure from the multiply-twisted helix but similar in effect to same. This can be obtained by hierarchically forming rings, using a ring as a base. The number of nearest-neighbor elements can be changed progressively by adjusting the number of elements of low-order rings forming high-order hierarchies. Thereby, the spatial filling ratio can be established, and the dimensionality of the material can be modified. In this multiply-looped ring structure, the above discussion is directly applicable only if the turn pitch in the multiply-twisted helix is replaced by the number of elements.

The inventor further proposes a multiply-complexed one-dimensional structure as a more general (TIE spatial filler structure that includes both a multiply-twisted helix-and a multiply-looped ring structure.

This is obtained by hierarchically forming one-dimensional structure systems having a finite curvature using a one-dimensional structure system having a finite curvature as the base. In this case, the number of nearest-neighbor elements can be changed progressively by adjusting the curvature of low-order one-dimensional structure systems forming high-order hierarchies. Thereby, the spatial filling ratio can be established, and the dimensionality of the material can be modified. In this multiply-complexed one-dimensional structure, the above discussion is directly applicable only if the turn pitch in the foregoing multiply-twisted helix or the number of elements in the foregoing multiply-looped ring structure is replaced by the curvature. In this multiply-complexed one-dimensional structure, those having a finite twisting ratio correspond to multiply-twisted helixes whilst those having zero twisting ratios correspond to multiply-looped ring structures.

The present invention has been made as a result of progressive studies based on the above review.

That is, to overcome the above-indicated problems, according to the first aspect of the invention, there is provided a multiply-complexed one-dimensional structure having a hierarchical structure in which a linear structure as an element of a one-dimensional structure having a finite curvature is made of a thinner one-dimensional structure having a finite curvature, comprising:

at least two layers of the one-dimensional structures bonded to each other in at least one site.

According to the second aspect of the invention, there is provided a multiply-complexed one-dimensional structure having a hierarchical structure in which a linear structure as an element of a one-dimensional structure having a finite curvature is made of a thinner one-dimensional structure having a finite curvature, characterized in:

exhibiting a nature regulated by setting a curvature in case the one-dimensional structure is made of thinner one-dimensional structures.

According to the third aspect of the invention, there is provided a multiply-complexed one-dimensional structure having a hierarchical structure in which a linear structure as an element of a one-dimensional structure having a finite curvature is made of a thinner one-dimensional structure having a finite curvature, characterized in:

having a dimensionality regulated by setting a curvature in case the one-dimensional structure is made of thinner one-dimensional structures According to the fourth aspect of the invention, there is provided a multiply-complexed one-dimensional structure having a hierarchical structure in which a linear structure as an element of a one-dimensional structure having a finite curvature is made of a thinner one-dimensional structure having a finite curvature, having a random potential introduced therein, and at least two one-dimensional structures bonded in at least one site, characterized in:

a quantum chaos occurring therein being controlled by setting the intensity of the random potential, by setting the intensity of layer-to-layer bonding, by setting the curvature used when forming the one-dimensional structure from thinner one-dimensional structures, or by adding a magnetic impurity.

Control of the quantum chaos produced typically relies on setting a bonding force between layers. Addition of magnetic impurities contributes to a decrease of the bonding force between layers and good control of the quantum chaos.

According to the fifth aspect of the invention, there is provided a functional material including in at least a portion thereof a multiply-complexed one-dimensional structure having a hierarchical structure in which a linear structure as an element of a one-dimensional structure having a finite curvature is made of thinner one-dimensional structures having a finite curvature, characterized in:

at least two layers of the one-dimensional structures being bonded to each other in at least one site.

According to the sixth aspect of the invention, there is provided a functional material including in at least a portion thereof a multiply-complexed one-dimensional structure having a hierarchical structure in which a linear structure as an element of a one-dimensional structure having a finite curvature is made of thinner one-dimensional structures having a finite curvature, characterized in:

the multiply-complexed one-dimensional structure exhibiting a nature regulated by setting the curvature used when the one-dimensional structure is made of thinner one-dimensional structures.

According to the seventh aspect of the invention, there is provided a functional material including in at least a portion thereof a multiply-complexed one-dimensional structure having a hierarchical structure in which a linear structure as an element of a one-dimensional structure having a finite curvature is made of thinner one-dimensional structures having a finite curvature, characterized in:

the multiply-complexed one-dimensional structure having a dimensionality regulated by setting a curvature in case the one-dimensional structure is made of thinner one-dimensional structures.

According to the eighth aspect of the invention, there is provided a multiply-twisted helix having a hierarchical structure in which a linear structure as an element of a spiral structure is made of thinner spiral structures, characterized in:

at least two layers of spiral structures being bonded in at least one site.

According to the ninth aspect of the invention, there is provided a multiply-twisted helix having a hierarchical structure in which a linear structure as an element of a spiral structure is made of thinner spiral structures, characterized in:

exhibiting a nature regulated by setting a turn pitch in case the spiral structure is made of thinner spiral structures.

According to the tenth aspect of the invention, there is provided a multiply-twisted helix having a hierarchical structure in which a linear structure as an element of a spiral structure is made of thinner spiral structures, characterized in:

having a dimensionality regulated by setting a turn pitch in case the spiral structure is made of thinner spiral structures.

According to the eleventh aspect of the invention, there is provided a multiply-twisted helix having a hierarchical structure in which a linear structure as an element of a spiral structure is made of a thinner spiral structure, having a random potential introduced therein, and at least two spiral structures bonded in at least one site, characterized in:

a quantum chaos occurring therein being controlled by setting the intensity of the random potential, by setting the intensity of layer-to-layer bonding, by setting the turn pitch used when forming the spiral structure from thinner spiral structures, or by adding a magnetic impurity.

Control of the quantum chaos produced typically relies on setting a bonding force between layers. Addition of magnetic impurities contributes to good control of the quantum chaos. Decreasing the bonding force between layers also contributes to good control of the quantum chaos.

According to the twelfth aspect of the invention, there is provided a multiply-twisted helix having a hierarchical structure in which a linear structure as an element of a spiral structure is made of a thinner spiral structure, and having at least two layers of spiral structures bonded in at least one site, characterized in:

the bonding performance between linear structures as elements of the spiral structure being controlled by a turn pitch in case of forming the spiral structure from thinner spiral structures, by the bonding force between the layers, or by a fluctuation in the bonding site between at least two layers of spiral structures.

According to the thirteenth aspect of the invention, there is provided a functional material including in at least a portion thereof a multiply-twisted helix having a hierarchical structure in which a linear structure as an element of a spiral structure is made of thinner spiral structures, characterized in:

at least two layers of spiral structures in the multiply-twisted helix being bonded in at least one site.

According to the fourteenth aspect of the invention, there is provided a functional material including in at least a part thereof a multiply-twisted helix having a hierarchical structure in which a linear structure as an element of a spiral structure is made of thinner spiral structures, characterized in:

the multiply-twisted helix exhibiting a nature regulated by setting a turn pitch produced when the spiral structure is made of thinner spiral structures.

According to the fifteenth aspect of the invention, there is provided a functional material including in at least a part thereof a multiply-twisted helix having a hierarchical structure in which a linear structure as an element of a spiral structure is made of thinner spiral structures, characterized in:

the multiply-twisted helix having a dimensionality regulated by setting a turn pitch in case the spiral structure is made of thinner spiral structures.

According to the sixteenth aspect of the invention, there is provided a multiply-looped ring structure having a hierarchical structure in which an annular structure as an element of a ring structure is made of a thinner ring structure, characterized in:

at least two layers of ring structures being bonded in at least one site.

According to the seventeenth aspect of the invention, there is provided a multiply-looped ring structure having a hierarchical structure in which a linear structure as an element of a ring structure is made of a thinner ring structure, characterized in:

exhibiting a nature regulated by setting a number of elements in case the ring structure is made of thinner ring structures.

According to the eighteenth aspect of the invention, there is provided a multiply-looped ring structure having a hierarchical structure in which a linear structure as an element of a ring structure is made of a thinner ring structure, characterized in:

having a dimensionality regulated by setting a number of elements in case the ring structure is made of thinner ring structures.

According to the nineteenth aspect of the invention, there is provided a multiply-looped ring structure having a hierarchical structure in which a linear structure as an element of a ring structure is made of a thinner ring, having a random potential introduced therein, and at least two ring structures bonded in at least one site, characterized in:

a quantum chaos occurring therein being controlled by setting the intensity of the random potential, by setting the intensity of layer-to-layer bonding, by setting the number elements used when forming the ring structure from thinner ring structures, or by adding a magnetic impurity.

Control of the quantum chaos produced typically relies on setting a bonding force between layers. Addition of magnetic impurities contributes to a decrease of the bonding force between layers and good control of the quantum chaos.

According to the twentieth aspect of the invention, there is provided a functional material including in at least a portion thereof a multiply-looped ring structure having a hierarchical structure in which a linear structure as an element of a ring structure is made of thinner ring structures, characterized in:

at least two layers of the ring structures being bonded to each other in at least one site.

According to the twenty-first aspect of the invention, there is provided a functional material including in at least a portion thereof a multiply-looped ring structure having a hierarchical structure in which a linear structure as an element of a ring structure is made of thinner ring structures, characterized in:

the multiply-looped ring structure exhibiting a nature regulated by setting the number of elements used when the ring structure is made of thinner ring structures.

According to the twenty-second aspect of the invention, there is provided a functional material including in at least a portion thereof a multiply-loop ring structure having a hierarchical structure in which a linear structure as an element of a ring structure is made of thinner ring structures, characterized in:

the multiply-looped ring structure having a dimensionality regulated by setting a number of elements in case the ring structure is made of thinner ring structures.

In the present invention, in the multiply-complexed one-dimensional structure, the curvature used when a one-dimensional structure in the first layer, for example, is made of a thinner one-dimensional structure in the second layer lower by one layer than the first layer is set to a value different from the curvature used when a one-dimensional structure in the third layer different from the first layer is made of a thinner one-dimensional structure in the fourth layer lower by one layer than the third layer. This curvature may be set to a different value, depending on a difference in position in the one-dimensional structure of the same layer. In the multiply-twisted helix, the turn pitch used when a spiral structure in the first layer, for example, is made of a thinner spiral structure in the second layer lower by one layer than the first layer is set to a value different from the curvature used when a spiral structure in the third layer different from the first layer is made of a thinner spiral structure in the fourth layer lower by one layer than the third layer. This turn pitch may be set to a different value, depending on a difference in position in the spiral structure of the same layer. In the multiply-looped ring structure, the number of elements used when a ring structure in the first layer is made of a thinner ring structure in the second layer go lower than one layer than the first layer is set to a value different from the number of elements used when a ring structure in the third layer different by one layer from the first layer is made of a thinner ring structure in the fourth layer lower by one layer than the third layer. This number of elements may be set to a different value, depending on a difference in position in the ring structure of the same layer.

There may be fluctuation in sites where spiral structures, ring structures or one-dimensional structures bond between at least two layers. This is equivalent to introduction of randomness to sites where spiral structures, ring structures or one-dimensional structures are bonded between layers. "Fluctuation" involves both spatial fluctuation (that can be reworded to disturbance or deviation) and temporal fluctuation. Any way is employable for introduction of fluctuation. For example, it may be introduced to appear in predetermined pitches. The fluctuation may be introduced by removing or adding bonds between at least two layers of spiral structures, ring structures or one-dimensional structures.

Curvature of the multiply-complexed one-dimensional structure, turn pitch of the multiply-twisted helix or number of elements of the multiply-looped ring structure is made variable under external control, for example. In a typical example of the multiply-complexed one-dimensional structure, multiply-twisted helix or multiply-looped ring structure, the one-dimensional structure, spiral structure or ring structure is made of a linear formation essentially made of atoms or groups of atoms (clusters) as elements. To introduce the above-mentioned fluctuation into this kind of structure, there is a method of inducing random absorption or elimination (surplus bonds or lack of bonds) of molecules in the linear formation. Since such introduction of a change or fluctuation of the curvature, turn pitch of number elements can be utilized as a kind of memory function, these multiply-complexed one-dimensional structure, multiply-twisted helix and multiply-looped ring structure can be used as memory devices.

In the present invention, control of curvature in the multiply-complexed one-dimensional structure, turn pitch in the multiply-twisted helix or number of elements in the multiply-looped ring structure can bring about phase transition, especially metal-insulator phase transition or ferromagnetic phase transition. Critical value of the phase transition is regulated in accordance with the curvature, turn pitch or number of elements. This phase transition is controlled by control of bonding positions between one-dimensional structures, helical structures or ring structures of two layers. Specifically, these positions are controlled by parallel movements of these bonds. Specifically, the multiply-complexed one-dimensional structure, multiply-twisted helix or multiply-looped ring structure includes, for example, metallic phase portions and insulating phase portions. The insulating phase portions can change their phase to the metallic phase because of their versatility. Critical temperature of ferromagnetic phase transition can be regulated by the degree of the above-mentioned fluctuation. Alternatively, critical temperature for ferromagnetic phase transition can be regulated by parallel movements of bonds between at least two one-dimensional structures, spiral structures or ring structures of different layers.

In a multiply-complexed one-dimensional structure, multiply-twisted helix or multiply-looped ring structure, including one-dimensional structures, helical structures or ring structures of at least two different layers, which are bonded, at least, at one position, if this at least one bond itself is made in form of a linear structure, then it is possible to control various physical phenomena that take place in the structure. For example, by setting the force of the bond made in form of a linear structure, critical temperature for ferromagnetic phase transition can be regulated. Alternatively, quantum chaos that may take place can be controlled. Further, electron state (electron correlation) can be controlled thereby to control metal-insulator phase transition.

In a multiply-complexed one-dimensional structure, multiply-twisted helix or multiply-looped ring structure, including one-dimensional structures, spiral structures or ring structures of at least two different layers, which are bonded, at least, at one position, if this at least one bond is made via an independent element, then it is possible to control various physical phenomena that take place in the structure. For example, by regulating critical temperature for ferromagnetic phase transition by making use of the criticality obtained by the structure, the structure can exhibit a stable physical property against minute structural fluctuations. Alternatively, control of the quantum chaos or control of metal-insulator phase transition is possible. Furthermore, it is possible to control the electron state thereby to control metal-insulator phase transition. These structures are not sensitive to structural fluctuations and exhibit pandemic physical properties, so it is easy to mass-produce a material exhibiting a constantly uniform physical property.

Features of the present aspect of the invention common to those of the fourth, 11th and 19th aspects of the invention are directly applicable to functional materials using any of the multiply-complexed one-dimensional structure, multiply-twisted helix or multiply-looped ring structure. Features of the present aspect of the invention common to those of the 12th aspect of the invention are also applicable to the multiply-complexed one-dimensional structure when the helical structures are replaced by one-dimensional structures having a finite curvature, and to the multiply-looped ring structure when the helical structures are replaced by ring structures. They are also applicable to functional materials using the multiply-complexed one-dimensional structure, multiply-twisted helix or multiply-looped ring structure.

According to the invention having the above-summarized configurations, by appropriately setting curvature of the multiply-complexed one-dimensional structure, spiral turn pitch of the multiply-twisted helix or number of elements in the multiply-looped ring structure, it is possible to select a desired value of spatial filling ratio, thereby modify or control dimensionality of the material and control physical properties that the material exhibit. Especially, for example, by controlling the number of nearest-neighbor elements in the multiply-complexed one-dimensional structure, multiply-twisted helix or multiply-looped ring structure, it is possible to modify phase transitional natures such as Mott-Hubbard metal-insulator phase transition or magnetic phase transition. Further, by introducing fluctuations of bonding sites between at least two one-dimensional structures, spiral structures or ring structures of different layers, that is in other words, by introducing randomness in bonding sites between one-dimensional structures, spiral structures or ring structures of different layers and controlling the intensity of the randomness, it is possible to adjust the insulation performance by inter-electron correlation for wider material designs. Furthermore, the quantum chaos can be controlled by appropriately setting the potential intensity and the bonding force between layers when introducing random potentials, by appropriately setting the curvature when one-dimensional structures in the multiply-complexed one-dimensional structure are made of thin one-dimensional structures, by appropriately setting the turn pitch when spiral structures in the multiply-twisted helix are made of thin helical structures, by appropriately setting the number of elements when ring structure in the multiply-looped ring structure are made of thin ring structures, or by addition of magnetic impurities.

BRIEF DESCRIPTION OF DRAWINGS

FIG. 120 is a rough diagram that shows spontaneous magnetization obtained by numerical radio calculation when s is changed in case of N=4 in the 18th embodiment of the invention;

FIG. 121 is a rough diagram that shows spontaneous magnetization obtained by numerical calculation when s is changed in case of N=6 in the 18th embodiment of the invention;

FIG. 122 is a rough diagram that shows spontaneous magnetization obtained by numerical calculation when s is changed in case of N=8 in the 18th embodiment of the invention;

FIG. 123 is a rough diagram that shows spontaneous magnetization obtained by numerical calculation when s is changed in case of N=10 in the 18th embodiment of the invention;

FIG. 124 is a rough diagram that shows spontaneous magnetization obtained by numerical calculation when s is changed in case of N=20 in the 18th embodiment of the invention;

FIG. 125 is a rough diagram that shows quantum level statistics upon changes of v in case of N=10 and s=1 in the 19th embodiment of the invention;

FIG. 126 is a rough diagram that shows quantum level statistics upon changes of v in case of N=10 and s=1 in the 19th embodiment of the invention;

FIG. 127 is a rough diagram that shows quantum level statistics upon changes of N in case of a v=2 and s=1 in the 19th embodiment of the invention;

FIG. 128 is a rough diagram that shows quantum level statistics upon changes of N in case of v=2 and s=1 in the 19th embodiment of the invention;

FIG. 129 is a rough diagram that shows quantum level statistics upon changes of s in case of v=2 and N=10 in the 19th embodiment of the invention;

FIG. 130 is a rough diagram that shows a density of states obtained by numerical calculation in case of N=10 and s=1 in the 20th embodiment of the invention;

FIG. 131 is a rough diagram that shows a density of states obtained by numerical calculation in case of s=1 and U=6 in the 20th embodiment of the invention;

Figure 132:
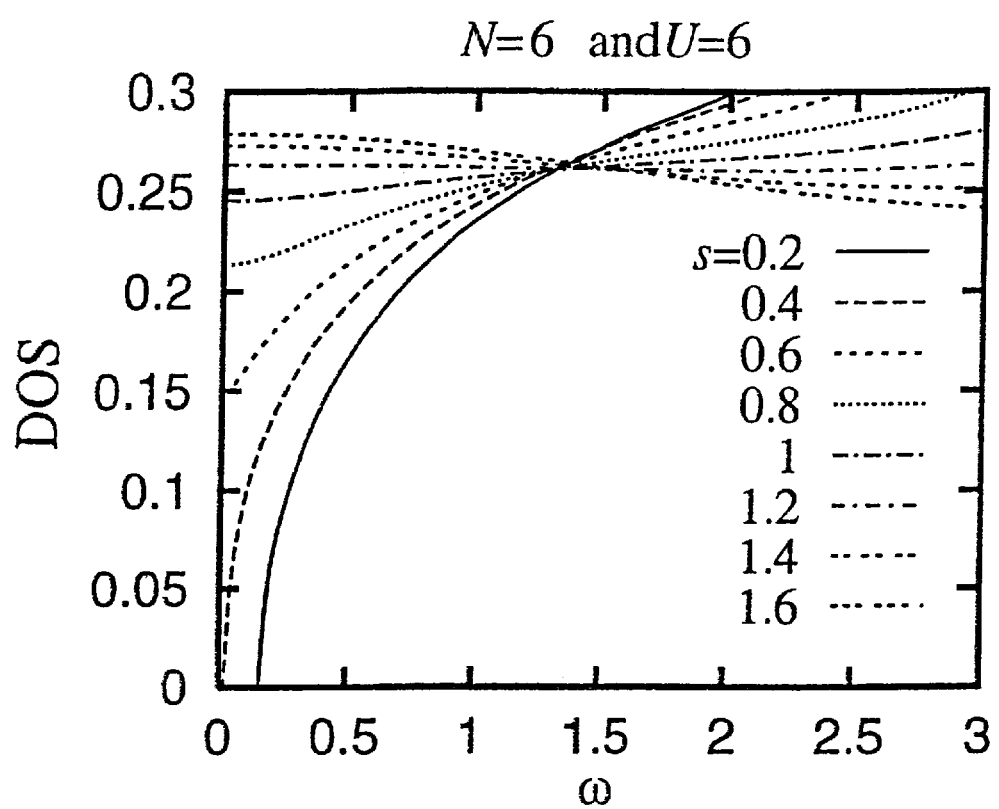
Figure 133:
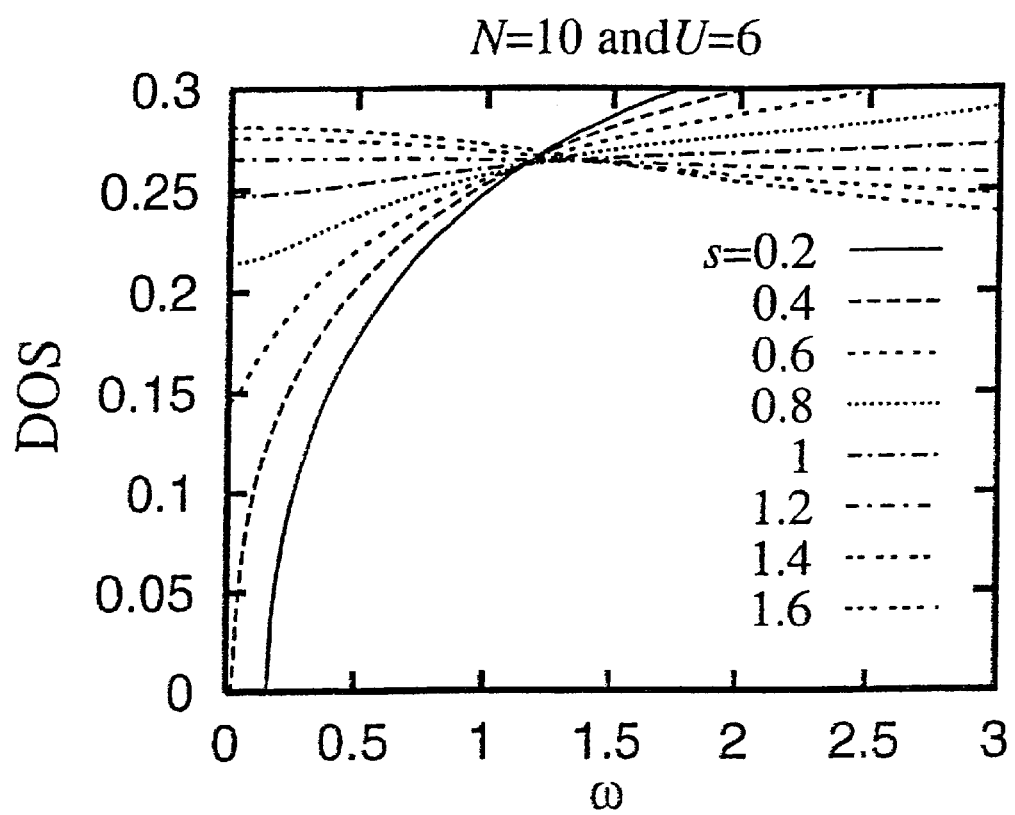
Figure 134:
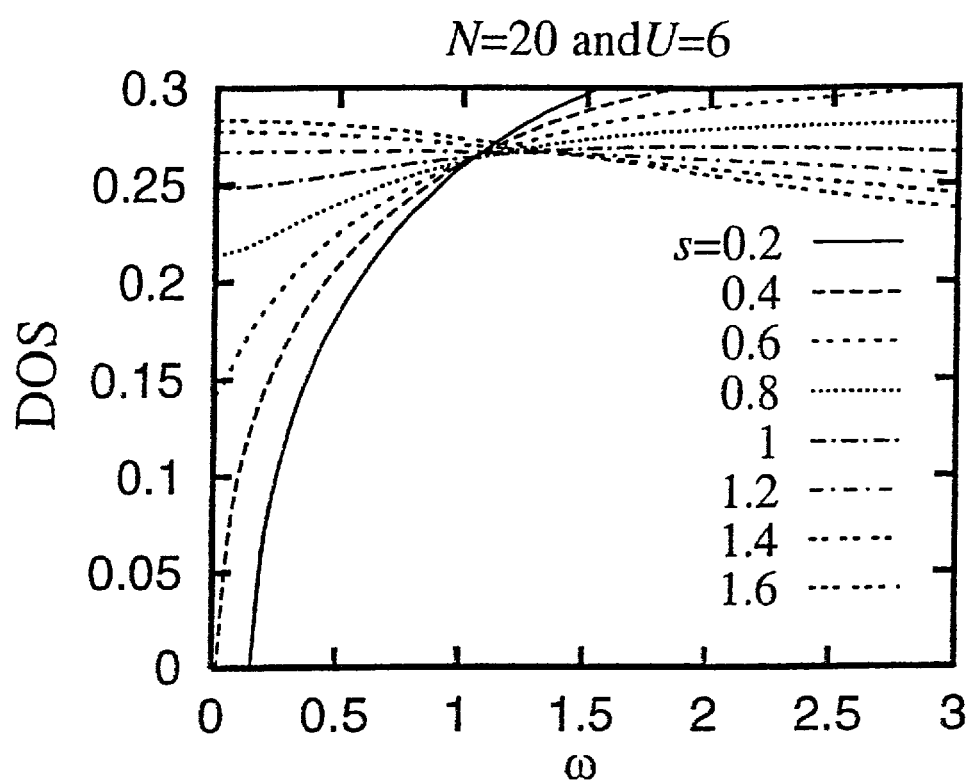
Figure 135:
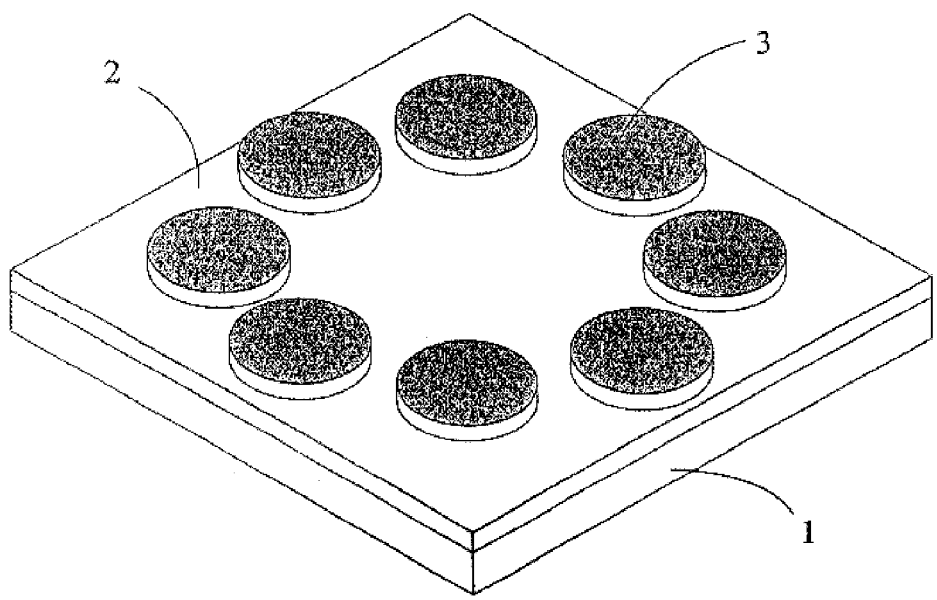
Figure 136:
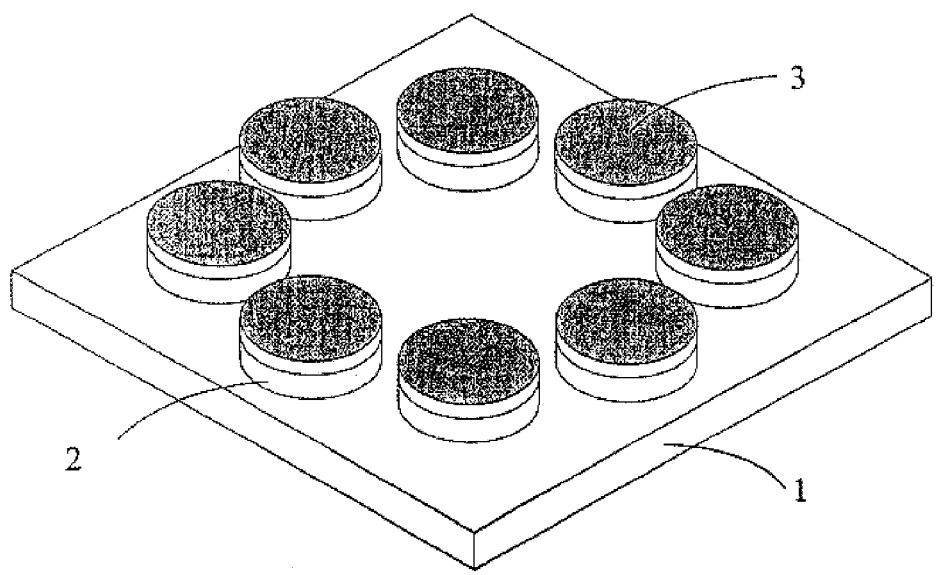
Figure 137:
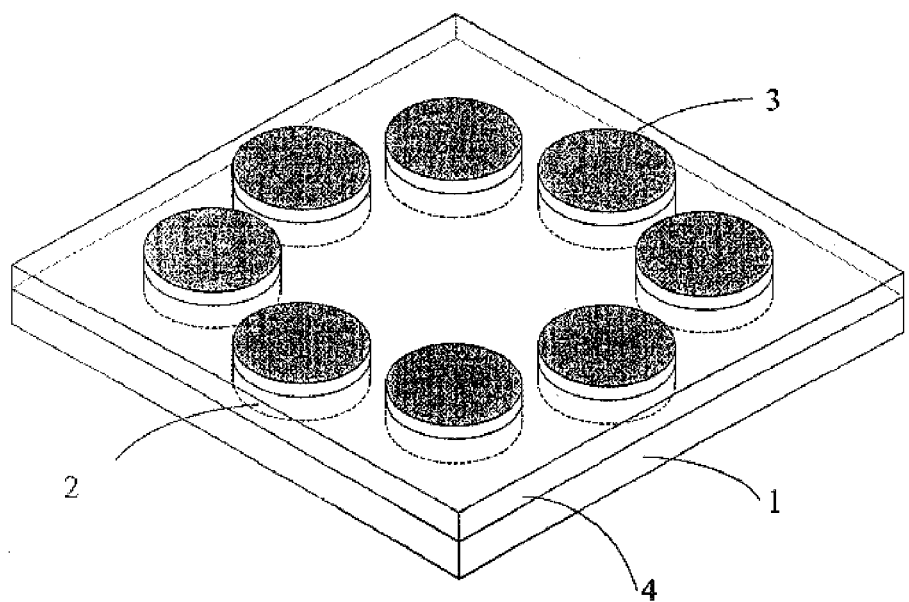
Figure 138:
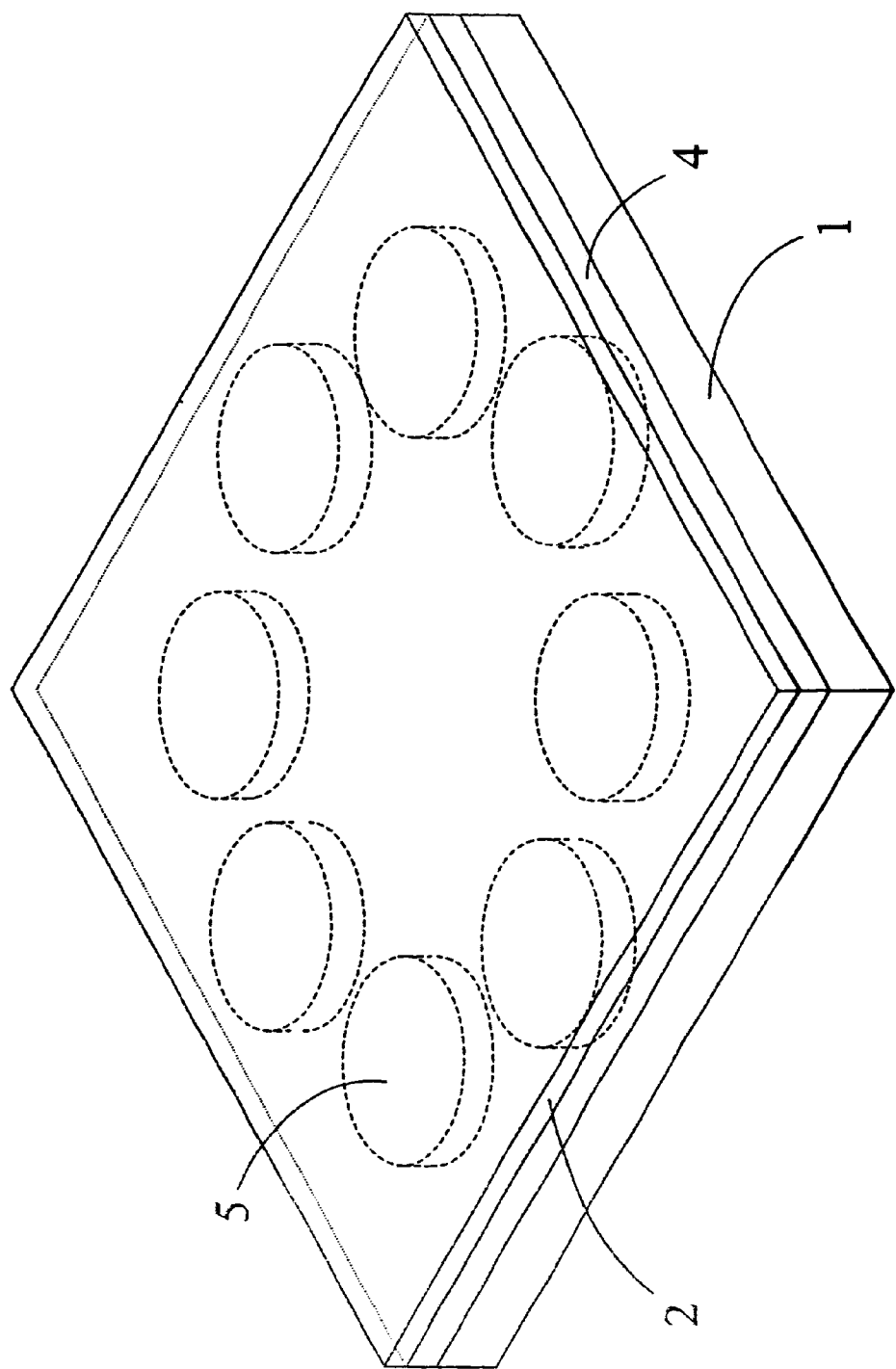
Figure 139:
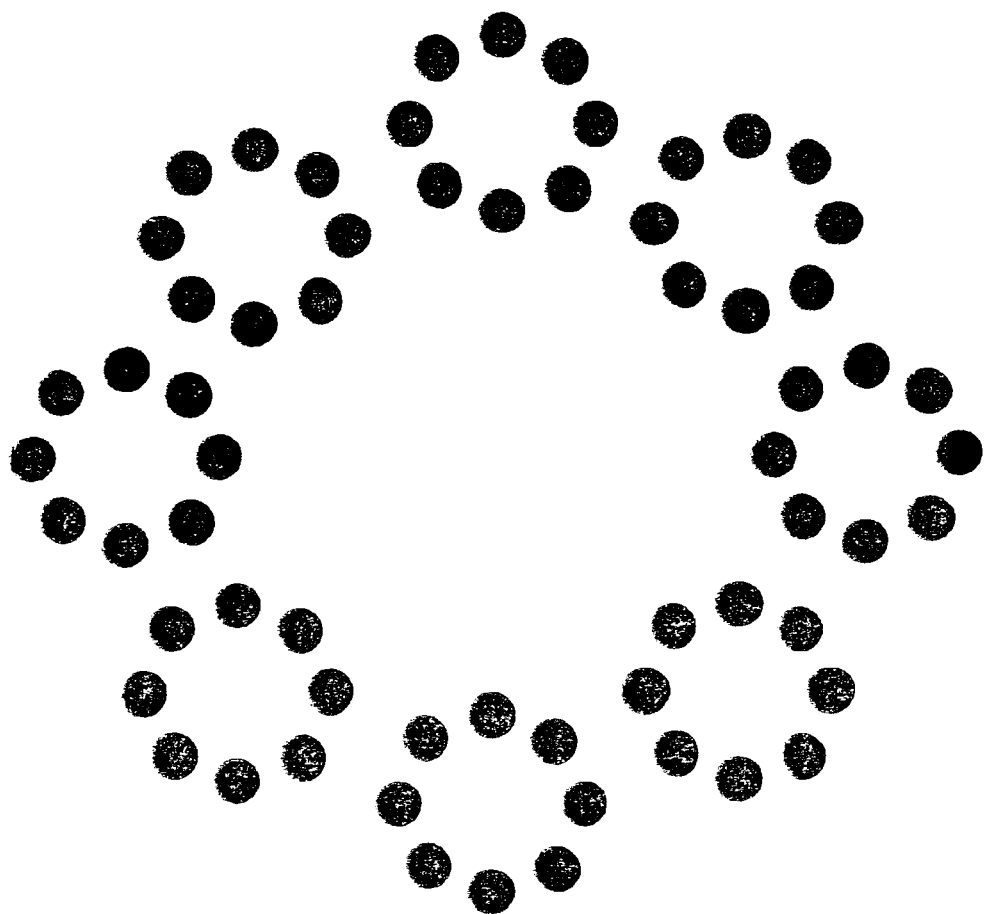

FIG. 132 is a rough diagram that shows a density of states obtained by numerical calculation in case of N=10 and U=6 in the 20th embodiment of the invention;

FIG. 133 is a rough diagram that shows a density of states obtained by numerical calculation in case of N=10 and U=6 in the 20th embodiment of the invention;

FIG. 134 is a rough diagram that shows a density of states obtained by numerical calculation in case of N=20 and U=6 in the 20th embodiment of the invention;

FIG. 135 is a perspective view for explaining a manufacturing method of a multiply-twisted helix of q=2 and N=8 in the 21st embodiment of the invention;

FIG. 136 is a perspective view for explaining a manufacturing method of a multiply-twisted helix of q=2 and N=8 in the 21st embodiment of the invention;

FIG. 137 is a perspective view for explaining a manufacturing method of a multiply-twisted helix of q=2 and N=8 in the 21st embodiment of the invention;

FIG. 138 is a perspective view for explaining a manufacturing method of a multiply-twisted helix of q=2 and N=8 in the 21st embodiment of the invention; and FIG. 139 is a perspective view for explaining a manufacturing method of a multiply-twisted helix of q=2 and N=8 in the 21st embodiment of the invention.

DETAILED DESCRIPTION OF THE INVENTION

Embodiments of the invention will now be explained below.

First explained is a multiply-twisted helix according to the first embodiment of the invention.

An electron system on a multiply-twisted spiral in the multiply-twisted helix according to the first embodiment is explained below.

Assuming a one-dimensional lattice, numbers are assigned as n= . . . , −1, 0, 1, . . . . Let the operator for generating an electron of a spin σ at the p-th lattice point be $\hat{C}_{p,\sigma}^\dagger$. Of course, there is the anticommutation relation $$\{\hat{C}_{p,\sigma}, \hat{C}_{q,\rho}^\dagger\} = \delta_{p,q}\delta_{\sigma,\rho} \qquad (1)$$

Here is defined a single-band Hubbard Hamiltonian $\hat{H}$ of the electron system as follows.

$$\hat{H} = t\sum_{i,j,\sigma} \lambda_{i,j} \hat{C}_{i,\sigma}^\dagger \hat{C}_{j,\sigma} + U\sum_j \hat{n}_{j,\uparrow}\hat{n}_{j,\downarrow} \qquad (2)$$

Letting electrons be movable only among neighboring sites, as $\lambda_{p,q}$ $$\lambda_{p,q} = \lambda_{q,p} = \begin{cases} 1 & \text{when } |p-q|=1 \\ s & \text{when } |p-q|=N \\ s^2 & \text{when } \mathrm{mod}(p,N)=0 \text{ and } q=p+N^2 \\ s^3 & \text{when } \mathrm{mod}(p,N^2)=1 \text{ and } q=p+N^3 \\ s^4 & \text{when } \mathrm{mod}(p,N^3)=2 \text{ and } q=p+N^4 \\ \vdots \\ 0 & \text{otherwise} \end{cases} \quad (3)$$

is employed. Assume hereunder that s=1. However, mod(a, b) is the remainder as a result of division of a by b. Here is made a review about the average number of nearest-neighbor sites. It is $$z = 2 + 2 + \frac{2}{N} + \frac{2}{N^2} + \ldots \quad (4)$$

$$= 2 + \frac{2N}{N-1} \quad (5)$$

Figure 1A:
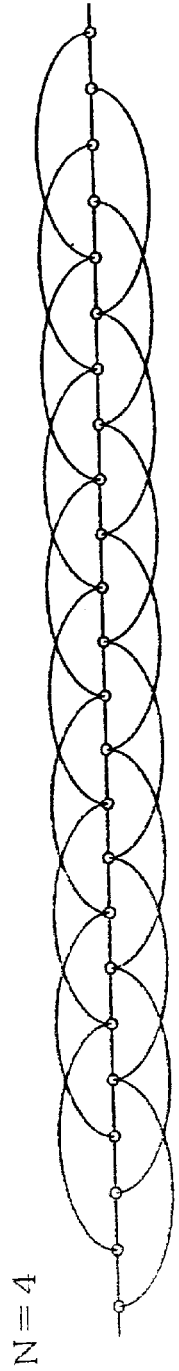
FIGS. 1A–C is a rough diagram that shows actual bonding in a multiply-twisted helical structure in case of N=4.
Figure 1B:
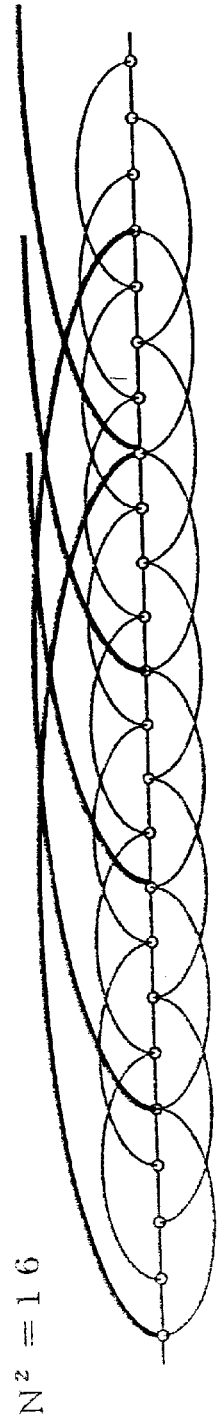
Figure 1C:
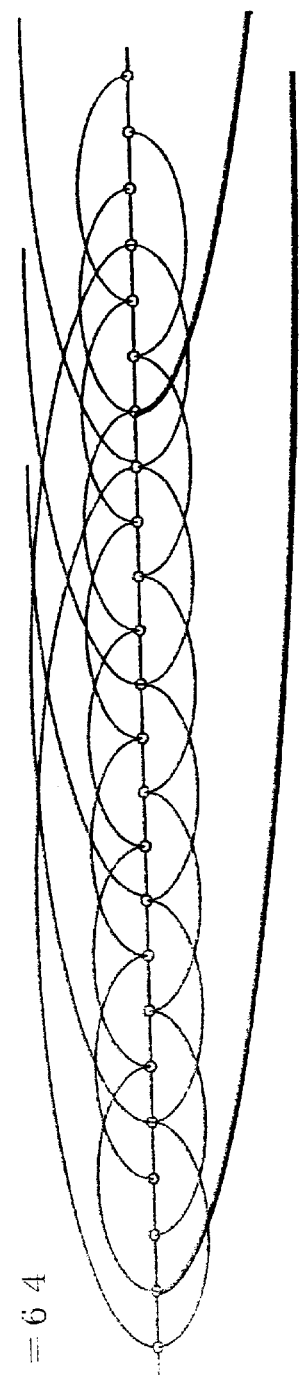
Figure 2:
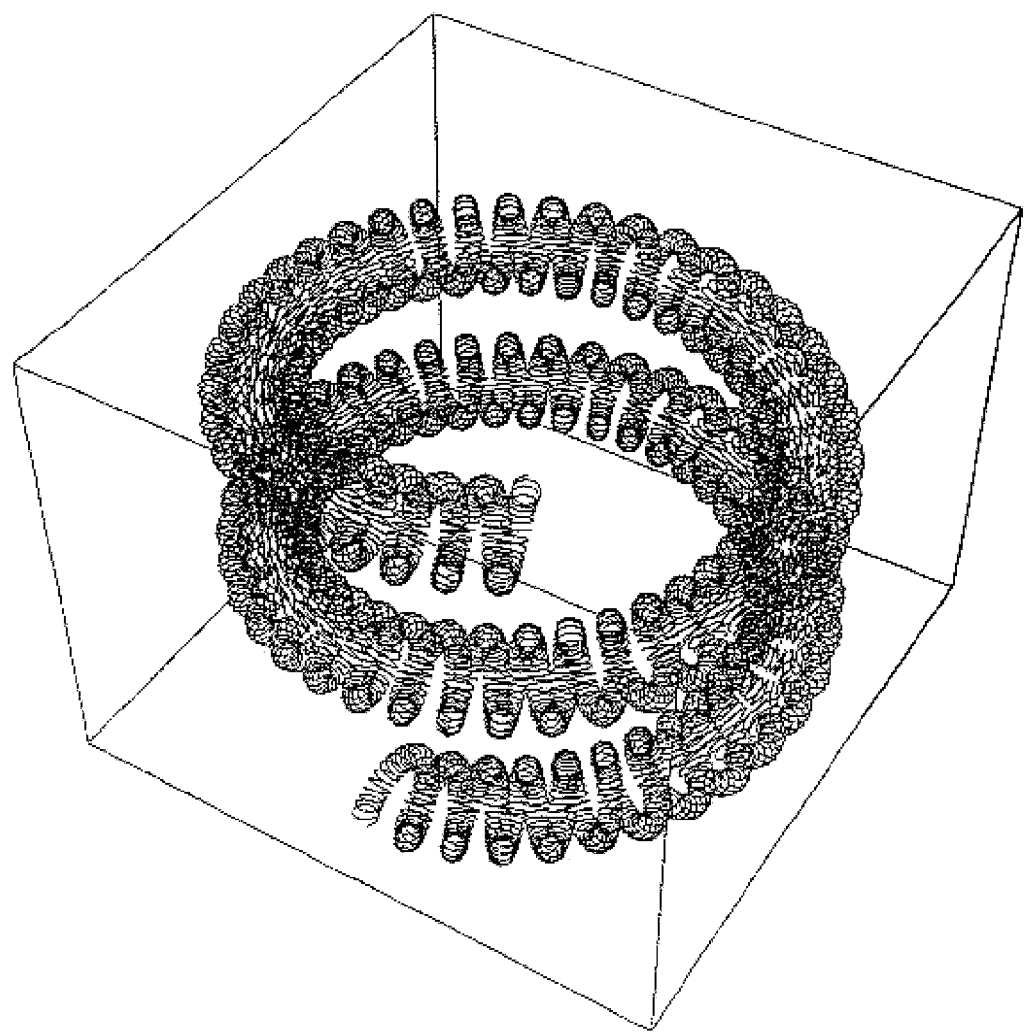
FIG. 2 is a rough diagram that schematically shows a multiply-twisted helix according to the first embodiment of the invention.

Apparently, it can be any value from the value of a three-dimensional tetragonal lattice, namely, z=6 when N=2, to the value of a two-dimensional tetragonal lattice, namely, z=4 when N→∞. A multiply-twisted helical structure is defined by the definition of the nearest-neighbor sites. FIG. 1 schematically show how the actual bonding is when N=4. FIG. 1A is for N pitch, FIG. 1B is for $N^2$ pitch, and FIG. 1C is for $N^3$ pitch. When the structure is folded such that the nearest-neighbor sites become spatially closer, the multiply-twisted spiral is obtained as shown in FIG. 2. FIG. 2, however, embellishes it to provide an easier view. In this case, the one-dimensional chain is bonded at two right and left sites, and the chain forms spirals of the N pitch. Since the spirals form spirals of the $N^2$ pitch, the term of $S^2$ enters as a result of transfer of electrons between adjacent spirals (Equation 3). Then, the spirals form spirals of a larger, i.e. $N^2$, pitch.

Here is defined a pin σ electron density operator of the j-th site $\hat{n}_{j,\sigma} = \hat{c}_{j,\sigma}^\dagger \hat{c}_{j,\sigma}$ and its sum $\hat{n}_j = \Sigma_\sigma \hat{n}_{j,\sigma}$.

For the purpose of defining a temperature Green's function, here is introduced a grand canonical Hamiltonian $\hat{K} = \hat{H} - \mu\hat{N}$ where $\hat{N} = \Sigma_j \hat{n}_j$. In the half filled taken here, chemical potential is $\mu = U/2$. The half-filled grand canonical Hamiltonian can be expressed as $$\hat{K} = t \sum_{i,j,\sigma} \lambda_{j,i} \hat{t}_{j,i,\sigma} + U/2 \sum_i (\hat{u}_i - 1) \quad (6)$$

Operators $\hat{t}_{j,i,\sigma}$, $\hat{j}_{j,i,\sigma}$, $\hat{u}_i$ and $\hat{d}_{i,\sigma}$ are defined beforehand as $$\hat{t}_{j,i,\sigma} = \hat{c}_{j,\sigma}^\dagger \hat{c}_{i,\sigma} + \hat{c}_{i,\sigma}^\dagger \hat{c}_{j,\sigma} \quad (7)$$

$$\hat{j}_{j,i,\sigma} = \hat{c}_{j,\sigma}^\dagger \hat{c}_{i,\sigma} - \hat{c}_{i,\sigma}^\dagger \hat{c}_{j,\sigma} \quad (8)$$

$$\hat{u}_i = \hat{c}_{i,\uparrow}^\dagger \hat{c}_{i,\uparrow} \hat{c}_{i,\downarrow}^\dagger \hat{c}_{i,\downarrow} + \hat{c}_{i,\uparrow} \hat{c}_{i,\uparrow}^\dagger \hat{c}_{i,\downarrow} \hat{c}_{i,\downarrow}^\dagger \quad (9)$$

$$\hat{d}_{i,\sigma} = \hat{c}_{i,\sigma}^\dagger \hat{c}_{i,\sigma} \hat{c}_{i,\sigma}^\dagger - \hat{c}_{i,\sigma} \hat{c}_{i,\sigma}^\dagger \quad (10)$$

If the temperature Green function is defined for operators $\hat{A}$ and $\hat{B}$ given, taking τ as imaginary time, it is as follows.

$$<\hat{A};\hat{B}> = -\int_0^\beta d\tau <T_\tau \hat{A}(\tau)\hat{B}>e^{i\omega_n\tau} \quad (11)$$

The on-site Green function $$G_{j,\sigma}(i\omega_n) = <\hat{c}_{j,\sigma};\hat{c}_{j,\sigma}^\dagger> \quad (12)$$

is especially important because, when analytic continuation is conducted as $i\omega_n \to \omega + i\delta$ for a small δ, $$D_j(\omega) = -\sum_{\sigma=\uparrow,\downarrow} \mathrm{Im} G_{j,\sigma}(\omega + i\delta) \quad (13)$$

becomes the local density of states of the site j, and $$D(\omega) = -\sum_{j,\sigma} \mathrm{Im} G_{j,\sigma}(\omega + i\delta) \quad (14)$$

becomes the density of states of the system. For later numerical calculation of densities of states, δ=0.0001 will be used. Further let the total number of sites be n=10001.

Imaginary time development of the system is obtained by the Heisenberg equation $$\frac{d}{d\tau}\hat{A}(\tau) = [\hat{K}, \hat{A}] \quad (15)$$

As the equation of motion of the on-site Green function, $$i\omega_n<\hat{c}_{j,\sigma};\hat{c}_{j,\sigma}^\dagger> = 1 + t\sum_{p,j} \lambda_{p,j}<\hat{c}_{p,\sigma};\hat{c}_{j,\sigma}^\dagger> + \frac{U}{2}<\hat{d}_{j,-\sigma}\hat{c}_{j,\sigma};\hat{c}_{j,\sigma}^\dagger> \quad (16)$$

is obtained. Then, the approximation shown below is introduced, following Gros ((31) C. Gros, Phys. Rev. B50, 7295(1994)). If the site p is the nearest-neighbor site of the site j, the resolution $$<\hat{c}_{p,\sigma};\hat{c}_{j,\sigma}^\dagger> \to t<\hat{c}_{p,\sigma};\hat{c}_{p,\sigma}^\dagger><\hat{c}_{j,\sigma};\hat{c}_{j,\sigma}^\dagger> \quad (17)$$

is introduced as the approximation. This is said to be exact in case of infinite-dimensional Bethe lattices, but in this case, it is only within approximation. Under the approximation, the following equation is obtained.

$$(i\omega_n - t^2\Gamma_{j,\sigma})G_{j,\sigma} = 1 + \frac{U}{2}<\hat{d}_{j,-\sigma}\hat{c}_{j,\sigma};\hat{c}_{j,\sigma}^\dagger> \quad (18)$$

where $$\Gamma_{j,\sigma} = \sum_p \lambda_{p,j} G_{p,\sigma} \quad (19)$$

was introduced. To solve the equation, obtained, $<\hat{d}_{j,-\sigma}\hat{c}_{j,\sigma};\hat{c}_{j,\sigma}^\dagger>$ has to be analyzed. In case of half-filled models, this equation of motion is $$i\omega_n<\hat{d}_{j,-\sigma}\hat{c}_{j,\sigma};\hat{c}_{j,\sigma}^\dagger> = \quad (20)$$

$$\frac{U}{2}G_{j,\sigma} - 2t\sum_p \lambda_{p,j}<\hat{j}_{p,j,-\sigma}\hat{c}_{j,\sigma};\hat{c}_{j,\sigma}^\dagger> + t\sum_p \lambda_{p,j}<\hat{d}_{j,-\sigma}\hat{c}_{p,\sigma};\hat{c}_{j,\sigma}^\dagger>$$

Here again, with reference to the Gros logic, approximation is introduced. It is the following translation.

$$<\hat{j}_{p,j,-\sigma}\hat{c}_{j,\sigma};\hat{c}_{j,\sigma}^\dagger> \to -tG_{p,-\sigma}<\hat{d}_{j,-\sigma}\hat{c}_{j,\sigma};\hat{c}_{j,\sigma}^\dagger> \quad (21)$$

$$<\hat{d}_{j,-\sigma}\hat{c}_{p,\sigma};\hat{c}_{j,\sigma}^\dagger> \to tG_{p,\sigma}<\hat{d}_{j,-\sigma}\hat{c}_{j,\sigma};\hat{c}_{j,\sigma}^\dagger> \quad (22)$$

By executing this translation, the following closed equation is obtained.

$$(i\omega_n - t^2\Gamma_{j,\sigma})G_{j,\sigma} = 1 + \frac{(U/2)^2}{i\omega_n - t^2\Gamma_{j,\sigma} - 2t^2\Gamma_{j,-\sigma}}G_{j,\sigma} \quad (23)$$

Figure 3:
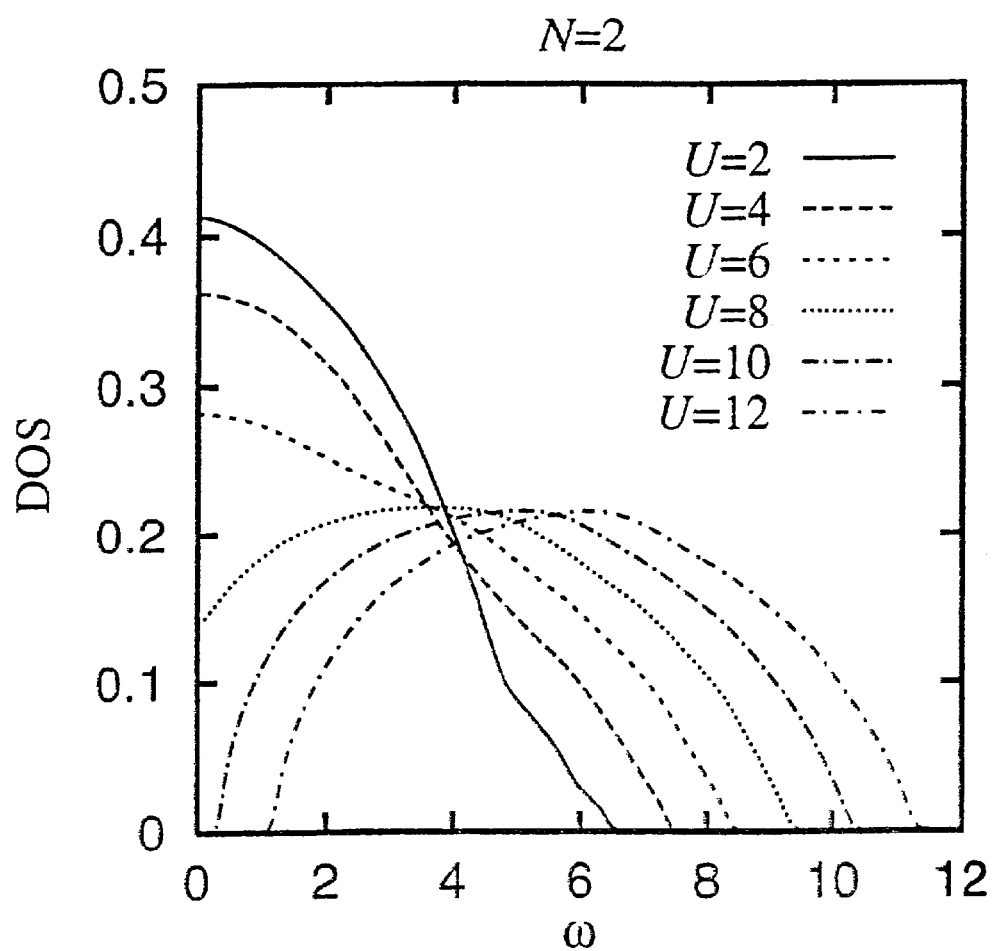
FIG. 3 is a rough diagram that shows a density of states obtained by numerical calculation in case of N=2 in the first embodiment of the invention.
Figure 4:
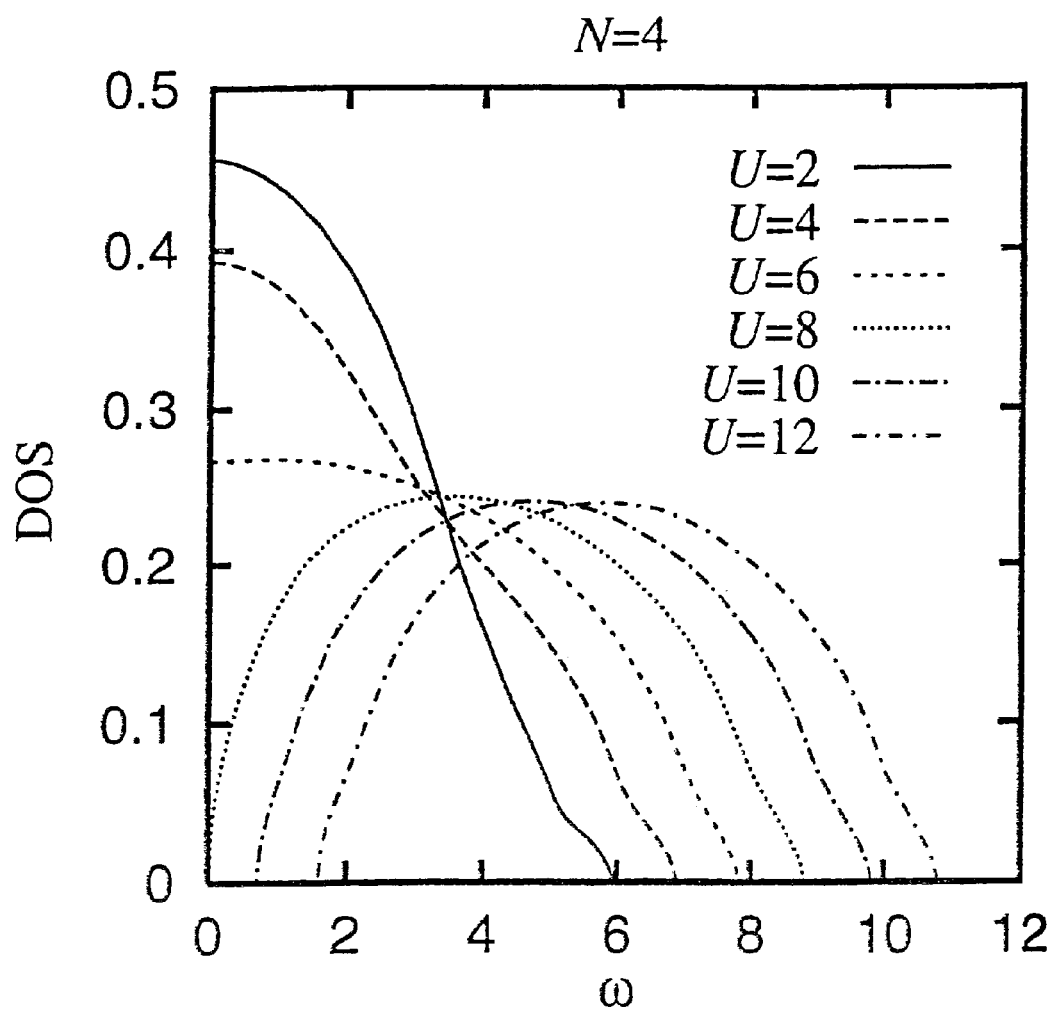
FIG. 4 is a rough diagram that shows a density of states obtained by numerical calculation in case of N=4 in the first embodiment of the invention.
Figure 5:
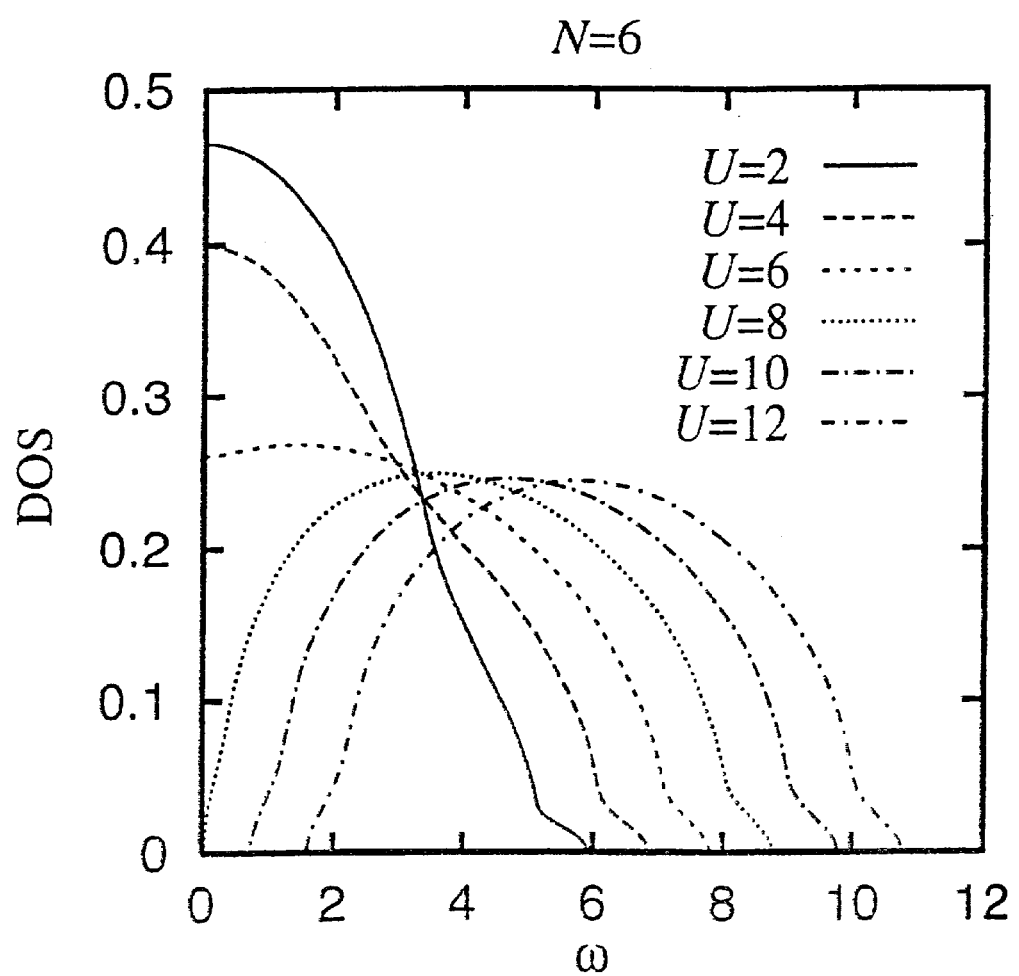
FIG. 5 is a rough diagram that shows a density of states obtained by numerical calculation in case of N=6 in the first embodiment of the invention.
Figure 6:
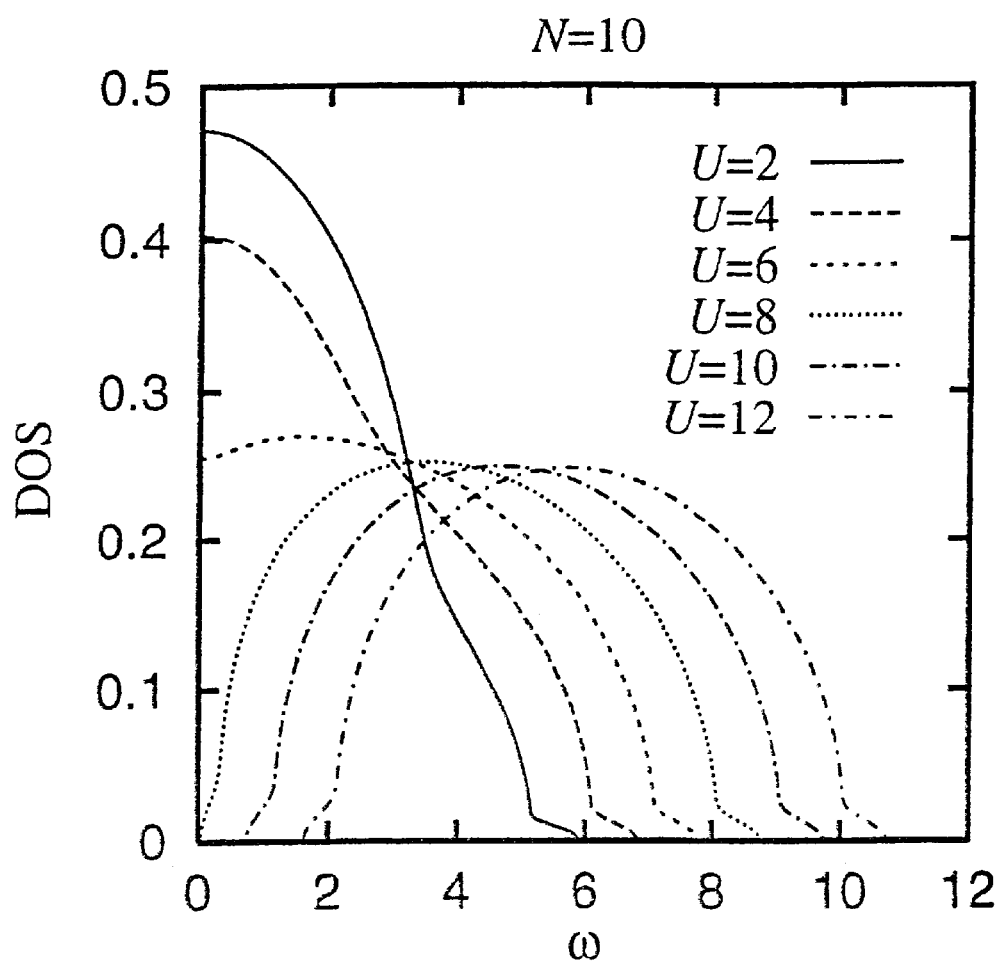
FIG. 6 is a rough diagram that shows a density of states obtained by numerical calculation in case of N=10 in the first embodiment of the invention.
Figure 7:
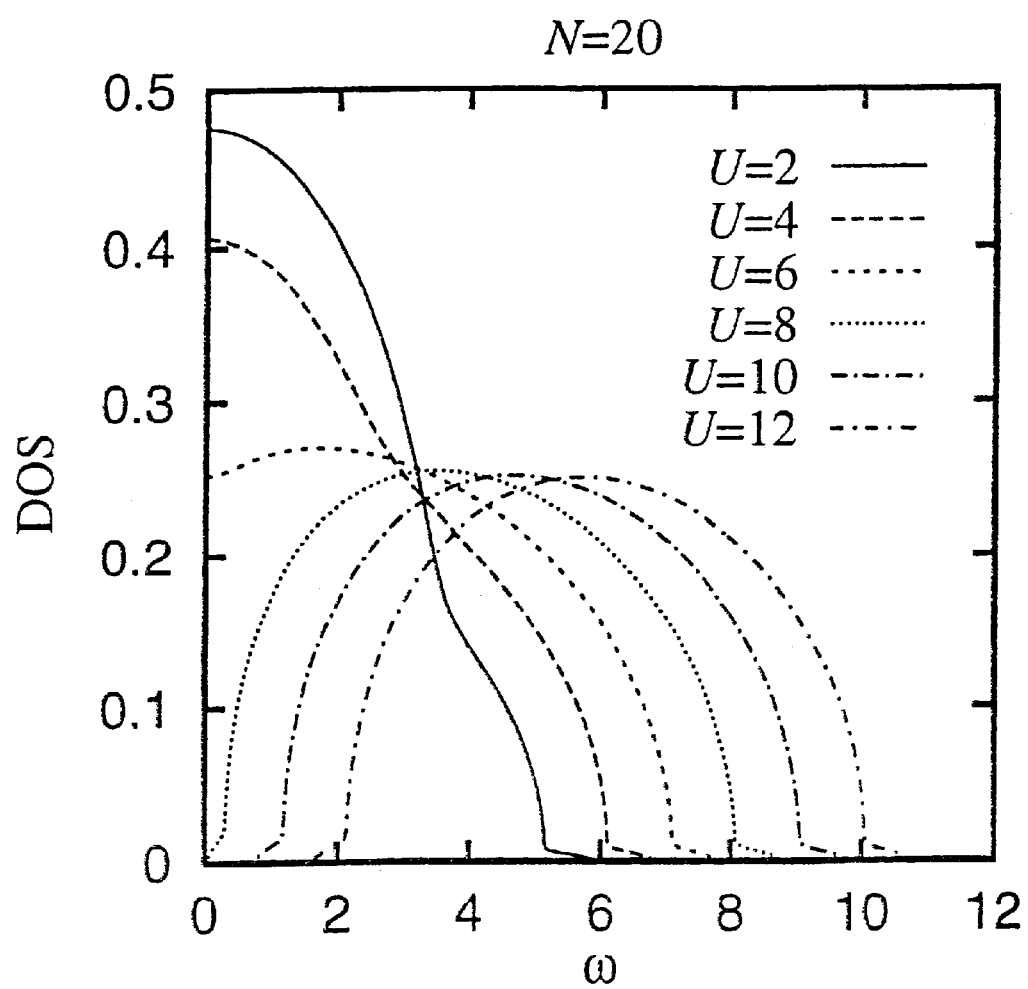
FIG. 7 is a rough diagram that shows a density of states obtained by numerical calculation in case of N=20 in the first embodiment of the invention.
Figure 8:
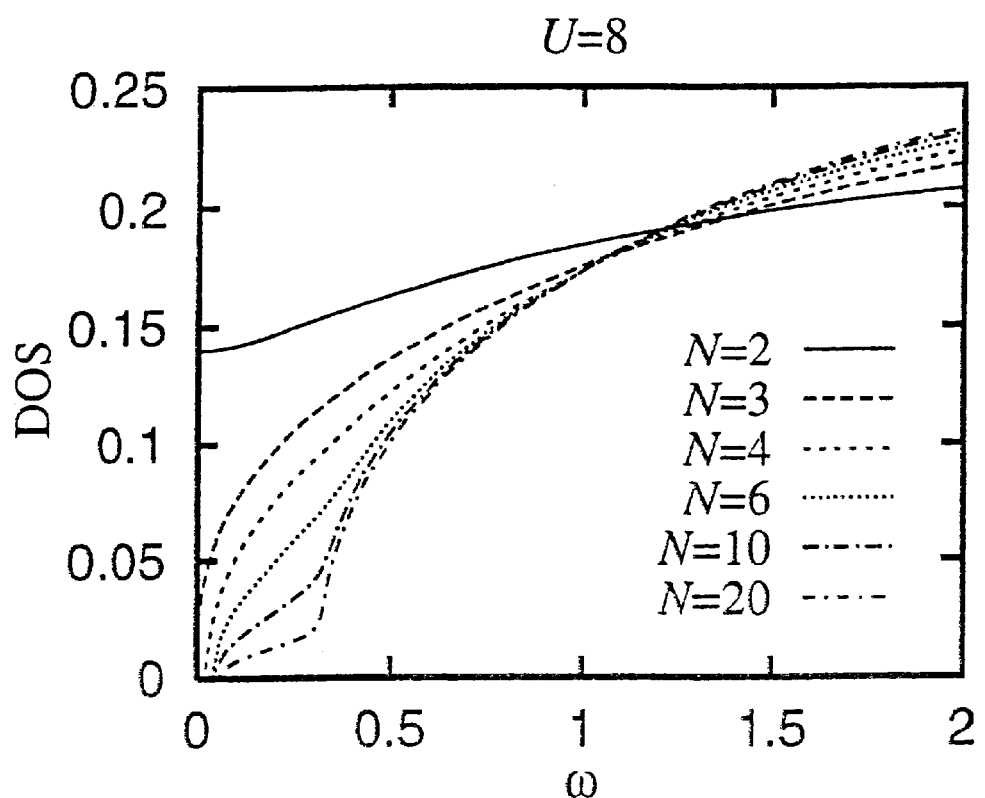
FIG. 8 is a rough diagram that shows a density of states obtained by numerical calculation in case of U=8 in the first embodiment of the invention.
Figure 9:
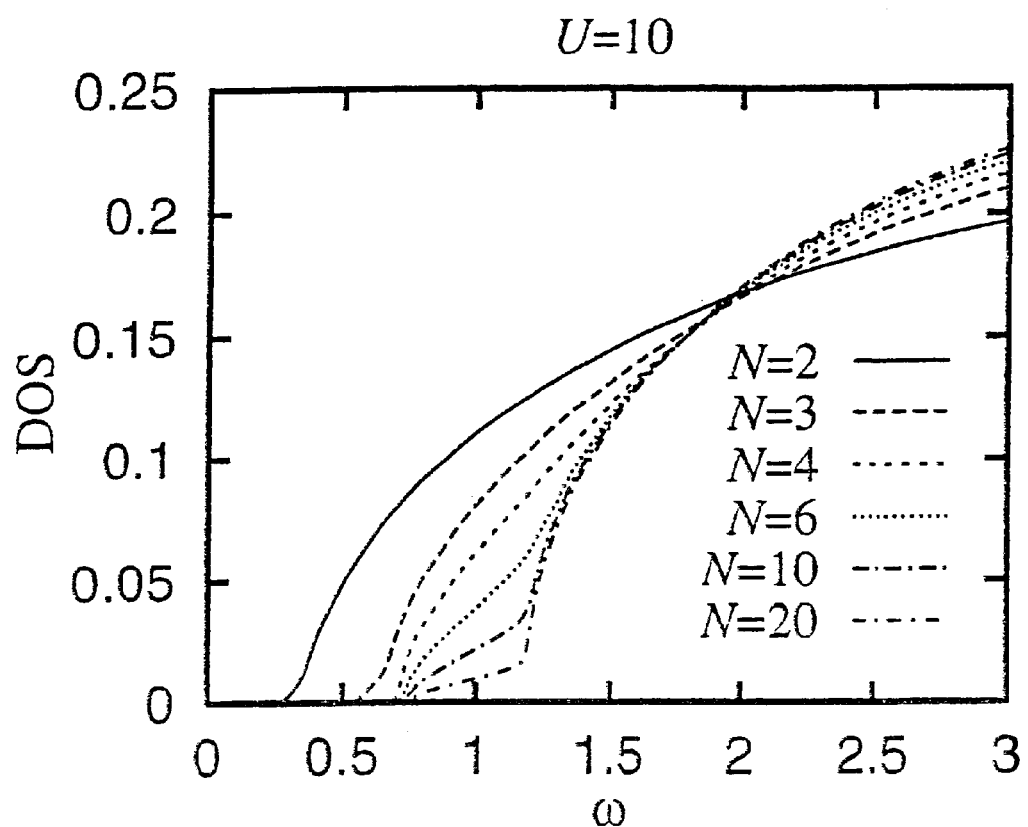
FIG. 9 is a rough diagram that shows a density of states obtained by numerical calculation in case of U=10 in the first embodiment of the invention.
Figure 10:
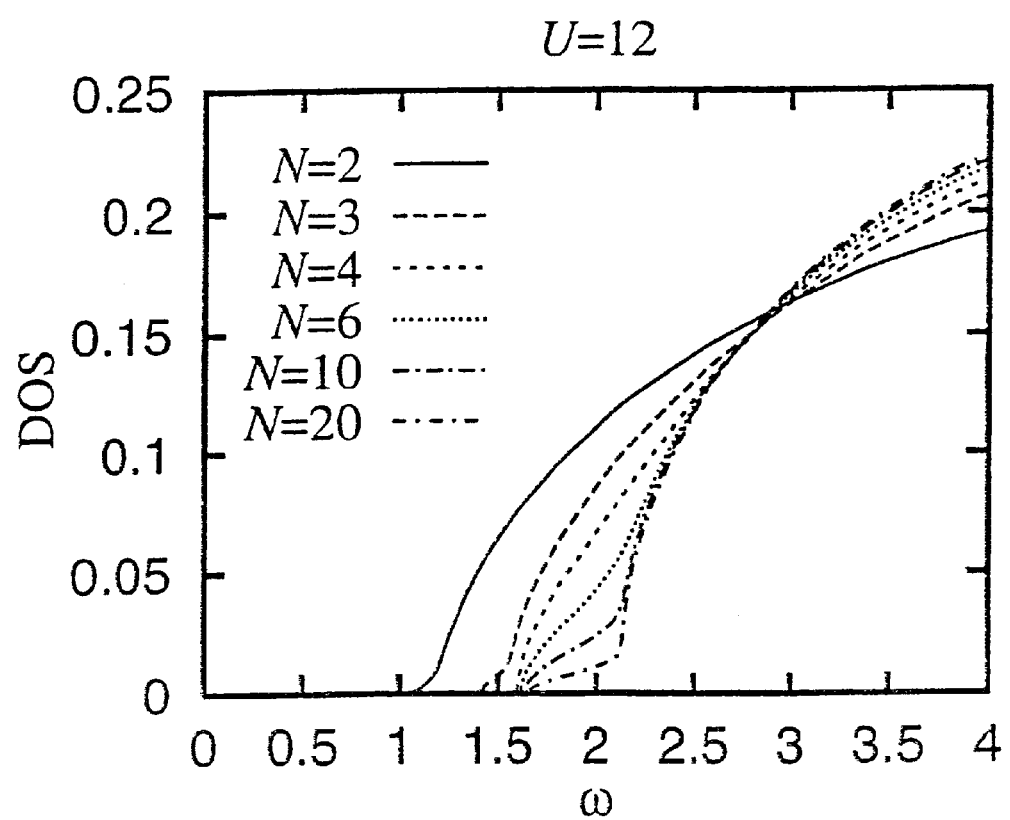
FIG. 10 is a rough diagram that shows a density of states obtained by numerical calculation in case of U=12 in the first embodiment of the invention.

Here is assumed that there is no dependency on spin. That is, assuming $$G_j = G_{j,\uparrow} = G_{j,\downarrow} \quad (24)$$

the following calculation is executed.
Densities of States (DOS)

$$-\frac{1}{n}\sum_j \mathrm{Im} G_j(\omega + i\delta)$$

that were obtained by numerical calculation are shown below. FIG. 3 shows DOS in case of N=2. As shown in FIG. 3, when N=2, the density of state D($\omega$=0) under the Fermi energy $\omega$=0 exists in case of U<8, and the system behaves as a metal. On the other hand, when U=10, a region where DOS has disappeared exists near the Fermi energy, and the system behaves as a Mott insulator. FIG. 4 shows DOS in case of N=4. As shown in FIG. 4, when U=8, D($\omega$=0) becomes substantially zero, the system is closer to a Mott insulator. When the models of N=6 (FIG. 5), N=10 (FIG. 6) and N=20 (FIG. 7) are compared, this tendency is enhanced as N increases. Regarding the case of changing N while fixing U=8, DOS is shown in FIG. 8. From FIG. 8, the system is apparently a metal when N=2, and it is easily observed that a change to a Mott insulator occurs as N increases. Examples of U=10 and U=12 are shown in FIGS. 9 and 10, respectively. Since a value twice the value of $\omega$ rendering DOS be zero is the gap of a Mott insulator (Hubbard gap), it is appreciated that the width of the Hubbard gap increases with N. Therefore, it has been confirmed that Mott-Hubbard transition can be controlled by adjusting N.

In this manner, when the turn pitch is controlled and designed, the system can behave as a metal or can behave an insulator. Therefore, a material having a plurality of regions having different turn pitches can be a superstructure having various regions including metallic regions and insulating regions, and this enables richer controls and designs of physical properties. For example, if a material is designed to have regions of metallic/insulating/metallic phases, a device behaving as a diode can be realized. Further, if the insulator region is made to changeable in phase to a metal under external control, the material can behave as a transistor.

A material containing the multiply-twisted helix as a part thereof could be made. For example, a material in which a structure other than multiply-twisted helical structures is added as an electrode to a multiply-twisted helical structure will be useful.

Figure 11:
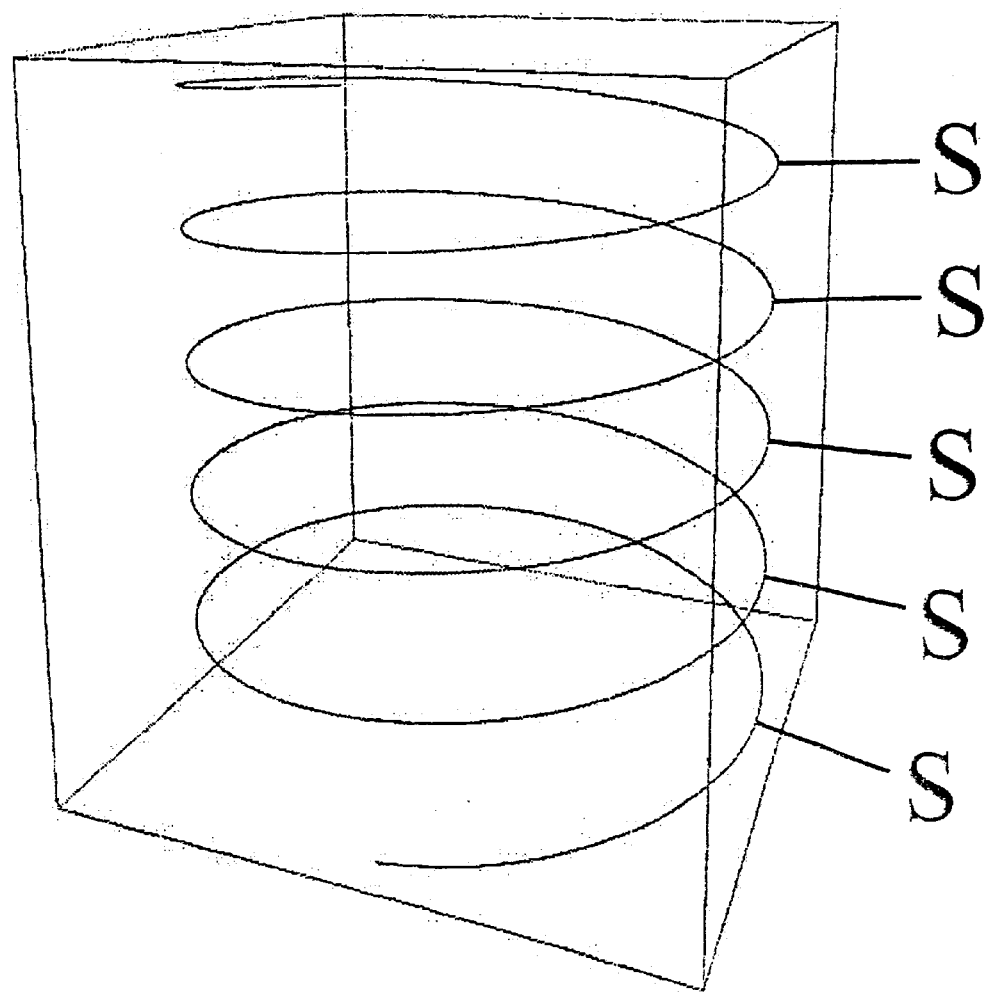
FIG. 11 is a rough diagram that shows a one-dimensional structure of a protein.
Figure 12:
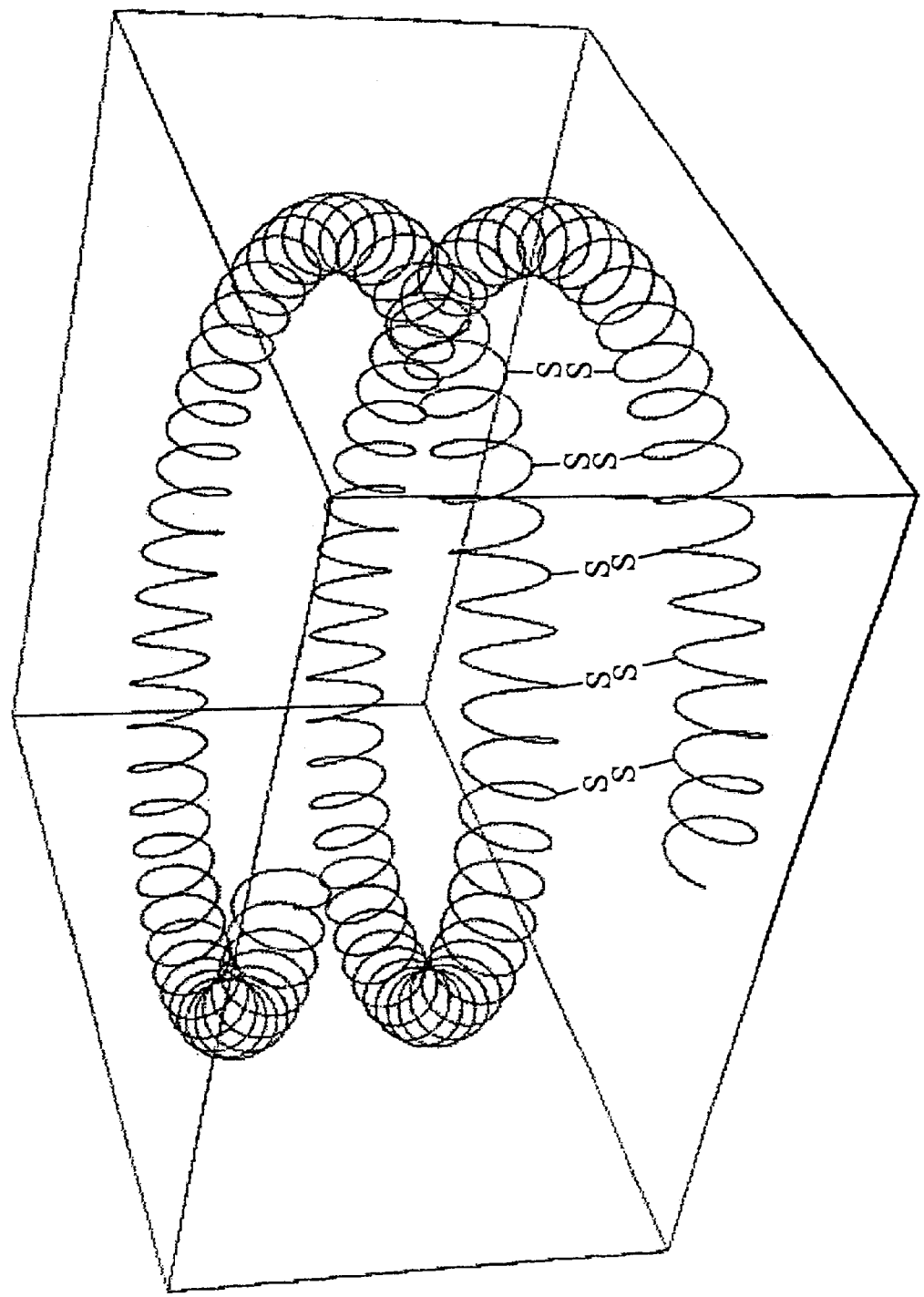
FIG. 12 is a rough diagram that shows a multiply-twisted spiral as a two-dimensional structure using disulfide bonds.

In the foregoing explanation, widths of N, $N^2$ and $N^3$ were assumed as turn pitches of multiply-twisted spirals; however, this assumption is only for simplicity, and there are various other possibilities. For example, in a p-th-order spiral, it will be possible to select $N^p + \Delta_p$ (where $\Delta_p$ is a random number of $-N^{p-1} < \Delta_p < N^{p-1}$). This is realized when a randomness regarding positions of bonding points is introduced in a high-order spiral. This randomness gives a qualitative difference to phase transition of a system. It will be explained later in greater detail with reference to the second embodiment A method of fabricating such a multiply-twisted spiral will now be explained. If a genetic engineering method is used, DNA having a predetermined sequence can be made. $\alpha$ helix is known as one of the most popular proteins. This is a spiral structure in which four amino acids form one turn. DNA can be made such that cysteine, one of one of amino acids and having sulfur atoms, is introduced into the $\alpha$ helix. When this DNA is copied by mRNA to activate the genes to synthesize a protein, its primary structure is as shown in FIG. 11. On the other hand, it is known that sulfur atoms of cysteine bond one another to form a disulfide linkage, and contribute to form high-order proteins. It is expected that the multiply-twisted spirals will be formed as a secondary structure using fill the disulfide linkage (FIG. 12).

Next explained is a multiply-twisted helix according to the second embodiment of the invention.

Explained below is an electron system on a multiply-twisted spiral in a multiply-twisted helix having introduced randomness regarding bonding positions between spiral structures of different layers.

Assuming a one-dimensional lattice, numbers are assigned as n= ..., −1, 0, 1, .... Let the operator for generating an electron of a spin $\sigma$ at the p-th lattice point be $\hat{C}_{p,\sigma}^\dagger$. Of course, there is the anticommutation relation $$\{\hat{C}_{p,\sigma}, \hat{C}_{q,\rho}^\dagger\} = \delta_{p,q}\delta_{\sigma,\rho} \quad (25)$$

Here is defined a single-band Hubbard Hamiltonian $\hat{H}$ of the electron system as follows.

$$\hat{H} = t\sum_{i,j,\sigma}\lambda_{i,j}\hat{C}_{i,\sigma}^\dagger\hat{C}_{j,\sigma} + U\sum_j \hat{n}_{j,\uparrow}\hat{n}_{j,\downarrow} \quad (26)$$

Letting electrons be movable only among neighboring sites, as $\lambda_{p,q}$ $$\lambda_{p,q} = \lambda_{q,p} = \begin{cases} 1 & \text{when } |p-q|=1 \\ s & \text{when } |p-q|=N \\ s^2 & \text{when } \mathrm{mod}(p,N)=0 \text{ and } q=p+N^2+N_r \\ s^3 & \text{when } \mathrm{mod}(p,N^2)=1 \text{ and } q=p+N^3+N^2 r \\ s^4 & \text{when } \mathrm{mod}(p,N^3)=2 \text{ and } q=p+N^4+N^3 r \\ \vdots & \\ 0 & \text{otherwise} \end{cases} \quad (27)$$

is employed. Note that mod(a, b) is the remainder as a result of division of a by b. r is a random variable that satisfies $$-1 < r < 1 \quad (28)$$

and the probability that the value of r appears is given by $$P_R(r) = \frac{R}{2}|r|^{R-1} \quad (29)$$

Average of this distribution is zero, and dispersion is the square root of $$\langle r^2 \rangle = \int_{-1}^{1} r^2 P_R(r)dr \quad (30)$$

$$= \frac{1}{1+2/R} \quad (31)$$

When R=1, distribution becomes uniform, and dispersion decreases as R decreases. At the limit of R→0, randomness disappears. In the following simulation, calculation is made for the cases of R=1, R=½, R=¼, R=⅛, R¹⁄₁₆ and R=0. s=1 is used below.

Here is defined a pin σ electron density operator of the j-th site $\hat{n}_{j,\sigma}=\hat{c}_{j,\sigma}^\dagger \hat{C}_{j,\sigma}$ and its sum $\hat{n}_j = \Sigma_\sigma \hat{n}_{j,\sigma}$.

For the purpose of defining a temperature Green's function, here is introduced a grand canonical Hamiltonian $\hat{K} = \hat{H} - \mu\hat{N}$ where $\hat{N} = \Sigma_j \hat{n}_j$. In the half filled taken here, chemical potential is $\mu = U/2$. The half-filled grand canonical Hamiltonian can be expressed as $$\hat{K} = t\sum_{i,j,\sigma} \lambda_{j,i} \hat{t}_{j,i,\sigma} + U/2 \sum_i (\hat{u}_i - 1) \tag{32}$$

Operators $\hat{t}_{j,i,\sigma}$, $\hat{j}_{j,i,\sigma}$, $\hat{u}_i$ and $\hat{d}_{i,\sigma}$ are defined beforehand as $$\hat{t}_{j,i,\sigma} = \hat{c}_{j,\sigma}^\dagger \hat{c}_{i,\sigma} + \hat{c}_{i,\sigma}^\dagger \hat{c}_{j,\sigma} \tag{33}$$

$$\hat{j}_{j,i,\sigma} = \hat{c}_{j,q}^\dagger \hat{c}_{i,\sigma} - \hat{c}_{i,\sigma}^\dagger \hat{c}_{j,\sigma} \tag{34}$$

$$\hat{u} = \hat{c}_{i,\uparrow}^\dagger \hat{c}_{i,\uparrow} \hat{c}_{i,\downarrow}^\dagger \hat{c}_{i,\downarrow} + \hat{c}_{i,\uparrow} \hat{c}_{i,\uparrow}^\dagger \hat{c}_{i,\downarrow} \hat{c}_{i,\downarrow}^\dagger \tag{35}$$

$$\hat{d}_{i,\sigma} = \hat{c}_{i,\sigma}^\dagger \hat{c}_{i,\sigma} - \hat{c}_{i,\sigma} \hat{c}_{i,\sigma}^\dagger \tag{36}$$

If the temperature Green function is defined for operators $\hat{A}$ and $\hat{B}$ given, taking τ as imaginary time, it is as follows.

$$\langle\hat{A};\hat{B}\rangle = -\int_0^\beta d\tau \langle T_\tau \hat{A}(\tau)\hat{B}\rangle e^{i\omega_n \tau} \tag{37}$$

The on-site Green function $$G_{j,\sigma}(i\omega_n) = \langle \hat{c}_{j,\sigma}; \hat{c}_{j,\sigma}^\dagger \rangle \tag{38}$$

is especially important because, when analytic continuation is conducted as $i\omega_n \to \omega + i\delta$ for a small δ, $$D_j(\omega) = -\sum_{\sigma=\uparrow,\downarrow} \mathrm{Im} G_{j,\sigma}(\omega + i\delta) \tag{39}$$

becomes the local density of states of the site j, and $$D(\omega) = -\sum_{j,\sigma} \mathrm{Im} G_{j,\sigma}(\omega + i\delta) \tag{40}$$

becomes the density of states of the system. For later numerical calculation of densities of states, δ=0.0001 will be used. Further let the total number of sites be n=10001.

Imaginary time development of the system is obtained by the Heisenberg equation $$\frac{d}{d\tau} \hat{A}(\tau) = [\hat{K}, \hat{A}] \tag{41}$$

As the equation of motion of the on-site Green function, $$i\omega_n \langle \hat{c}_{j,\sigma}; \hat{c}_{j,\sigma}^\dagger \rangle = 1 + t\sum_{p,j} \lambda_{p,j} \langle \hat{c}_{p,\sigma}; \hat{c}_{j,\sigma}^\dagger \rangle + \frac{U}{2} \langle \hat{d}_{j,-\sigma} \hat{c}_{j,\sigma}; \hat{c}_{j,\sigma}^\dagger \rangle \tag{42}$$

is obtained. Then, the approximation shown below is introduced, following Gros ((31) C. Gros, Phys. Rev. B50, 7295(1994)). If the site p is the nearest-neighbor site of the site j, the resolution $$\langle \hat{c}_{p,\sigma}; \hat{c}_{j,\sigma}^\dagger \rangle \to t \langle \hat{c}_{p,\sigma}; \hat{c}_{p,\sigma}^\dagger \rangle \langle \hat{c}_{j,\sigma}; \hat{c}_{j,\sigma}^\dagger \rangle \tag{43}$$

is introduced as the approximation. This is said to be exact in case of infinite-dimensional Bethe lattices, but in this case, it is only within approximation. Under the approximation, the following equation is obtained.

$$(i\omega_n - t^2 \Gamma_{j,\sigma}) G_{j,\sigma} = 1 + \frac{U}{2} \langle \hat{d}_{j,-\sigma} \hat{c}_{j,\sigma}; \hat{c}_{j,\sigma}^\dagger \rangle \tag{44}$$

where $$\Gamma_{j,\sigma} = \sum_p \lambda_{p,j} G_{p,\sigma} \tag{45}$$

was introduced. To solve the equation obtained, $\langle \hat{d}_{j,-\sigma} \hat{c}_{j,\sigma}; \hat{c}_{j,\sigma}^\dagger \rangle$ has to be analyzed. In case of half-filled models, this equation of motion is $$i\omega_n \langle \hat{d}_{j,-\sigma} \hat{c}_{j,\sigma}; \hat{c}_{j,\sigma}^\dagger \rangle = \tag{46}$$

$$\frac{U}{2} G_{j,\sigma} - 2t \sum_p \lambda_{p,j} \langle \hat{j}_{p,j,-\sigma} \hat{c}_{j,\sigma}; \hat{c}_{j,\sigma}^\dagger \rangle + t \sum_p \lambda_{p,j} \langle \hat{d}_{j,-\sigma} \hat{c}_{p,\sigma}; \hat{c}_{j,\sigma}^\dagger \rangle$$

Here again, with reference to the Gros logic, approximation is introduced. It is the following translation.

$$\langle \hat{j}_{p,j,-\sigma} \hat{c}_{j,\sigma}; \hat{c}_{j,\sigma}^\dagger \rangle \to t G_{p,-\sigma} \langle \hat{d}_{j,-\sigma} \hat{c}_{j,\sigma}; \hat{c}_{j,\sigma}^\dagger \rangle \tag{47}$$

$$\langle \hat{d}_{j,-\sigma} \hat{c}_{p,\sigma}; \hat{c}_{j,\sigma}^\dagger \rangle \to t G_{p,\sigma} \langle \hat{d}_{j,-\sigma} \hat{c}_{j,\sigma}; \hat{c}_{j,\sigma}^\dagger \rangle \tag{48}$$

By executing this translation, the following closed equation is obtained.

$$(i\omega_n - t^2 \Gamma_{j,\sigma}) G_{j,\sigma} = 1 + \frac{(U/2)^2}{i\omega_n - t^2 \Gamma_{j,\sigma} - 2t^2 \Gamma_{j,-\sigma}} G_{j,\sigma} \tag{49}$$

Here is assumed that there is no dependency on spin. That is, assuming $$G_j = G_{j,\uparrow} = G_{j,\downarrow} \tag{50}$$

the following calculation is executed. In the models currently under consideration, there exist three parameters of R that determine inter-electron interaction U, turn pitch N and random distribution. Although t=1, generality is not lost.

Figure 13:
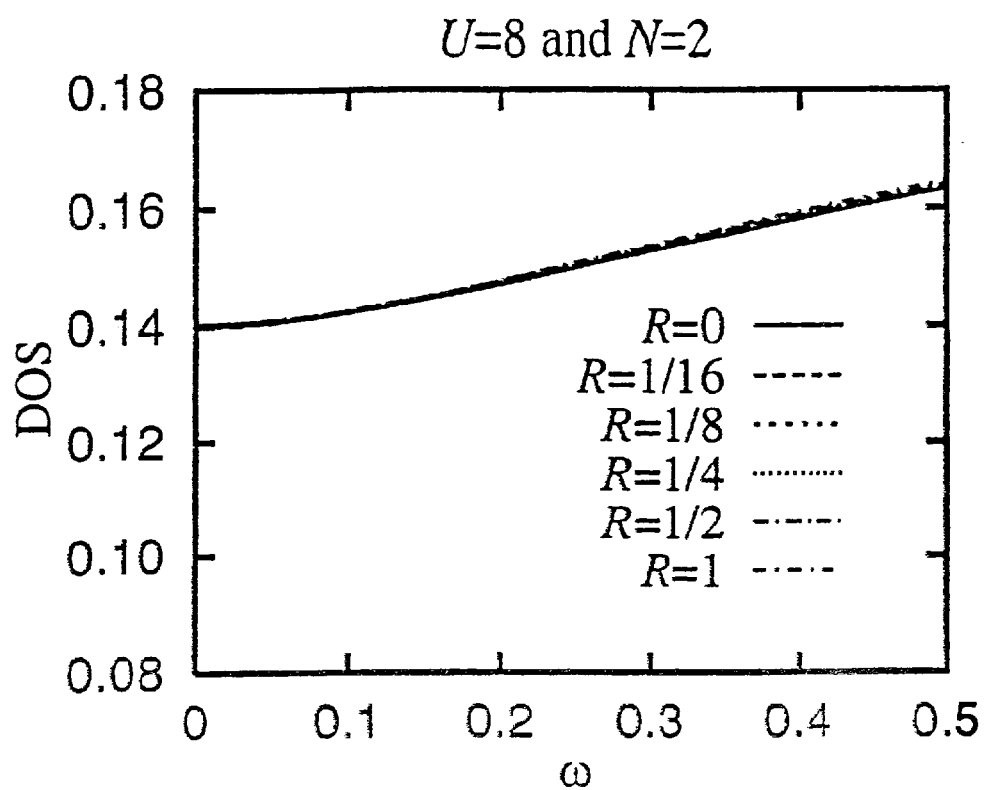
FIG. 13 is a rough diagram that shows a density of states obtained by numerical calculation in case of U=8 and N=2 in the second embodiment of the invention.
Figure 14:
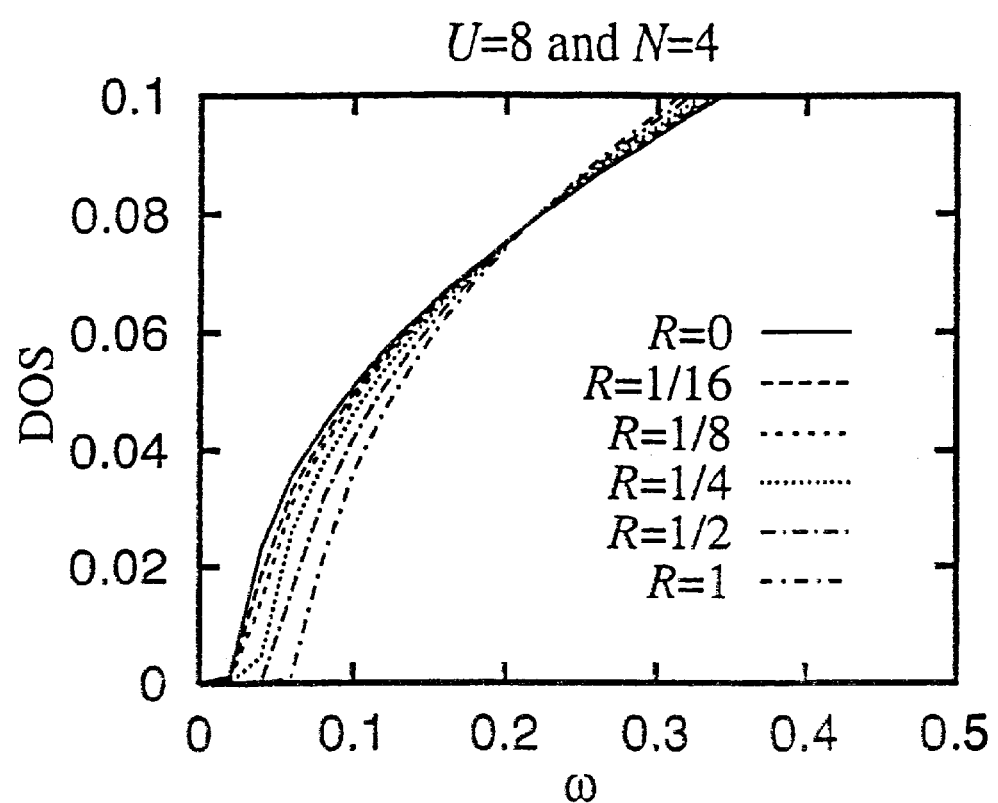
FIG. 14 is a rough diagram that shows a density of states obtained by numerical calculation in case of U=8 and N=4 in the second embodiment of the invention.
Figure 15:
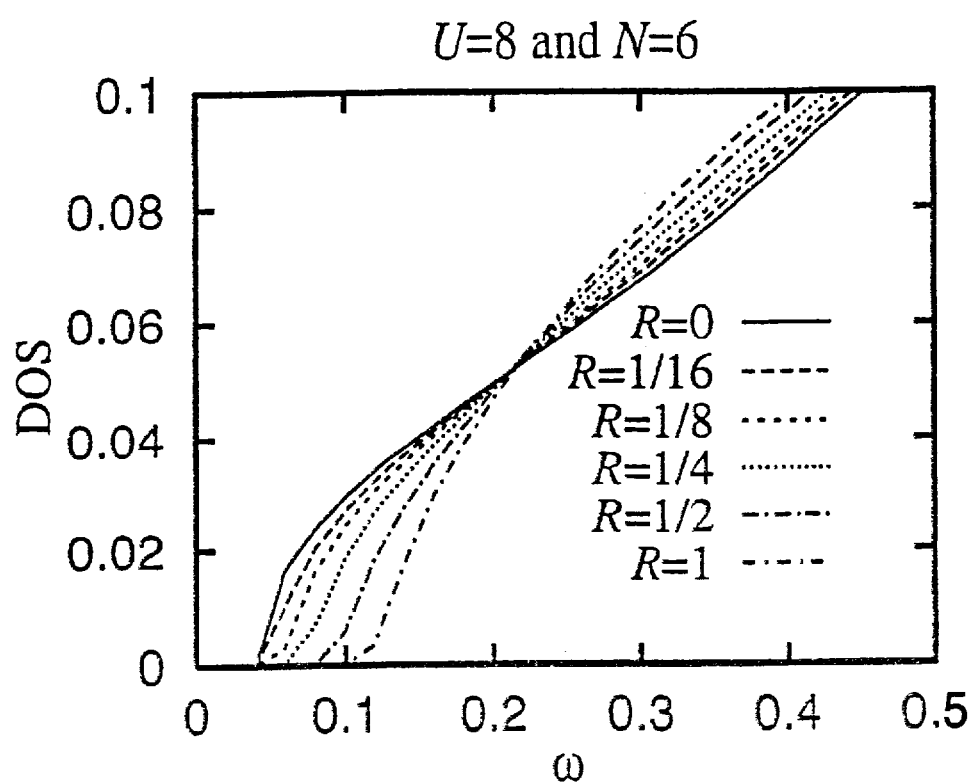
FIG. 15 is a rough diagram that shows a density of states obtained by numerical calculation in case of U=8 and N=6 in the second embodiment of the invention.
Figure 16:
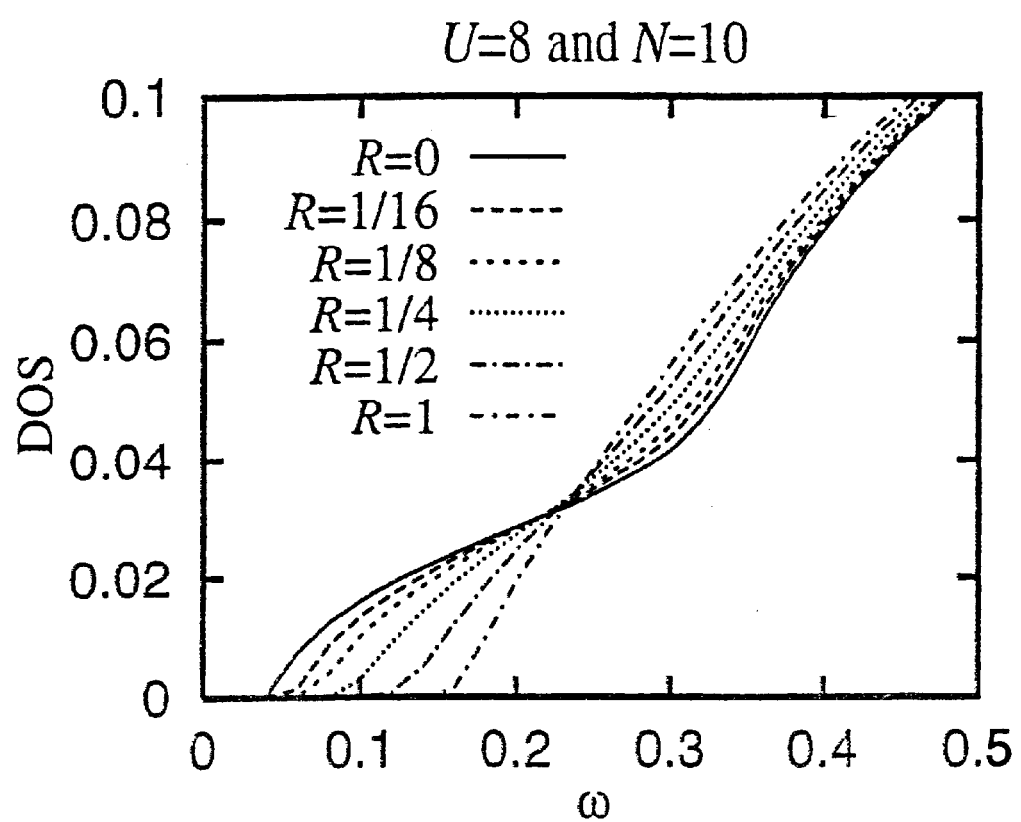
FIG. 16 is a rough diagram that shows a density of states obtained by numerical calculation in case of U=8 and N=10 in the second embodiment of the invention.
Figure 17:
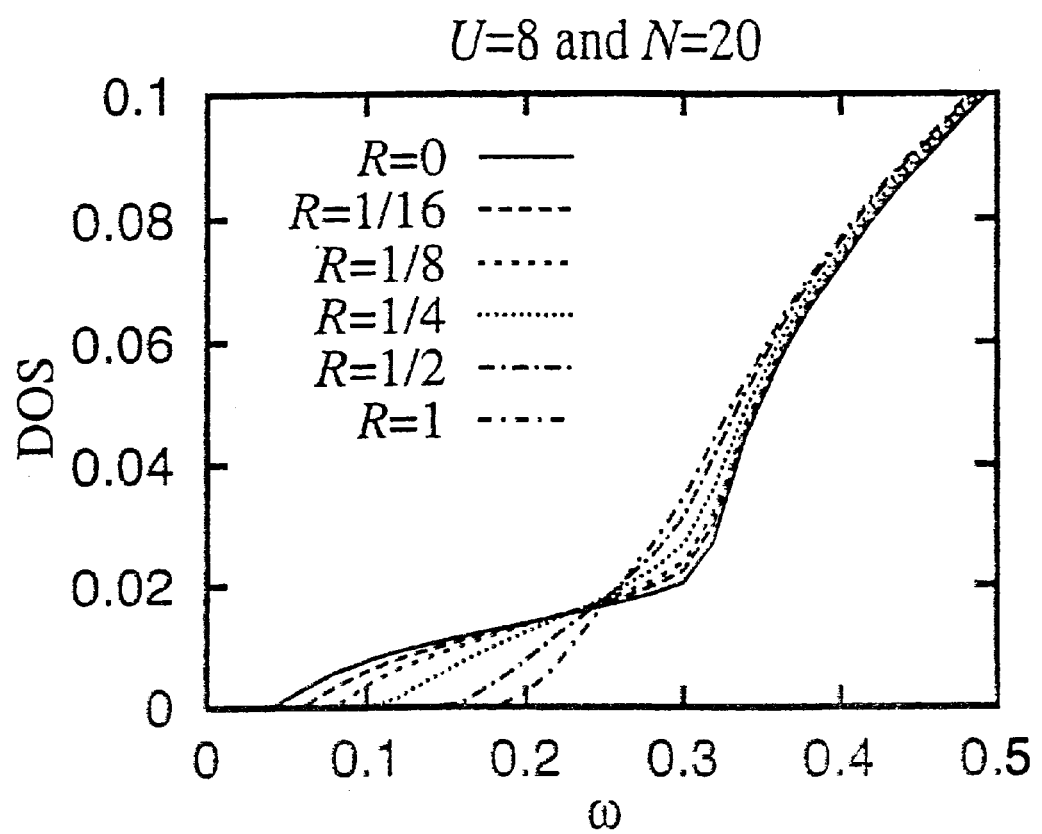
FIG. 17 is a rough diagram that shows a density of states obtained by numerical calculation in case of U=8 and N=20 in the second embodiment of the invention.
Figure 18:
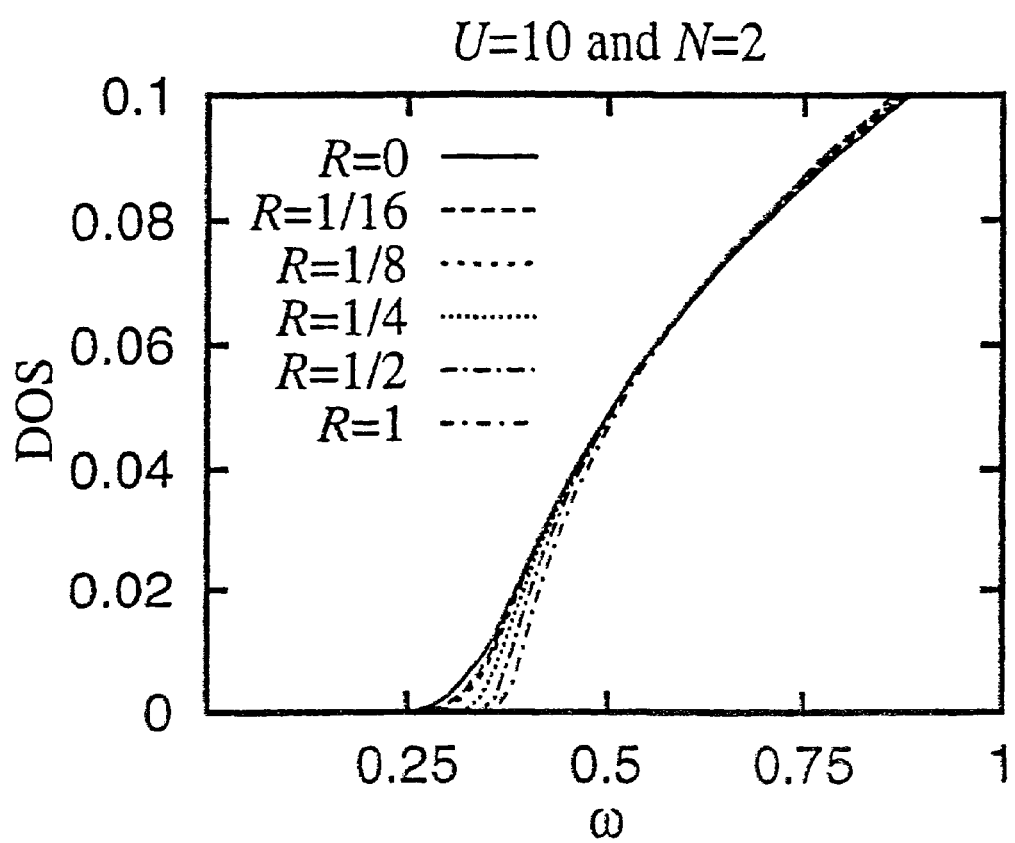
FIG. 18 is a rough diagram that shows a density of states obtained by numerical calculation in case of U=10 and N=2 in the second embodiment of the invention.
Figure 19:
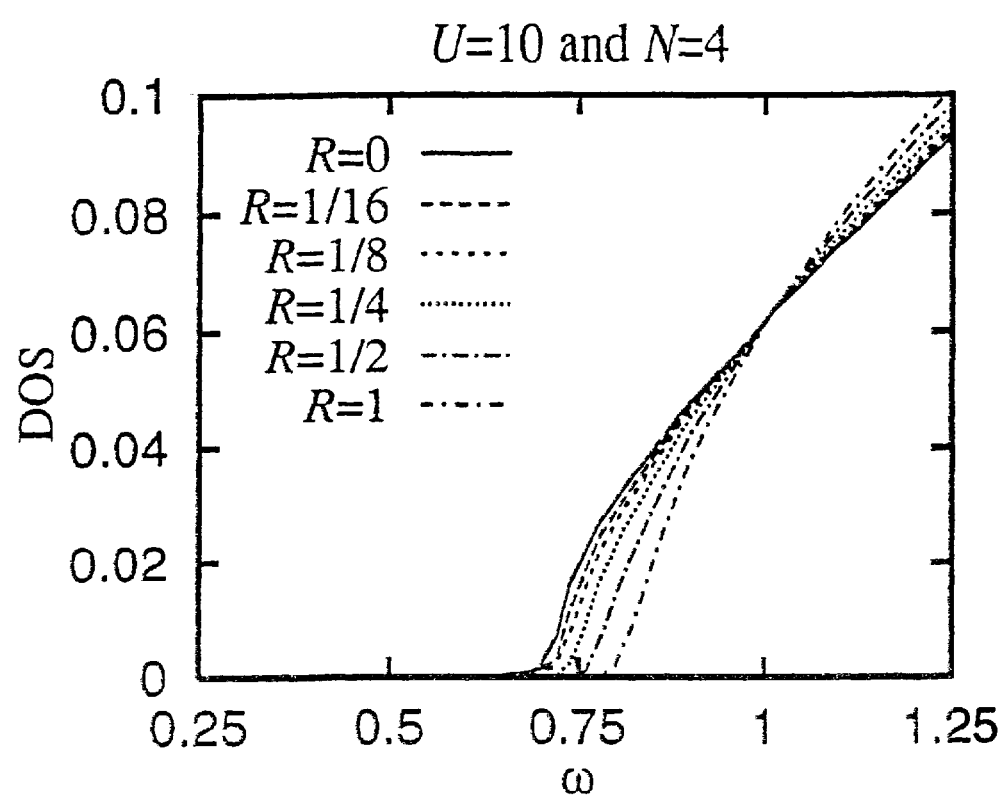
FIG. 19 is a rough diagram that shows a density of states obtained by numerical calculation in case of U=10 and N=4 in the second embodiment of the invention.
Figure 20:
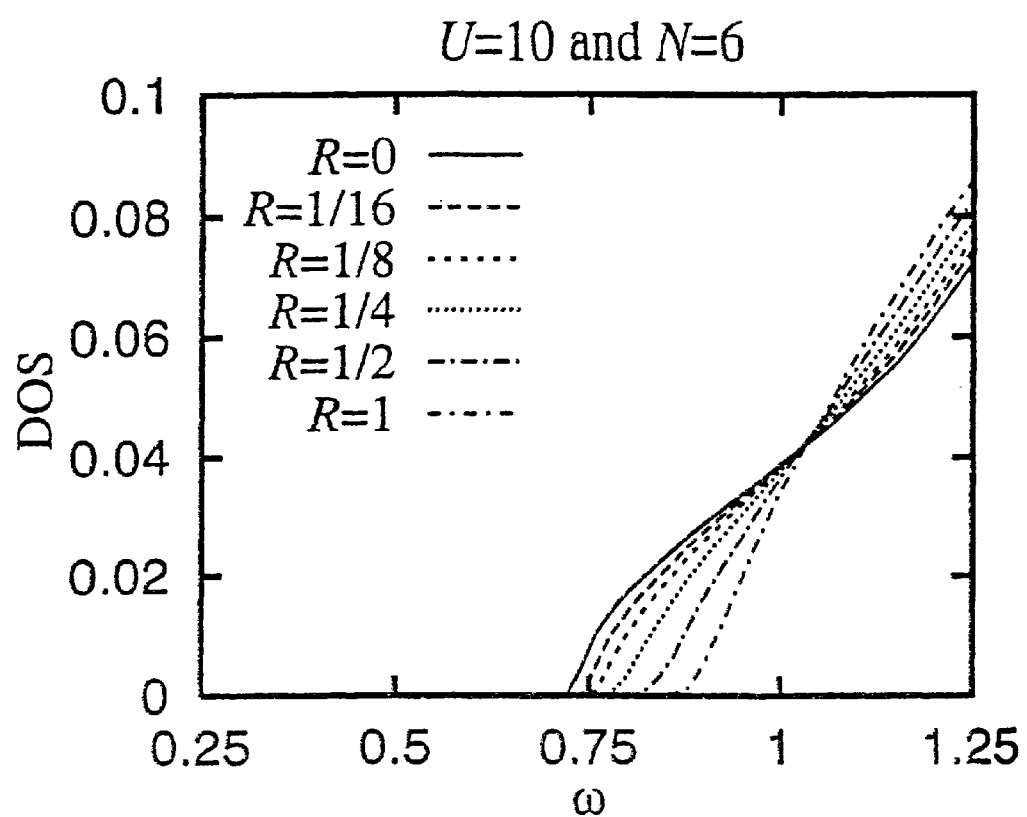
FIG. 20 is a rough diagram that shows a density of states obtained by numerical calculation in case of U=10 and N=6 in the second embodiment of the invention.
Figure 21:
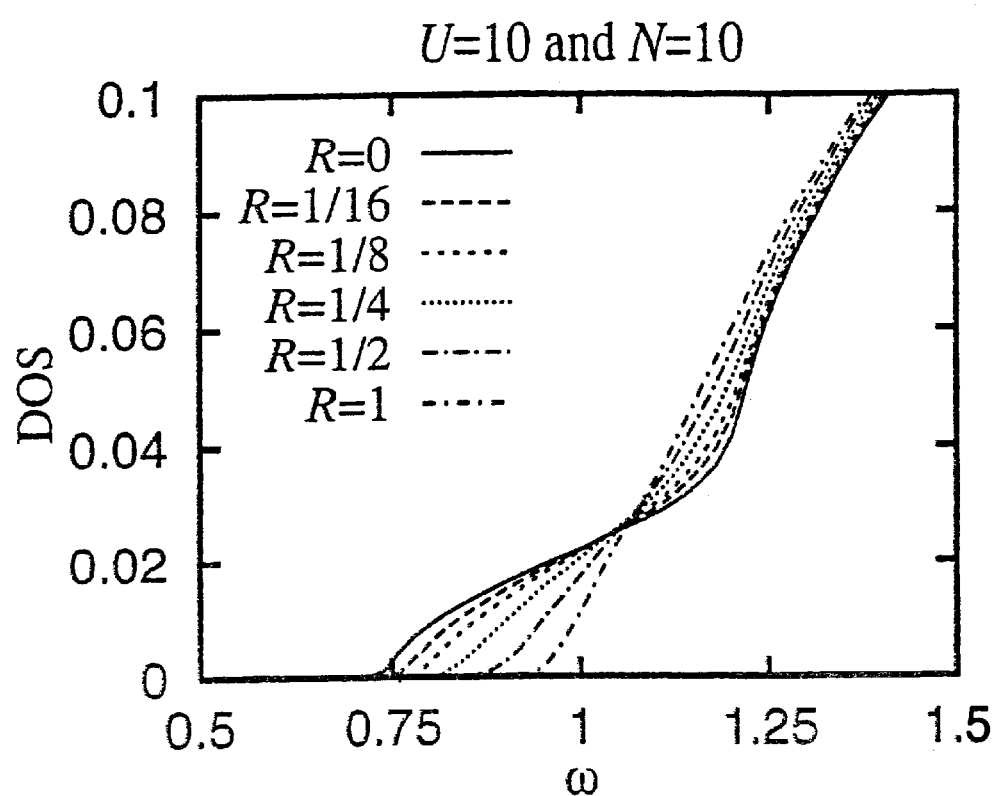
FIG. 21 is a rough diagram that shows a density of states obtained by numerical calculation in case of U=10 and N=10 in the second embodiment of the invention.
Figure 22:
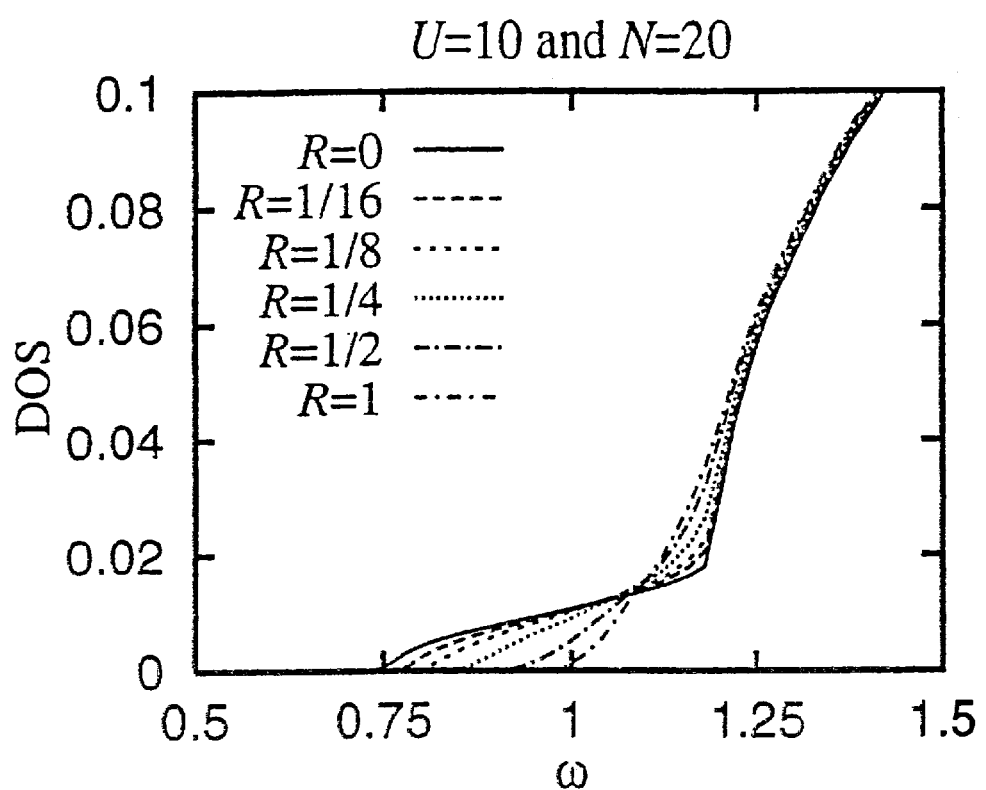
FIG. 22 is a rough diagram that shows a density of states obtained by numerical calculation in case of U=10 and N=20 in the second embodiment of the invention.

Let effects of randomness be discussed. Aspects of DOS under U=8 are shown in FIG. 13 (N=2), FIG. 14 (N=4), FIG. 15 (N=6), FIG. 16 (N=10), and FIG. 17 (N=20). As R increases, randomness also increases. Randomness gives almost no influences to metallic states (FIG. 13). As N increases and the nature of multiply-twisted spirals is introduced, a tail appears on DOS under R=0. This tail narrows the Hubbard gap, but as the randomness increases, the tail disappears and the insulation performance increases, as understood from the figure. Aspects of DOS under U=10 are shown in FIG. 18 (N=2), FIG. 19 (N=4), FIG. 20 (N=6), FIG. 21 (N=10), and FIG. 22 (N=20). In FIG. 18, it should be remarked that influences of randomness are not so large. In this case, the system is already a Mott insulator, the value of N is small. Therefore, there exists no tail structure derived from the multiply-twisted helical structure. On the other hand, as N increases, a tail is produced, and thereafter disappears due to randomness as understood from the figure.

It has been confirmed in this manner that, when the turn pitch is controlled and designed, the system can behave as a metal or can behave an insulator, and its insulation performance is enhanced by randomness.

For the purpose of comparison with a system in which randomness has been introduced to bonds between different layers of the multiply-twisted helical structure of different layers, an absolute random-bonding system was analyzed. This was directed to Mott transition on lattices in which bonds are formed absolutely randomly under the constraint that each of 10001 sites has at least four nearest-neighbor sites. As the average, the number of nearest-neighbor sites was determined as $$Z=4+L/5 \quad (51)$$

Figure 23:
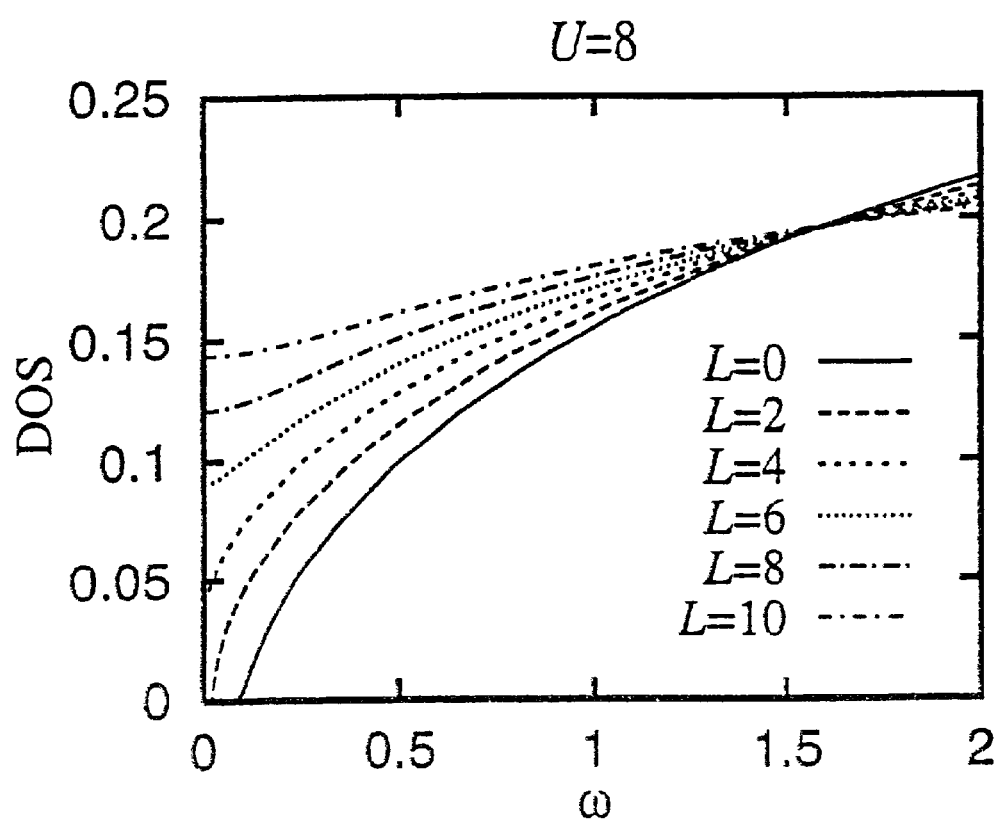
FIG. 23 is a rough diagram that shows a density of states obtained by numerical calculation in case of U=8 in the second embodiment of the invention.
Figure 24:
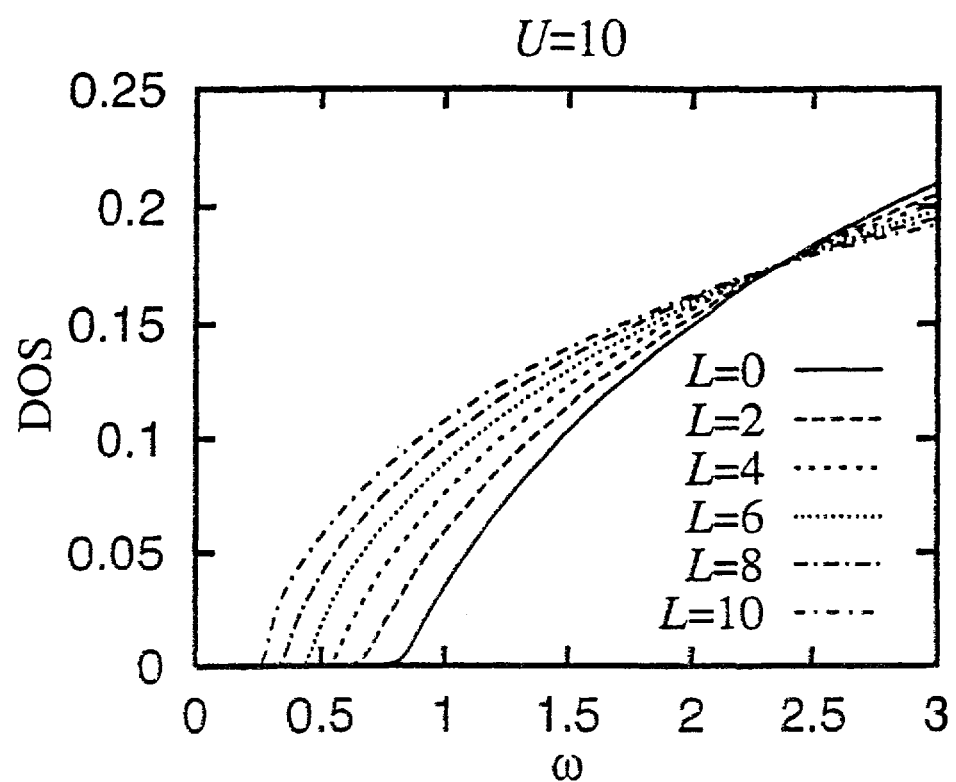
FIG. 24 is a rough diagram that shows a density of states obtained by numerical calculation in case of U=10 in the second embodiment of the invention.
Figure 25:
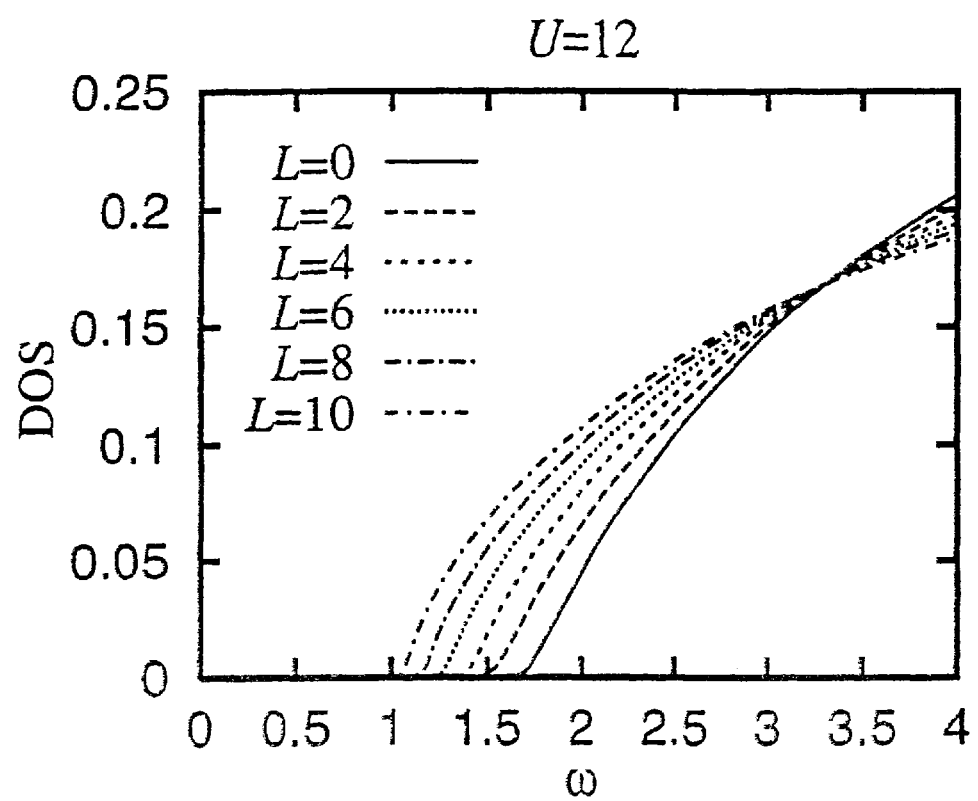
FIG. 25 is a rough diagram that shows a density of states obtained by numerical calculation in case of U=12 in the second embodiment of the invention.

Therefore, when L=0, it becomes a number of nearest-neighbor sites equivalent to that of a two-dimensional tetragonal lattice. When L=10, it becomes a number of nearest-neighbor sites equivalent to that of a three-dimensional tetragonal lattice. Aspects of DOS of this random-bonding system are shown in FIG. 23 (U=8), FIG. 24 (U=10) and FIG. 25 (U=12). Changes of DOS are smooth, apparently unlike the foregoing multiply-twisted helical structure.

Next explained is an electron system on a multiply-twisted spiral in a multiply-twisted helix according to the third embodiment.

Assuming a one-dimensional lattice, numbers are assigned as n= . . . , −1, 0, 1, . . . . Let the operator for generating an electron of a spin (at the p-th lattice point be $\hat{c}_{p,\sigma}^{\dagger}$. Of course, there is the anticommutation relation $$\{\hat{c}_{p,\sigma}, \hat{c}_{q,\rho}^{\dagger}\} = \delta_{p,q}\delta_{\sigma,\rho} \quad (52)$$

Here is defined a single-band Hubbard Hamiltonian $\hat{H}$ of the electron system as follows.

$$\hat{H} = t\sum_{i,j,\sigma}\lambda_{i,j}\hat{c}_{i,\sigma}^{\dagger}\hat{c}_{j,\sigma} + U\sum_{j}\hat{n}_{j,\uparrow}\hat{n}_{j,\downarrow} \quad (53)$$

Letting electrons be movable only among neighboring sites, as $\lambda_{p,q}$ $$\lambda_{p,q} = \lambda_{q,p} = \begin{cases} 1 & \text{when } |p-q|=1 \\ s & \text{when } |p-q|=N \\ s^2 & \text{when } \mathrm{mod}(p,N)=0 \text{ and } q=p+N^2+f(N) \\ s^3 & \text{when } \mathrm{mod}(p,N^2)=1 \text{ and } q=p+N^3+f(N^2) \\ s^4 & \text{when } \mathrm{mod}(p,N^3)=2 \text{ and } q=p+N^4+f(N^3) \\ \vdots \\ 0 & \text{otherwise} \end{cases} \quad (54)$$

is employed. Note that mod(a, b) is the remainder as a result of division of a by b. In this definition, an arbitrary function f(x) is introduced to provide a generalized model. For example, a model given by $$f(x)=0 \quad (55)$$

is the model analyzed in the first embodiment. Whereas, a model given by $$f(x)=rx \quad (56)$$

where r is a random variable that satisfies $$-1<r<1 \quad (57)$$

and having the probability of appearance of r given by $$P_R(r) = \frac{R}{2}|r|^{R-1} \quad (58)$$

is the model analyzed in the second embodiment.

A model analyzed in the third embodiment is one given by $$f(x)=\Omega x \quad (59)$$

in which $\Omega=-\frac{1}{2}$. That is, here is taken a model based on the multiply-twisted helix according to the second embodiment but having the random variable r fixed to $-\frac{1}{2}$. In other words, it can be considered that inter-layer bonds have entirely moved in parallel from the system of f(x)=0.

Here is defined a pin σ electron density operator of the j-th site $\hat{n}_{j,\sigma}=\hat{c}_{j,\sigma}^{\dagger}\hat{c}_{j,\sigma}$ and its sum $\hat{n}_j=\Sigma_\sigma\hat{n}_{j,\sigma}$.

For the purpose of defining a temperature Green's function, here is introduced a grand canonical Hamiltonian $\hat{K}=\hat{H}-\mu\hat{N}$ where $\hat{N}=\Sigma_j\hat{n}_j$. In the half filled taken here, chemical potential is $\mu=U/2$. The half-filled grand canonical Hamiltonian can be expressed as $$\hat{K} = t\sum_{i,j,\sigma}\lambda_{j,i}\hat{t}_{j,i,\sigma} + U/2\sum_i(\hat{u}_i - 1) \quad (60)$$

Operators $\hat{t}_{j,i,\sigma}$, $\hat{j}_{j,i,\sigma}$, $\hat{u}_i$ and $\hat{d}_{i,\sigma}$ are defined beforehand as $$\hat{t}_{j,i,\sigma}=\hat{c}_{j,\sigma}^{\dagger}\hat{c}_{i,\sigma}+\hat{c}_{i,\sigma}^{\dagger}\hat{c}_{j,\sigma} \quad (61)$$

$$\hat{j}_{j,i,\sigma}=\hat{c}_{j,\sigma}^{\dagger}\hat{c}_{i,\sigma}-\hat{c}_{i,\sigma}^{\dagger}\hat{c}_{j,\sigma} \quad (62)$$

$$\hat{u}_i=\hat{c}_{i,\uparrow}^{\dagger}\hat{c}_{i,\uparrow}\hat{c}_{i,\downarrow}^{\dagger}\hat{c}_{i,\downarrow}+\hat{c}_{i,\uparrow}\hat{c}_{i,\uparrow}^{\dagger}\hat{c}_{i,\downarrow}\hat{c}_{i,\downarrow}^{\dagger} \quad (63)$$

$$\hat{d}_{i,\sigma}=\hat{c}_{i,\sigma}^{\dagger}\hat{c}_{i,\sigma}-\hat{c}_{i,\sigma}\hat{c}_{i,\sigma}^{\dagger} \quad (64)$$

If the temperature Green function is defined for operators $\hat{A}$ and $\hat{B}$ given, taking τ as imaginary time, it is as follows.

$$<\hat{A};\hat{B}> = -\int_0^\beta d\tau <T_\tau\hat{A}(\tau)\hat{B}>e^{i\omega_n\tau} \quad (65)$$

The on-site Green function $$G_{j,\sigma}(i\omega_n) = <\hat{c}_{j,\sigma};\hat{c}_{j,\sigma}^{554}> \quad (66)$$

is especially important because, when analytic continuation is conducted as $i\omega_n \to \omega+i\delta$ for a small δ, $$D_j(\omega) = -\sum_{\sigma=\uparrow,\downarrow}\mathrm{Im}G_{j,\sigma}(\omega+i\delta) \quad (67)$$

becomes the local density of states of the site j, and $$D(\omega) = -\sum_{j,\sigma}\mathrm{Im}G_{j,\sigma}(\omega+i\delta) \quad (68)$$

becomes the density of states of the system. For later numerical calculation of densities of states, δ=0.0001 will be used. Further let the total number of sites be n=10001.

Imaginary time development of the system is obtained by the Heisenberg equation $$\frac{d}{d\tau}\hat{A}(\tau) = [\hat{K},\hat{A}] \quad (69)$$

As the equation of motion of the on-site Green function, $$i\omega_n\langle\hat{c}_{j,\sigma};\hat{c}_{j,\sigma}^{\dagger}\rangle = 1 + t\sum_{p,j}\lambda_{p,j}\langle\hat{c}_{p,\sigma};\hat{c}_{j,\sigma}^{\dagger}\rangle + \frac{U}{2}\langle\hat{d}_{j,-\sigma}\hat{c}_{j,\sigma};\hat{c}_{j,\sigma}^{\dagger}\rangle \quad (70)$$

is obtained. Then, the approximation shown below is introduced, following Gros ((31) C. Gros, Phys. Rev. B50, 7295(1994)). If the site p is the nearest-neighbor site of the site j, the resolution $$<\hat{c}_{p,\sigma};\hat{c}_{j,\sigma}^{\dagger}> \to t<\hat{c}_{p,\sigma};\hat{c}_{p,\sigma}^{\dagger}><\hat{c}_{j,\sigma};\hat{c}_{j,\sigma}^{\dagger}> \quad (71)$$

is introduced as the approximation. This is said to be exact in case of infinite-dimensional Bethe lattices, but in this case, it is only within approximation. Under the approximation, the following equation is obtained.

$$(i\omega_n - t^2\Gamma_{j,\sigma})G_{j,\sigma} = 1 + \frac{U}{2}\langle \hat{d}_{j,-\sigma}\hat{c}_{j,\sigma}; \hat{c}^\dagger_{j,\sigma}\rangle \quad (72)$$

where $$\Gamma_{j,\sigma} = \sum_p \lambda_{p,j} G_{p,\sigma} \quad (73)$$

was introduced. To solve the equation obtained, $\langle \hat{d}_{j,-\sigma}\hat{c}_{j,\sigma}; \hat{c}^\dagger_{j,\sigma}\rangle$ has to be analyzed. In case of half-filled models, this equation of motion is $$i\omega_n\langle \hat{d}_{j,-\sigma}\hat{c}_{j,\sigma}; \hat{c}^\dagger_{j,\sigma}\rangle = \quad (74)$$

$$\frac{U}{2}G_{j,\sigma} - 2t\sum_p \lambda_{p,j}\langle \hat{j}_{p,j,-\sigma}\hat{c}_{j,\sigma}; \hat{c}^\dagger_{j,\sigma}\rangle + t\sum_p \lambda_{p,j}\langle \hat{d}_{j,-\sigma}\hat{c}_{p,\sigma}; \hat{c}^\dagger_{j,\sigma}\rangle$$

Here again, with reference to the Gros logic, approximation is introduced. It is the following translation.

$$\langle \hat{j}_{p,j,-\sigma}\hat{c}_{j,\sigma}; \hat{c}^\dagger_{j,\sigma}\rangle \rightarrow -tG_{p,-\sigma}\langle \hat{d}_{j,-\sigma}\hat{c}_{j,\sigma}; \hat{c}^\dagger_{j,\sigma}\rangle \quad (75)$$

$$\langle \hat{d}_{j,-\sigma}\hat{c}_{j,\sigma}; \hat{c}^\dagger_{j,\sigma}\rangle \rightarrow tG_{p,\sigma}\langle \hat{d}_{j,-\sigma}\hat{c}_{j,\sigma}; \hat{c}^\dagger_{j,\sigma}\rangle \quad (76)$$

By executing this translation, the following closed equation is obtained.

$$(i\omega_n - t^2\Gamma_{j,\sigma})G_{j,\sigma} = 1 + \frac{(U/2)^2}{i\omega_n - t^2\Gamma_{j,\sigma} - 2t^2\Gamma_{j,-\sigma}}G_{j,\sigma} \quad (77)$$

Here is assumed that there is no dependency on spin. That is, assuming $$G_j = G_{j,\uparrow} = G_{j,\downarrow} \quad (78)$$

the following calculation is executed. In the models currently under consideration, there exist parameters of the inter-electron interaction U and the turn pitch N. For the following calculation, s=t=1 is used.

Figure 26:
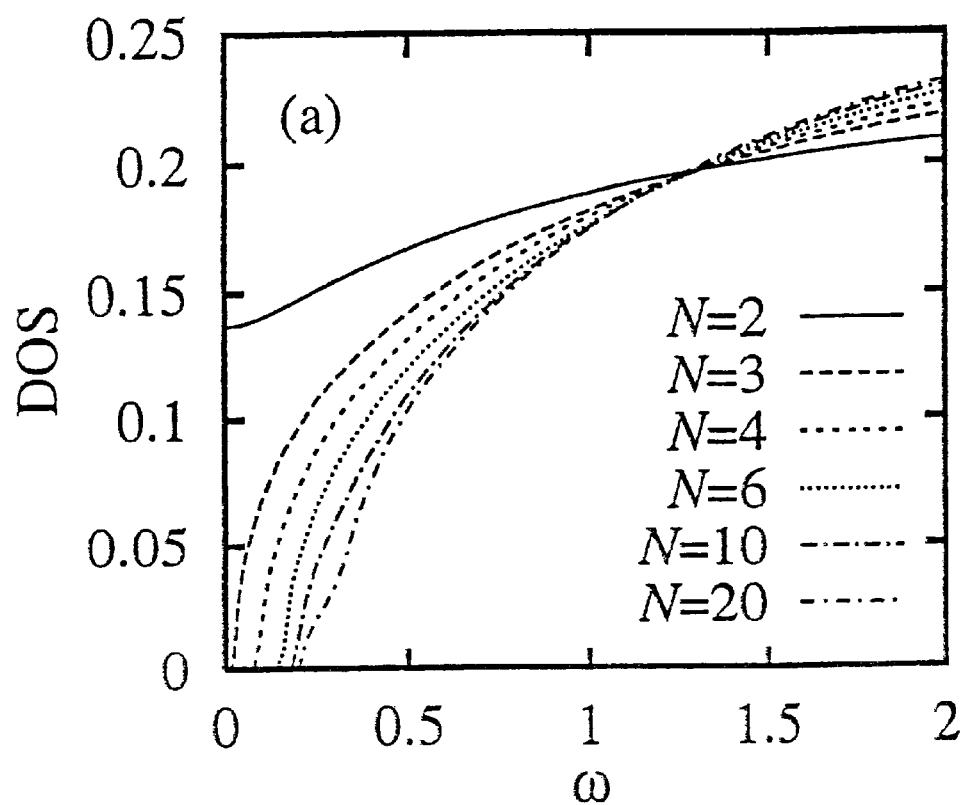
FIG. 26 is a rough diagram that shows a density of states obtained by numerical calculation in case of U=8 in the third embodiment of the invention.
Figure 27:
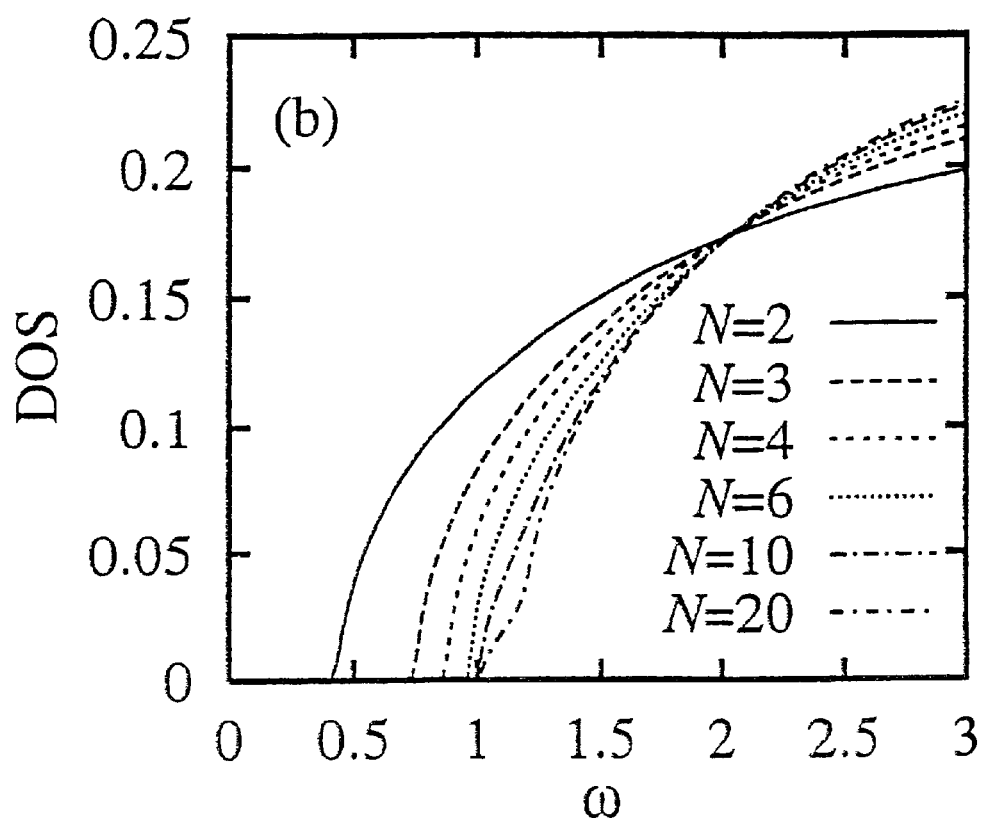
FIG. 27 is a rough diagram that shows a A density of states obtained by numerical calculation in case of U=10 in the third embodiment of the invention.
Figure 28:
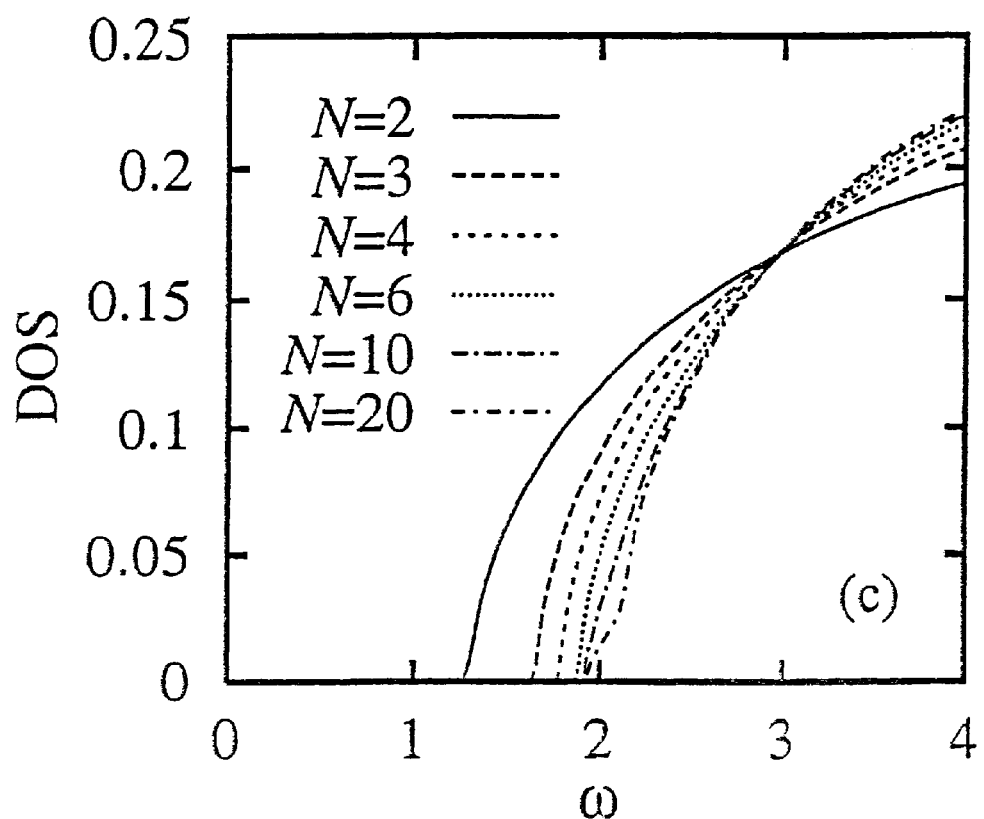
FIG. 28 is a rough diagram that shows a density of states obtained by numerical calculation in case of U=12 in the third embodiment of the invention.

Let discussion be progressed to a case using f(x)=−x/2. Aspects of DOS under N=2, 3, 4, 6, 10, 20 are shown in FIG. 26 (U=8), FIG. 27 (U=10) and FIG. 28 (U=12). It will be appreciated that the Mott transition is qualitatively controlled by N similarly to FIG. 8. However, they are different quantitatively. Especially, the Hubbard band tail structure remarkable when N is large is small in FIG. 27. Therefore, it is possible to modify the electron state in the multiply-twisted helix by changing Ω in f(x)=Ωx.

Next explained is a multiply-twisted helix according to the fourth embodiment of the invention.

In the fourth embodiment, ferromagnetic phase transition is analyzed by using a Monte Carlo simulation to demonstrate that critical temperature for ferromagnetic phase transition can be controlled by adjusting the turn pitch of the multiply-twisted helix.

Explanation is first made about a spin system on a multiply-twisted spiral in the multiply-twisted helix.

Assuming a one-dimensional lattice, numbers are assigned as n= ..., −1, 0, 1, .... Hamiltonian H of this spin system is defined as follows.

$$H = -\sum_{p,q} J_{p,q} S_p \cdot S_q \quad (79)$$

$S_p$=1 or −1 is used as the spin variable, and an Ising model is handled. As $J_{p,q}$ $$J_{p,q} = J_{q,p} = \begin{cases} 1 & \text{when } |p-q|=1 \\ s & \text{when } |p-q|=N \\ s^2 & \text{when } \mathrm{mod}(p,N)=0 \text{ and } q=p+N^2 \\ s^3 & \text{when } \mathrm{mod}(p,N^2)=1 \text{ and } q=p+N^3 \\ s^4 & \text{when } \mathrm{mod}(p,N^3)=2 \text{ and } q=p+N^4 \\ \vdots \\ 0 & \text{otherwise} \end{cases} \quad (80)$$

is employed. Note that mod(a, b) is the remainder as a result of division of a by b. Positional relation between spins is determined by $J_{p,q}$, and the multiply-twisted helix is defined thereby. Partition function $$Z = \sum_{\{S_p\}} e^{-\beta H} \quad (81)$$

is introduced, and physical property values are calculated at finite temperatures by using statistical mechanics. T is the temperature, and β=1/T and $k_B$=1 are used. Expected value concerning an arbitrary function $f(S_j)$ of the spin variable is calculated by $$\langle f(S_p) \rangle = \frac{1}{Z}\sum_{\{S_p\}} f(S_j) e^{-\beta H} \quad (82)$$

When n is the total number of sites, expected value of spontaneous magnetization is $$M = \frac{1}{n}\sum_{j=0}^{n} \langle S_j \rangle \quad (83)$$

Hereunder, n=10001 is used.

Figure 29:
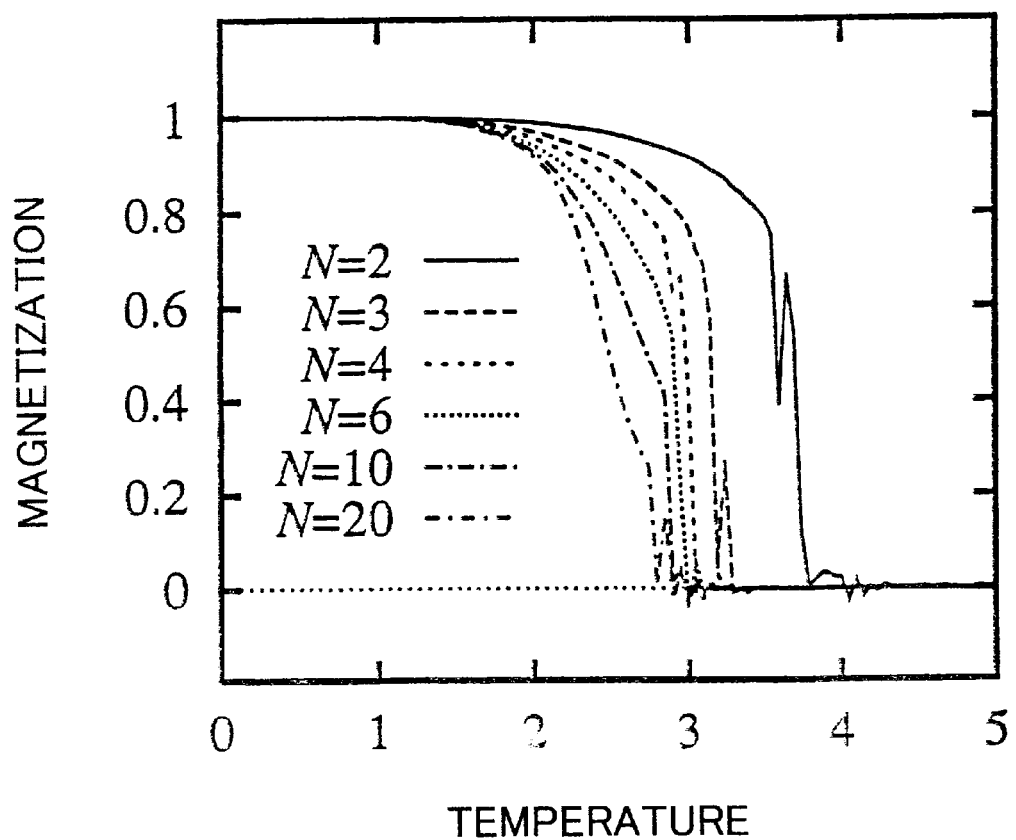
FIG. 29 is a rough diagram that shows spontaneous magnetization obtained by numerical calculation in case of N=2, 3, 4, 6, 10, 20 in the fourth embodiment of the invention.

FIG. 29 is a result of calculation of spontaneous magnetization by using the Metropolis method that is one of the Monte Carlo methods. 100000 is used as the Monte Carlo step. Here are shown values obtained by setting N=2, 3, 4, 5, 10, 20 as the turn pitch. The multiply-twisted helix of N=2 exhibits a critical temperature substantially equivalent to that of a three-dimensional system, but as N increases, the critical temperature for spontaneous magnetization to disappear gradually decreases.

Figure 30:
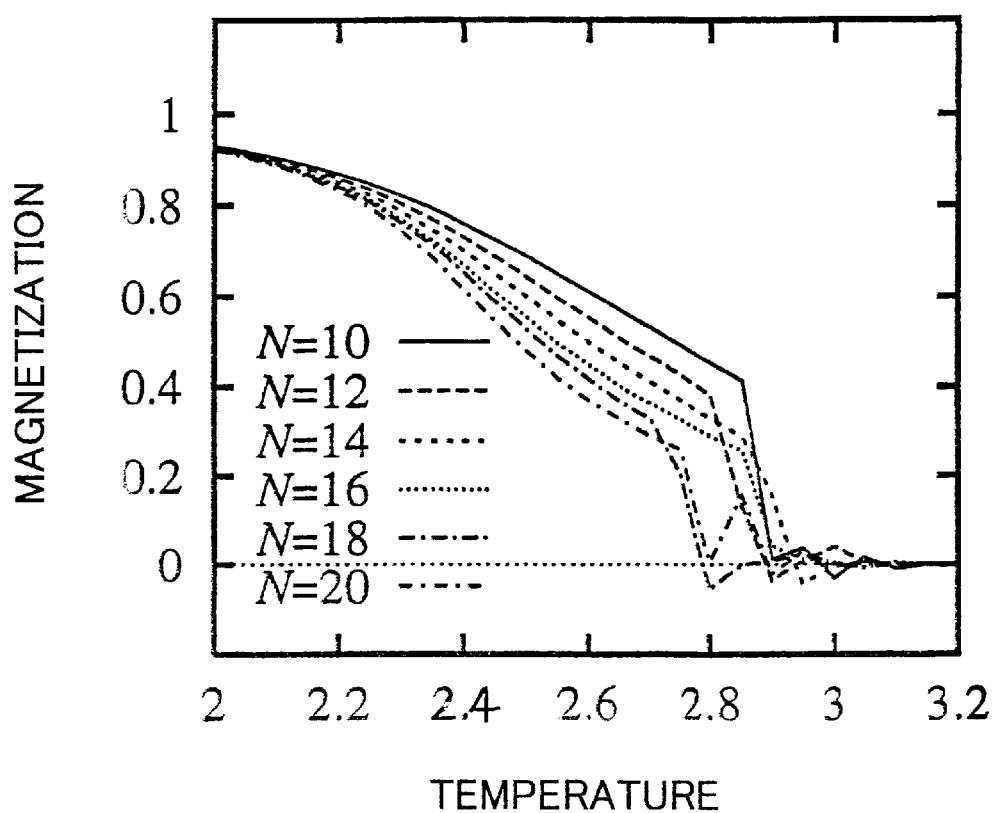
FIG. 30 is a rough diagram that shows spontaneous magnetization obtained by numerical calculation in case of N=10, 12, 14, 16, 18, 20 in the fourth embodiment of the invention.

The multiply-twisted helixes in which N<10 exhibit behaviors similar to those of a tetragonal lattice in terms of dependency of spontaneous magnetization upon temperature; however, when the regions of N>10 are remarked, there are remarkable differences in dependency of spontaneous magnetization upon temperature. FIG. 30 shows a result of calculation of spontaneous magnetization in multiply-twisted helixes of N=10, 12, 14, 16, 18, 20 in those regions by the same method as used in FIG. 29. As the temperature rises, spontaneous magnetization first decreases as a differentiable continuous function, and thereafter, spontaneous magnetization disappears with a differentiable drop. It suggests that this magnetic transition is primary phase transition.

Let a physical interpretation be given. A multiply-twisted helix may be considered to be made of spirals as one-dimensional elements. Its diameter is written as R. Of course, R is a quantity of the same degree as the turn pitch N. If the correlation length of a spin system is smaller than R, the system is considered to be behaving one-dimensionally. Since no order parameter is established under one dimension, the system is always a disorderly system at finite temperatures. However, when the spin correlation length exceeds R, spin correlation occurs between spiral structures as elements, and the system comes to behave as anal substance, exhibiting a three-dimensional order. That is, it can be appreciated that primary phase transition from the one-dimensional disorderly phase to the three-dimensional orderly phase.

Referring to FIG. 30, there are fluctuations in temperature for phase transition to occur, and the values do not appear to flatly decrease with N; however, this is also a feature of primary phase transition.

Next explained is a multiply-twisted helix according to the fifth embodiment of the invention. In the fifth embodiment, quantum level statistics will be analyzed concerning quantum states in multiply-twisted helixes to which random potentials are introduced, thereby to demonstrate that quantum chaos can be controlled.

Explained is an electron system on a multiply-twisted spiral in a multiply-twisted helix according to the fifth embodiment.

Assuming a one-dimensional lattice, numbers are assigned as n= ..., -1, 0, 1, .... Let the operator for generating a quantum at the p-th lattice point be $\hat{C}_p^\dagger$. Of course, let this operator satisfy the anticommutation relation $$\{\hat{C}_p, \hat{C}_q^\dagger\} = \delta_{p,q} \tag{84}$$

This quantum is a fermion having no free spin freedom. This corresponds to analysis of an electron in a solid is which spin orbit interaction can be disregarded.

Here is defined the Hamiltonian $\hat{H}$ of the electron system as follows.

$$\hat{H} = -\sum_{i,j} \lambda_{i,j} \hat{c}_i^\dagger \hat{c}_j + \sum_j v_j \hat{c}_j^\dagger \hat{c}_j \tag{85}$$

Letting electrons be movable only among neighboring sites, as $\lambda_{p,q}$, $$\lambda_{p,q} = \lambda_{q,p} = \begin{cases} 1 & \text{when } |p-q|=1 \\ s & \text{when } |p-q|=N \\ s^2 & \text{when } \mod(p,N)=0 \text{ and } q=p+N^2+f(N) \\ s^3 & \text{when } \mod(p,N^2)=1 \text{ and } q=p+N^3+f(N^2) \\ s^4 & \text{when } \mod(p,N^3)=2 \text{ and } q=p+N^4+f(N^3) \\ \vdots \\ 0 & \text{otherwise} \end{cases} \tag{86}$$

is employed. Note that mod(a, b) is the remainder as a result of division of a by b. What is analyzed here is a model using $$f(x) = -\text{int}\left(\frac{x}{2}\right) \tag{87}$$

where int(x) is the maximum integer that does not exceed x. The total number of sites is M, and a periodical boundary condition is introduced beforehand to p=1, 2, ..., M. The second term of the Hamiltonian is the term of the random potential. For each site, the random variable $$-\frac{v}{2} < v_j < \frac{v}{2} \tag{88}$$

is generated to form the Hamiltonian. The variable breadth v of the random potential is useful as a parameter determining the degree of the randomness.

Here, N, which determines the turn pitch of multiply-twisted spirals, s, which determines the inter-layer bonding force, and v, which determines the intensity of the random potential, are varied as parameters.

When eigen energy of the Hamiltonian $\hat{H}$ is $\epsilon_m$, and the eigen vector is |m>, then $$\hat{H}|m\rangle = \epsilon_m |m\rangle \tag{89}$$

where m=1, 2, ..., M.

First, M quantum levels $\epsilon_m$ are standardized such that their nearest-neighbor level spacing becomes 1 in average. The density of states of the system is defined by $$P(\varepsilon) = \frac{1}{M} \sum_{m=1}^{M} \delta(\varepsilon - \varepsilon_m) \tag{90}$$

and its staircase function $$\lambda(\epsilon) = \int_{-\infty}^{\epsilon} d\eta \rho(\eta) \tag{91}$$

is calculated. The staircase function obtained is converted by using a procedure called unfolding such that the density of states becomes constant in average. Using the quantum level obtained in this manner, the nearest-neighbor level spacing distribution P(s) and the $\Delta_3$ statistics of Dyson and Mehta are calculated as quantum level statistics. As taught in a literature ((32) L. E. Reichl The transition to chaos: in conservative classical systems: quantum manifestations (Springer, N.Y., 1992; (33) F. Haake, Quantum Signatures of chaos, (Springer-Verlag, 1991)), by using these statistics, it can be detected whether quantum chaos has been generated or not. It is also known that a quantum chaotic system is sensitive to perturbation from outside similarly to the classical chaotic system, and analysis of quantum chaos is important as a polestar of designs of non-linear materials.

In case of an integrable system, nearest-neighbor level spacing distribution P(s) and $\Delta_3$ statistics are those of Poisson Distribution $$P_P(s) = e^{-s} \tag{92}$$

$$\Delta_3(n) = \frac{n}{15} \tag{93}$$

In case the system currently reviewed exhibits quantum chaos, it becomes GOE (Gaussian orthogonal ensemble) distribution $$P_{GOE}(s) = \frac{\pi s}{2} e^{-\frac{\pi s^2}{4}} \tag{94}$$

$$\Delta_3(n) = \frac{1}{\pi^2}\left[\log(2\pi n) + \gamma - \frac{\pi^2}{8} - \frac{5}{4}\right] + O(n^{-1}) \tag{95}$$

where $\gamma$ is the Euler's constant.

Since the multiply-twisted helix analyzed here is made up of M=10001 sites, there are M=10001 eigen states in this quantum system. Among them, the following quantum level statistics values were calculated on the basis of energy eigen values concerning 2001 states from the 4001st to the 6001st states from the ground state.

Figure 31:
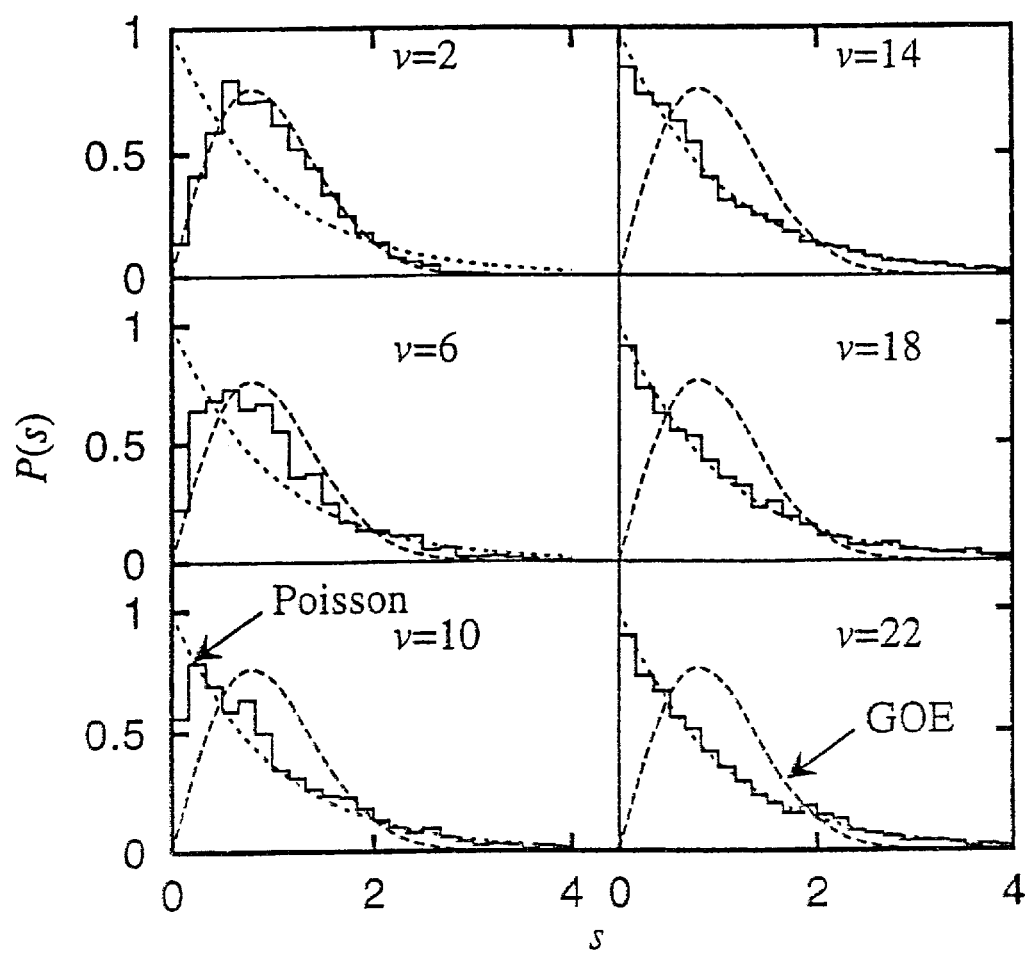
FIG. 31 is a rough diagram that shows quantum level statistics upon changes of v in case of N=10 and s=1 in the fifth embodiment of the invention.
Figure 32:
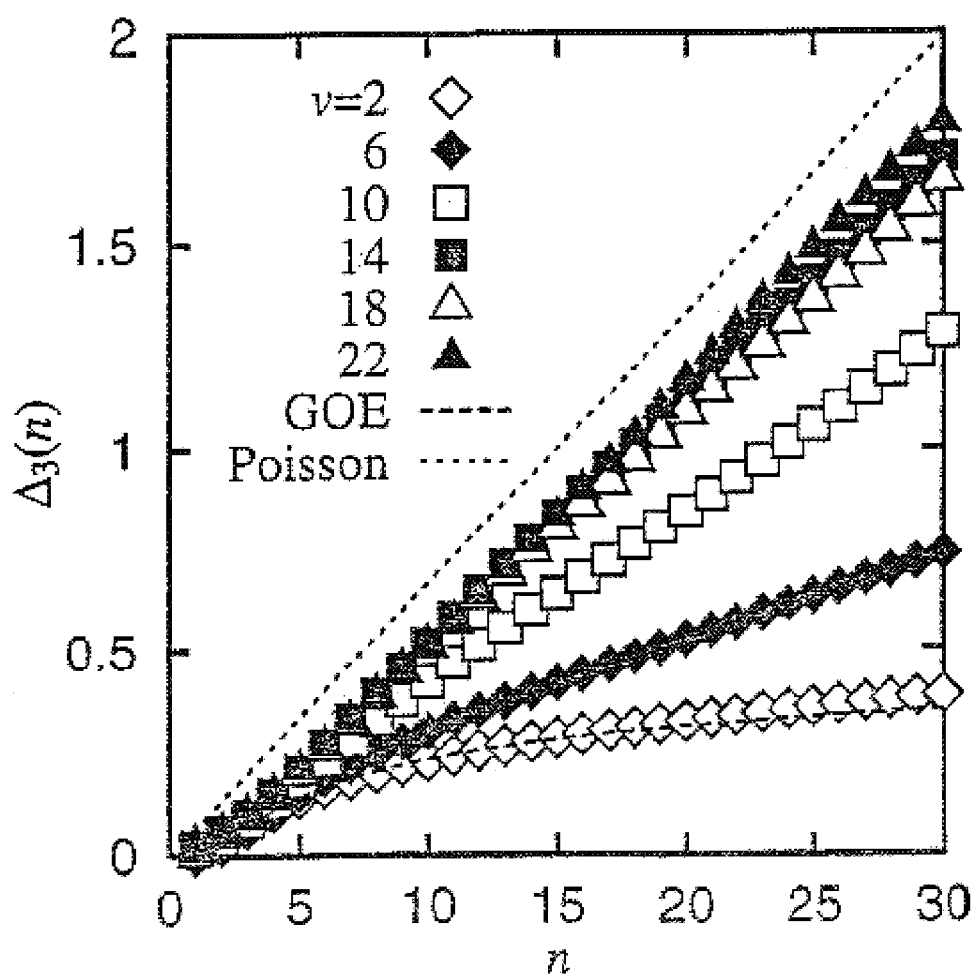
FIG. 32 is a rough diagram that shows quantum level statistics upon changes of v in case of N=10 and s=1 in the fifth embodiment of the invention.

FIG. 31 and FIG. 32 show quantum level statistics of multiply-twisted helixes of N=10 while fixing the inter-layer bonding to s=1 and changing the ram potential intensity v. FIG. 31 shows P(s) whilst FIG. 32 show $\Delta_3$ statistics values. When v is small, the system is in a metallic state, and the quantum level statistics is that of a quantum chaotic system of GOE. As v increases, the quantum level statistics changes toward the Poisson distribution. This is typical Anderson transition ((34) Phys. Rev. 109, 1492 (1958); (35) Phys. Rev. Lett. 42, 783(1979); (36) Rev. Mod. Phys. 57. 287(1985)).

Figure 33:
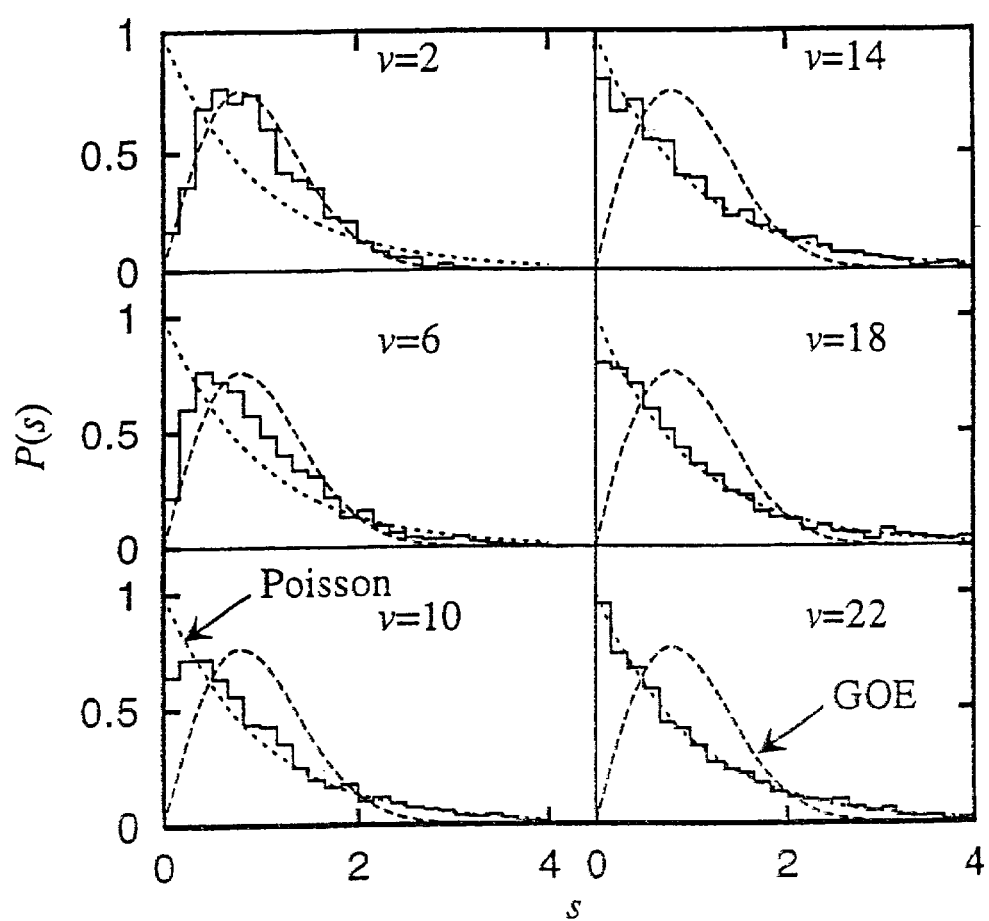
FIG. 33 is a rough diagram that shows quantum level statistics upon changes of v in case of N=10 and s=1 in the fifth embodiment of the invention.
Figure 34:
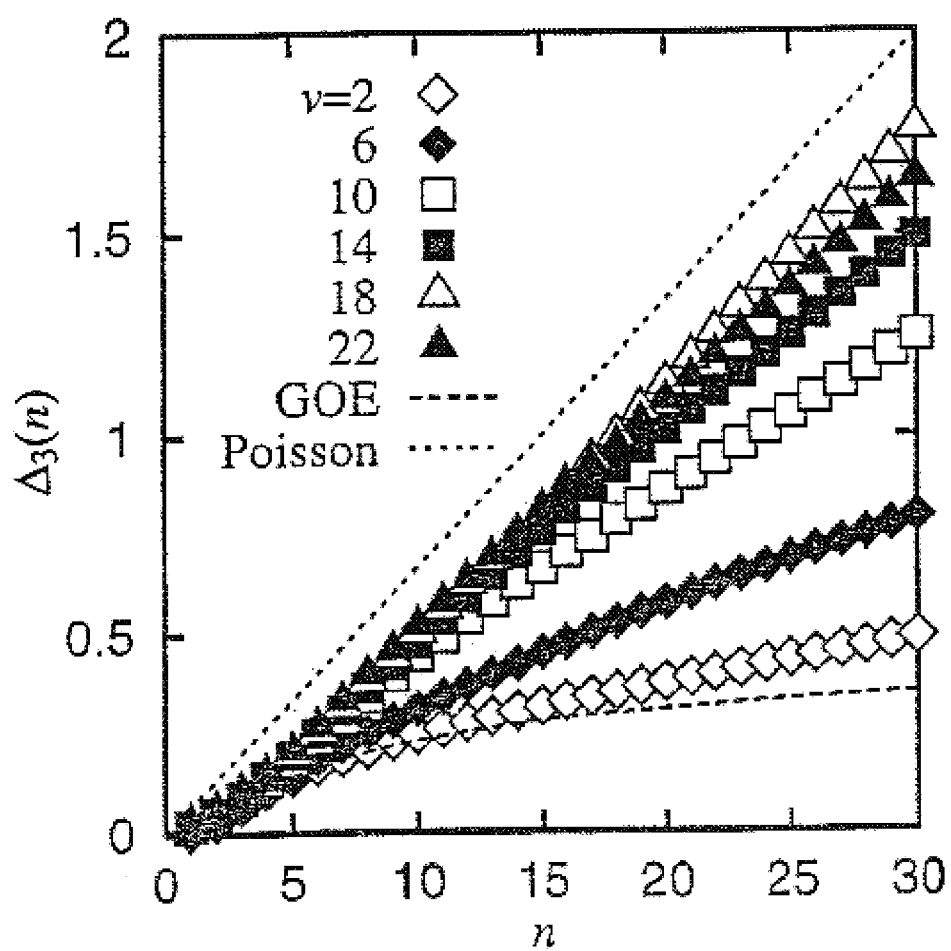
FIG. 34 is a rough diagram that shows quantum level statistics upon changes of v in case of N=10 and s=1 in the fifth embodiment of the invention.

FIG. 33 and FIG. 34 show quantum level statistics of multiply-twisted helixes of N=4 while fixing the inter-layer bonding to s=1. It is recognized that, along with changes from v=2 to v=22, the system changes from an approximately quantum chaotic system to an approximately integrable system. What should be noted is the difference the quantum level statistics values of v=2 in FIGS. 33 and 34 (N=4) and the quantum level statistics values of v=2 in FIGS. 31 and 32 (N=10).

Figure 35:
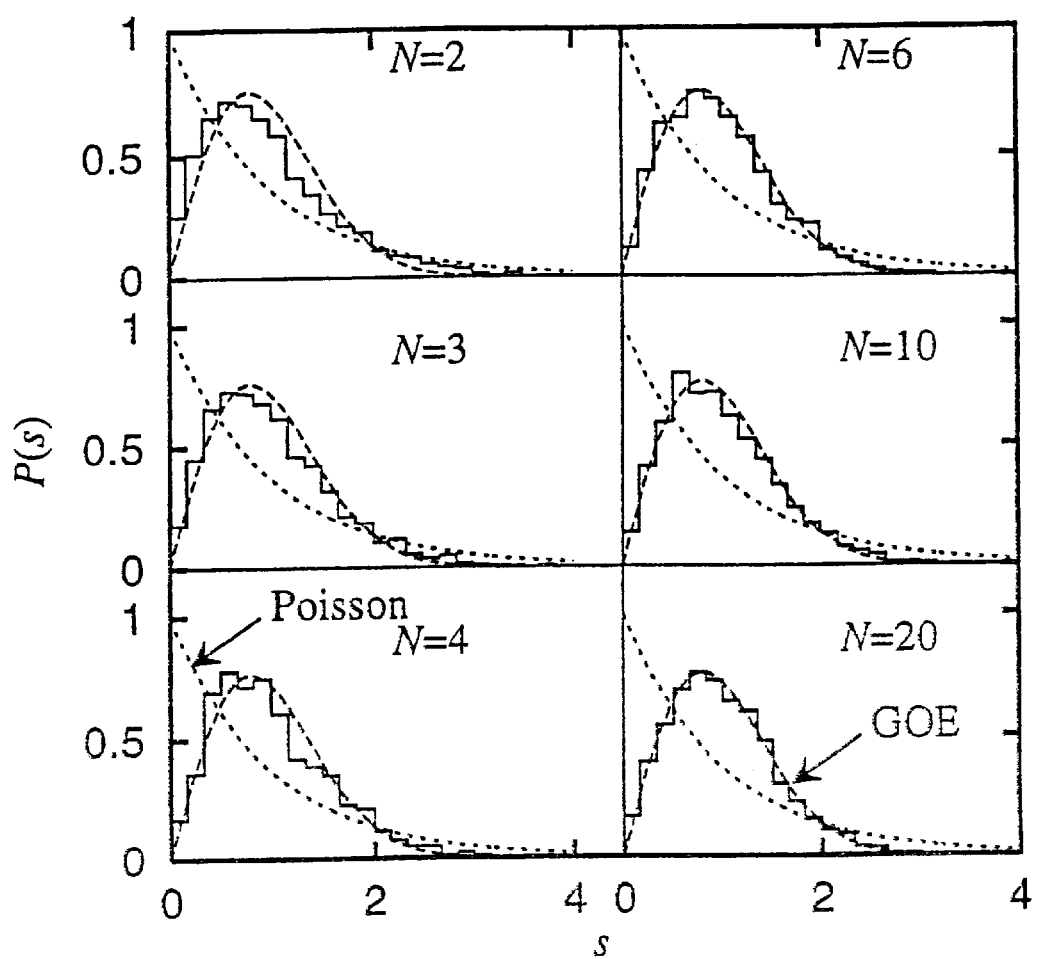
FIG. 35 is a rough diagram that shows quantum level statistics upon changes of v in case of N=10 and s=1 in the fifth embodiment of the invention.
Figure 36:
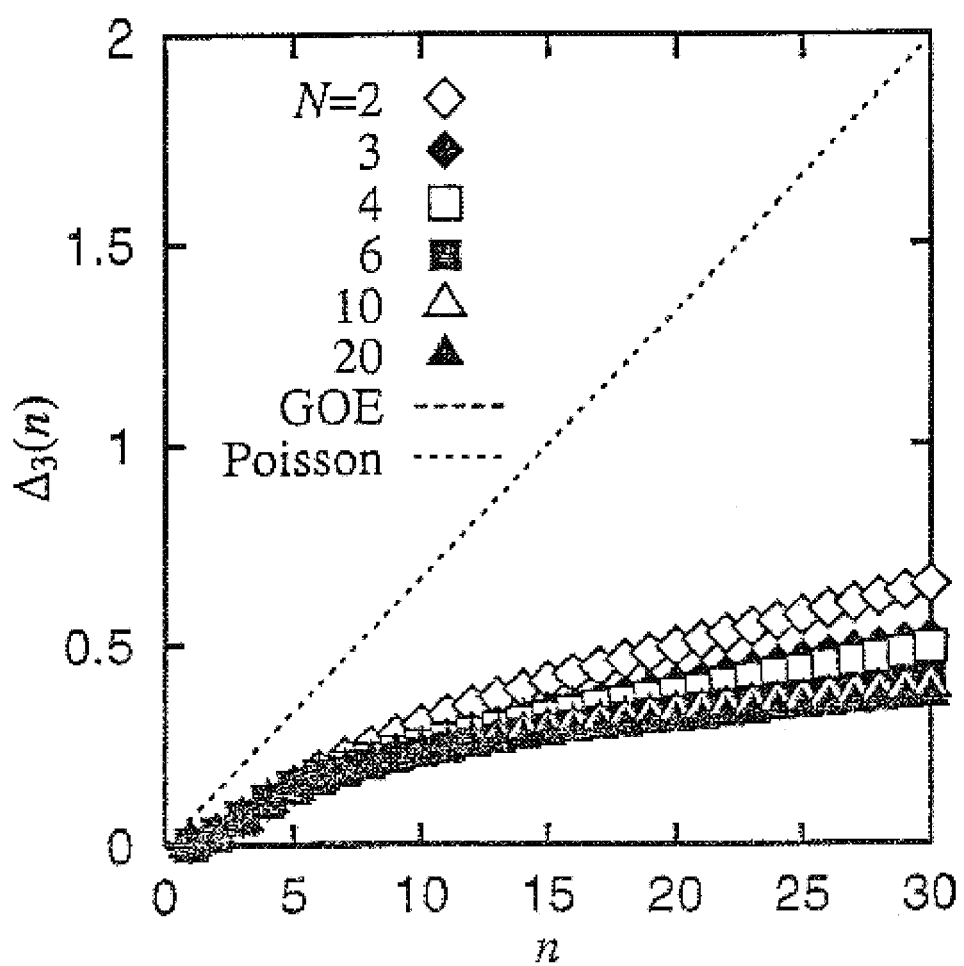
FIG. 36 is a rough diagram that shows quantum level statistics upon changes of v in case of N=10 and s=1 in the fifth embodiment of the invention.

FIGS. 35 and 36 shows quantum level statistics values obtained when fixing v=2 and s=1 and changing N. For example, reviewing $\Delta_3(n)$ in detail, it is recognized that the quantum level statistics value of v=2 in the multiply-twisted helix of N=4 is larger than that in case of N=10. Apparently, as N decreases, quantum exhibits a tendency of localization.

Figure 37:
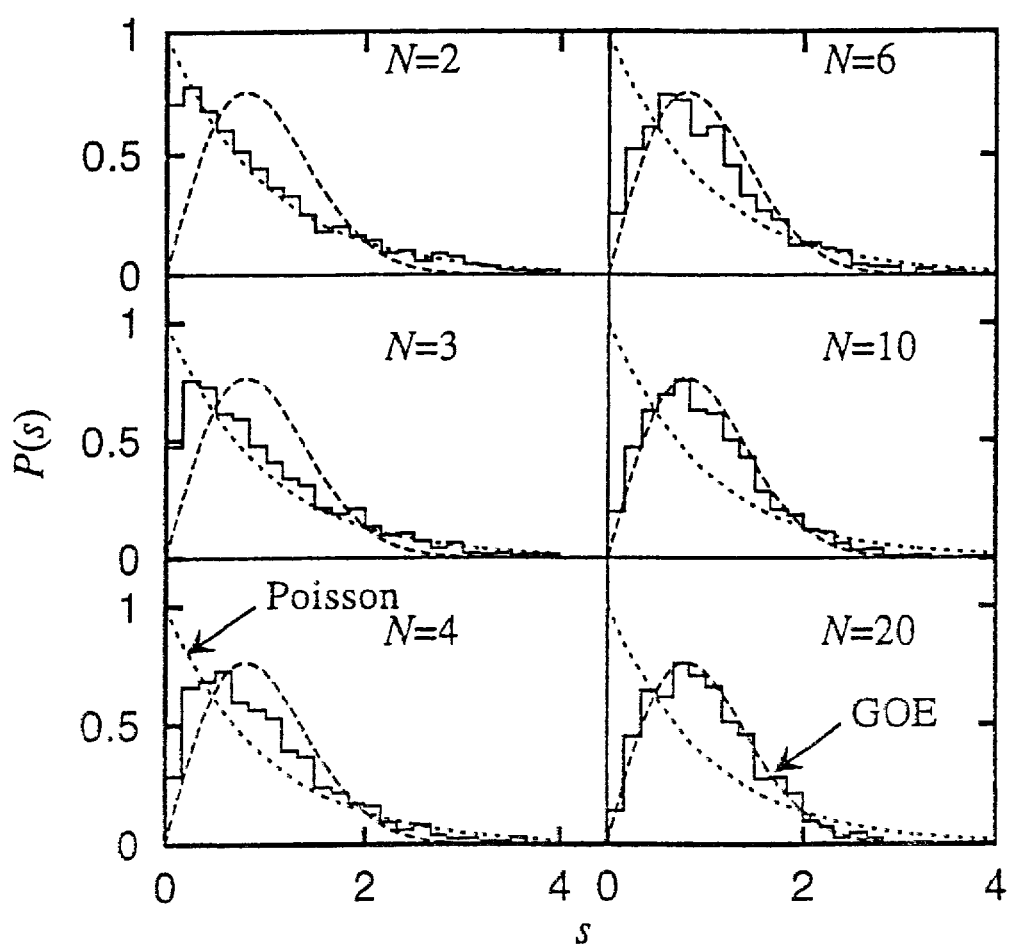
FIG. 37 is a rough diagram that shows quantum level statistics upon changes of v in case of N=10 and s=1 in the fifth embodiment of the invention.
Figure 38:
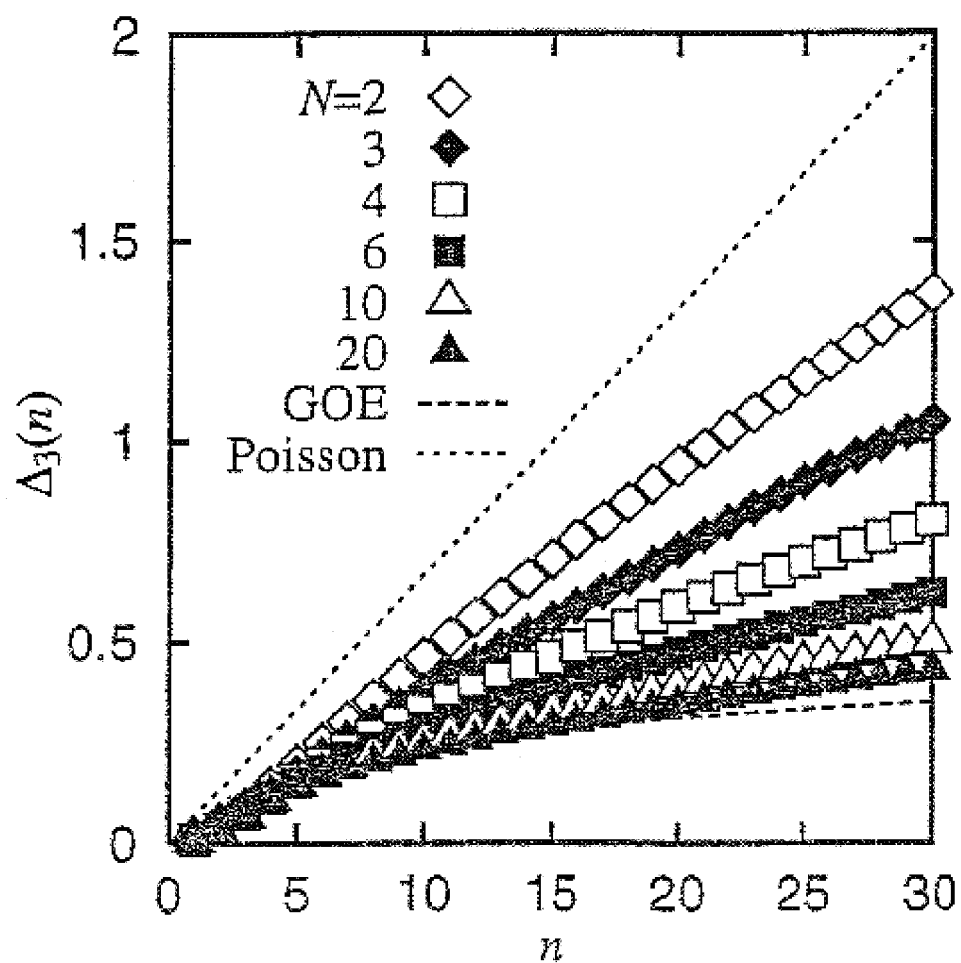
FIG. 38 is a rough diagram that shows quantum level statistics upon changes of v in case of N=10 and s=1 in the fifth embodiment of the invention.
Figure 39:
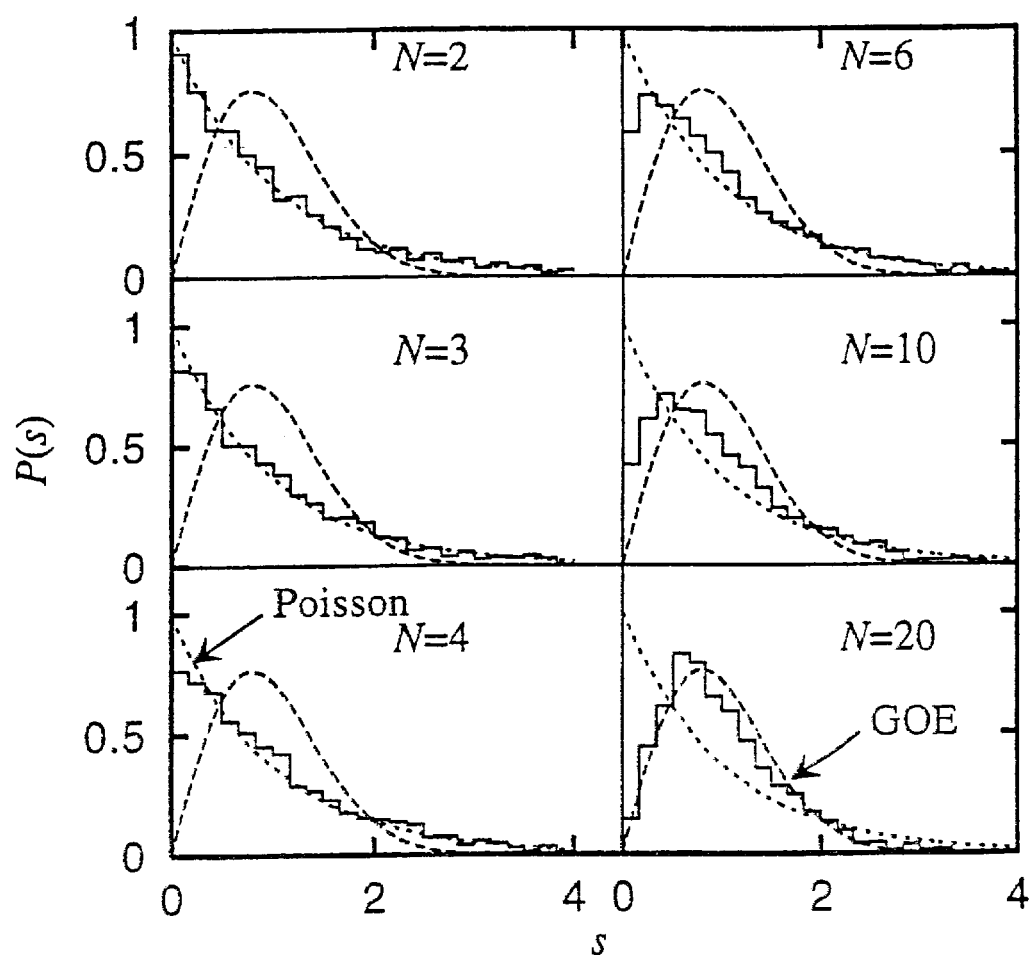
FIG. 39 is a rough diagram that shows quantum level statistics upon changes of v in case of N=10 and s=1 in the fifth embodiment of the invention.
Figure 40:
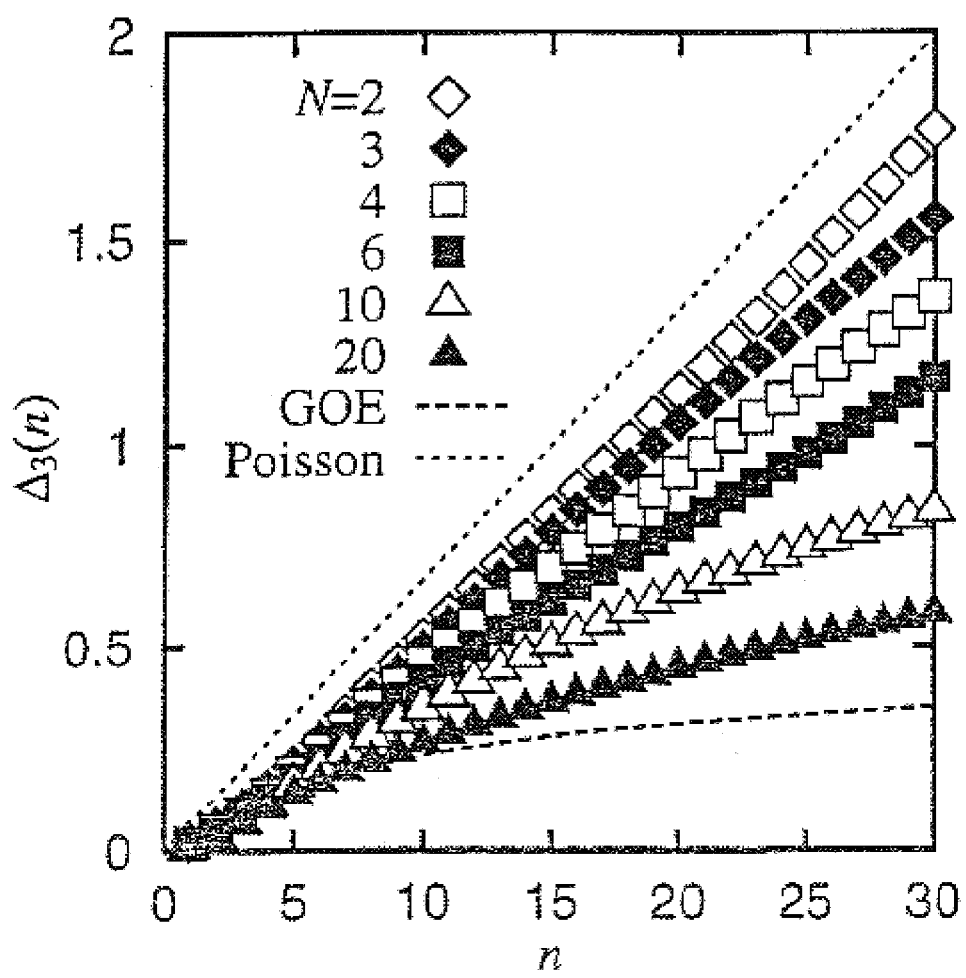
FIG. 40 is a rough diagram that shows quantum level statistics upon changes of v in case of N=10 and s=1 in the fifth embodiment of the invention.

In case of s=1 in FIGS. 35 and 36, the change of the quantum statistics value by the change of N was small. This means that the system lacks modulability from the viewpoint of the purpose of controlling the quantum chaos. Let it tried to change s to improve that point. FIG. 37 and FIG. 38 show quantum level statistics values obtained when fixing v=2 and s=0.8 and changing N. FIG. 39 and FIG. 40 show quantum level statistics values obtained when fixing v=2 and s=0.6 and changing N. Similarly to the cases of s=1, quantum exhibits the tendency of localization as N decreases; however, the breadth of the change is larger than that in case of s=1. It has been confirmed that various quantum systems can be obtained from substantial Poisson distribution to substantial GOE distribution.

Next explained is a multiply-twisted helix according to the sixth embodiment of the invention. In the sixth embodiment, it is demonstrated that ferromagnetic transition in a multiply-twisted helix can be controlled not only by the number of turns but also by randomness of inter-layer bonding.

Explanation is made about a spin system on a multiply-twisted spiral in the multiply-twisted helix according to the sixth embodiment.

Assuming a one-dimensional lattice, numbers are assigned as p= ..., −1, 0, 1, .... Hamiltonian H of this spin system is defined as follows.

$$H = -\sum_{p,q} J_{p,q} S_p \cdot S_q \tag{96}$$

Here is employed a three-dimensional vector having values at vertices of a regular octahedron. That is, $S_p$=(1, 0, 0), (−1, 0, 0), (0, 1, 0), (0, −1, 0), (0, 0, 1), (0, 0, −1) are allowable as the spin value.

As $J_{p,q}$ $$J_{p,q} = J_{q,p} = \begin{cases} 1 & \text{when } |p-q|=1 \\ s & \text{when } |p-q|=N \\ s^2 & \text{when } \text{mod}(p, N) = 0 \text{ and } q = p+N^2+f(N) \\ s^3 & \text{when } \text{mod}(p, N^2) = 1 \text{ and } q = p+N^3+f(N^2) \\ s^4 & \text{when } \text{mod}(p, N^3) = 2 \text{ and } q = p+N^4+f(N^3) \\ \vdots \\ 0 & \text{otherwise} \end{cases} \tag{97}$$

is employed. Note that mod(a, b) is the remainder as a result of division of a by b. Positional relation between spins is determined by $J_{p,q}$, and the multiply-twisted helix is defined thereby. What is analyzed here is a model in which randomness is defined in f(x) as defined as follows.

$$f(x) = \text{sign}(rx) \text{int}(|rx|) \tag{98}$$

Here is used $$\text{sign}(x) = \begin{cases} 1 & \text{when } x \geq 0 \\ -1 & \text{when } x < 0 \end{cases} \tag{99}$$

The term int(x) is the largest integer that does not exceed x. r is the random variable that satisfies $$-1 < r < 1 \tag{100}$$

and let the probability that the value of r appears be given by $$P_R(r) = \frac{R}{2} |r|^{R-1} \tag{101}$$

R is the parameter that characterizes the probability distribution. Although the average value of the distribution is always <r>=0, self multiplication of dispersion is given by $$\langle r^2 \rangle = \int_{-1}^{1} dr\, r^2 P_R(r) = \frac{1}{1-2/R} \tag{102}$$

and dispersion increases as R increases. Under R=0, randomness disappears. On the other hand, in case of R=1, the distribution becomes most even, and the randomness is largest in the model. The random variable is generated for each inter-layer bond, and randomness is introduced to bonding positions, thereby to produce the multiply-twisted helix to be analyzed.

For the purpose of calculating physical values at finite temperatures using statistical mechanics, a distribution function $$Z = \sum_{\{S_p\}} e^{-\beta H} \tag{103}$$

is introduced, where T is the temperature, and $\beta=1/T$ and $k_B=1$ are used. Expected value concerning an arbitrary function $f(S_j)$ of the spin variable is calculated by $$\langle f(S_j) \rangle = \frac{1}{Z} \sum_{\{S_p\}} f(S_j) e^{-\beta H} \tag{104}$$

When n is the total number of sites, expected value of spontaneous magnetization is $$M = \frac{1}{n}\sum_{j=0}^{n}\langle S_i \rangle \quad (105)$$

Hereunder, n=10001 is used.

Figure 41:
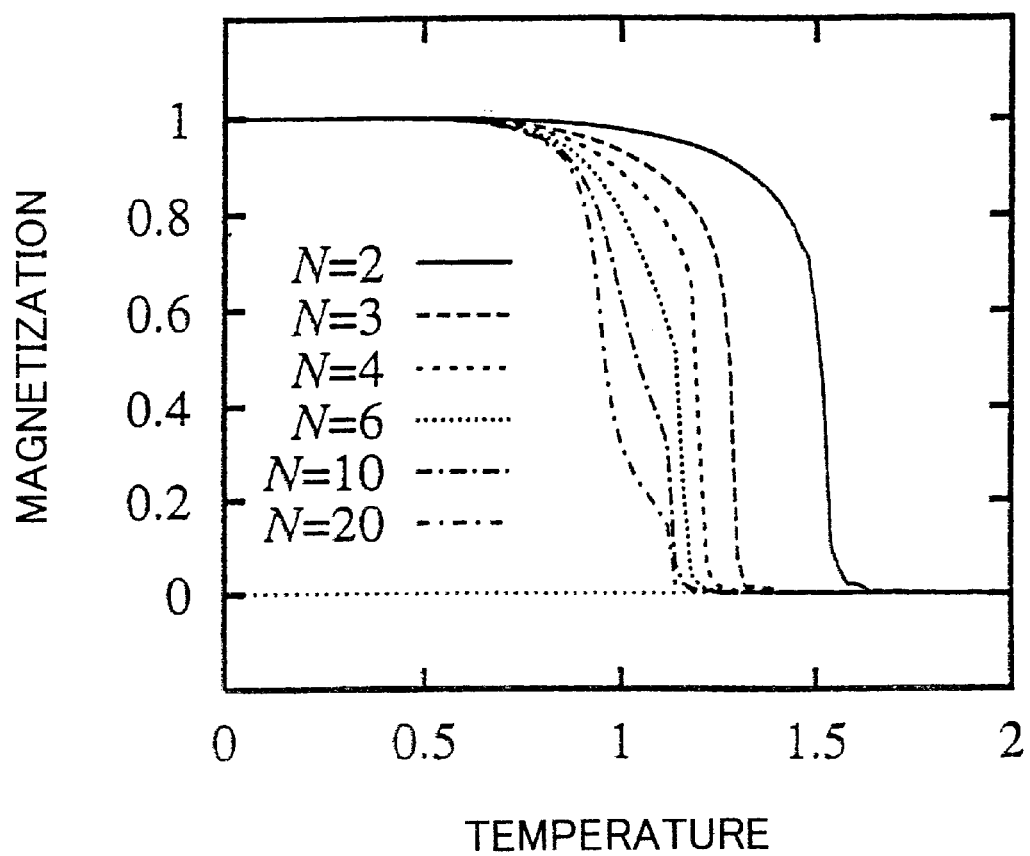
FIG. 41 is a rough diagram that shows spontaneous magnetization obtained by numerical calculation in case of N=2, 3, 4, 6, 10, 20 in the sixth embodiment of the invention.

Spontaneous magnetization is calculated by using the Metropolis method that is one of the Monte Carlo methods. 100000 was used as the Monte Carlo steps. First, FIG. 41 shows spontaneous magnetization under no randomness of R=0. Here are shown the cases setting the turn pitch as N=2, 3, 4, 6, 10, 20 as the turn pitch. The multiply-twisted helix of N=2 exhibits a critical temperature substantially equivalent to that of a three-dimensional system, but as N increases, the critical temperature for spontaneous magnetization to disappear gradually decreases. This result qualitatively coincides with spontaneous magnetization in the Ising model in the fourth embodiment in which only 1 or −1 is available as the spin.

Figure 42:
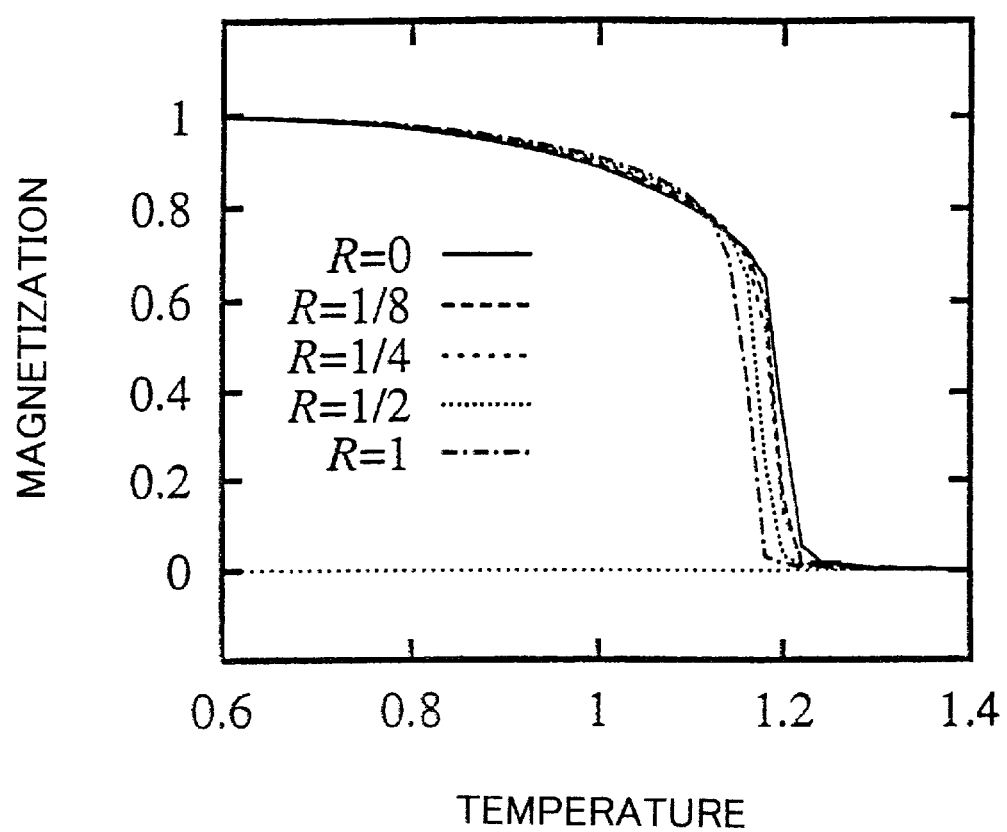
FIG. 42 is a rough diagram that shows spontaneous magnetization obtained by numerical calculation when R is changed in case of N=4 in the sixth embodiment of the invention.
Figure 43:
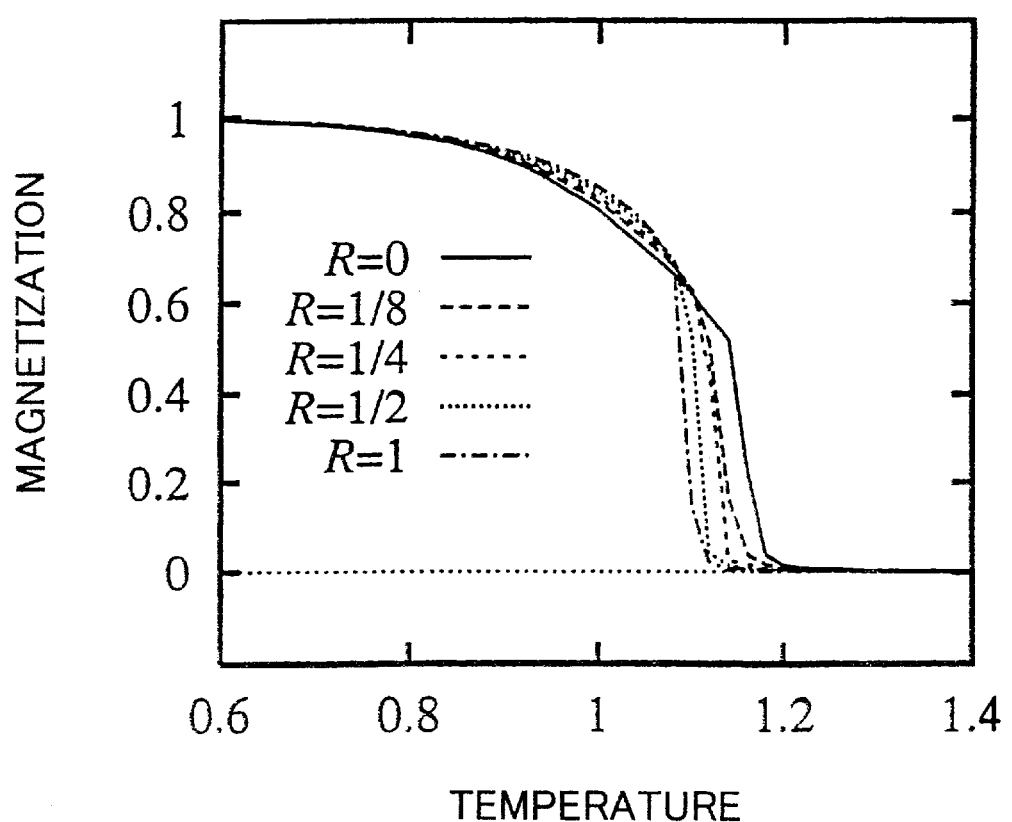
FIG. 43 is a rough diagram that shows spontaneous magnetization obtained by numerical calculation when R is changed in case of N=6 in the sixth embodiment of the invention.
Figure 44:
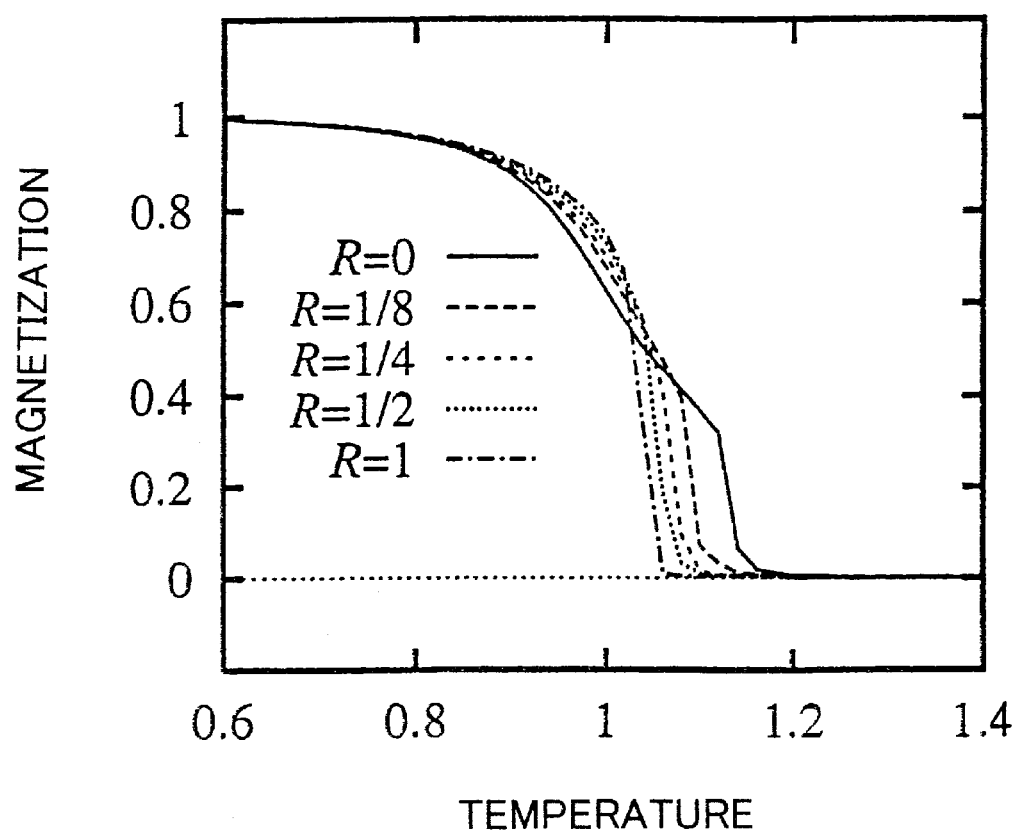
FIG. 44 is a rough diagram that shows spontaneous magnetization obtained by numerical calculation when R is changed in case of N=10 in the sixth embodiment of the invention.
Figure 45:
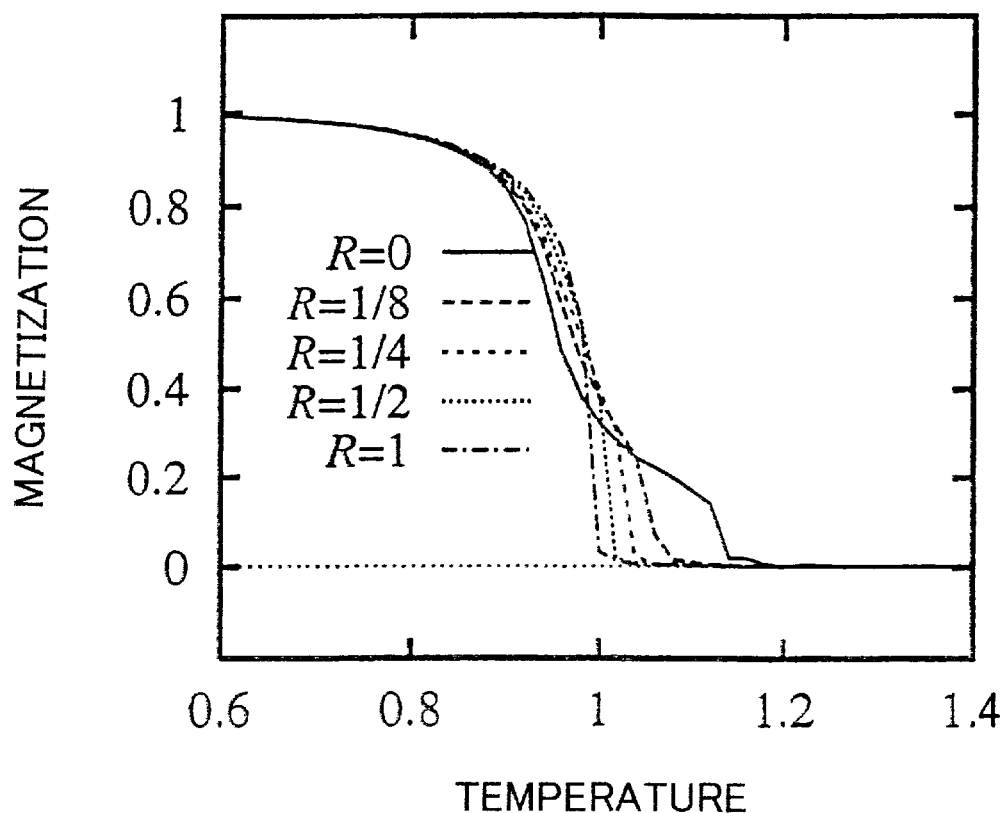
FIG. 45 is a rough diagram that shows spontaneous magnetization obtained by numerical calculation when R is changed in case of N=20 in the sixth embodiment of the invention.

Here is made a review about the effect of randomness. Spontaneous magnetization in cases using R=⅛, ¼, ½ and 1 as the value of R is shown below. FIG. 42 shows one under N=4, FIG. 43 shows one under N=6, FIG. 44 shows one under N=10, and FIG. 45 shows one under N=20. With each value of N, critical temperature changes as R increases. One of its reasons might be attenuation of the characterized nature of the magnetization curve due to introduction of randomness. When N was small, super-period originally unique to the multiply-twisted helix did not affect so much, for example, in FIG. 42 or FIG. 43, so the magnetization curve itself is not different so much from the case of a tetragonal lattice. In this case, although the critical temperature decreases because of introduction of R>0, the shape of the magnetization curve itself does not change substantially. On the other hand, when N is large, magnetization curves under R=0 in FIGS. 44 and 45, for example, were considerably different from that of a tetragonal lattice. In case of R>0, since the system progressively changes while losing its unique structure, the breadth of the decrease of the critical temperature by introduction of randomness is large. Through the analysis shown above, it has confirmed that critical temperature for ferromagnetic transition can be controlled by introduction of randomness by R>0.

Next explained is a multiply-twisted structure according to the seventh embodiment of the invention. In the seventh embodiment, a simple cellular automaton is assumed in the multiply-twisted structure, and simulations of its dynamics are performed to introduce inter-element spacing. Based on the spacing, inter-element bonding property is investigated to show that the bonding property can be modified.

Assuming a one-dimensional lattice made up of elements, numbers are assigned as p= . . . , −1, 0, 1, . . . A multiply-twisted structure is defined by the bonding among elements. For the purpose of defining nearest-neighbor elements, $$J_{p,q} = J_{q,p} = \begin{cases} 1 & \text{when } |p-q| = 1 \\ s & \text{when } |p-q| = N \\ s^2 & \text{when } \mod(p, N) = 0 \text{ and } q = p + N^2 + f(N) \\ s^3 & \text{when } \mod(p, N^2) = 1 \text{ and } q = p + N^3 + f(N^2) \\ s^4 & \text{when } \mod(p, N^3) = 2 \text{ and } q = p + N^4 + f(N^3) \\ \vdots \\ 0 & \text{otherwise} \end{cases} \quad (106)$$

is introduced, and s=1 is used hereunder. Assume that the p-th element and the g-th element are the nearest-neighbor elements with each other when $J_{p,q}$=1. The following function is employed as f(x).

$$f(x) = \text{sign}(rx)int(|rx|) - int(\alpha x) \quad (107)$$

Here was used $$\text{sign}(x) = \begin{cases} 1 & \text{when } x \geq 0 \\ -1 & \text{when } x > 0 \end{cases} \quad (108)$$

The term int(x) is the largest integer that does not exceed x. r is the random variable that satisfies $$1 - <r<1 \quad (109)$$

and let the probability that the value of r appears be given by $$P_R(r) = \frac{R}{2}|r|^{R-1} \quad (110)$$

R is the parameter that characterizes the probability distribution. Although the average value of the distribution is always +r,=0, self multiplication of dispersion is given by $$\langle r^2 \rangle = \int_{-1}^{1} dr\, r^2 P_R(r) = \frac{1}{1 + 2/R} \quad (111)$$

and dispersion increases as R increases. Under R=0, randomness disappears. On the other hand, in case of R=1, the distribution becomes most even, and the randomness is largest in the model. The random variable is generated for each inter-layer bond, and randomness is introduced to bonding positions, thereby to produce the multiply-twisted structure to be analyzed. α>0 causes parallel movement of the distribution. In the multiply-twisted structure, there are parameters of the turn pitch N. inter-layer bonds distribution width R, inter-layer bonds distribution position α.

Analysis made below is to introduce a certain sense of spacing between sites that are not nearest-neighbor sites and to measure the inter-site bonding property on the basis of the number sites existing at the distance from a certain site. For this purpose, a simple cellular automaton (CA) is introduced. A variable of $\sigma_n$=1 or 0 is introduced to the n-th site. Let this variable vary with time t=0, 1, . . . , and let it written as $\sigma_n(t)$.

As the initial condition $$\sigma_n(0) = \begin{cases} 1 & \text{when } n = p \\ 0 & \text{when } n \neq p \end{cases} \quad (112)$$

is used. As the CA dynamics $$\sigma_n(t+1) = \Theta\left(\sum_m J_{n,m}\sigma_m(t)\right) \tag{113}$$

is used, where $$\Theta(x) = \begin{cases} 1 & \text{when } x > 0 \\ 0 & \text{when } x \leq 0 \end{cases} \tag{114}$$

Through this time development, the time t when the q-th site first becomes $\sigma_q(t)=1$ is used to define the distance $\Delta_{p,q}$ between the p-th site and the q-th site.

Let a physical interpretation be given to the distance $\Delta_{p,q}$. There are a plurality of paths connecting the p-th site and the q-th site via the nearest-neighbor sites, and the shortest one is the above-mentioned distance. In a continuous three-dimensional space (x, y, z), it corresponds to a case where $|x|+|y|+|z|$ is employed as the distance from the origin. In CA mentioned above, propagation to the nearest-neighbor site occurs during the time width 1, and the time required for $\sigma_p(0)=1$ having localized in the p-th site to reach the q-th site was measured to be used as the distance. Of course, the distance introduced here satisfies the axioms $$\Delta_{p,q} \geq 0 \tag{115}$$

$$\Delta_{p,q} = \Delta_{q,p} \tag{116}$$

$$\Delta_{p,r} \leq \Delta_{p,q} + \Delta_{q,r}$$
$$\Delta_{p,q} = 0 \Rightarrow p=q \tag{117}$$

By execution of this CA simulation, arbitrary (p, q) distance can be determined.

The quantity remarked in this seventh embodiment is the total number $\omega(r; p_j)$ of the site q at the distance $\Delta_{pj, q}=r$ from an arbitrary $p_j$-th site. What is calculated below is the quantity $$\Omega(r) = \frac{1}{M_s}\sum_{j=1}^{M_s} \omega(r; p_j) \tag{118}$$

to be obtained by using a multiply-twisted structure made up of M=10001 sites and averaging $M_s$=1000 samples selected as $p_j$ sites from them. It will be readily understood that this quantity becomes $$\Omega(r) = \text{Const.} + 4r^2 \tag{119}$$

in case of a three-dimensional tetragonal lattice.

Figure 46:
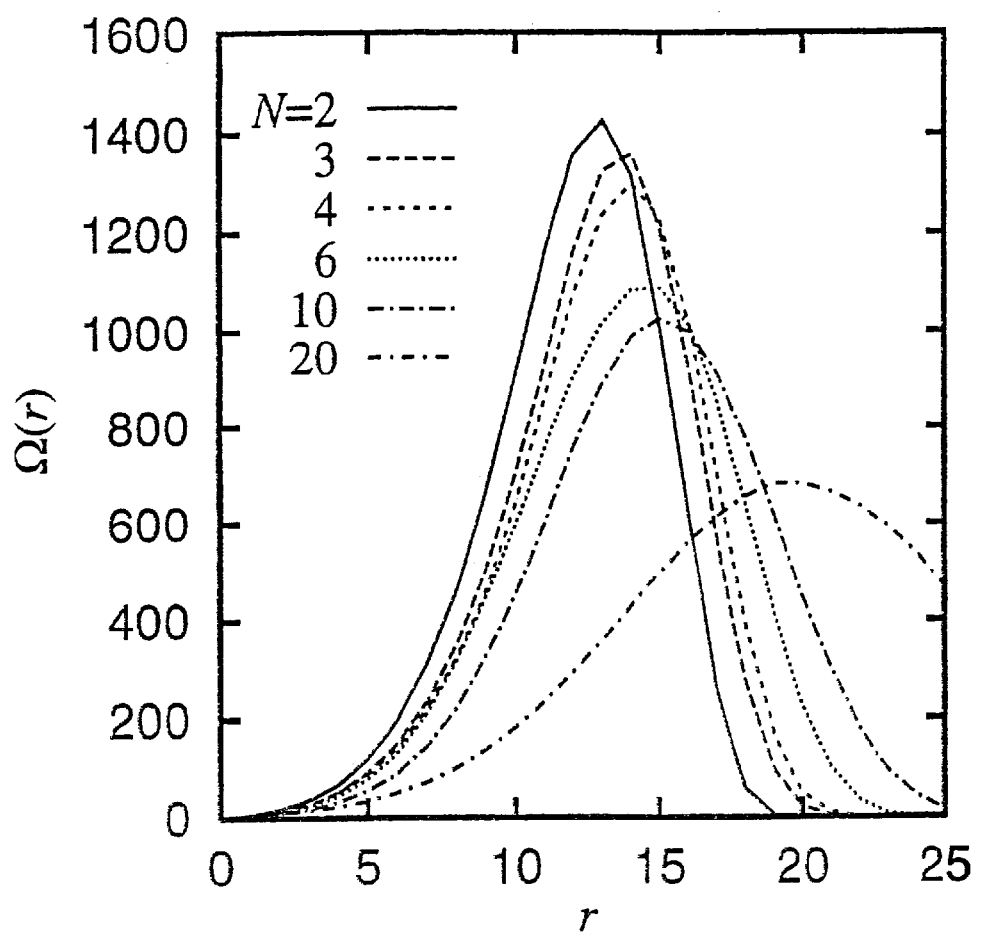
FIG. 46 is a rough diagram that shows changes of $\Omega(r)$ when N is changed in case of R=0 and $\alpha$=0 in the seventh embodiment of the invention.
Figure 47:
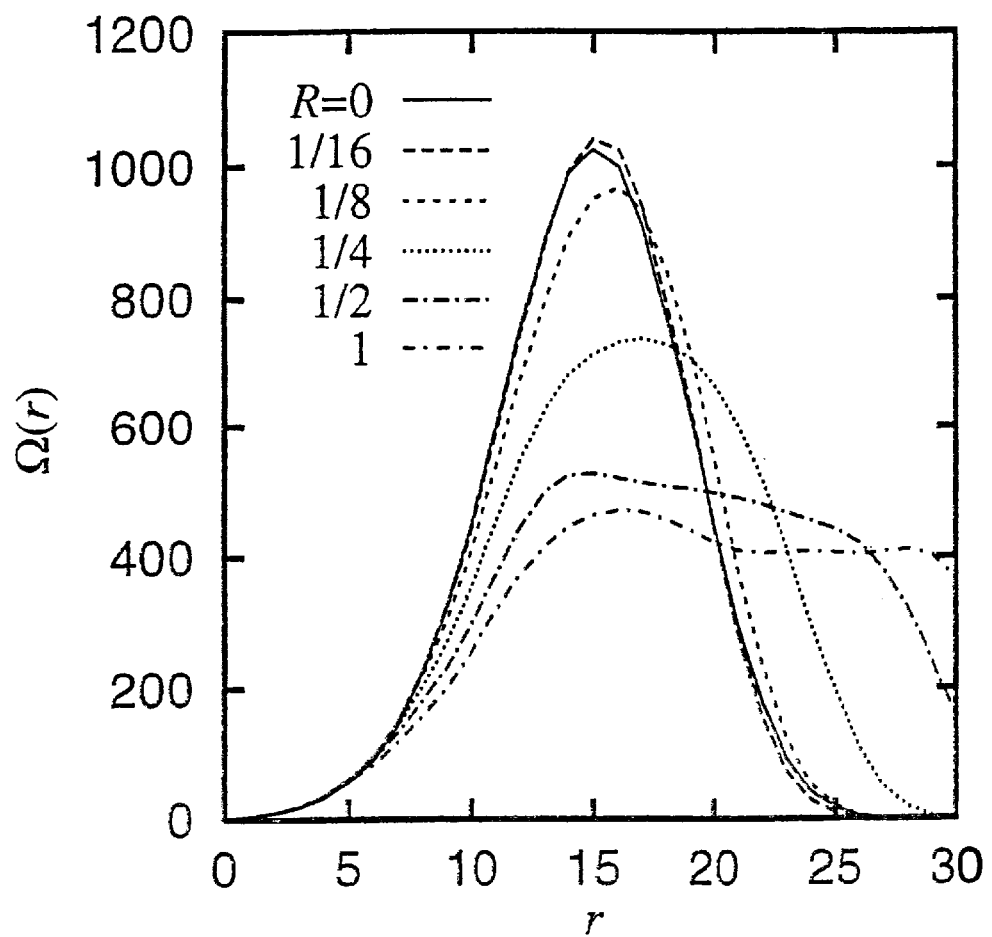
FIG. 47 is a rough diagram that shows changes of $\Omega(r)$ when R is changed in case of N=10 and $\alpha$=0 in the seventh embodiment of the invention.
Figure 48:
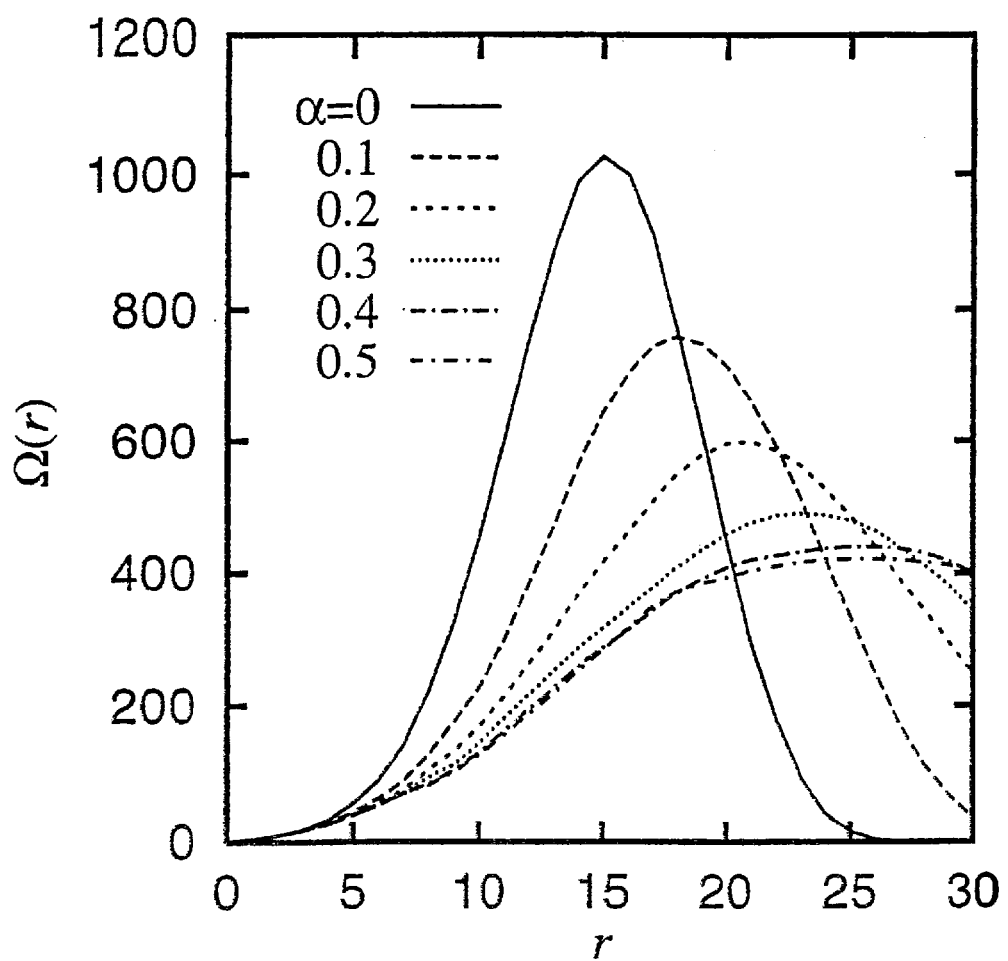
FIG. 48 is a rough diagram that shows changes of $\Omega(r)$ when $\alpha$ is changed in case of N=10 and R=0 in the seventh embodiment of the invention.

Let $\Omega(r)$ in the multiply-twisted structure be calculated. In FIG. 46, $\Omega(r)$ in case of R=0 and $\alpha$=0 was plotted for various N. This system is a multiply-twisted structure similar to that taken for analysis of Mott transition in the first embodiment. In FIG. 47, $\Omega(r)$ in case of N=10 and $\alpha$=0 was plotted for various R. This system is a multiply-twisted structure similar to that taken for analysis of Mott transition in the second embodiment. In FIG. 48, $\Omega(r)$ in case of N=19 and R=0 was plotted for various $\alpha$. This system is a multiply-twisted structure similar to that taken for analysis of Mott transition in the third embodiment. In these figures, $\Omega(r)$ in a region of the level of r<10 is described well by quadratic functions of r.

Hereunder, this is generally developed as $$\Omega(r) = C_0 + C_1 r^2 + C_2 r^4 \tag{120}$$

and discussed while using coefficients $C_1$ and $C_2$.

Figure 49:
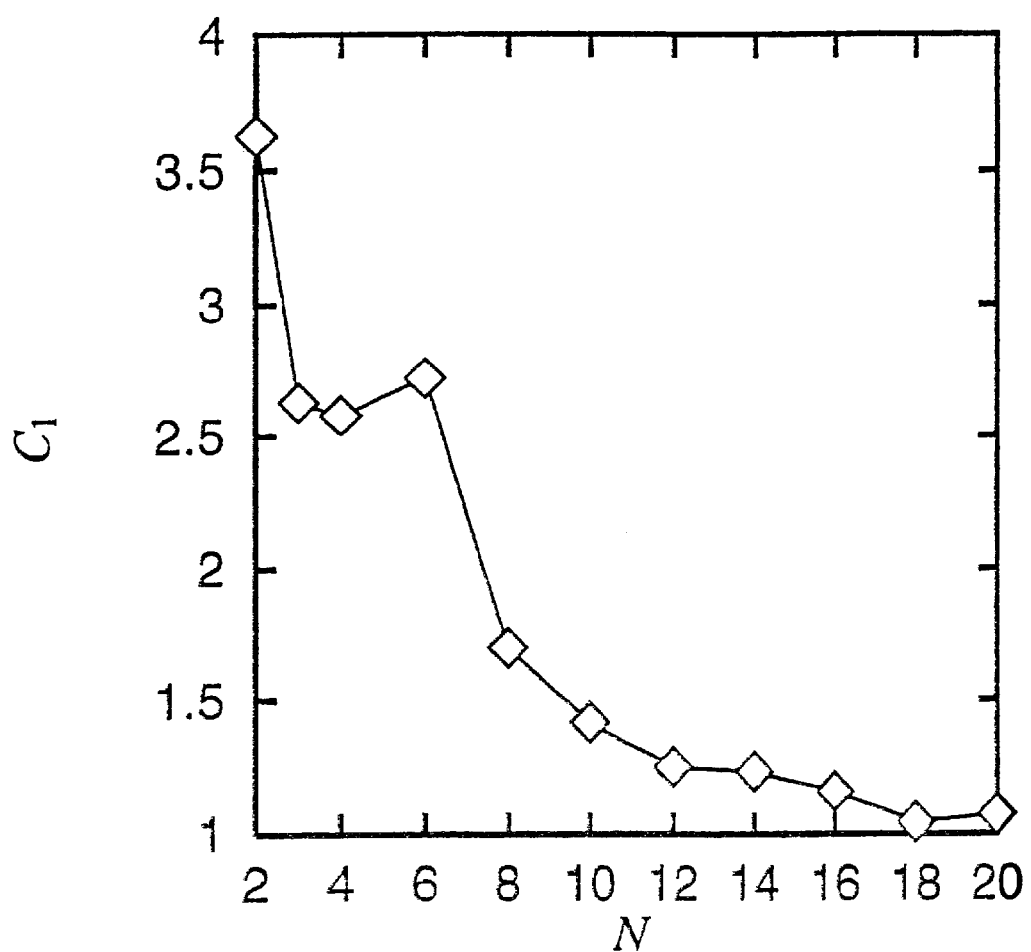
FIG. 49 is a rough diagram that shows a coefficient $C_1$ upon optimum approximation of $\Omega(r)$ by Equation 120 in case of R=0 and $\alpha$=0 in the seventh embodiment of the invention.
Figure 50:
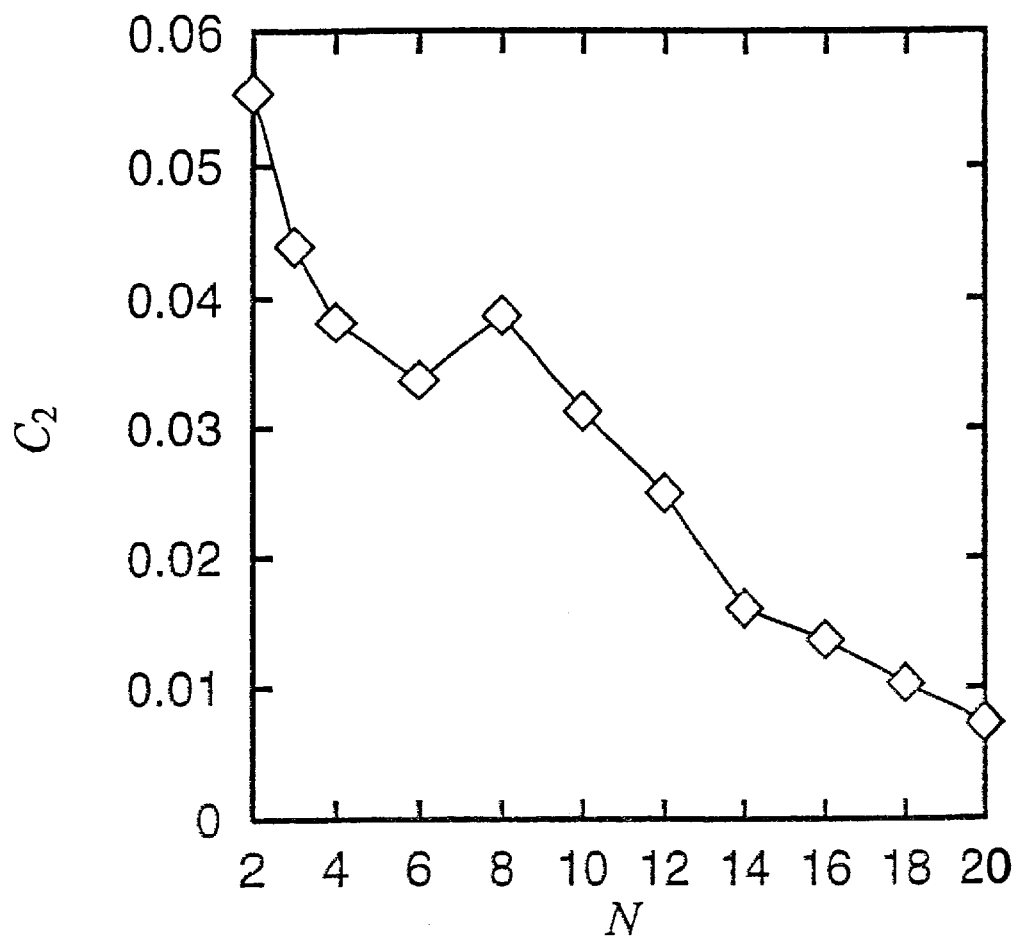
FIG. 50 is a rough diagram that shows a coefficient $C_2$ upon optimum approximation of $\Omega(r)$ by Equation 120 in case of R=0 and $\alpha$=0 in the seventh embodiment of the invention.
Figure 51:
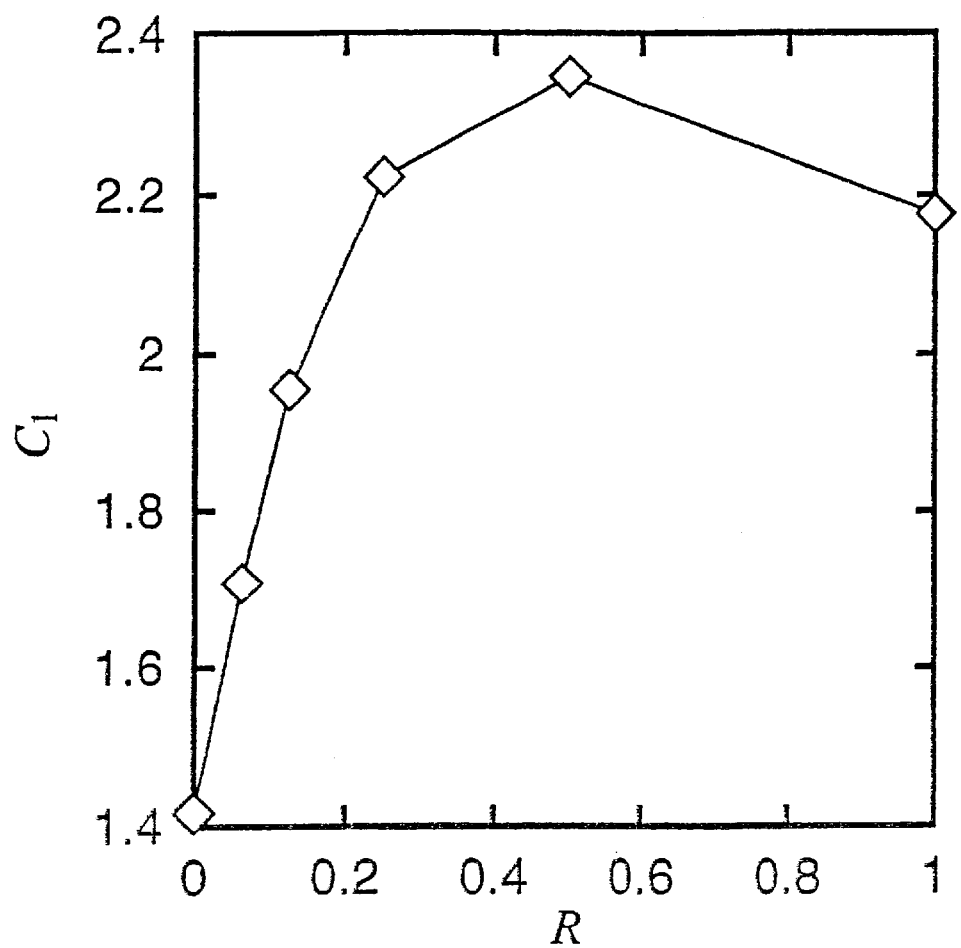
FIG. 51 is a rough diagram that shows a coefficient $C_1$ upon optimum approximation of $\Omega(r)$ by Equation 120 in case of N=10 and $\alpha$=0 in the seventh embodiment of the invention.
Figure 52:
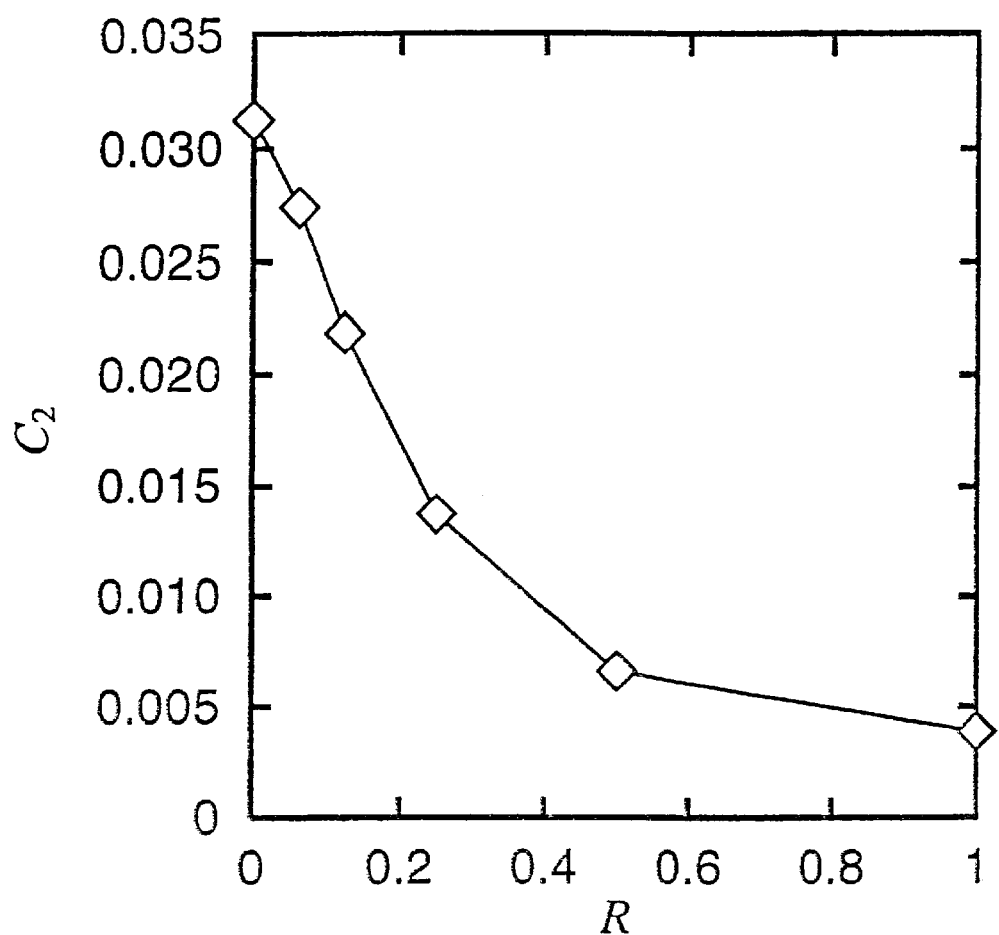
FIG. 52 is a rough diagram that shows a coefficient $C_2$ upon optimum approximation of $\Omega(r)$ by Equation 120 in case of N=10 and $\alpha$=0 in the seventh embodiment of the invention.
Figure 53:
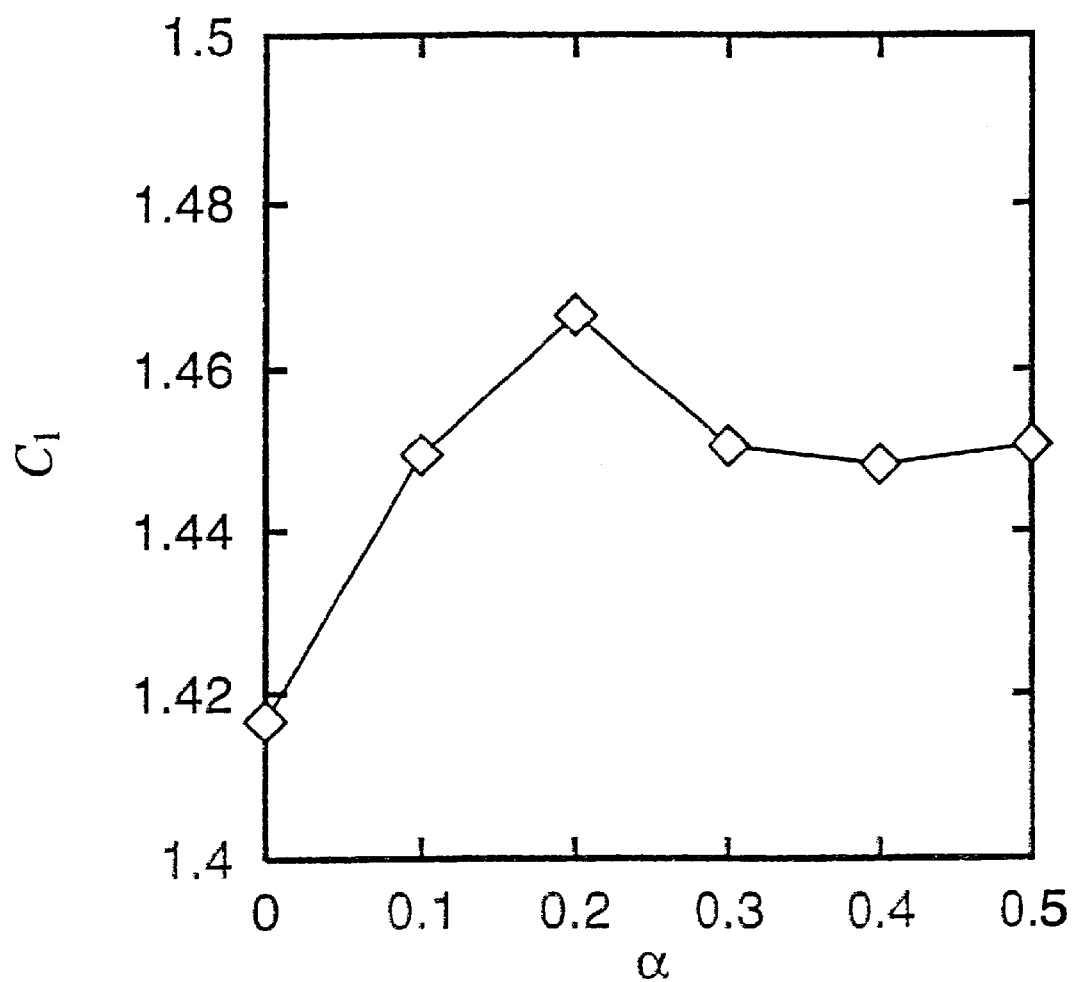
FIG. 53 is a rough diagram that shows a coefficient $C_1$ upon optimum approximation of $\Omega(r)$ by Equation 120 in case of N=10 and R=0 in the seventh embodiment of the invention.
Figure 54:
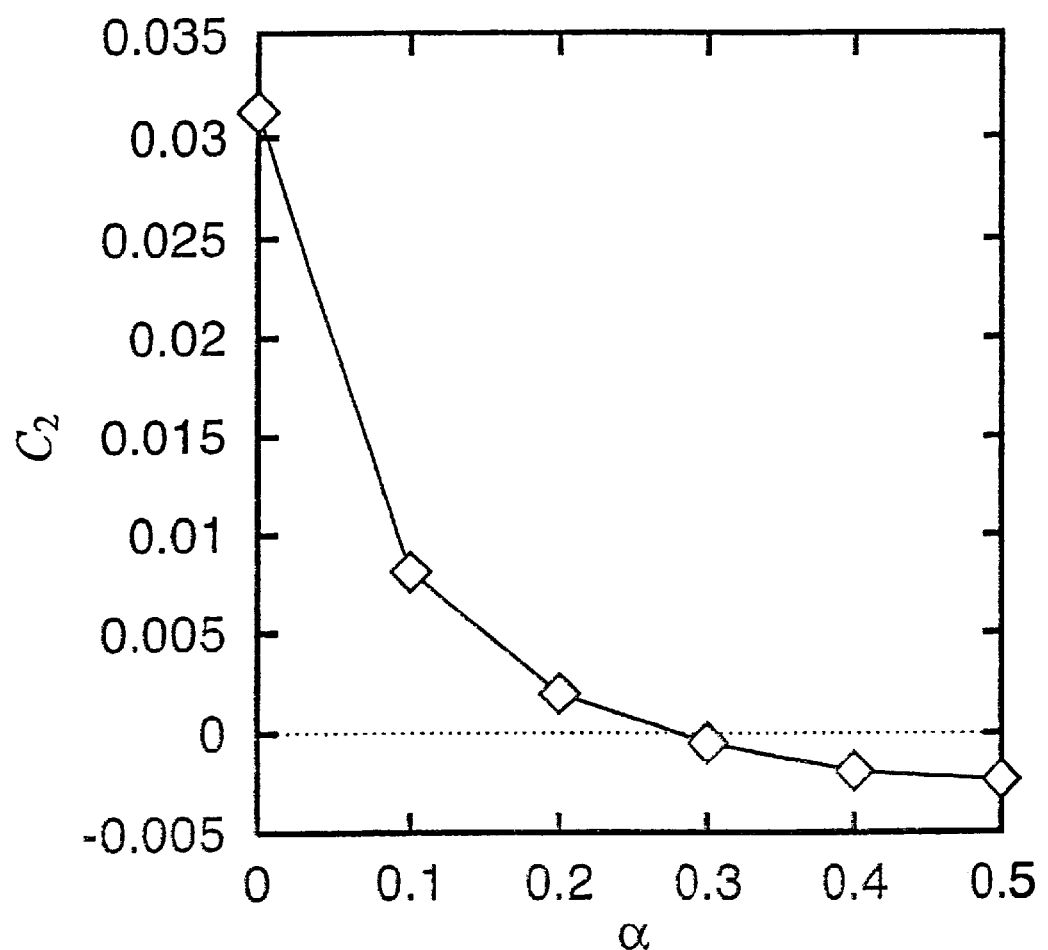
FIG. 54 is a rough diagram that shows a coefficient $C_2$ upon optimum approximation of $\Omega(r)$ by Equation 120 in case of N=10 and R=0 in the seventh embodiment of the invention.

FIG. 49 and FIG. 50 respectively show the coefficients $C_1$ and $C_2$ in the case where $\Omega(r)$ under 0<r<10 is optimally approximated by Equation 120 when R=0 and $\alpha$=0 in FIG. 46. FIG. 51 and FIG. 52 respectively show the coefficients $C_1$ and $C_2$ in the case where $\Omega(r)$ under 0<r<10 is optimally approximated by Equation 120 when N=10 and $\alpha$=0 in FIG. 47. FIG. 53 and FIG. 54 respectively show the coefficients $C_1$ and $C_2$ in the case where $\Omega(r)$ under 0<r<10 is optimally approximated by Equation 120 when N=10 and R=0 in FIG. 48.

In the cases of FIG. 46 and FIG. 47, the Coefficient $C_1$ of $O(r^2)$ is modified well be N and R as shown in FIGS. 49 and 51. As appreciated from FIGS. 50 and 52, since $C_2$ is very small, $\Omega(r)$ is described well by quadratic functions. This demonstrates that these multiply-twisted structures have three-dimensional properties, but they are controlled in number of sites in the region separated by the distance r from a certain site by modulation of its coefficients. Therefore, physical phenomena appearing on the structures are controllable. What can be said from those results is that, even in the order of r~10, evaluation of the average number of the nearest-neighbor sites is directly valid and modulability in the multiply-twisted helix extends even globally. In case of FIG. 48, as apparent from FIG. 53 and FIG. 54, there is almost no change in $C_1$ even with changes of $\alpha$ unlike the foregoing two examples. On the other hand, $C_2$ varies to a certain degree, and its sign is inverted. Therefore, modulability under changes of $\alpha$ of FIG. 48 results in changes of the coefficient of $O(r^4)$.

Next explained is a multiply-twisted structure according to the eighth embodiment of the invention. In the eighth embodiment, it is demonstrated that ferromagnetic transition in a multiply-twisted structure can be controlled by parallel movements of inter-layer bonds.

Assuming a one-dimensional lattice, numbers are assigned as p= . . . , –1, 0, 1, . . . Hamiltonian H of this spin system is defined as follows.

$$H = -\sum_{p,q} J_{p,q} S_p \cdot S_q \tag{121}$$

Here are employed three-dimensional vectors having values at vertices of a regular octahedron. That is, $S_p$=(1,0,0), (–1, 0, 0), (0, 1, 0), (0, –1, 0), (0, 0, 1), (0, 0, –1) are allowable as the spin value.

As $J_{p,q}$ $$J_{p,q} = J_{q,p} = \begin{cases} 1 & \text{when } |p-q|=1 \\ s & \text{when } |p-q|=N \\ s^2 & \text{when } \text{mod}(p, N)=0 \text{ and } q=p+N^2+f(N) \\ s^3 & \text{when } \text{mod}(p, N^2)=1 \text{ and } q=p+N^3+f(N^2) \\ s^4 & \text{when } \text{mod}(p, N^3)=2 \text{ and } q=p+N^4+f(N^3) \\ \vdots \\ 0 & \text{otherwise} \end{cases} \tag{122}$$

is employed. Note that mod(a, b) is the remainder as a result of division of a by b. Positional relation between spins is determined by $J_{p,q}$, and the multiply-twisted structure is defined thereby. What is analyzed here is a model undergoing parallel movements as defined by $$f(x) = -\text{int}(\alpha x) \tag{123}$$

The term int(x) is the largest integer that does not exceed x. In case of $\alpha$=0, the system exhibits the same structure as that of the fourth embodiment.

For the purpose or calculating physical values at finite temperatures using statistical mechanics, a distribution function $$Z = \sum_{\{S_p\}} e^{-\beta H} \quad (124)$$

is introduced, where T is the temperature, and $\beta=1/T$ and $k_B=1$ are used. Expected value concerning an arbitrary function $f(S_j)$ of the spin variable is calculated by $$\langle f(S_j) \rangle = \frac{1}{Z} \sum_{\{S_p\}} f(S_j) e^{-\beta H} \quad (125)$$

When n is the total number of sites, expected value of spontaneous magnetization is $$M = \frac{1}{n} \sum_{j=1}^{n} \langle S_j \rangle \quad (126)$$

Hereunder, n=10001 is used.

Figure 55:
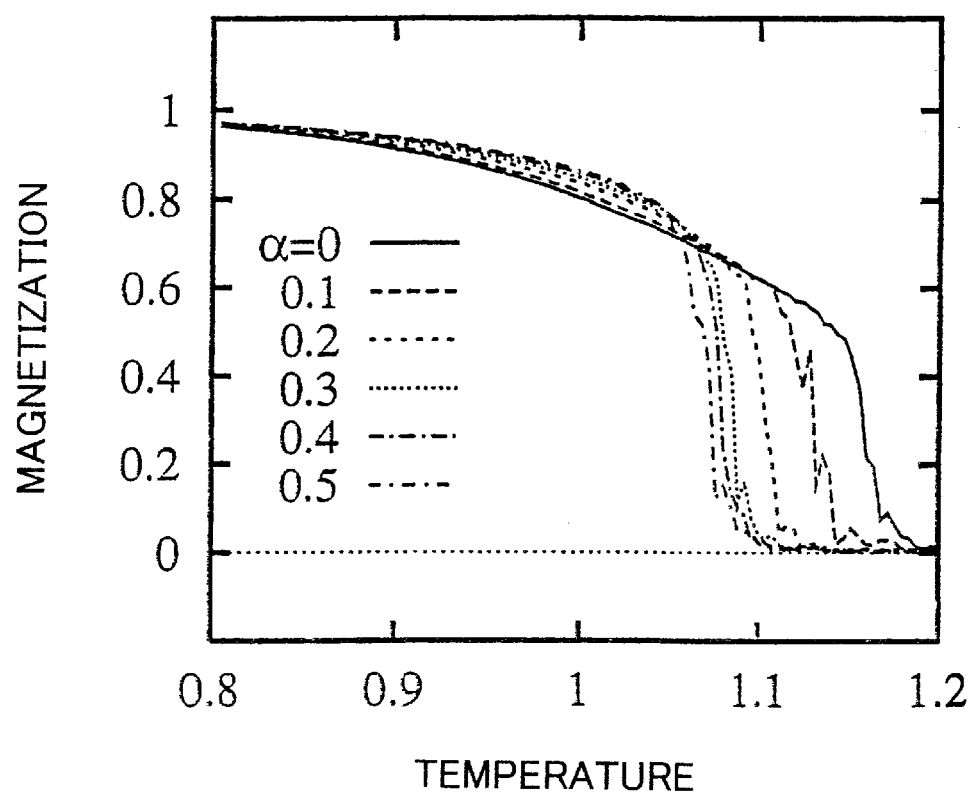
FIG. 55 is a rough diagram that shows spontaneous magnetization obtained by numerical calculation when $\alpha$ is changed in case of N=6 in the eighth embodiment of the invention.
Figure 56:
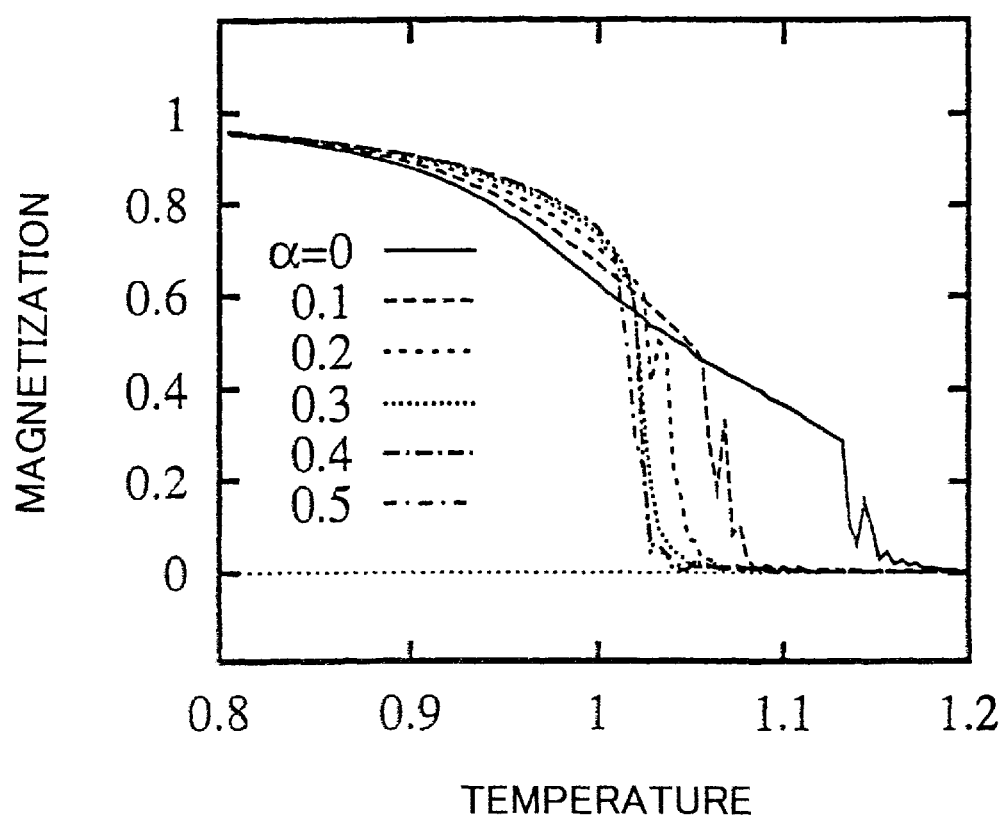
FIG. 56 is a rough diagram that shows spontaneous magnetization obtained by numerical calculation when $\alpha$ is changed in case of N=10 in the eighth embodiment of the invention.
Figure 57:
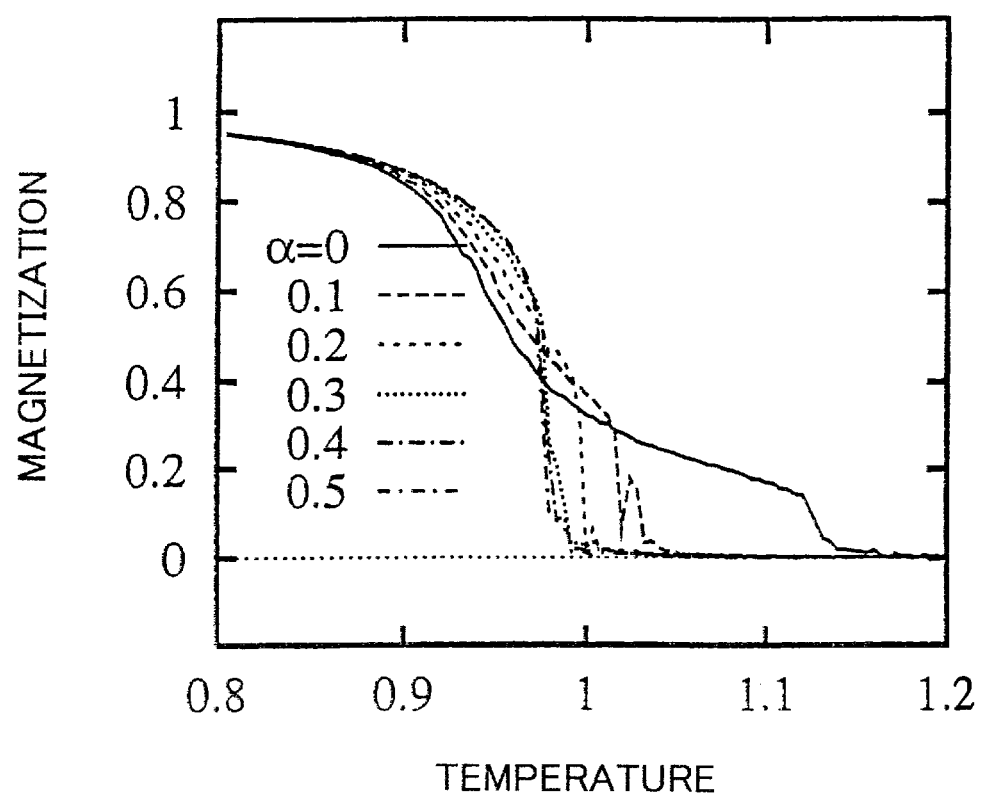
FIG. 57 is a rough diagram that shows spontaneous magnetization obtained by numerical calculation when $\alpha$ is changed in case of N=20 in the eighth embodiment of the invention.

Spontaneous magnetization is calculated by using the Metropolis method that is one of the Monte Carlo methods. Using 100000 as the Monte Carlo steps, three different turn pitches, N=6, 10, 20, were analyzed. FIGS. 55 through 57 show results of Monte Carlo simulations conducted by using $\alpha=0, 0.1, 0.2, 0.3, 0.4, 0.5$. FIG. 55 is the result of N=6, FIG. 56 is the result of N=10, and FIG. 57 is the result of N=20. Under each of N, critical temperature, i.e. the temperature for spontaneous magnetization to disappear, decreases as $\alpha$ increases. This phenomenon would be a result of a change of the positional relation between nearest-neighbor sites along with an increase of $\alpha$, which makes the spin order fragile.

It has been confirmed through the analysis that critical temperature for ferromagnetic transition can be controlled by parallel movement of inter-layer bonds by $\alpha>0$.

Next explained is a multiply-twisted helix according to the ninth embodiment of the invention. In the ninth embodiment, it is demonstrated that quantum chaos in a multiply-twisted helix having introduced a random potential can be controlled by a random magnetic field that can be realized by magnetic impurities.

A quantum system on a multiply-twisted spiral in the multiply-twisted helix according to the ninth embodiment will be explained below.

Assuming a one-dimensional lattice, numbers are assigned as p= . . . , −1, 0, 1, . . . Let the operator for generating a quantum at the p-th lattice point be $\hat{C}_p^\dagger$. Of course, there is the anticommutation relation $$\{\hat{c}_p, \hat{c}_q^\dagger\} = \delta_{p,q} \quad (127)$$

This quantum is a fermion having no free spin freedom. This corresponds to analysis of an electron in a solid in which spin orbit interaction can be disregarded.

Here is defined the Hamiltonian $\hat{H}$ of the electron system as follows.

$$\hat{H} = -\sum_{p,q} t_{p,q} \lambda_{p,q} \hat{c}_p^\dagger \hat{c}_q + \sum_p v_p \hat{c}_p^\dagger \hat{c}_p \quad (128)$$

Letting electrons be movable only among neighboring sites, as $\lambda_{p,q}$, $$\lambda_{p,q} = \lambda_{q,p} = \begin{cases} 1 & \text{when } |p-q|=1 \\ s & \text{when } |p-q|=N \\ s^2 & \text{when } \mathrm{mod}(p,N)=0 \text{ and } q=p+N^2+f(N) \\ s^3 & \text{when } \mathrm{mod}(p,N^2)=1 \text{ and } q=p+N^3+f(N^2) \\ s^4 & \text{when } \mathrm{mod}(p,N^3)=2 \text{ and } q=p+N^4+f(N^3) \\ \vdots \\ 0 & \text{otherwise} \end{cases} \quad (129)$$

Note that mod(a, b) is the remainder as a result of division of a by b. What is analyzed here is a model using $$f(x) = -\mathrm{int}\left(\frac{x}{2}\right) \quad (130)$$

where int(x) is the maximum integer that does not exceed x. $t_{p,q}$ is introduced for the random magnetic field. Here is determined as $$t_{p,q} = \exp(i\theta_{p,q}) \quad (131)$$

where $\theta_{p,q} = -\theta_{q,p}$ is a random real number that satisfies $$0 < \theta_{p,q} < 2\pi \quad (132)$$

Due to hopping to the nearest-neighbor sites, the random phase factor $\theta_{p,q}$ is re-suffixed, depending the sites. If the phase factor is integrated in the loop making one turn around a lattice point, a magnetic flux passing through the loop is obtained. This means a magnetic field is locally introduced to the random distribution of $0<\theta_{p,q}<2\pi$ this magnetic field is absolutely random in both intensity and direction, and if it is averaged spatially, it becomes a zero magnetic field.

Using M as the total number of sites, a periodical boundary condition is introduced before hand to p=1, 2, . . . , M. The second term of the Hamiltonian is the term of the random potential. For each site, the random variable $$-\frac{v}{2} < v_p < \frac{v}{2} \quad (133)$$

is generated to form the Hamiltonian. The variable breadth v of the random potential is useful as a parameter determining the degree of the randomness. Here, N, which determines the turn pitch of multiply-twisted spirals, s, which determines the inter-layer bonding force, and v, which determines the intensity of the random potential, are varied as parameters.

When eigen energy of the Hamiltonian $\hat{H}$ is $\epsilon_m$, and the eigen vector is $|m\rangle$, then $$\hat{H}|m\rangle = \epsilon_m |m\rangle \quad (134)$$

where m=1, 2, . . . , M.

First, M quantum levels $\epsilon_m$ are standardized such that their nearest-neighbor level spacing becomes 1 in average. The density of states of the system is defined by $$\rho(\varepsilon) = \frac{1}{M} \sum_{m=1}^{M} \delta(\varepsilon - \varepsilon_m) \quad (135)$$

and its staircase function $$\lambda(\epsilon) = \int_{-\infty}^{\epsilon} d\eta \rho(\eta) \quad (136)$$

is calculated. The staircase function obtained is converted by using a procedure called unfolding such that the density of states becomes constant in average. Using the quantum level obtained in this manner, the nearest-neighbor level spacing distribution P(s) and the $\Delta_3$ statistics of Dyson and Mehta are calculated as quantum level statistics. As taught by Literatures (32) and (33), by using these statistics, it can be detected whether quantum chaos has been generated or not. It is also known that a quantum chaotic system is sensitive to perturbation from outside similarly to the classical chaotic system, and analysis of quantum chaos is important as a polestar of designs of non-linear materials.

In case of an integrable system, nearest-neighbor level spacing distribution P(s) and $\Delta_3$ statistics are those of Poisson Distribution $$P_P(s) = e^{-s} \tag{137}$$

$$\Delta_3(n) = \frac{n}{15} \tag{138}$$

In case of quantum chaos under a magnetic field, it becomes GUE (Gaussian unitary ensemble) distribution $$P_{GUE}(s) = \frac{32s^2}{\pi^2} e^{\frac{-4s^2}{\pi}} \tag{139}$$

$$\Delta_3(n) = \frac{1}{2\pi^2}\left[\log(2\pi n) + \gamma - \frac{5}{4}\right] + O(n^{-1}) \tag{140}$$

where $\gamma$ is the Euler's constant.

Since the multiply-twisted structure analyzed here is made up of M=10001 sites, there are M=10001 eigen states in this quantum system. Among them, the following quantum level statistics values were calculated on the basis of energy eigen values concerning 2001 states from the 4001st to the 6001st states from the ground state.

Figure 58:
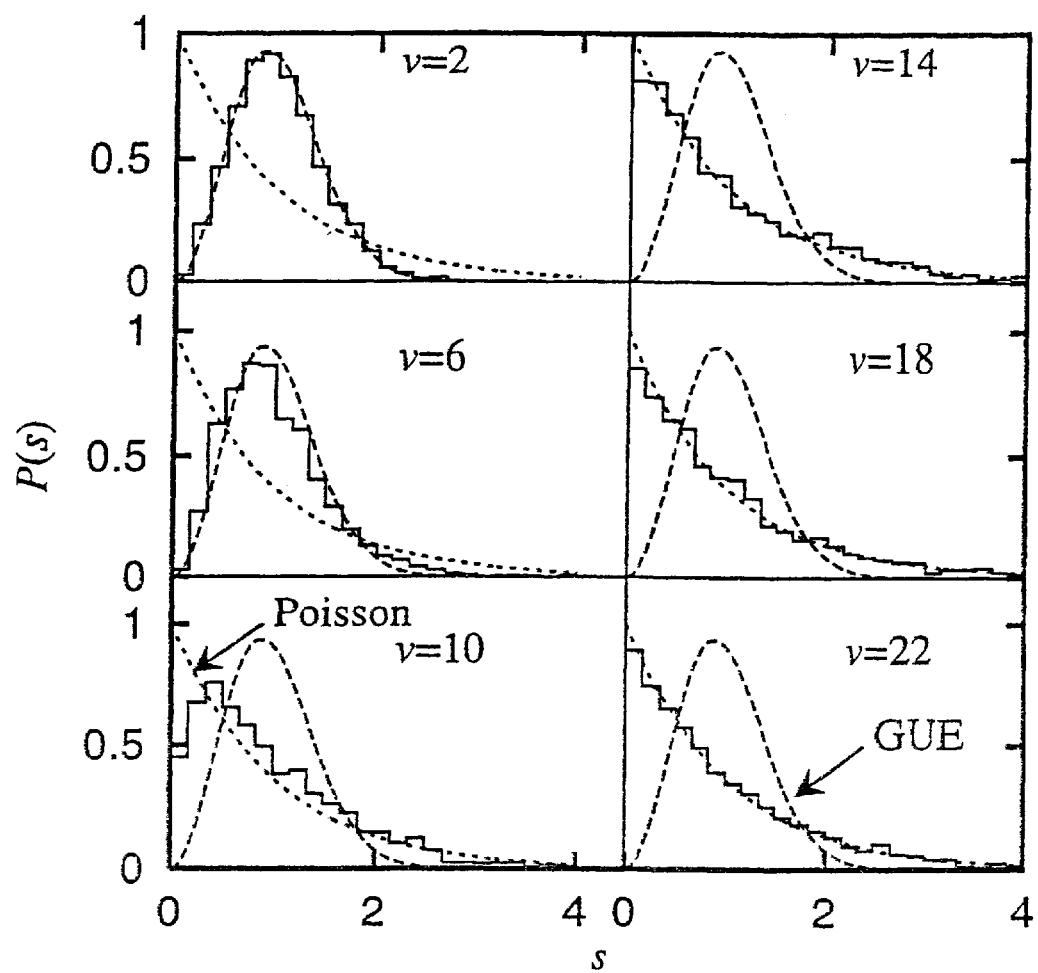
FIG. 58 is a rough diagram that shows quantum level statistics upon changes of v in case of N=10 and s=1 in the ninth embodiment of the invention.
Figure 59:
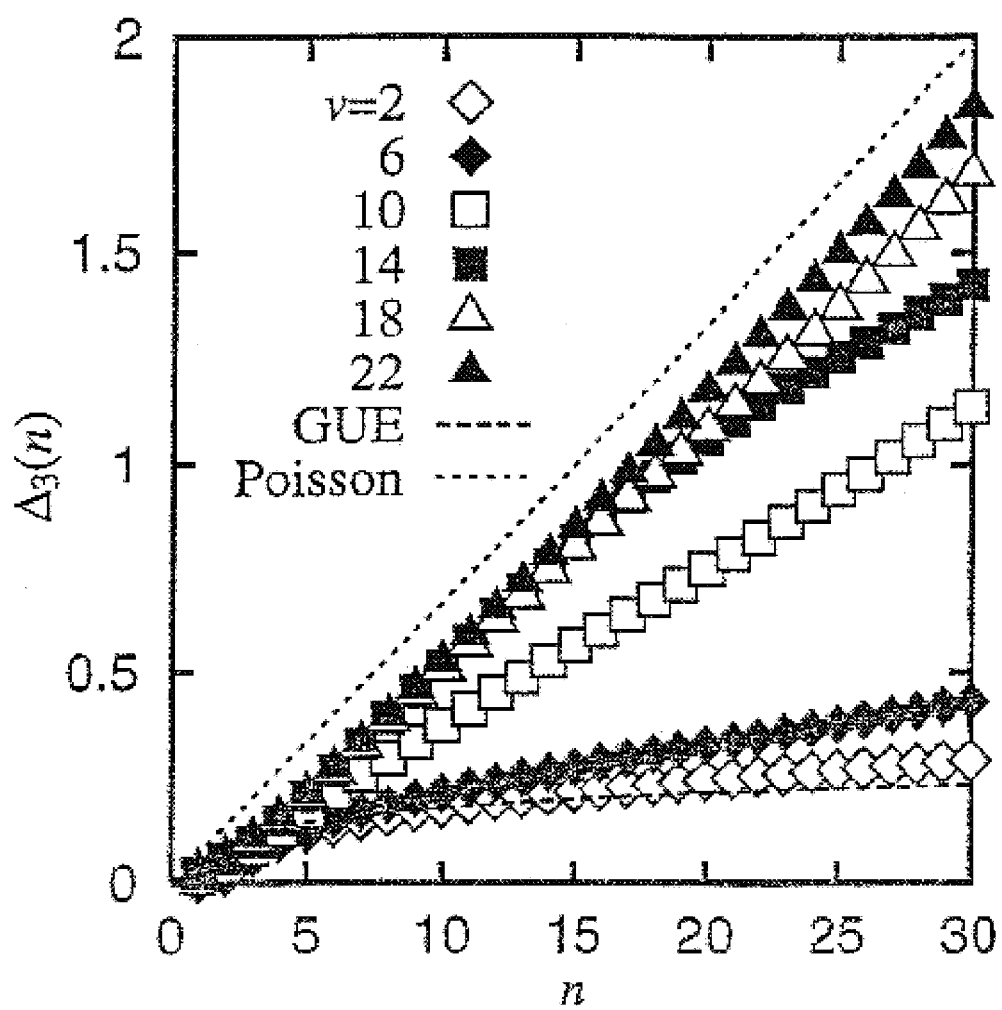
FIG. 59 is a rough diagram that shows quantum level statistics upon changes of v in case of N=10 and s=1 in the ninth embodiment of the invention.

FIG. 58 and FIG. 59 show quantum level statistics of multiply-twisted structures of N=10 while fixing the inter-layer bonding to s=1 and changing the random potential intensity v. FIG. 58 shows P(s) whilst FIG. 59 shows $\Delta_3$ statistics values. When v is small, the system is in a metallic state, and the quantum level statistics is that of a quantum chaotic system of GUE. As v increases, the quantum level statistics changes toward the Poisson distribution. This is typical Anderson transition under a magnetic field ((34) Phys. Rev. 109, 1492 (1958); (35) Phys. Rev. Lett. 42, 783(1979); (36) Rev. Mod. Phys. 57. 287(1985)).

Figure 60:
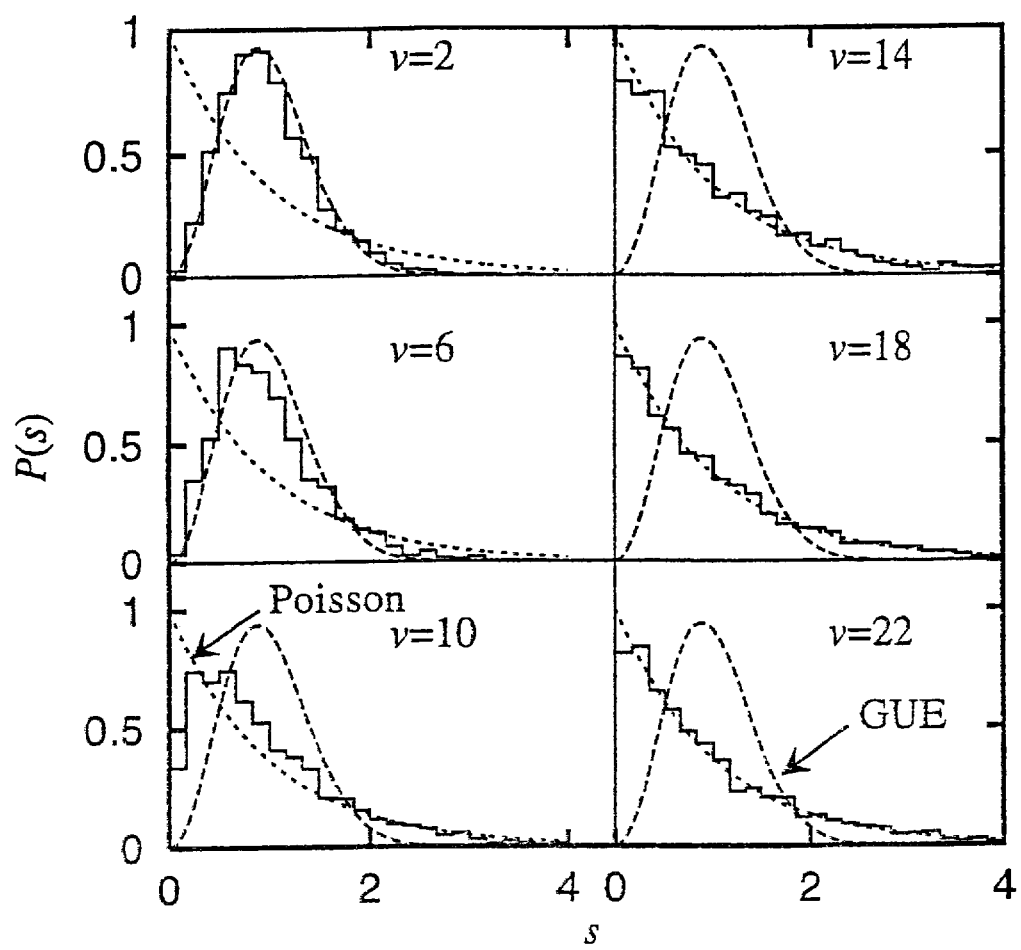
FIG. 60 is a rough diagram that shows quantum level statistics upon changes of v in case of N=4 and s=1 in the ninth embodiment of the invention.
Figure 61:
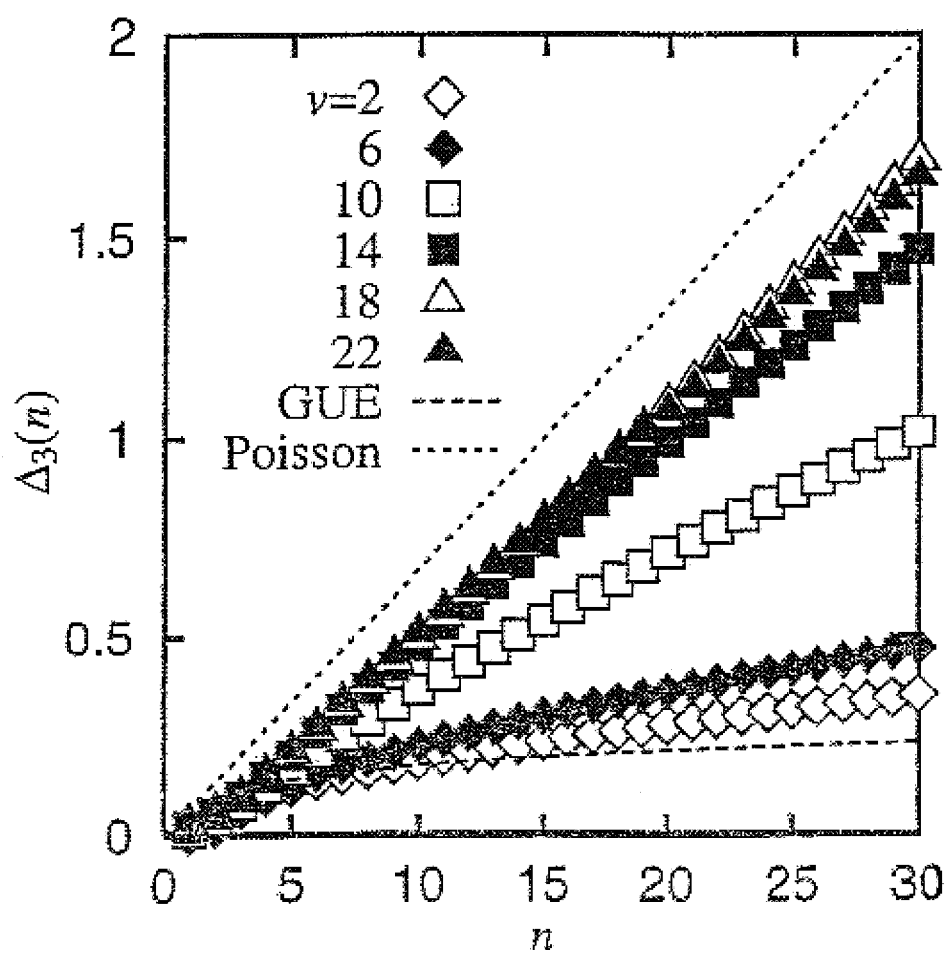
FIG. 61 is a rough diagram that shows quantum level statistic son changes of v in case of N=4 and s=1 in the ninth embodiment of the invention.

FIG. 60 and FIG. 61 show quantum level statistics of multiply-twisted structures of N=4 while fixing the inter-layer bonding to s=1. It is recognized that, along with changes from v=2 to v=22, the system changes from an approximately quantum chaotic system to an approximately integrable system. What should be noted is the difference the quantum level statistics values of v=2 in FIGS. 60 and 61 (N=4) and the quantum level statistics values of v=2 in FIGS. 58 and 59 (N=10).

Figure 62:
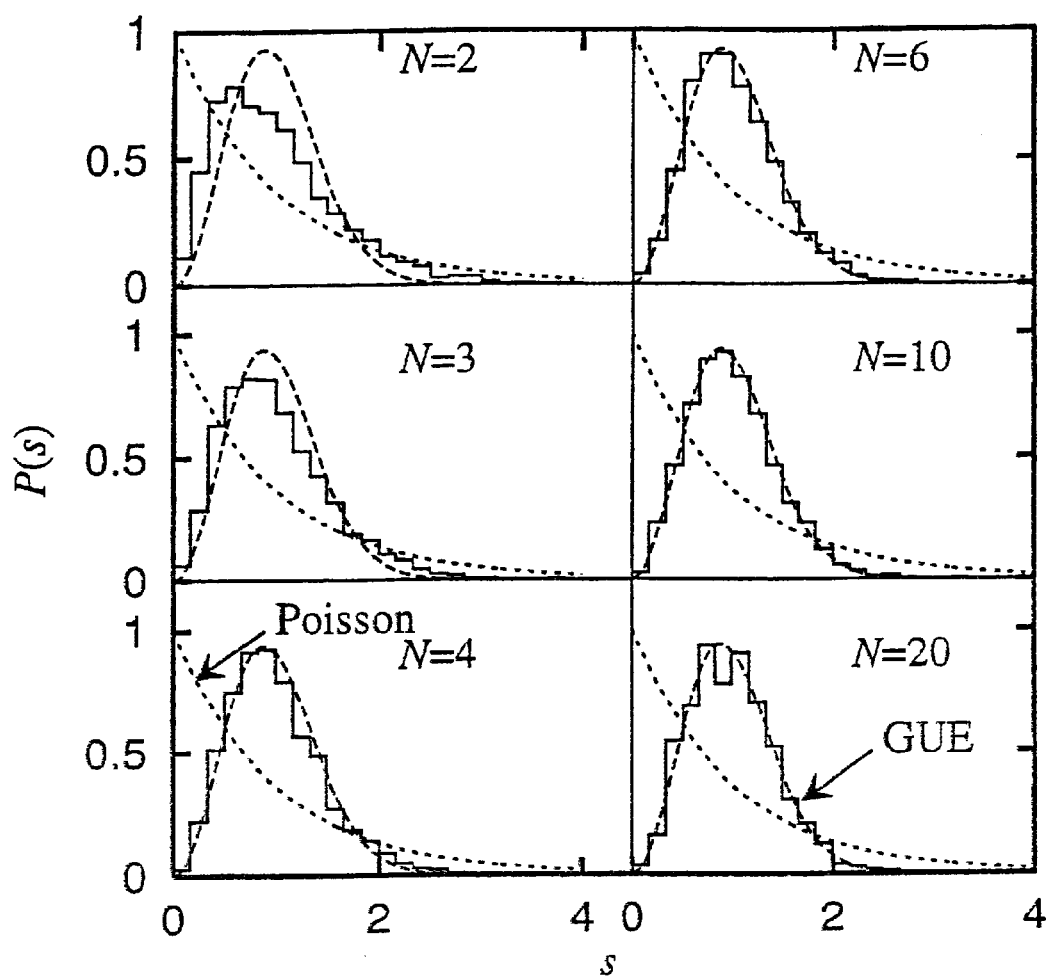
FIG. 62 is a rough diagram that shows quantum level statistics upon changes of N in case of v=2 and s=1 in the ninth embodiment of the invention.
Figure 63:
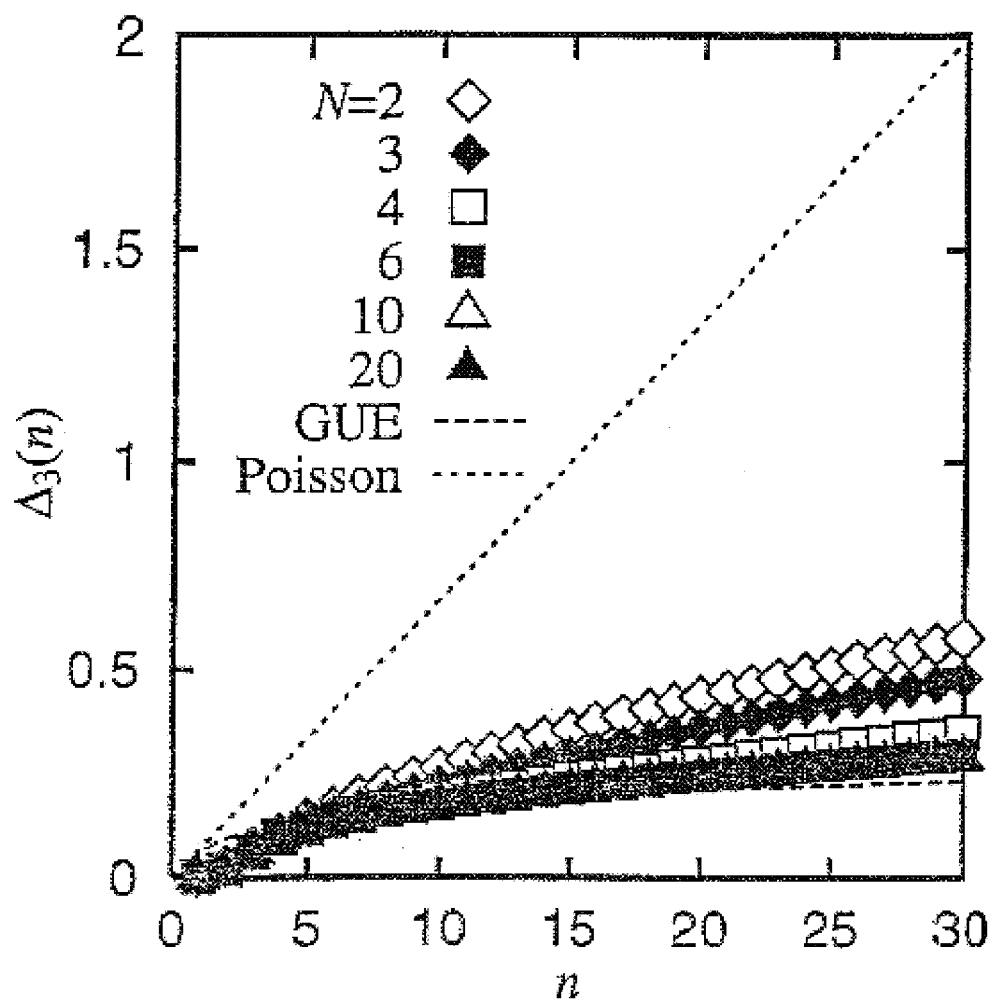
FIG. 63 is a rough diagram that shows quantum level statistics upon changes of N in case of v=2 and s=1 in the ninth embodiment of the invention.

FIGS. 62 and 63 shows quantum level statistics values obtained when fixing v=2 and s=1 and changing N. For example, reviewing $\Delta_3(n)$ in detail, it is recognized that the quantum level statistics value of v=2 in the multiply-twisted structure of N=4 is larger than that in case of N=10. Apparently, as N decreases, quantum exhibits a tendency of localization.

Figure 64:
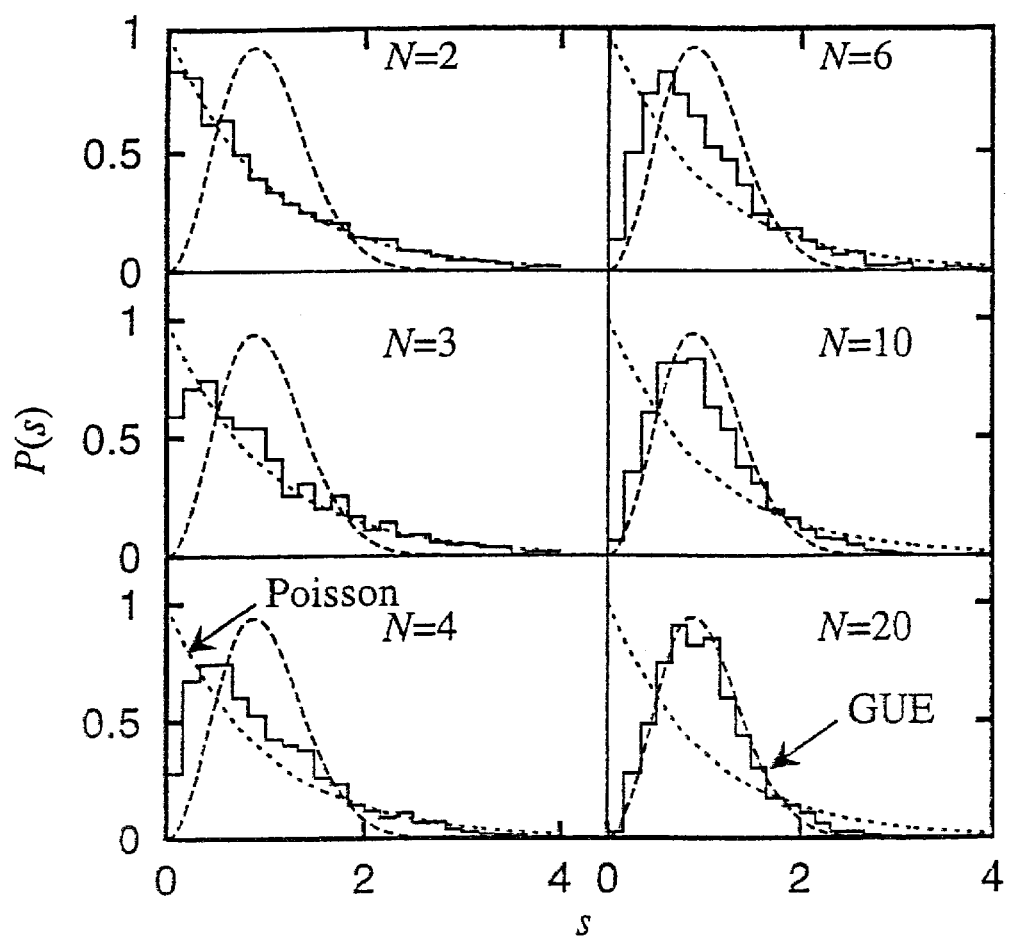
FIG. 64 is a rough diagram that shows quantum level statistics upon changes of N in case of v=2 and s=0.8 in the ninth embodiment of the invention.
Figure 65:
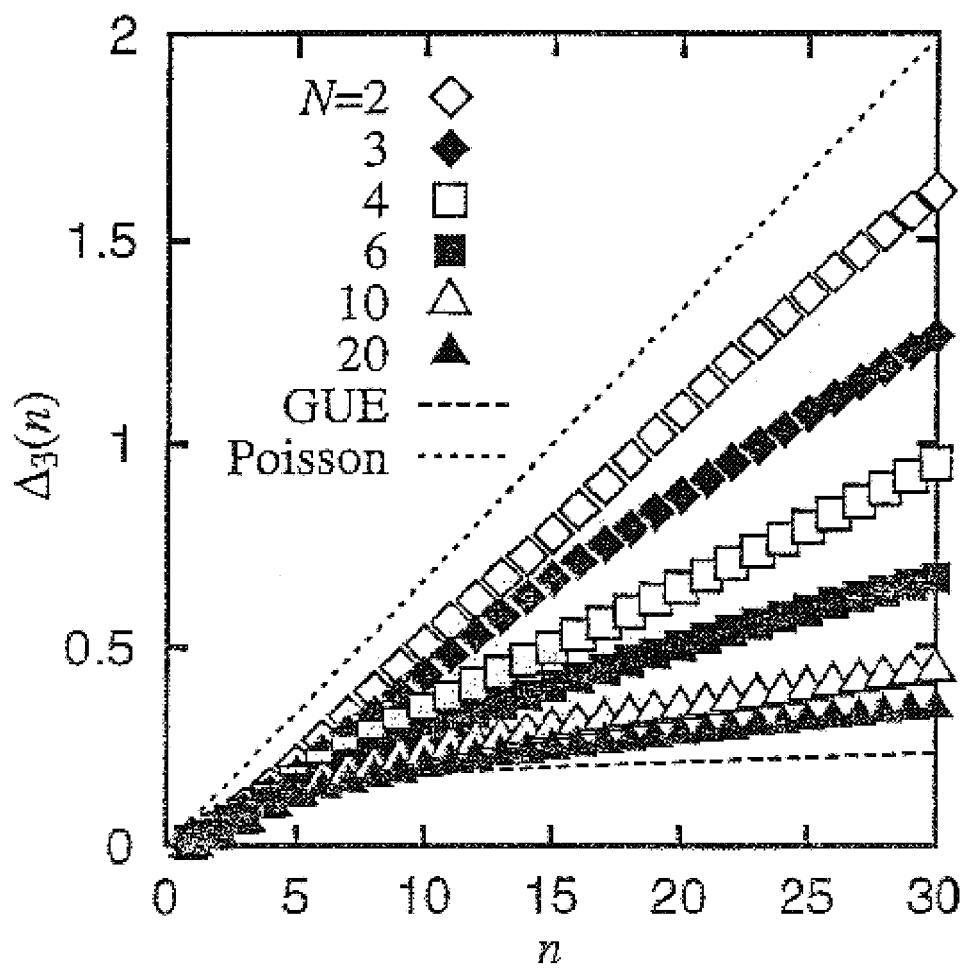
FIG. 65 is a rough diagram that shows quantum level statistics upon changes of N in case of v=2 and s=0.8 in the ninth embodiment of the invention.
Figure 66:
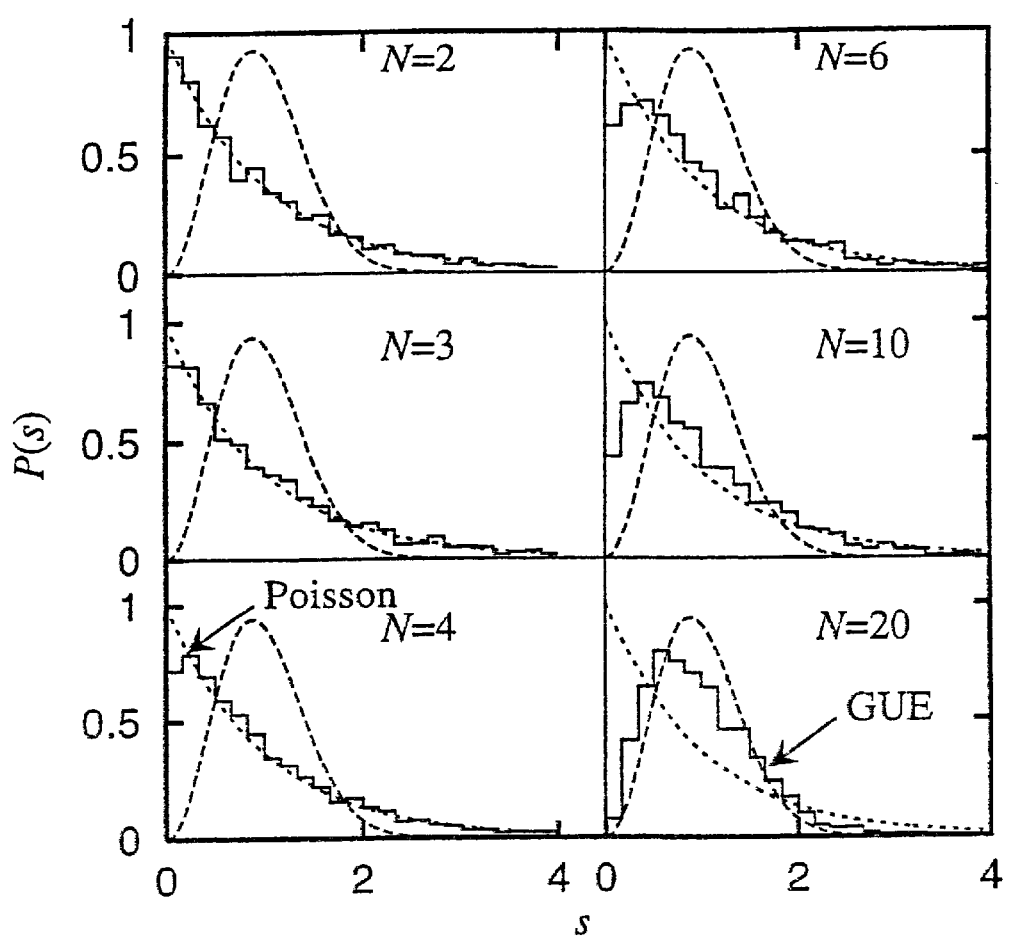
FIG. 66 is a rough diagram that shows quantum level statistics upon changes of N in case of v=2 and s=0.6 in the ninth embodiment of the invention.
Figure 67:
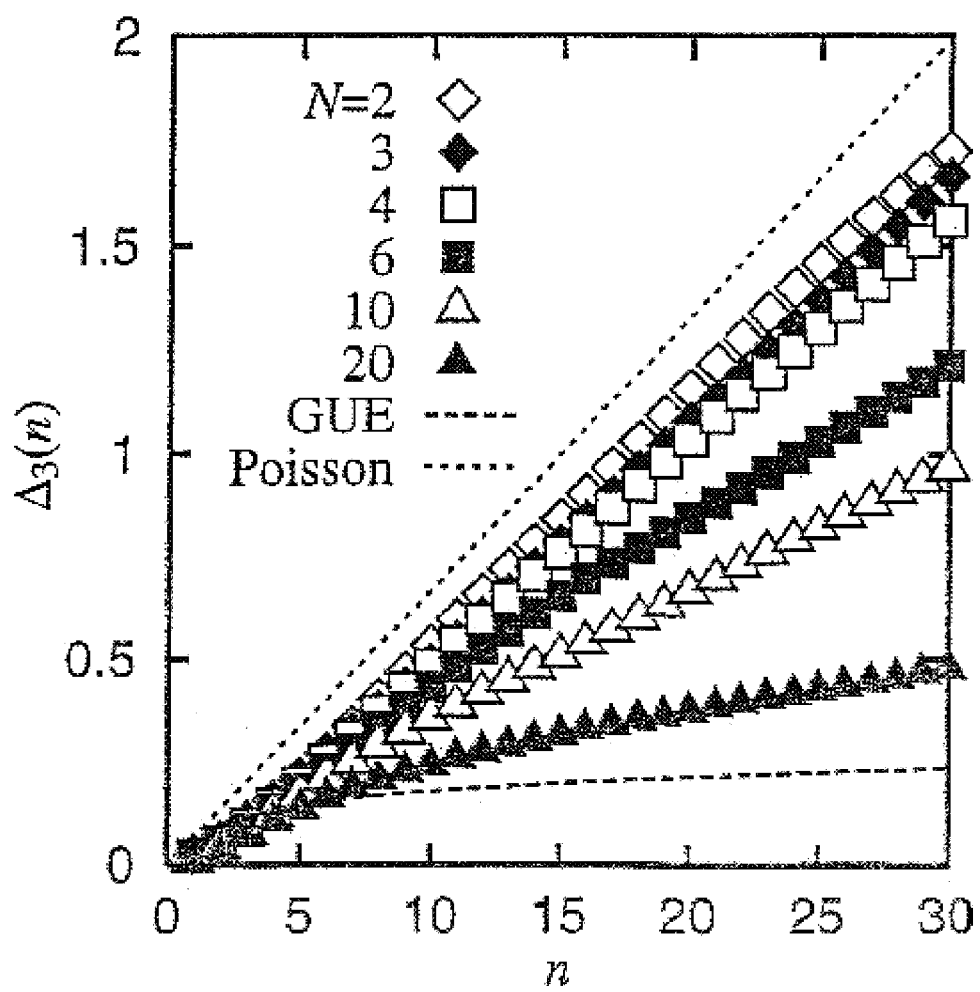
FIG. 67 is a rough diagram that shows quantum level statistics upon changes of N in case of v=2 and s=0.6 in the ninth embodiment of the invention.

In case of s=1 in FIGS. 62 and 63, the change of the quantum statistics value by the change of N was small. This means that the system lacks modulability from the viewpoint of the purpose of controlling the quantum chaos. Let it tried to change s to improve that point. FIG. 64 and FIG. 65 show quantum level statistics values obtained when fixing v=2 and s=0.8 and changing N. FIG. 66 and FIG. 67 show quantum level statistics values obtained when fixing v=2 and s=0.6 and changing N. Similarly to the cases of s=1, quantum exhibits the tendency of localization as N decreases; however, the breadth of the change is larger than that in case of s=1. As seen from N=2 to N=20, it has been confirmed that various quantum systems can be obtained from substantial Poisson distribution to substantial GUE distribution.

Next explained is a multiply-looped ring structure according to the tenth embodiment of the invention.

Explained below is an electron system on a multiply-looped ring in the multiply-looped ring structure according to the tenth embodiment.

Using a ring having L sites in one cycle, multiply-looped rings are defined hierarchically. Assuming q hierarchies or layers, the total number of sites is $L^q$. The sites are described by a q-dimensional cube.

$$a=(a_1,a_2,a_3 \ldots a_q) \tag{141}$$

where $a_k$ is an integer that satisfies $1 \leq a_k \leq L$.

Let the operator for generating an electron of spin $\sigma$ at the a-th lattice point be $\hat{c}_{a,\sigma}^\dagger$. Of course, there is the anticommutation relation $$\{\hat{c}_{a,\sigma}, \hat{c}_{b,\rho}^\dagger\} = \delta(a-b)\delta(\sigma-\rho) \tag{142}$$

Here is used $$\delta(a-b) = \prod_{J=1}^{q} \delta(a_j - b_j) \tag{143}$$

where $\delta(a-b)$ is a delta function defined by $$\delta(a-b) = \begin{cases} 1 & \text{when } a = b \\ 0 & \text{otherwise} \end{cases} \tag{144}$$

Here is defined a single-band Hubbard Hamiltonian $\hat{H}$ of the electron system as follows.

$$\hat{H} = t\sum_{a,b,\sigma} \lambda_{a,b} \hat{c}_{a,\sigma}^\dagger \hat{c}_{b,\sigma} + U\sum_{a} \hat{n}_{a,\uparrow}\hat{n}_{a,\downarrow} \tag{145}$$

Letting electrons be movable only among neighboring sites, $\lambda_{a,b}$ defines their bonding relation. First introduced is the following function.

$$\xi(a,b;k,L) = \begin{cases} 1 & \text{when } |a_k - b_k| = 1 \text{ or } |a_k - b_k| = L-1 \\ 0 & \text{otherwise} \end{cases} \tag{146}$$

This function has been introduced to provide a periodical boundary condition when loops of the period L are formed in the k-th layer.

$$\zeta(a,b;k,q)=\delta(a_1-b_1)\delta(a_2-b_2)\ldots\delta(a_{k-1}-b_{k-1})\times\delta(a_{k+1}-b_{k+1})\delta(a_{k+2}-b_{k+2})\ldots\delta(a_q-b_q) \tag{147}$$

is a function that takes 1 only when having the same suffix, except for the k-th layer.

$$\eta(a, b; k, q) = \prod_{j=1}^{q-k} \delta(a_{k+1} - j) \qquad (148)$$

has been introduced to prevent bonds from concentrating at a particular site. This definition, however, is for q>k, and $\eta(a, b; q, q)=1$ is affixed beforehand. Using these functions $$\lambda_{a,b} = \lambda_{b,a} = \sum_{k=1}^{q} \xi(a, b; k, L)\zeta(a, b; k, q)\eta(a, b; k, q)s^{q-k} \qquad (149)$$

is defined.

Figure 68A:
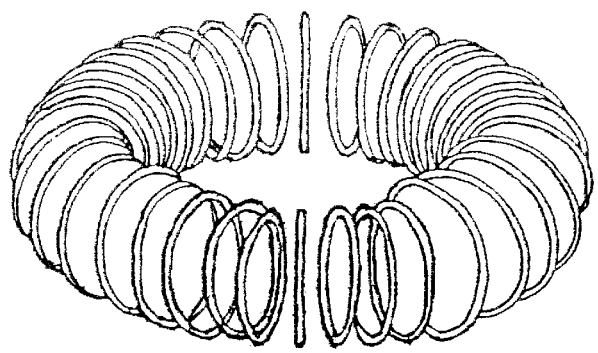
FIGS. 68A–D is a rough diagram that schematically shows a multiply-looped ring structure according to the tenth embodiment of the invention.
Figure 68B:
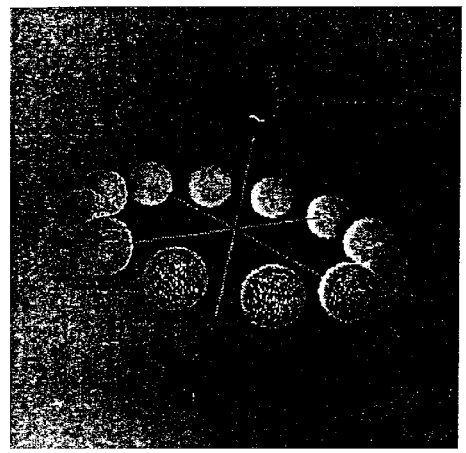
Figure 68C:
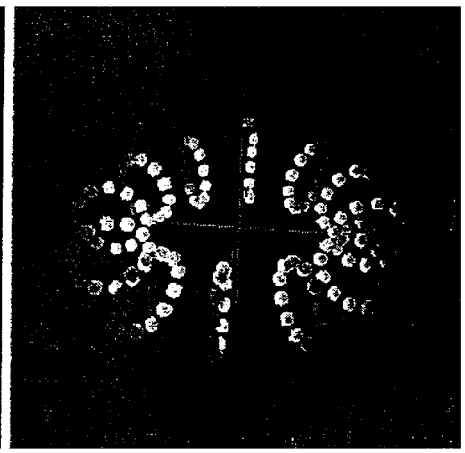
Figure 68D:
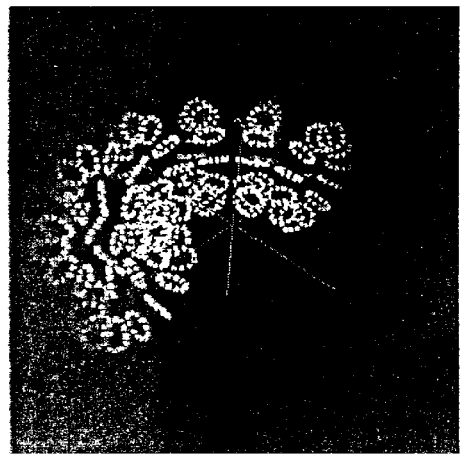

Assume hereunder that s=1. However, Let a review be made about the average number of the nearest-neighbor sites. When the total number of bonds $$N_{rmbond} = L^q + L^q + L^{q-1} + \ldots + L^2 \qquad (150)$$

is divided by the total number of sites $L_q$ and then doubled, $$z = 2 + 2L - \frac{L^{2-q}}{L-1} \qquad (151)$$

is obtained. At the limit of $q \to \infty$, it becomes $$z = 2 + 2\frac{L}{L-1} \qquad (152)$$

and it is known that it can take any value from the value of a three-dimensional tetragonal lattice of z=6 kw when L=2 to the value of a two-dimensional tetragonal lattice under z=4 when $L \to \infty$. A multiply-looped ring structure is defined by using the definition of the nearest-neighbor sites. FIG. 68A schematically shows the multiply-looped ring structure. FIG. 68B shows a ring of L=12 sites, FIG. 68C shows a torus of $L^2$ sites, FIG. 68D shows a triple multiply-looped ring structure of $L^3$ sites.

Hereunder, for simplicity, a natural number j is defined as $$j = 1 + \sum_{k=1}^{q} (a_k - 1)L^{q-k} \qquad (153)$$

In this manner, sites of the multiply-looped ring structure can be equated with a one-dimensional lattice of $1 \leq j \leq L_q$. Here is defined a pin $\sigma$ electron density operator of the j-th site $\hat{n}_{j,\sigma} = \hat{c}_{j,\sigma}^\dagger \hat{C}_{j,\sigma}$ and its sum $\hat{n}_j = \Sigma_\sigma \hat{n}_{j,\sigma}$.

For the purpose of defining a temperature Green's function, here is introduced a grand canonical Hamiltonian $\hat{K} = \hat{H} - \mu \hat{N}$ where $\hat{N} = \Sigma_j \hat{n}_j$. In the half filled taken here, chemical potential is $\mu = U/2$. The half-filled grand canonical Hamiltonian can be expressed as $$\hat{K} = t \sum_{i,j,\sigma} \lambda_{j,i} \hat{t}_{j,i,\sigma} + U/2 \sum_i (\hat{u}_i - 1) \qquad (154)$$

Operators $\hat{t}_{j,i,\sigma}$, $\hat{j}_{j,i,\sigma}$, $\hat{u}_i$ and $\hat{d}_{i,\sigma}$ are defined beforehand as $$\hat{t}_{j,i,\sigma} = \hat{c}_{j,\sigma}^\dagger \hat{c}_{i,\sigma} + \hat{c}_{i,\sigma}^\dagger \hat{c}_{j,\sigma} \qquad (155)$$

$$\hat{j}_{j,i,\sigma} = \hat{c}_{j,\sigma}^\dagger \hat{c}_{i,\sigma} - \hat{c}_{i,\sigma}^\dagger \hat{c}_{j,\sigma} \qquad (156)$$

$$\hat{u}_i = \hat{c}_{i,\uparrow}^\dagger \hat{c}_{i,\uparrow} \hat{c}_{i,\downarrow}^\dagger \hat{c}_{i,\downarrow} + \hat{c}_{i,\uparrow} \hat{c}_{i,\uparrow}^\dagger \hat{c}_{i,\downarrow} \hat{c}_{i,\downarrow}^\dagger \qquad (157)$$

$$\hat{d}_{i,\sigma} = \hat{c}_{i,\sigma}^\dagger \hat{c}_{i,\sigma} - \hat{c}_{i,\sigma} \hat{c}_{i,\sigma}^\dagger \qquad (158)$$

If the temperature Green function is defined for operators $\hat{A}$ and $\hat{B}$ given, taking $\tau$ as imaginary time, it is as follows.

$$<\hat{A}; \hat{B}> = -\int_0^\beta d\tau <T_\tau \hat{A}(\tau)\hat{B}> e^{i\omega_n \tau} \qquad (159)$$

The on-site Green function $$G_{j,\sigma}(i\omega_n) = <\hat{c}_{j,\sigma}; \hat{c}_{j,\sigma}^\dagger> \qquad (160)$$

is especially important because, when analytic continuation is conducted as $i\omega_n \to \omega + i\delta$ for a small $\delta$, $$D_j(\omega) = -\sum_{\sigma=\uparrow,\downarrow} \text{Im} G_{j,\sigma}(\omega + i\delta) \qquad (161)$$

becomes the local density of states of the site j, and $$D(\omega) = -\sum_{j,\sigma} \text{Im} G_{j,\sigma}(\omega + i\delta) \qquad (162)$$

becomes the density of states of the system. For later numerical calculation of densities of states, $\delta = 0.0001$ will be used.

Imaginary time development of the system is obtained by the Heisenberg equation $$\frac{d}{d\tau}\hat{A}(\tau) = [\hat{K}, \hat{A}] \qquad (163)$$

As the equation of motion of the on-site Green function, $$i\omega_n \langle \hat{c}_{j,\sigma}; \hat{c}_{j,\sigma}^\dagger \rangle = 1 + t\sum_{p,j} \lambda_{p,j} \langle \hat{c}_{p,\sigma}; \hat{c}_{j,\sigma}^\dagger \rangle + \frac{U}{2}\langle \hat{d}_{j,-\sigma}\hat{c}_{j,\sigma}; \hat{c}_{j,\sigma}^\dagger \rangle \qquad (164)$$

is obtained. Then, the approximation shown below is introduced, following Gros ((31) C. Gros, Phys. Rev. B50, 7295(1994)). If the site p is the nearest-neighbor site of the site j, the resolution $$<\hat{c}_{p,\sigma}; \hat{c}_{j,\sigma}^\dagger> \to t<\hat{c}_{p,\sigma}\hat{c}_{p,\sigma}^\dagger><\hat{c}_{j,\sigma}; \hat{c}_{j,\sigma\uparrow}^\dagger> \qquad (165)$$

is introduced as the approximation. This is said to be exact in case of infinite-dimensional Bethe lattices, but in this case, it is only within approximation. Under the approximation, the following equation is obtained.

$$(i\omega_n - t^2 \Gamma_{j,\sigma})G_{j,\sigma} = 1 + \frac{U}{2}\langle \hat{d}_{j,-\sigma}\hat{c}_{j,\sigma}; \hat{c}_{j,\sigma}^\dagger \rangle \qquad (166)$$

where $$\Gamma_{j,\sigma} = \sum_p \lambda_{p,j} G_{p,\sigma} \qquad (167)$$

was introduced. To solve the equation obtained, $<\hat{d}_{j,-\sigma}\hat{c}_{j,\sigma}; \hat{c}_{j,\sigma}^\dagger>$ has to be analyzed. In case of half-filled models, this equation of motion is $$i\omega_n \langle \hat{d}_{j,-\sigma}\hat{c}_{j,\sigma}; \hat{c}_{j,\sigma}^\dagger \rangle = \qquad (168)$$

$$\frac{U}{2}G_{j,\sigma} - 2t\sum_p \lambda_{p,j}\langle \hat{j}_{p,j,-\sigma}\hat{c}_{j,\sigma}; \hat{c}_{j,\sigma}^\dagger \rangle + t\sum_p \lambda_{p,j}\langle \hat{d}_{j,-\sigma}\hat{c}_{p,\sigma}; \hat{c}_{j,\sigma}^\dagger \rangle$$

Here again, with reference to the Gros logic, approximation is introduced. It is the following translation.

$$\langle \hat{j}_{p,j,-\sigma} \hat{c}_{j,\sigma}; \hat{c}_{j,\sigma}^\dagger \rangle \to -tG_{p,-\sigma} \langle \hat{d}_{j,-\sigma} \hat{c}_{j,\sigma}; \hat{c}_{j,\sigma}^\dagger \rangle \quad (169)$$

$$\langle \hat{d}_{j,-\sigma} \hat{c}_{p,\sigma}; \hat{c}_{j,\sigma}^\dagger \rangle \to -tG_{p,\sigma} \langle \hat{d}_{j,-\sigma} \hat{c}_{j,\sigma}; \hat{c}_{j,\sigma}^\dagger \rangle \quad (170)$$

By executing this translation, the following closed equation is obtained.

$$(i\omega_n - t^2 \Gamma_{j,\sigma})G_{j,\sigma} = 1 + \frac{(U/2)^2}{i\omega_n - t^2 \Gamma_{j,\sigma} - 2t^2 \Gamma_{j,-\sigma}} G_{j,\sigma} \quad (171)$$

Here is assumed that there is no dependency on spin. That is, assuming $$G_j = G_{j,\uparrow} = G_{j,\downarrow} \quad (172)$$

the following calculation is executed.

Values of DOS obtained by numerical calculation are shown below. The numerical calculation was conducted as to L=3, 4, 5, 6, 10, 20. In case of L=3, q=8 is used, and the total number of sites is n=6561. Values of the following table were used, respectively.

| L | q | n |
|---|---|---|
| 3 | 8 | 6561 |
| 4 | 7 | 16384 |
| 5 | 6 | 15625 |
| 6 | 5 | 7776 |
| 10 | 4 | 10000 |
| 20 | 3 | 8000 |

Figure 69:
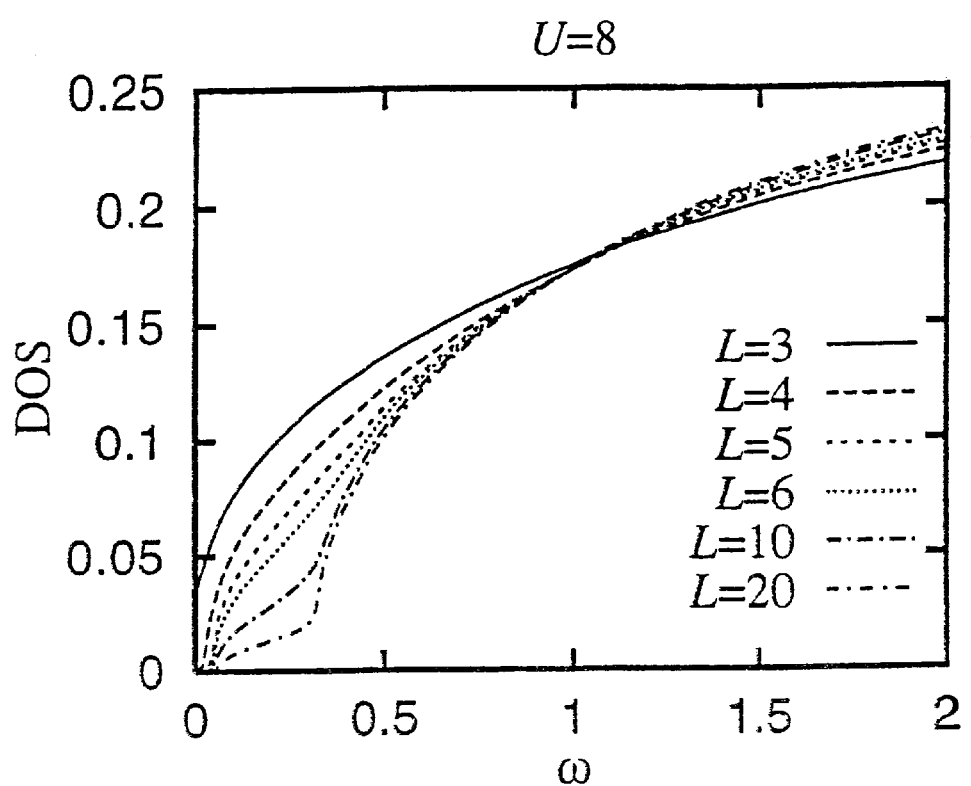
FIG. 69 is a rough diagram that shows a density of states obtained by numerical calculation in case of U=8 in the tenth embodiment of the invention.
Figure 70:
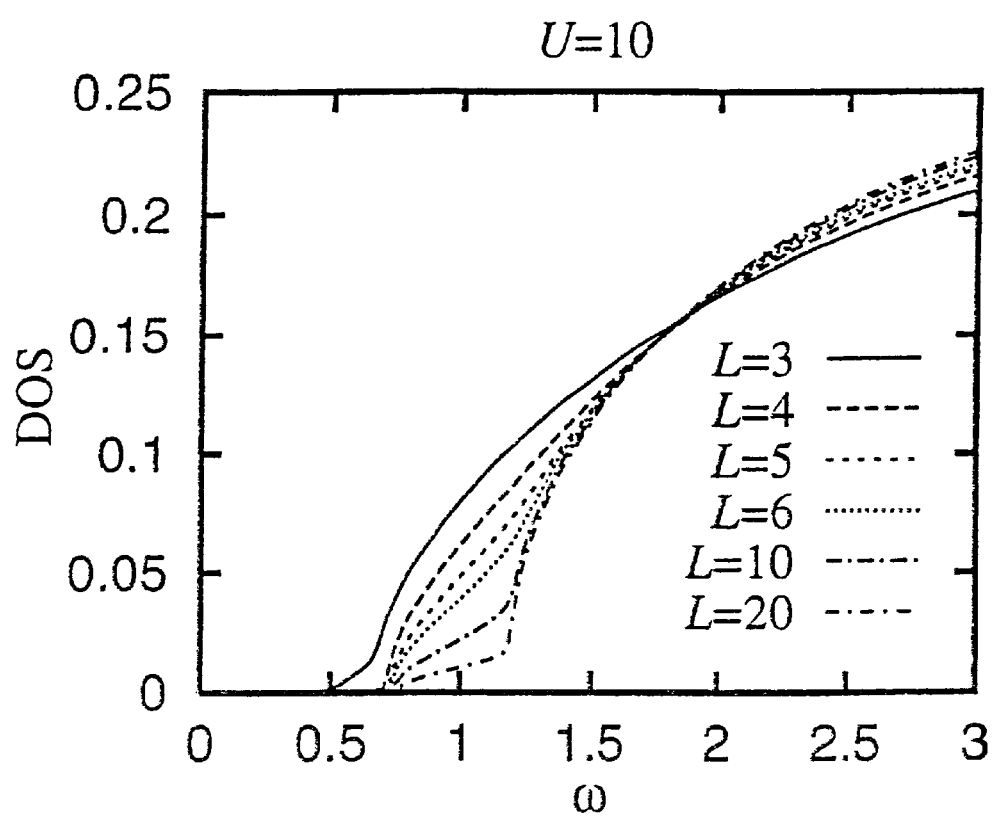
FIG. 70 is a rough diagram that shows a density of states obtained by numerical calculation in case of U=10 in the tenth embodiment of the invention.
Figure 71:
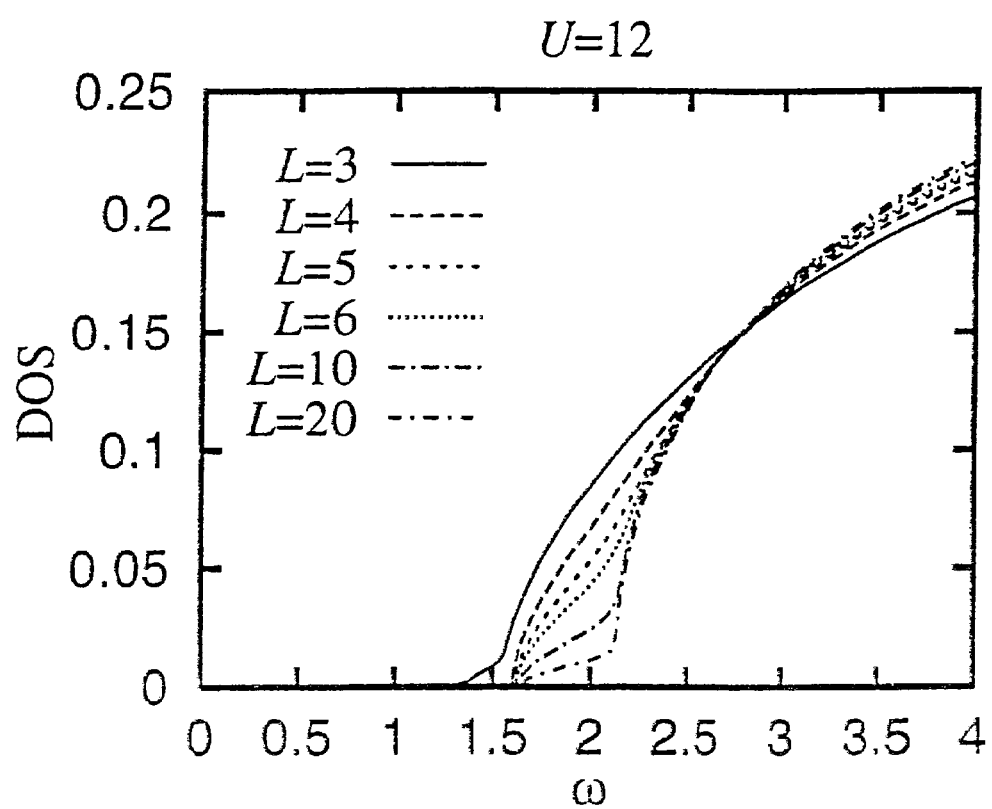
FIG. 71 is a rough diagram that shows a density of states obtained by numerical calculation in case of U=12 in the tenth embodiment of the invention.

Setting U=8 in FIG. 69, U=10 in FIG. 70, U=12 in FIG. 71, and setting L=3, 4, 5, 6, 10, 20 for each value of U, numerical calculation was executed.

In FIG. 69, in case of L=3, the density of state D($\omega$=0) under the Fermi energy $\omega$=0 exists, and the system behaves as a metal. On the other hand, in FIGS. 70 and 71, a region where DOS has disappeared exists near the Fermi energy, and the system behaves as a Mott insulator. When densities of states corresponding to different values of L are remarked in FIG. 69, in case of L>4, the system has changed to an insulator. Therefore, in case of U=8, Mott metal-insulator transition has been confirmed to occur when L changes.

In case of U≧10, the system behaves as a Mott insulator under all analyzed values of L, but since the value corresponding to a double of the value of $\omega$ rendering DOS be zero is the gap as the Mott insulator(Hubbard gap), it is appreciated that the width of the Hubbard gap increases with L. Therefore, it has been confirmed that Mott-Hubbard transition can be controlled by adjusting L.

In this manner, when the number of elements L of the multiply-looped ring is controlled and designed, the system can behave as a metal or can behave an insulator. Therefore, a material having a plurality of regions having different numbers of elements can be a superstructure having various regions including metallic regions and insulating regions, and this enables richer controls and designs of physical properties. For example, if a material is designed to have regions of metallic/insulating/metallic phases, a device behaving as a diode can be realized. Further, if the insulator region is made to changeable in phase to a metal under external control, the material can behave as a transistor. A material containing the multiply-looped ring structure as a part thereof could be made. For example, a material in which a structure other than the multiply-looped ring structure is added as an electrode to a multiply-looped ring structure will be useful.

Next explained is a multiply-looped ring structure according to the 11th embodiment of the invention. In the 11th embodiment, quantum level statistics will be analyzed concerning quantum states in the multiply-looped ring structure to which random potentials are introduced, thereby to demonstrate that quantum chaos can be controlled.

Explained below is an electron system on a multiply-looped ring in the multiply-looped ring structure according to the 11th embodiment.

Using a ring having L sites in one cycle, multiply-looped rings are defined hierarchically. Assuming q hierarchies or layers, the total number of sites is $L_q$. The sites are described by a q-dimensional cube.

$$a = (a_1, a_2, a_3 \ldots a_q) \quad (173)$$

where $a_k$ is an integer that satisfies $1 \leq a_k \leq L$.

Let the operator for generating a quantum at the a-th lattice point be $\hat{c}_a^\dagger$. Of course, let the operator satisfy the anticommutation relation $$\{\hat{c}_a, \hat{c}_b^\dagger\} = \delta(a-b) \quad (174)$$

This quantum is a fermion having no free spin freedom. This corresponds to analysis of an electron in a solid in which spin orbit interaction can be disregarded. Here is used $$\delta(a-b) = \prod_{j=1}^{q} \delta(a_j - b_j) \quad (175)$$

where $\delta(a-b)$ is a delta function defined by $$\delta(a-b) = \begin{cases} 1 & \text{when } a = b \\ 0 & \text{otherwise} \end{cases} \quad (176)$$

Letting electrons be movable only among neighboring sites, $\lambda_{a,b}$ determines their bonding relations. First introduced is the following function.

$$\Xi^{(\pm)}(a, b; k, L) = \begin{cases} 1 & \text{when } b_k - a_k = \pm 1 \\ 1 & \text{when } b_k - a_k = \pm(1-L) \\ 0 & \text{otherwise} \end{cases} \quad (177)$$

This function has been introduced to provide a periodical boundary condition and bonds between adjacent loops in the k-th layer. Next introduced is $$\Psi(a, b; k) = \prod_{j=1}^{k-1} \delta(a_j - b_j) \quad (178)$$

This is a function that, takes 1 only when having the same suffix concerning layers beyond the k-th layer. Furthermore, by using $$Q(a, b; k, q) = \begin{cases} \prod_{j=2}^{q-k} \delta(a_{k+j} - j)\delta(b_{k+j} - j) & \text{when } q > k+1 \\ 1 & \text{when } q \leq k+1 \end{cases} \quad (179)$$

-continued $$R^{(\pm)}(x;\alpha,L) = \delta\left(\mathrm{mod}\left(x-1\pm\frac{\sigma L}{2},L\right)\right) \qquad (180)$$

also introduced is $$\Phi^{(\pm)}(a,b;k,q) = R^{(\mp)}(a_{k+1};\alpha,L)R^{(\pm)}(b_{k+1};\alpha,L)Q(a,b;k,q) \qquad (181)$$

Using these functions, $$\lambda_{a,b} = \lambda_{b,a} = \sum_{\sigma=+,-}\sum_{k=1}^{q}\Xi^{(\sigma)}(a,b;k,L)\phi^{(\sigma)}(a;k,q)\Psi(a,b;k)s^{q-k} \qquad (182)$$

is defined. When placing $\alpha=0$, the above definition results in the same as that already discussed in the tenth embodiment. When $\alpha>0$, the same effects as parallel movements of inter-layer bonds in the multiply-twisted helix is expected. Regarding its effects to Mott metal-insulator transition, detailed explanation will be made later in the second embodiment.

Hereunder, using $\alpha=0.5$, calculation will be conducted.
Generally, a natural number j is defined as $$j = 1 + \sum_{k=1}^{q}(a_k-1)L^{q-k} \qquad (183)$$

In this manner, sites of the multiply-looped ring structure can be equated with a one-dimensional lattice of $1 \leq j \leq L_q$. The Hamiltonian $\hat{H}$ of this quantum system is defined as $$\hat{H} = -\sum_{a,b}\lambda_{a,b}\hat{c}_a^\dagger\hat{c}_b + \sum_a v_a\hat{c}_a^\dagger\hat{c}_a \qquad (184)$$

The second term of the Hamiltonian is the term of the random potential. For each site, the random variable $$-\frac{v}{2} < v_a < \frac{v}{2} \qquad (185)$$

is generated to form the Hamiltonian. The variable breadth v of the random potential is useful as a parameter determining the degree of the randomness.

When eigen energy of the Hamiltonian $\hat{H}$ is $\epsilon_m$, and the eigen vector is $|m\rangle$, then $$\hat{H}|m\rangle = \epsilon_m|m\rangle \qquad (186)$$

where $m=1, 2, \ldots, n$.

First, n quantum levels $\epsilon_m$ are standardized such that their nearest-neighbor level spacing becomes 1 in average. The density of states of the system is defined by $$\rho(\varepsilon) = \frac{1}{n}\sum_{m=1}^{n}\delta(\varepsilon-\varepsilon_m) \qquad (187)$$

and its staircase function $$\lambda(\epsilon) = \int_{-\infty}^{\epsilon}d\eta\rho(\eta) \qquad (188)$$

is calculated. The staircase function obtained is converted by using a procedure called unfolding such that the density of states becomes constant in average. Using the quantum level obtained in this manner, the nearest-neighbor level spacing distribution P(s) and the $\Delta_3$ statistics of Dyson and Mehta are calculated as quantum level statistics. As taught by Literatures (32) and (33), by using these statistics, it can be detected whether quantum chaos has been generated or not. It is also known that a quantum chaotic system is sensitive to perturbation from outside similarly to the classical chaotic system, and analysis of quantum chaos is important as a polestar of designs of non-linear materials.

In case of an integrable system, nearest-neighbor level spacing distribution P(s) and $\Delta_3$ statistics are those of Poisson Distribution $$P_p(s) = e^{-s} \qquad (189)$$

$$\Delta_3(n) = n/15 \qquad (190)$$

In case the system discussed here exhibits quantum chaos, it becomes GOE distribution $$P_{GOE}(s) = \frac{\pi s}{2}e^{-\frac{\pi s^2}{4}} \qquad (191)$$

$$\Delta_3(n) = \frac{1}{\pi^2}\left[\log(2\pi n) + \gamma - \frac{\pi^2}{8} - \frac{5}{4}\right] + O(n^{-1}) \qquad (192)$$

where $\gamma$ is the Euler's constant.

In this section, L, which determines the turn pitch of the multiply-looped ring structure, s, which determines the inter-layer bonding force, and v, which determines the intensity of the random potential, are varied as parameters. When L=6, 10, 20 is used as the turn pitch, the values

| L | q | n |
|---|---|---|
| 6 | 5 | 7776 |
| 10 | 4 | 10000 |
| 20 | 3 | 8000 | were used as the total number of sites. Statistics values are calculated by using 2001 quantum levels, in total, taking 1000 states on each side from the band center among n states used for each L.

Figure 72:
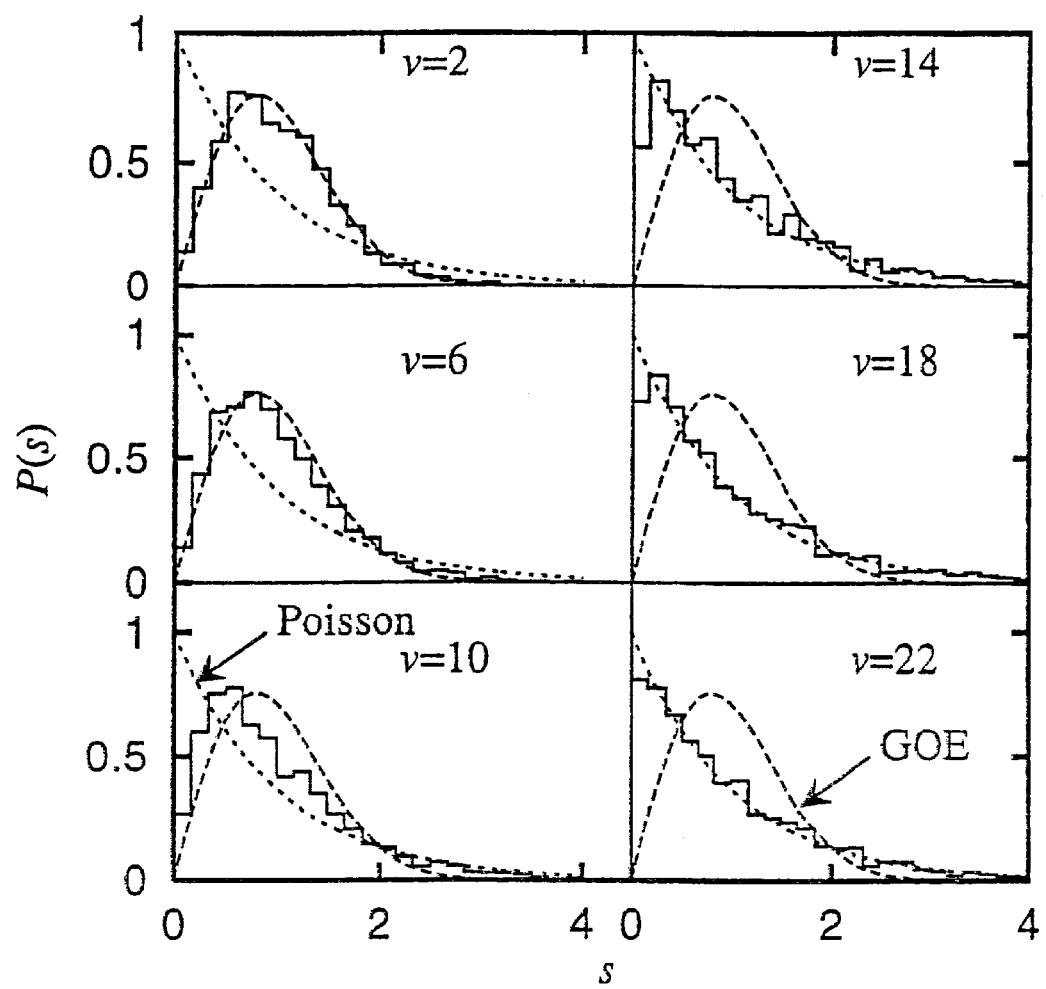
FIG. 72 is a rough diagram that shows quantum level statistics upon changes of v in case of N=6 and s=1 in the 11th embodiment of the invention.
Figure 73:
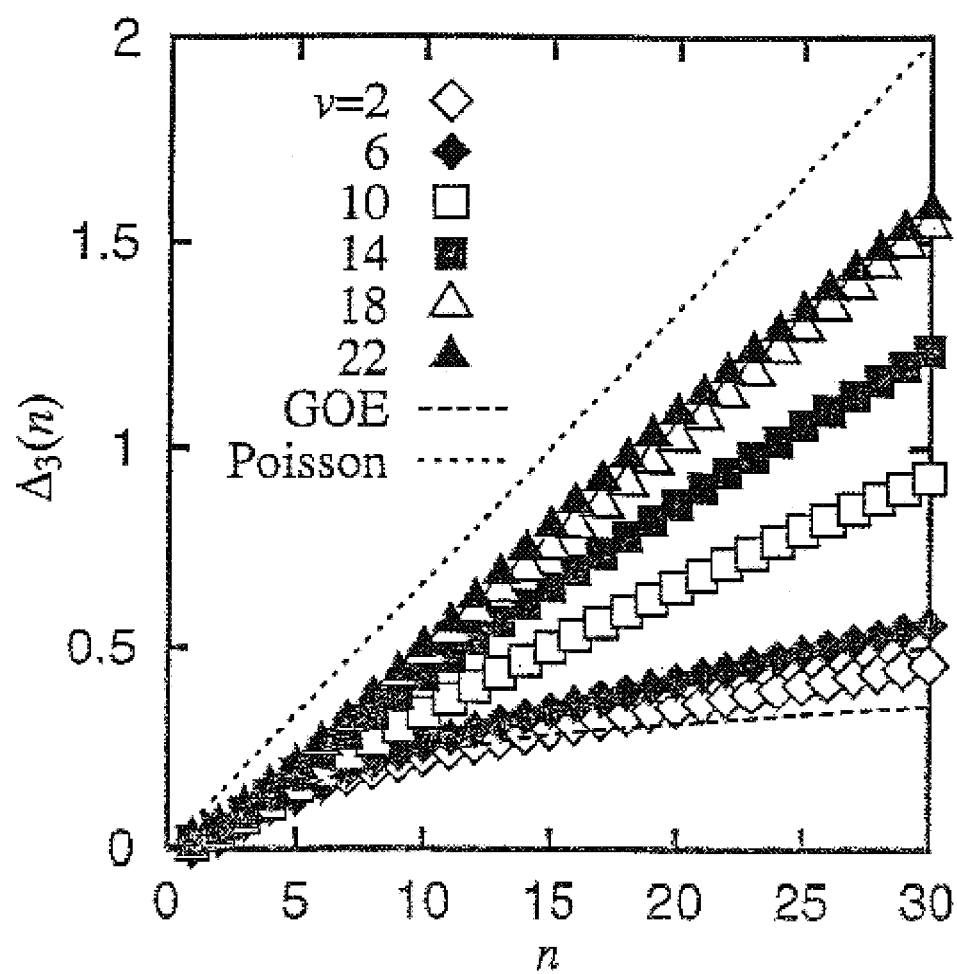
FIG. 73 is a rough diagram that shows quantum level statistics upon changes of v in case of N=6 and s=1 in the 11th embodiment of the invention.
Figure 74:
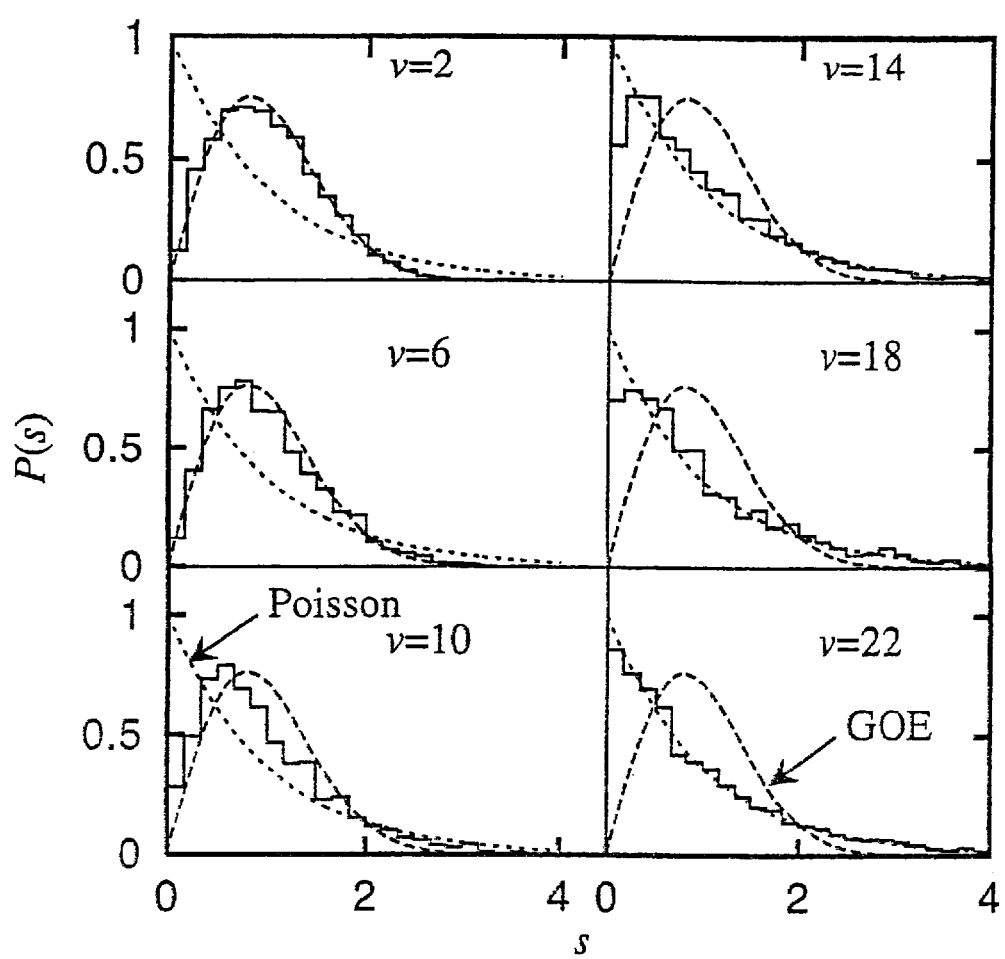
FIG. 74 is a rough diagram that shows quantum level statistics upon changes of v in case of N=10 and s=1 in the 11th embodiment of the invention.
Figure 75:
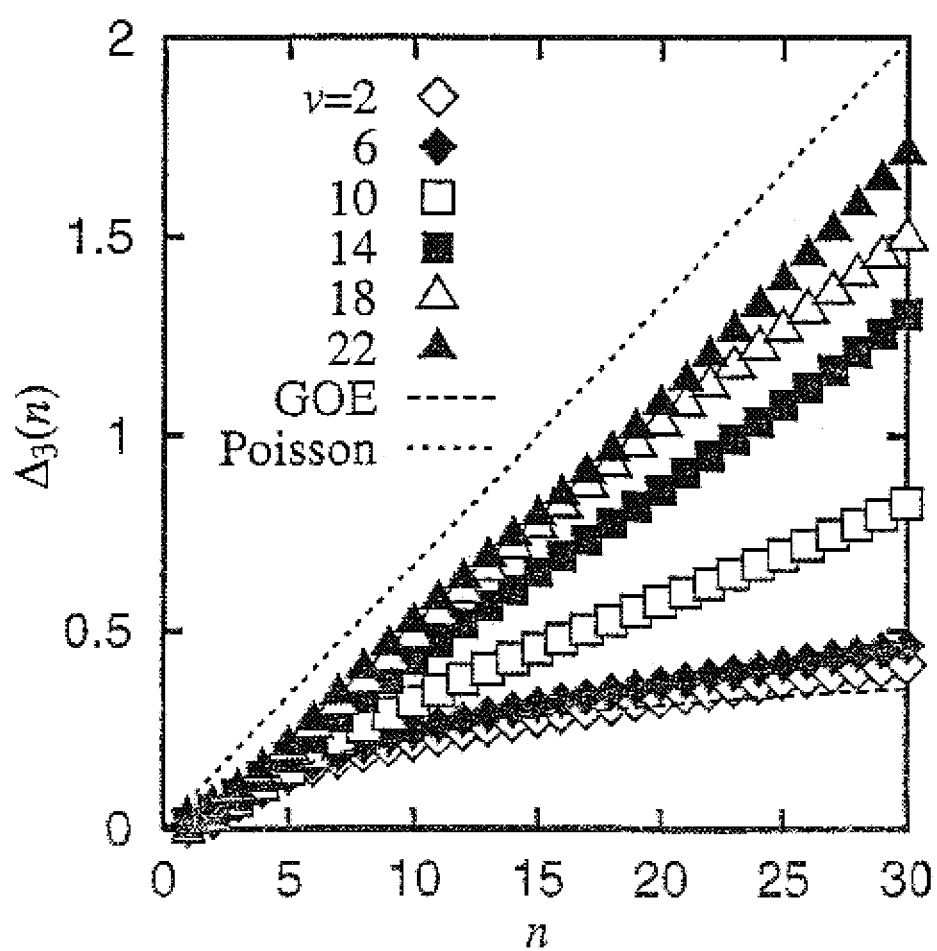
FIG. 75 is a rough diagram that shows quantum level statistics upon changes of v in case of N=10 and s=1 in the 11th embodiment of the invention.
Figure 76:
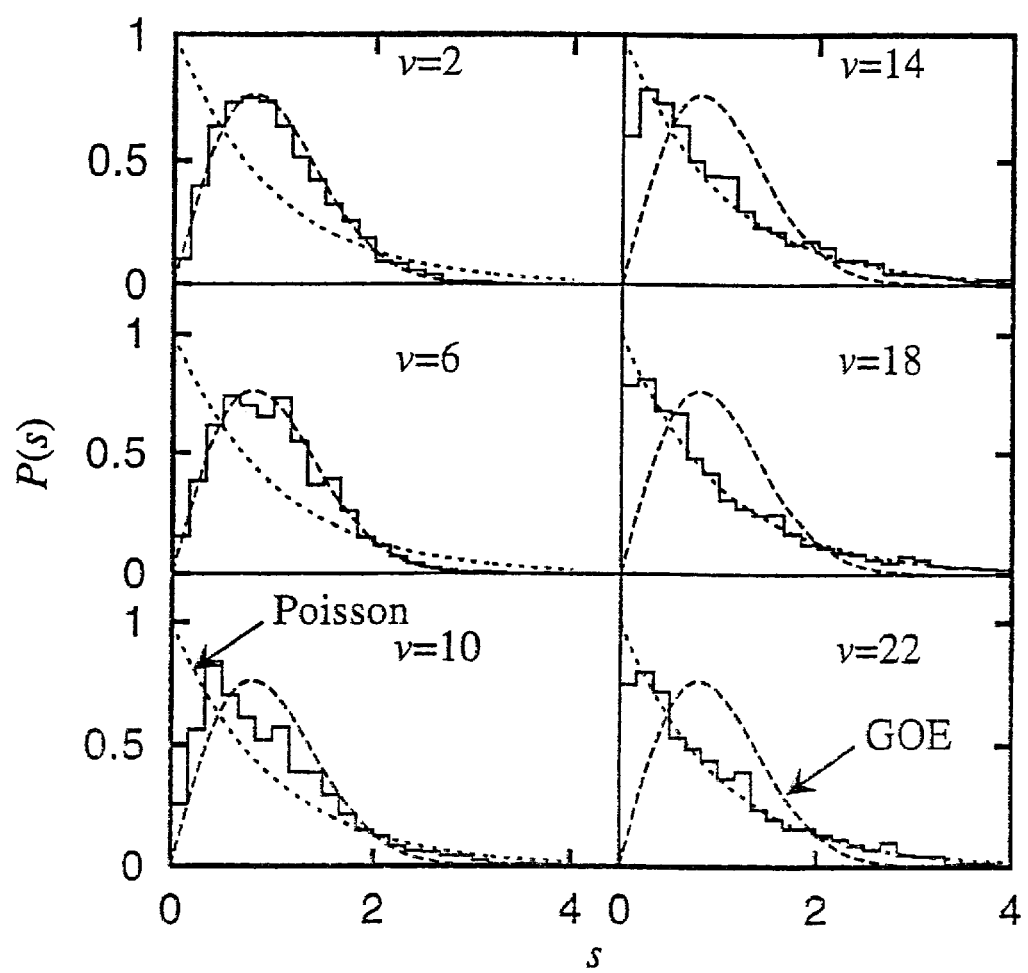
FIG. 76 is a rough diagram that shows quantum level statistics upon changes of v in case of N=20 and s=1 in the 11th embodiment of the invention.
Figure 77:
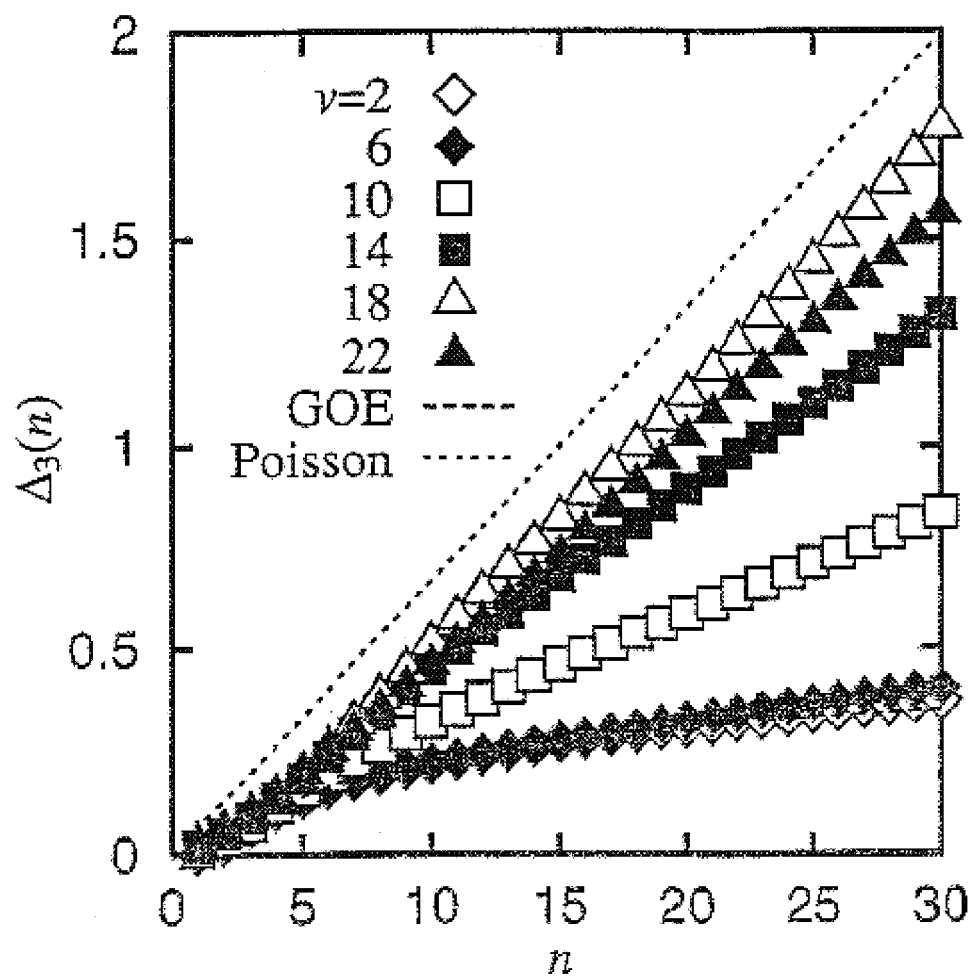
FIG. 77 is a rough diagram that shows quantum level statistics upon changes of v in case of N=20 and s=1 in the 11th embodiment of the invention.

FIG. 72 and FIG. 73 show quantum level statistics of multiply-looped ring structures of L=6 while fixing the inter-layer bonding to s=1 and changing the random potential intensity v. FIG. 74 and FIG. 75 show quantum level statistics of multiply-looped ring structures of L=10 while fixing the inter-layer bonding to s=1 and changing the random potential statistics of multiply-looped ring structures of L=20 while fixing the inter-layer bonding to s=1 and changing the random potential intensity v. FIGS. 72, 74 and 76 show P(s) whilst FIG. 73, 75 and 77 show $\Delta_3$ statistics values. In each of FIGS. 72 through 77, when v is small, the system is in a metallic state, and the quantum level statistics is that of a quantum chaotic system of GOE. As v increases, the quantum level statistics changes toward the Poisson distribution. This is typical Anderson transition ((34) Phys. Rev. 109, 1492 (1958); (35) Phys. Rev. Lett. 42, 783(1979); (36) Rev. Mod. Phys. 57. 287(1985)).

Through a careful review of the case of v=2, it is confirmed that the chaotic tendency is enhanced as L increases. On the other hand, in case of v=22, as L increases, the system asymptotically changes toward the Poisson distribution. That is, as L increases, the level statistics values of this quantum system become more sensitive to changes of v.

Figure 78:
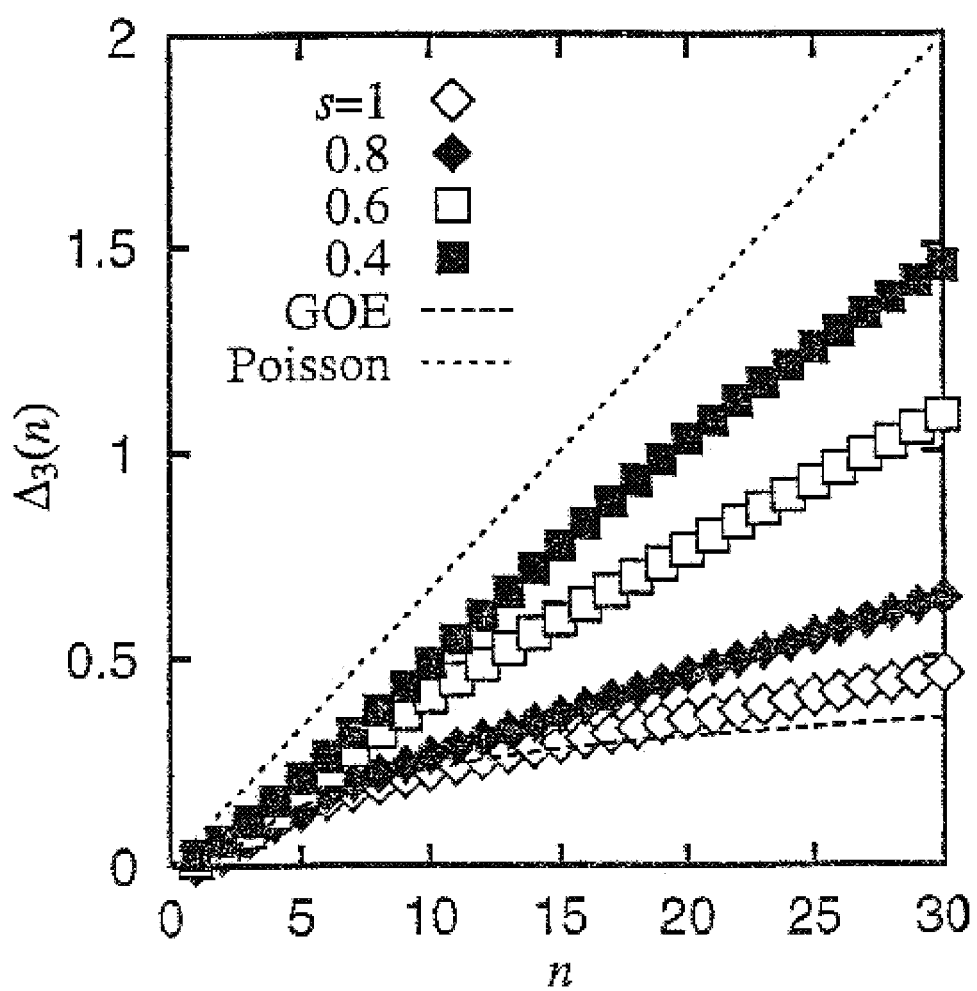
FIG. 78 is a rough diagram that shows quantum level statistics upon changes of s in case of v=2 and L=6 in the 11th embodiment of the invention.
Figure 79:
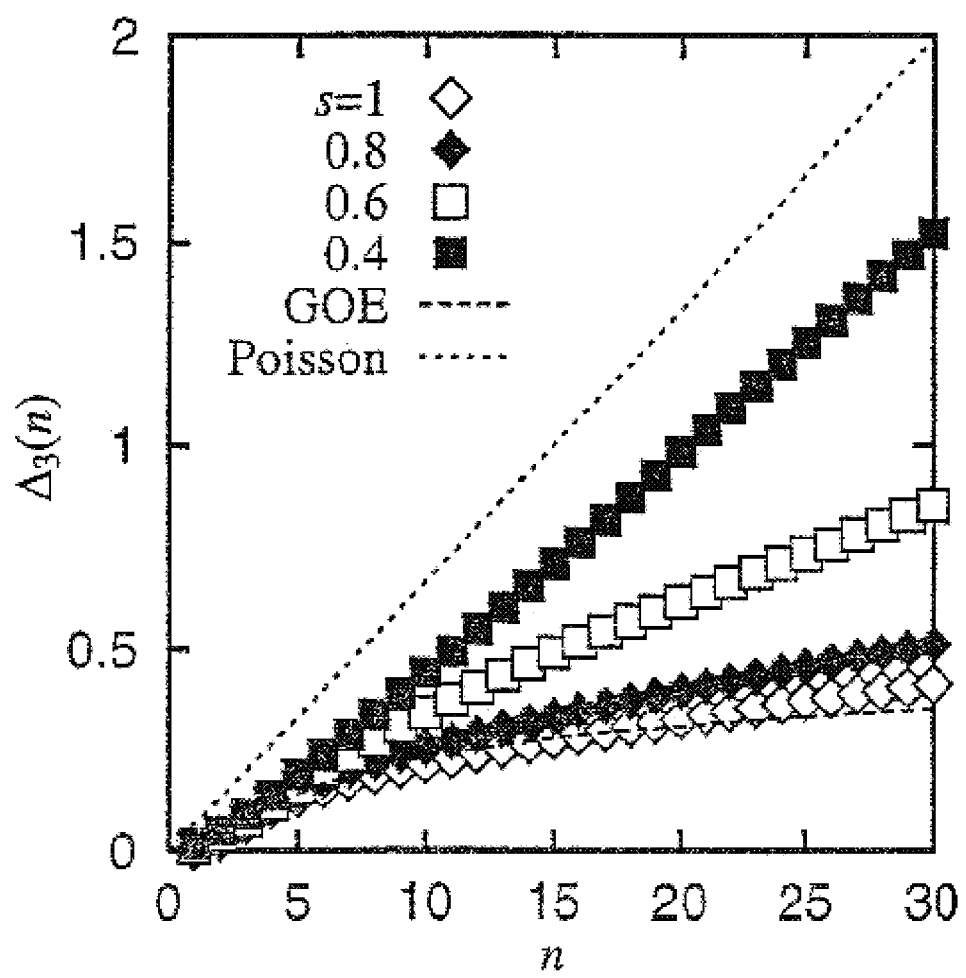
FIG. 79 is a rough diagram that shows quantum level statistics upon changes of s in case of v=2 and L=10 in the 11th embodiment of the invention.
Figure 80:
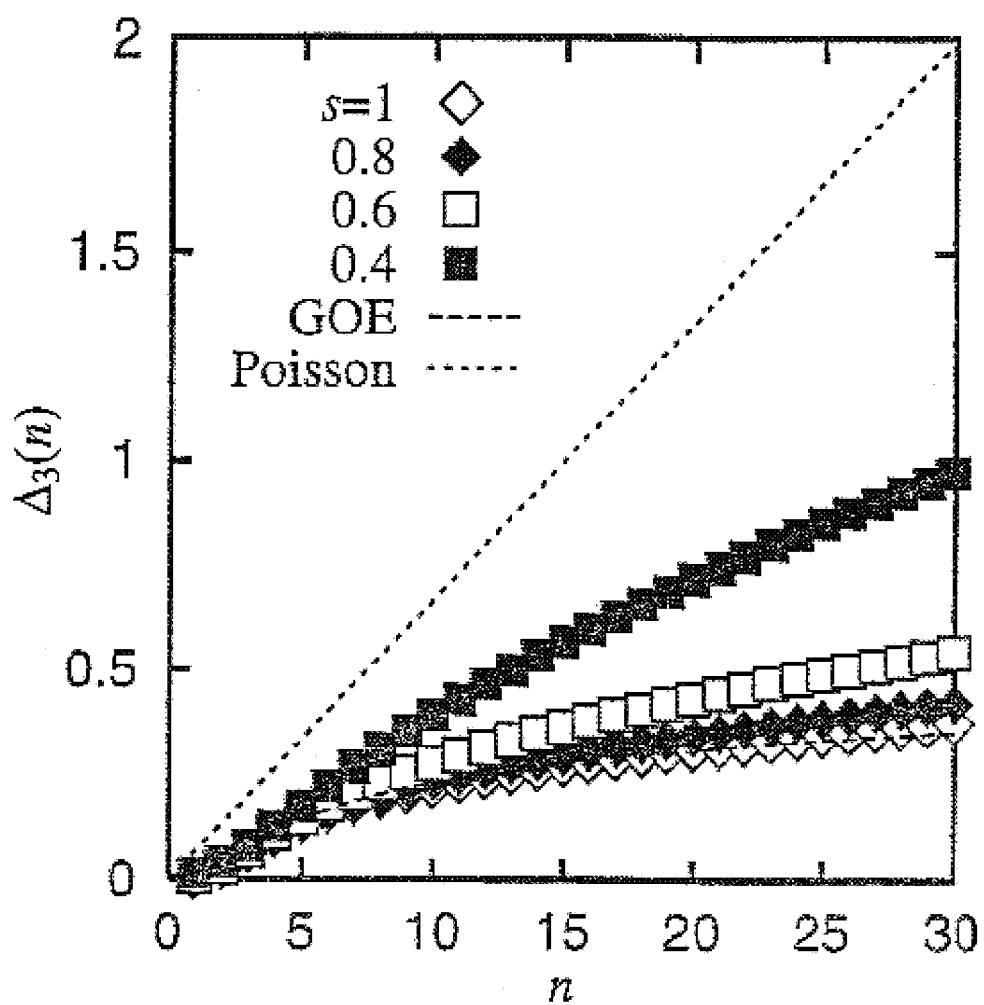
FIG. 80 is a rough diagram that shows quantum level statistics upon changes of s in case of v=2 and L=20 in the 11th embodiment of the invention.

Similarly to the multiply-twisted helix, here is explained is a result of analysis of a system in which the inter-layer bonding intensity s is decreased. While fixing v=2, FIG. 78 shows $\Delta_3$ statistics values of multiply-looped ring structures of L=6, FIG. 79 shows $\Delta_3$ statistics values of multiply-looped ring structures of L=10, and FIG. 80 shows $\Delta_3$ statistics values of multiply-looped ring structures of L=20. When s decreases from 1, the inter-layer bonding becomes weaker, and the spatial dimension reduces. Therefore, it results in enhancing localization. It is appreciated from FIGS. 78 through 80 that the system changes from a quantum chaotic sate to a considerably localized state along with changes from s=1 to s=0.4. The degree of the changes becomes larger as L becomes smaller. This is because, when L is small, because of a small diameter of the basic double ring, this is substantially a one-dimensional tube, but in contrast, when L is large, because of a large diameter of the basic double ring, this itself forms a two-dimensional sheet.

Next explained is a multiply-looped ring structure according to the 12th embodiment of the invention. In the 12th embodiment, parallel movement of inter-layer bonds in multiply-looped ring structures are introduced. Thereby, it is demonstrated that, by the use of this freedom, the nature of Mott metal-insulator transition occurring in multiply-looped ring structures can be controlled and inter-electron correlation intensity can be designed.

Explained below is an electron system on a multiply-looped ring in the multiply-looped ring structure according to the 12th embodiment.

Using a ring having L sites in one cycle, multiply-looped rings are defined hierarchically. Assuming q hierarchies or layers, the total number of sites is $L_q$. The sites are described by a q-dimensional cube.

$$a=(a_1,a_2,a_3 \ldots a_q) \tag{193}$$

where $a_k$ is an integer that satisfies $1 \leq a_k \leq L$.

Let the operator for generating an electron of spin $\sigma$ at the a-th lattice point be $\hat{C}_{a,\sigma}^\dagger$. Of course, there is the anticommutation relation $$\{\hat{c}_{a,\sigma}, \hat{c}_{b,\rho}^\dagger\} = \delta(a-b)\delta(\sigma-\rho) \tag{194}$$

Here is used $$\delta(a-b) = \prod_{j=1}^{q} \delta(a_j - b_j) \tag{195}$$

where $\delta(a-b)$ is a delta function defined by $$\delta(a-b) = \begin{cases} 1 & \text{when } a = b \\ 0 & \text{otherwise} \end{cases} \tag{196}$$

Here is defined a single-band Hubbard Hamiltonian $\hat{H}$ of the electron system as follows.

$$\hat{H} = t \sum_{a,b,\sigma} \lambda_{a,b} \hat{c}_{a,\sigma}^\dagger \hat{c}_{b,\sigma} + U \sum_a \hat{n}_{a,\uparrow} \hat{n}_{a,\downarrow} \tag{197}$$

Letting electrons be movable only among neighboring sites, $\lambda_{a,b}$ defines their bonding relation. First introduced is the following function.

$$\Xi^{(\pm)}(a,b;k,L) = \begin{cases} 1 & \text{when } b_k - a_k = \pm 1 \\ 1 & \text{when } b_k - a_k = \pm(1-L) \\ 0 & \text{otherwise} \end{cases} \tag{198}$$

This function has been introduced to provide a periodical boundary condition when loops of the period L are formed in the k-th layer. Next, $$\Psi(a,b;k) = \prod_{j=1}^{k-1} \delta(a_j - b_j) \tag{199}$$

is a function that takes 1 only when having the same suffix concerning layers beyond the k-th layer. Furthermore, by using $$Q(a,b;k,q) = \begin{cases} \prod_{j=2}^{q-k} \delta(a_{k+j} - j)\delta(b_{k+j} - j) & \text{when } q > k+1 \\ 1 & \text{when } q \leq k+1 \end{cases} \tag{200}$$

$$R^{(\pm)}(x;\alpha,L) = \delta\left(\text{mod}\left(x-1 \pm \frac{\alpha L}{2}, L\right)\right) \tag{201}$$

also introduced is $$\Phi^{(\pm)}(a,b;k,q) = R^{(\mp)}(a_{k+1};\alpha,L)R^{(\pm)}(b_{k+1};\alpha,L)Q(a,b;k,q) \tag{202}$$

Using these functions, $$\lambda_{a,b} = \lambda_{b,a} = \sum_{\sigma=+,-} \sum_{k=1}^{q} \Xi^\sigma(a,b;k,L)\Phi^{(\sigma)}(a;k,q)\Psi(a,b;k)s^{q-k} \tag{203}$$

is defined. Hereunder, s=1 is assumed.

For simplicity, in the subsequent procedures. a natural number j is defined as $$j = 1 + \sum_{k=1}^{q} (a_k - 1)L^{q-k} \tag{204}$$

In this manner, sites of the multiply-looped ring structure can be equated with a one-dimensional lattice of $1 \leq j \leq L_q$. Now defined are the operator of density of electrons with spin $\sigma$ in the j-th site $$\hat{n}_{j,\sigma} = \hat{c}_{j,\sigma}^\dagger \hat{c}_{j,\sigma} \tag{205}$$

and the sum thereof $$\hat{n}_j = \Sigma_\sigma \hat{n}_{j,\sigma} \tag{206}$$

For the purpose of defining a temperature Green's function, here is introduced a grand canonical Hamiltonian $$\hat{K} = \hat{H} - \mu\hat{N} \tag{207}$$

where $$\hat{N} = \Sigma_j \hat{n}_j \tag{208}$$

In the half filled taken here, chemical potential is $\mu = U/2$. The half-filled grand canonical Hamiltonian can be expressed as $$\hat{K} = t \sum_{i,j,\sigma} \lambda_{j,i} \hat{t}_{j,i,\sigma} + U/2 \sum_i (\hat{u}_i - 1) \tag{209}$$

Operators $\hat{t}_{j,i,\sigma}$, $\hat{j}_{j,i,\sigma}$, $\hat{u}_i$ and $\hat{d}_{i,\sigma}$ are defined beforehand as $$\hat{t}_{j,i,\sigma} = \hat{c}_{j,\sigma}{}^\dagger \hat{c}_{i,\sigma} + \hat{c}_{i,\sigma}{}^\dagger \hat{c}_{j,\sigma} \tag{210}$$

$$\hat{j}_{j,i,\sigma} = \hat{c}_{j,\sigma}{}^\dagger \hat{c}_{i,\sigma} - \hat{c}_{i,\sigma}{}^\dagger \hat{c}_{j,\sigma} \tag{211}$$

$$\hat{u}_i = \hat{c}_{i,\uparrow}{}^\dagger \hat{c}_{i,\uparrow} \hat{c}_{i,\downarrow}{}^\dagger \hat{c}_{i,\downarrow} + \hat{c}_{i,\uparrow} \hat{c}_{i,\uparrow}{}^\dagger \hat{c}_{i,\downarrow} \hat{c}_{i,\downarrow}{}^\dagger \tag{212}$$

$$\hat{d}_{i,\sigma} = \hat{c}_{i,\sigma}{}^\dagger \hat{c}_{i,\sigma} - \hat{c}_{i,\sigma} \hat{c}_{i,\sigma}{}^\dagger \tag{213}$$

If the temperature Green function is defined for operators $\hat{A}$ and $\hat{B}$ given, taking $\tau$ as imaginary time, it is as follows.

$$\langle \hat{A}; \hat{B} \rangle = -\int_0^\beta d\tau \langle T_\tau \hat{A}(\tau) \hat{B} \rangle e^{i\omega\tau} \tag{214}$$

The on-site Green function $$G_{j,\sigma}(i\omega_n) = \langle \hat{c}_{j,\sigma}; \hat{c}_{j,\sigma}{}^\dagger \rangle \tag{215}$$

is important for calculation of densities of states.

Imaginary time development of the system is obtained by the Heisenberg equation $$\frac{d}{d\tau}\hat{A}(\tau) = [\hat{K}, \hat{A}] \tag{216}$$

As the equation of motion of the on-site Green function, $$i\omega_n \langle \hat{c}_{j,\sigma}; \hat{c}_{j,\sigma}^\dagger \rangle = 1 + t\sum_{p,j} \lambda_{p,j} \langle \hat{c}_{p,\sigma}; \hat{c}_{j,\sigma}^\dagger \rangle + \frac{U}{2} \langle \hat{d}_{j,-\sigma}\hat{c}_{j,\sigma}; \hat{c}_{j,\sigma}^\dagger \rangle \tag{217}$$

is obtained. Then, the approximation shown below is introduced, following Gros ((31) C. Gros, Phys. Rev. B50, 7295(1994)). If the site p is the nearest-neighbor site of the site j, the resolution $$\langle \hat{c}_{p,\sigma}; \hat{c}_{j,\sigma}{}^\dagger \rangle \rightarrow t \langle \hat{c}_{p,\sigma}; \hat{c}_{p,\sigma}{}^\dagger \rangle \langle \hat{c}_{j,\sigma}; \hat{c}_{j,\sigma}{}^\dagger \rangle \tag{218}$$

is introduced as the approximation. This is said to be exact in case of infinite-dimensional Bethe lattices, rig but in this case, it is only within approximation. Under the approximation, the following equation is obtained.

$$(i\omega_n - t^2 \Gamma_{j,\sigma}) G_{j,\sigma} = 1 + \frac{U}{2} \langle \hat{d}_{j,-\sigma}\hat{c}_{j,\sigma}; \hat{c}_{j,\sigma}^\dagger \rangle \tag{219}$$

where $$\Gamma_{j,\sigma} = \sum_p \lambda_{p,j} G_{p,\sigma} \tag{220}$$

was introduced. To solve the equation obtained, $\langle \hat{d}_{j,-\sigma}\hat{c}_{j,\sigma}; \hat{c}_{j,\sigma}{}^\dagger \rangle$ has to be analyzed. In case of half-filled models, this equation of motion is $$i\omega_n \langle \hat{d}_{j,-\sigma}\hat{c}_{j,\sigma}; \hat{c}_{j,\sigma}^\dagger \rangle = \tag{221}$$

$$\frac{U}{2}G_{j,\sigma} - 2t\sum_p \lambda_{p,j}\langle \hat{j}_{p,j,-\sigma}\hat{c}_{j,\sigma}; \hat{c}_{j,\sigma}^\dagger \rangle + t\sum_p \lambda_{p,j}\langle \hat{d}_{j,-\sigma}\hat{c}_{p,\sigma}; \hat{c}_{j,\sigma}^\dagger \rangle$$

Here again, with reference to the Gros logic, approximation is introduced. It is the following translation.

$$\langle \hat{j}_{p,j,-\sigma}\hat{c}_{j,\sigma}; \hat{c}_{j,\sigma}{}^\dagger \rangle \rightarrow -tG_{p,-\sigma}\langle \hat{d}_{j,-\sigma}\hat{c}_{j,\sigma}; \hat{c}_{j,\sigma}{}^\dagger \rangle \tag{222}$$

$$\langle \hat{d}_{j,-\sigma}\hat{c}_{p,\sigma}; \hat{c}_{j,\sigma}{}^\dagger \rangle \rightarrow -tG_{p,\sigma}\langle \hat{d}_{j,-\sigma}\hat{c}_{j,\sigma}; \hat{c}_{j,\sigma}{}^\dagger \rangle \tag{223}$$

By executing this translation, the following closed equation is obtained.

$$(i\omega_n - t^2 \Gamma_{j,\sigma})G_{j,\sigma} = 1 + \frac{(U/2)^2}{i\omega_n - t^2\Gamma_{j,\sigma} - 2t^2\Gamma_{j,-\sigma}} G_{j,\sigma} \tag{224}$$

Here is assumed that there is no dependency on spin. That is, assuming $$G_j(i\omega_n) = G_{j,\uparrow}(i\omega_n) = G_{j,\downarrow}(i\omega_n) \tag{225}$$

the following calculation is executed. When analytic continuation is conducted as $i\omega_n \rightarrow \omega + i\delta$ for a small $\delta$, $$D_j(\omega) = -Im G_j(\omega + i\delta) \tag{226}$$

becomes the local density of states of the site j, and $$D(\omega) = \frac{1}{n}\sum_{j=1}^n D_j(\omega) \tag{227}$$

becomes the density of states of spin $\sigma$ electrons.

Values of DOS obtained by numerical calculation while fixing t=1 are shown below. Regarding L=3, 4, 6, 8, 10, 20, values in the following table are used as the number of layers q and the total number of sites $n=L^q$.

| L | q | n |
|---|---|---|
| 3 | 8 | 6561 |
| 4 | 6 | 4096 |
| 6 | 5 | 7776 |
| 8 | 4 | 4096 |
| 10 | 4 | 10000 |
| 20 | 3 | 8000 |

Figure 82:
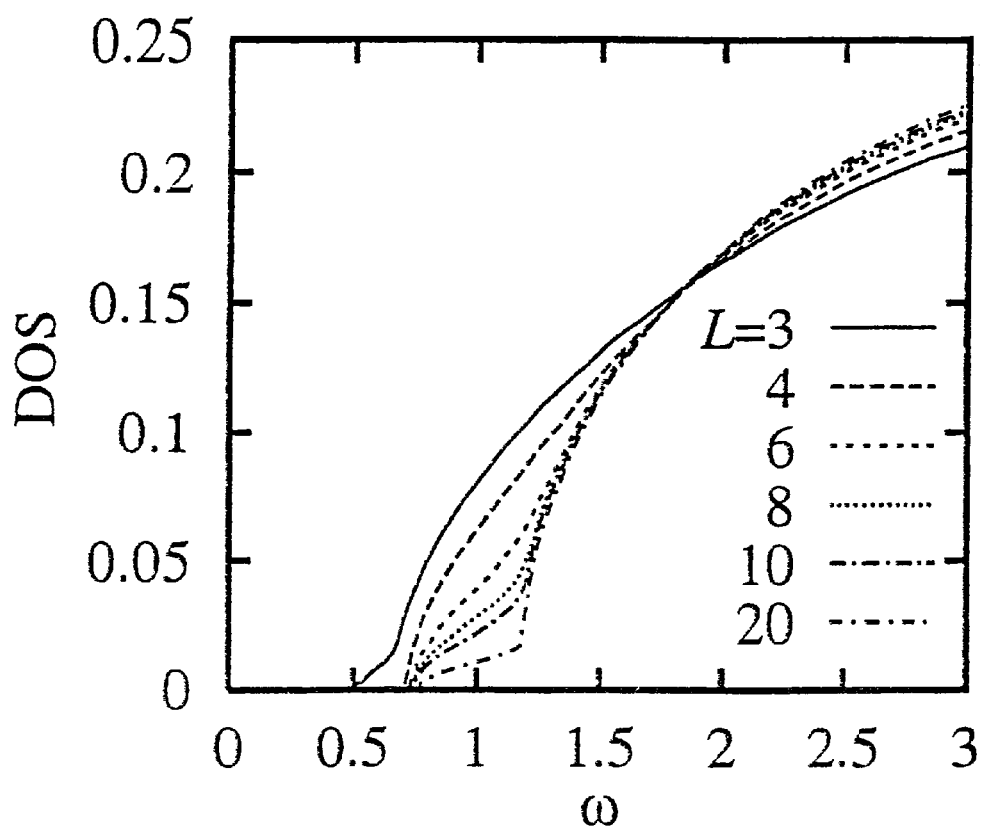
FIG. 82 is a rough diagram that shows a density of states obtained by numerical calculation in case of U=10 in a multiply-looped ring structure of α=0 as a comparative example in the 12th embodiment of the invention.
Figure 83:
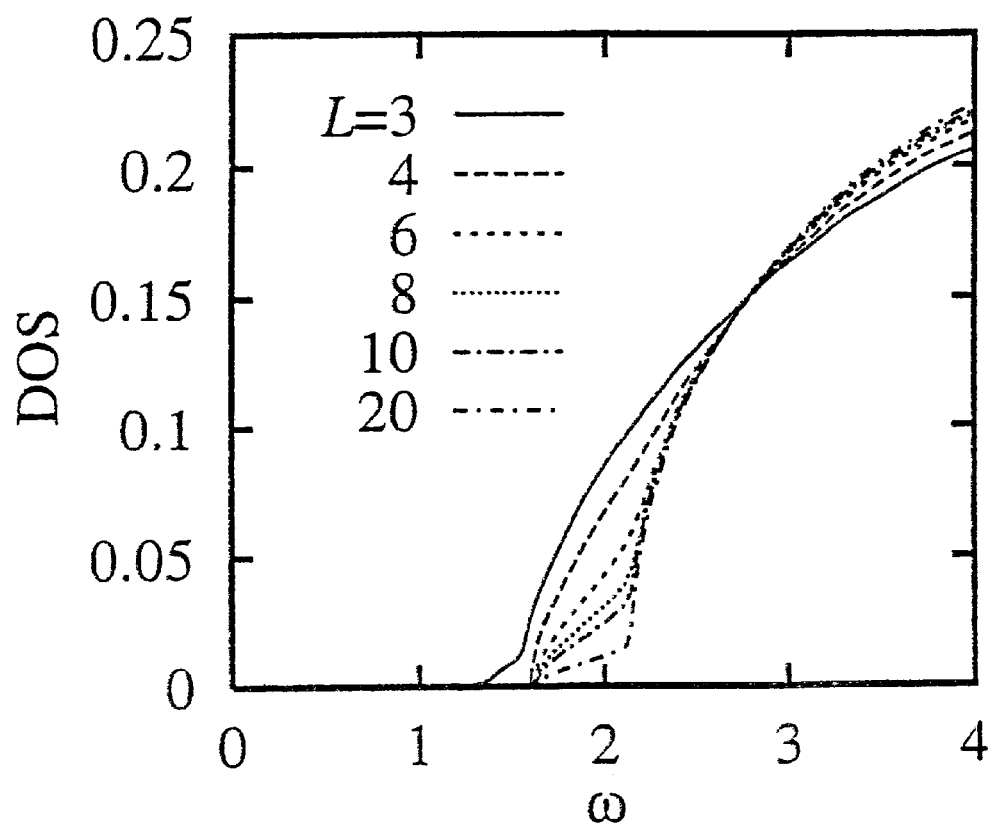
FIG. 83 is a rough diagram that shows a density of states obtained by numerical calculation in case of U=12 in a multiply-looped ring structure of α=0 as a comparative example in the 12th embodiment of the invention.

First, the case of $\alpha=0$ (tenth embodiment) is reviewed again. Numerical calculation was executed setting U=8 in FIG. 81, U=10 in FIG. 82, U=12 in FIG. 83, and selecting L=3, 4, 6, 8, 10, 20 for each value of U.

Figure 81:
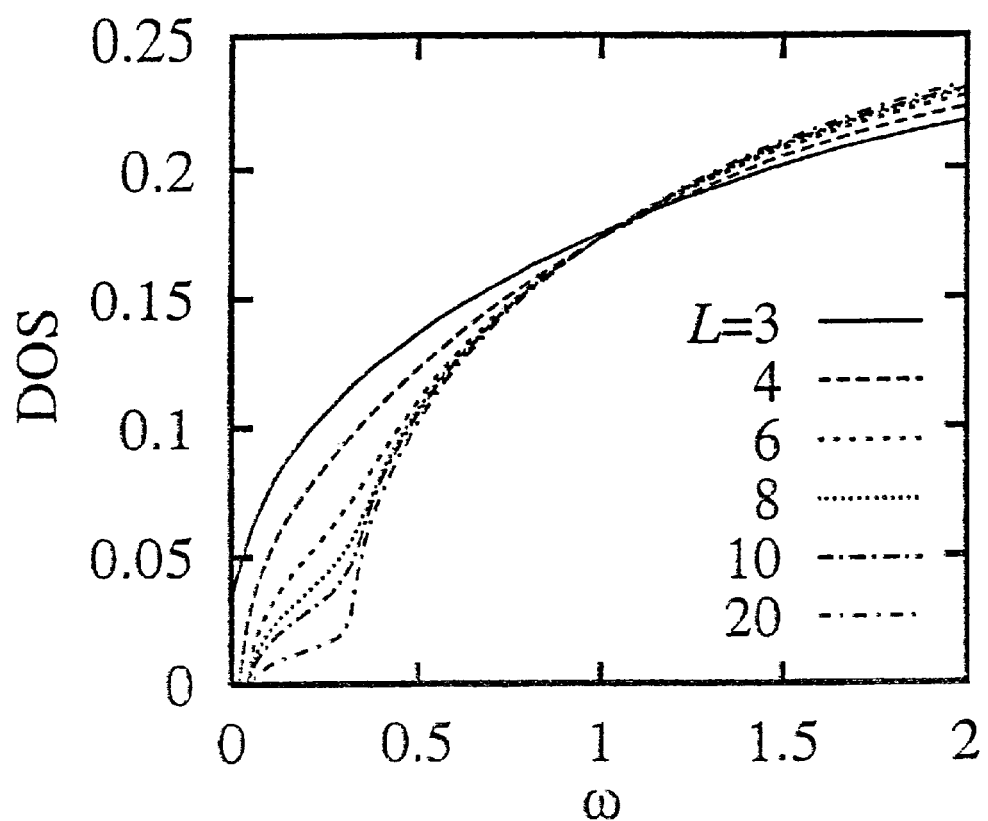
FIG. 81 is a rough diagram that shows a density of states obtained by numerical calculation in case of U=8 in a multiply-looped ring structure of α=0 as a comparative example in the 12th embodiment of the invention.

In FIG. 81, in case of L=3, the density of state $D(\omega=0)$ under the Fermi energy $\omega=0$ exists, and the electron system behaves as a metal. On the other hand, in FIGS. 82 and 83, a region where DOS has disappeared exists near the Fermi energy, and the system behaves as a Mott insulator. When densities of states corresponding to different values of L are remarked in FIG. 81, in case of L>4, the system has changed to an insulator. Therefore, in case of U=8, Mott metal-insulator transition has been confirmed to occur when L changes.

In case of $U \geq 10$, the system behaves as a Mott insulator under all analyrzed values of L, but since the value corresponding to a double of the value of $\omega$ rendering DOS be zero is the gap as the Mott insulator(Hubbard gap), it is appreciated that the width of the Hubbard gap increases with L. Therefore, it has been confirmed that Mott-Hubbard transition can be controlled by adjusting L.

Figure 84:
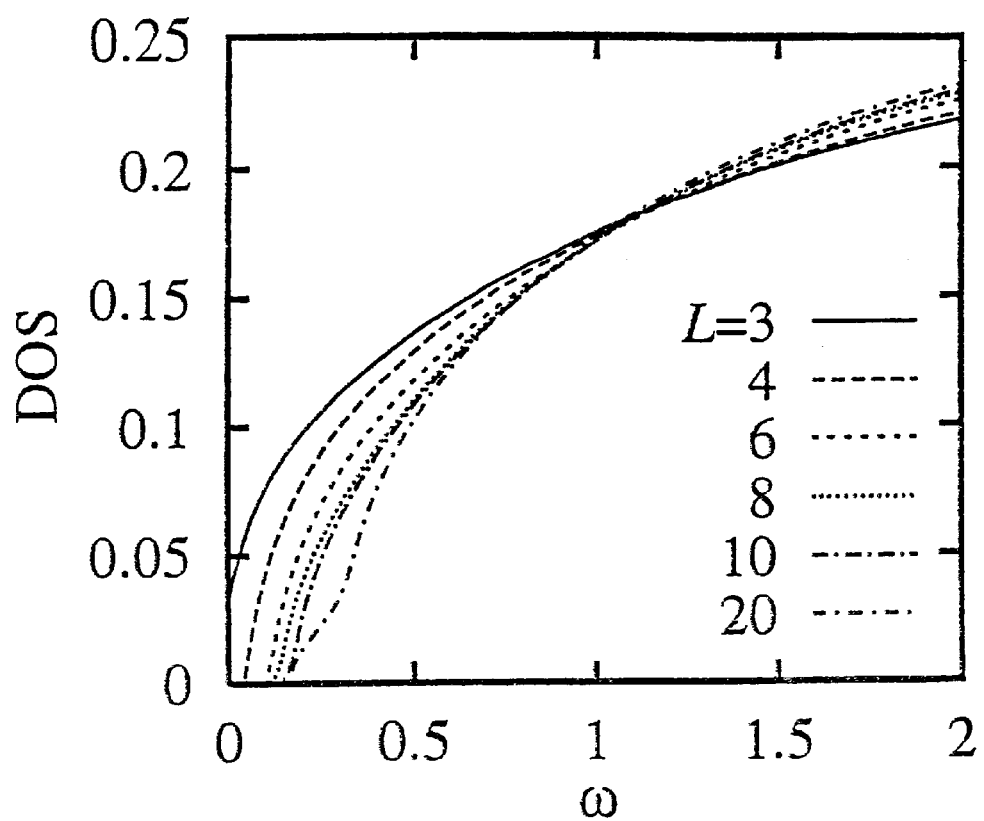
FIG. 84 is a rough diagram that shows a density of states obtained by numerical calculation in case of U=8 in the 12th embodiment of the invention.
Figure 85:
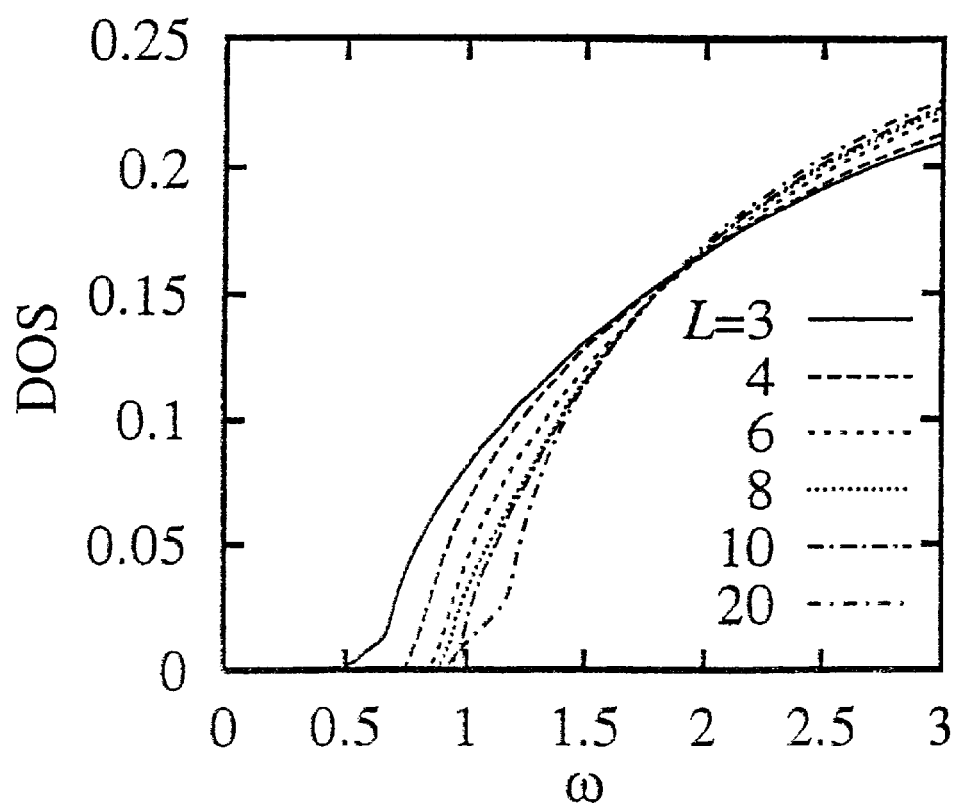
FIG. 85 is a rough diagram that shows a density of states obtained by numerical calculation in case of U=10 in the 12th embodiment of the invention.
Figure 86:
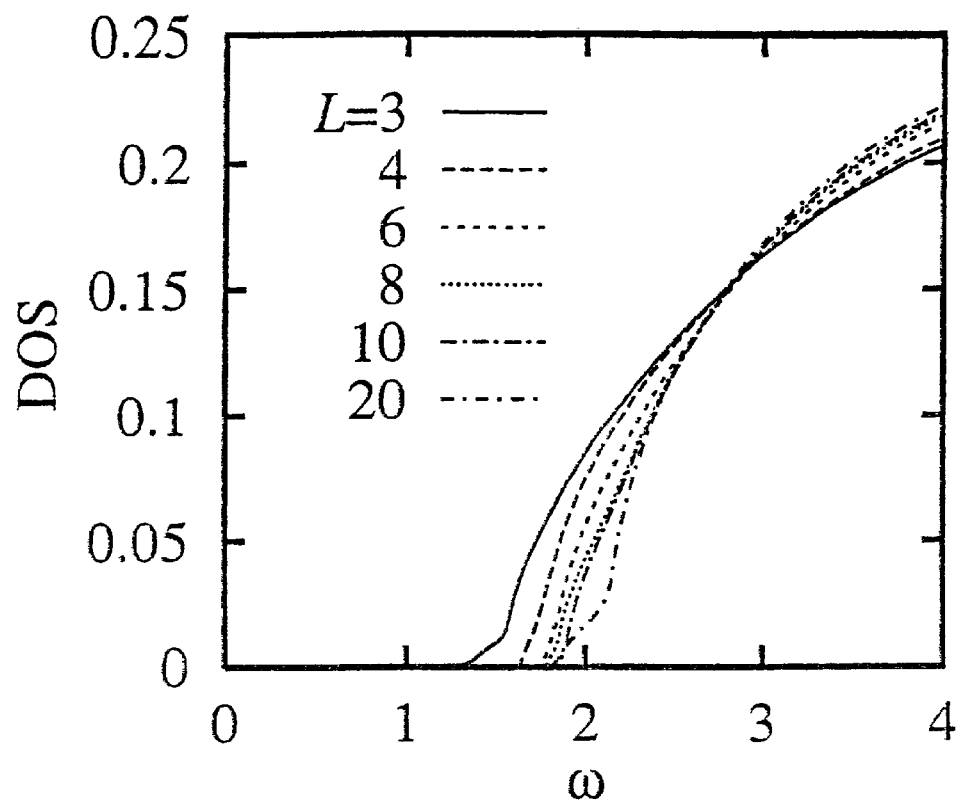
FIG. 86 is a rough diagram that shows a density of states obtained by numerical calculation in case of U=12 in the 12th embodiment of the invention.

FIGS. 84 through 86 show DOS of multiply-looped ring structures of $\alpha=0.5$ modified by parallel movement proposed here. Setting U=8 in FIG. 84, U=10, in FIG. 85 and U=12 in FIG. numerical calculation was executed, selecting L=3, 4, 6, 8, 10, 20 for each value of U. This model is characterized in the tail structure of the density of state is smaller than the case of α=0 and may even disappears. That is, when α>0, the Hubbard gap width increases, and the-tendency of the system as the Mott insulator is enhanced. This is the same as effect of parallel movement in a multiply-twisted helix (third embodiment), and it has been demonstrated that Mott metal-insulator transition in multiply-looped ring structures behave in the same manner as that in multiply-twisted helix.

Next explained is a multiply-looped ring structure according to the 13th embodiment of the invention. In the 13th embodiment, quantum level statistics will be analyzed concerning quantum states in the multiply-looped ring structure to which random potentials are introduced, thereby to demonstrate that quantum chaos can be controlled by addition of magnetic impurities.

Explained below is an electron system on a multiply-twisted ring in the multiply-looped ring structure according to the 13th embodiment.

Using a ring having L sites in one cycle, multiply-twisted rings are defined hierarchically. Assuming q hierarchies or layers, the total number of sites is $L_q$. The sites are described by a q-dimensional cube.

$$a=(a_1, a_2, a_3 \ldots a_q) \tag{228}$$

where $a_k$ is an integer that satisfies $1 \leq a_k \leq L$.

Let the operator for generating a quantum at the a-th lattice point be $\hat{c}_a^\dagger$. Of course, let the operator satisfy the anticommutation relation $$\{\hat{c}_a, \hat{c}_b^\dagger\} = \delta(a-b) \tag{229}$$

This quantum is a fermion having no free spin freedom. This corresponds to analysis of an electron in a solid in which spin orbit interaction can be disregarded. Here is used $$\delta(a-b) = \prod_{j=1}^{q} \delta(a_j - b_j) \tag{230}$$

where $\delta(a-b)$ is a delta function defined by $$\delta(a-b) = \begin{cases} 1 & \text{when } a = b \\ 0 & \text{otherwise} \end{cases} \tag{231}$$

Letting electrons be movable only among neighboring sites, $\lambda_{a,b}$ determines their bonding relations. First introduced is the following function.

$$\Xi^{(\pm)}(a,b;k,L) = \begin{cases} 1 & \text{when } b_k - a_k = \pm 1 \\ 1 & \text{when } b_k - a_k = \pm(1-L) \\ 0 & \text{otherwise} \end{cases} \tag{232}$$

This function has been introduced to provide a periodical boundary condition and bonds between adjacent loops in the k-th layer. Next introduced is $$\Psi(a,b;k) = \prod_{j=1}^{k-1} \delta(a_j - b_j) \tag{233}$$

This is a function that takes 1 only when having the same suffix concerning layers beyond the k-th layer. Furthermore, by using $$Q(a,b;k,q) = \begin{cases} \prod_{j=2}^{q-k} \delta(a_{k+j} - j)\delta(b_{k+j} - j) & \text{when } q > k+1 \\ 1 & \text{when } q \leq k+1 \end{cases} \tag{234}$$

$$R^{(\pm)}(x;\alpha,L) = \delta\left(\text{mod}\left(x - 1 \pm \frac{\alpha L}{2}, L\right)\right) \tag{235}$$

also introduced is $$\Phi^{(\pm)}(a,b;k,q) = R^{(\mp)}(a_{k+1};\alpha,L)R^{(\pm)}(b_{k+1};\alpha,L)Q(a,b;k,q) \tag{236}$$

Using these functions, $$\lambda_{a,b} = \lambda_{b,a} = \sum_{\sigma=+,-}\sum_{k=1}^{q} \Xi^{(\sigma)}(a,b;k,L)\Phi^{(\sigma)}(a;k,q)\Psi(a,b;k)s^{q-k} \tag{237}$$

is defined. When placing α=0, the above definition results in the same as that already discussed in the tenth embodiment. When α>0, the same effects as parallel movements of inter-layer bonds in the multiply-twisted helix is expected. Hereunder, using α=0.5, calculation will be conducted.

Generally, a natural number j is defined as $$j = 1 + \sum_{k=1}^{q}(a_k - 1)L^{q-k} \tag{238}$$

In this manner, sites of the multiply-looped ring structure can be equated with a one-dimensional lattice of $1 \leq j \leq L_q$. The Hamiltonian $\hat{H}$ of this quantum system is defined as $$\hat{H} = -\sum_{a,b} t_{a,b}\lambda_{a,b}\hat{c}_a^\dagger \hat{c}_b + \sum_a v_a \hat{c}_a^\dagger \hat{c}_a \tag{239}$$

The second term of the Hamiltonian is the term of the random potential. For each site, the random variable $$-\frac{v}{2} < v_a < \frac{v}{2} \tag{240}$$

is generated to form the Hamiltonian. The variable breadth v of the random potential is useful as a parameter determining the degree of the randomness. $t_{a,b}$ has been introduced for the random magnetic field.

Here is determined as $$t_{a,b} = \exp(i\theta_{a,b}) \tag{241}$$

where $\theta_{p,q} = -\theta_{b,a}$ is a random real number that satisfies $$0 < \theta_{a,b} < 2\pi \tag{242}$$

Due to hopping to the nearest-neighbor sites, the random phase factor $\theta_{a,b}$ is re-suffixed, depending the sites. If the phase factor is integrated in the loop making one turn around a lattice point, a magnetic flux passing through the loop is obtained. This means a magnetic field is locally introduced to the random distribution of $0 < \theta_{a,b} < 2\pi$ this magnetic field is absolutely random in both intensity and direction, and if it is averaged spatially, it becomes a zero magnetic field.

When eigen energy of the Hamiltonian $\hat{H}$ is $\epsilon_m$, and the eigen vector is $|m\rangle$, then $$\hat{H}|m\rangle = \epsilon_m |m\rangle \qquad (243)$$

where m=1, 2, ..., n.

First, n quantum levels $\epsilon_m$ are standardized such that their nearest-neighbor level spacing becomes 1 in average. The density of states of the system is defined by $$\rho(\varepsilon) = \frac{1}{n}\sum_{m=1}^{n} \delta(\varepsilon - \varepsilon_m) \qquad (244)$$

and its staircase function $$\lambda(\epsilon) = \int_{-\infty}^{\epsilon} d\eta \rho(\eta) \qquad (245)$$

is calculated. The staircase function obtained is converted by using a procedure called unfolding such that the density of states becomes constant in average. Using the quantum level obtained in this manner, the nearest-neighbor level spacing distribution P(s) and the $\Delta_3$ statistics of Dyson and Mehta are calculated as quantum level statistics. As taught by Literatures (32) and (33), by using these statistics, it can be detected whether quantum chaos has been generated or not. It is also known that a quantum chaotic system is sensitive to perturbation from outside similarly to the classical chaotic system, and analysis of quantum chaos is important as a polestar of designs of non-linear materials.

In case of an integrable system, nearest-neighbor level spacing distribution P(s) and $\Delta_3$ statistics are those of Poisson Distribution $$P_P(s) = e^{-s} \qquad (246)$$

$$\Delta_3(n) = \frac{n}{15} \qquad (247)$$

In case of a quantum chaos under a magnetic field, it becomes GUE distribution $$P_{GUE}(s) = \frac{32s^2}{\pi^2} e^{-\frac{4s^2}{\pi}} \qquad (248)$$

$$\Delta_3(n) = \frac{1}{2\pi^2}\left[\log(2\pi n) + \gamma - \frac{5}{4}\right] + O(n^{-1}) \qquad (249)$$

where $\gamma$ is the Euler's constant.

In this section, L, which determines the turn pitch of the multiply-looped ring structure, s, which determines the inter-layer bonding force, and v, which determines the intensity of the random potential, are varied as parameters. When L=6, 10, 20 is used as the turn pitch, the values

| L | q | n |
|---|---|---|
| 6 | 5 | 7776 |
| 10 | 4 | 10000 |
| 20 | 3 | 8000 | were used as the total number of sites. Statistics values are calculated by using 2001 quantum levels, in total, taking 1000 states on each side from the band center among n states used for each L.

Figure 87:
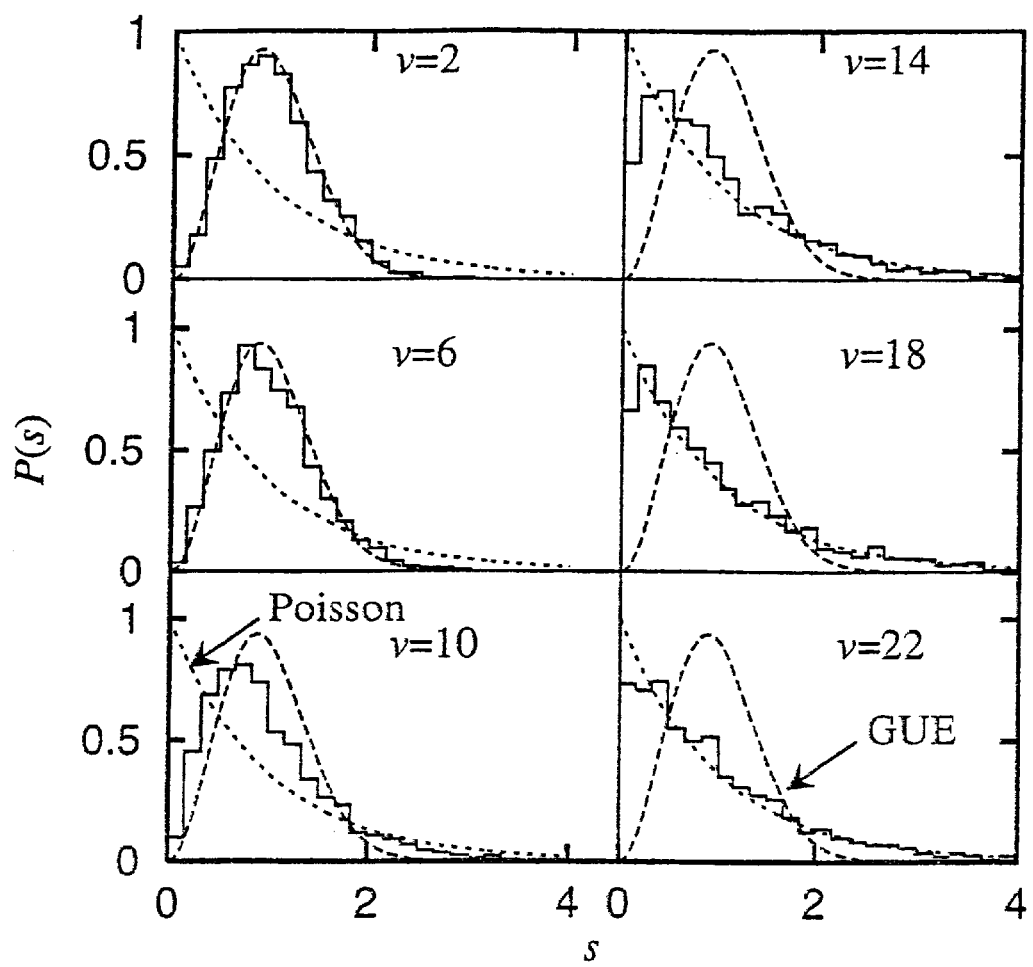
FIG. 87 is a rough diagram that shows quantum level statistics upon changes of V in case of L=6 and s=1 in the 13th embodiment of the invention.
Figure 88:
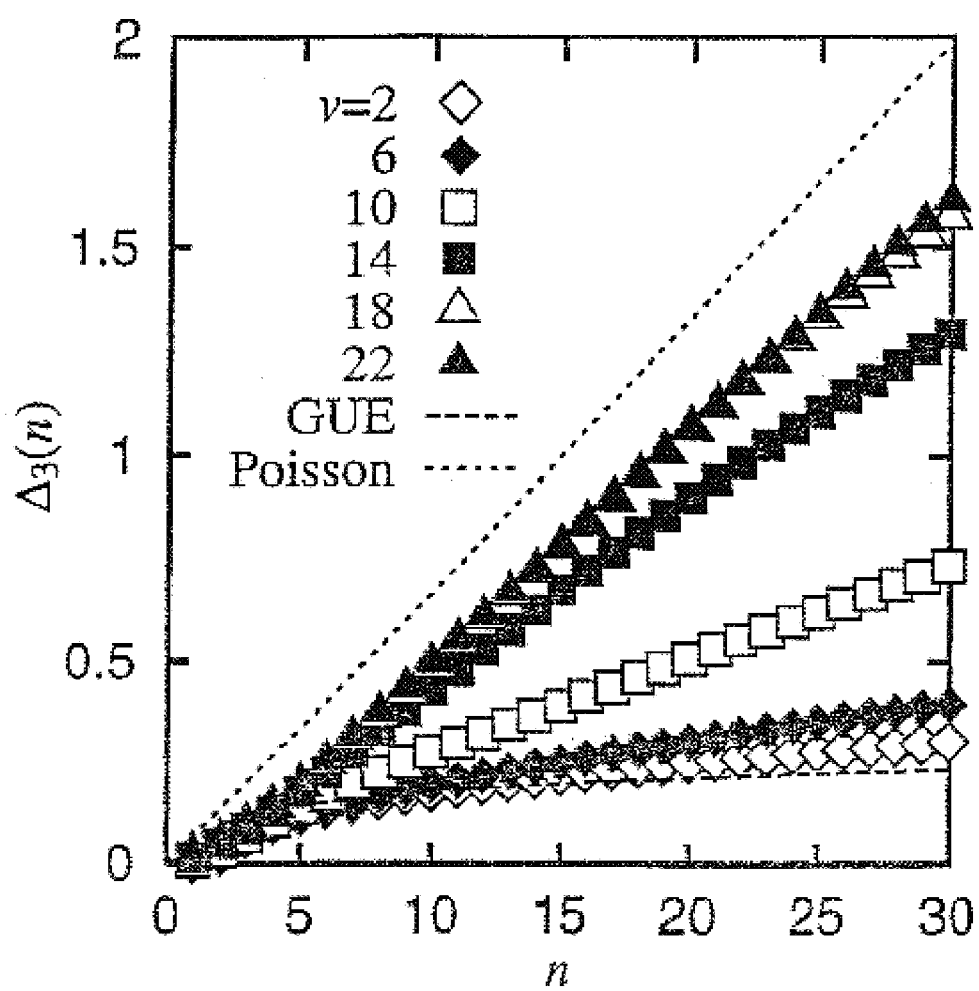
FIG. 88 is a rough diagram that shows quantum level statistics upon changes of V in case of L=6 and s=1 in the 13th embodiment of the invention.
Figure 89:
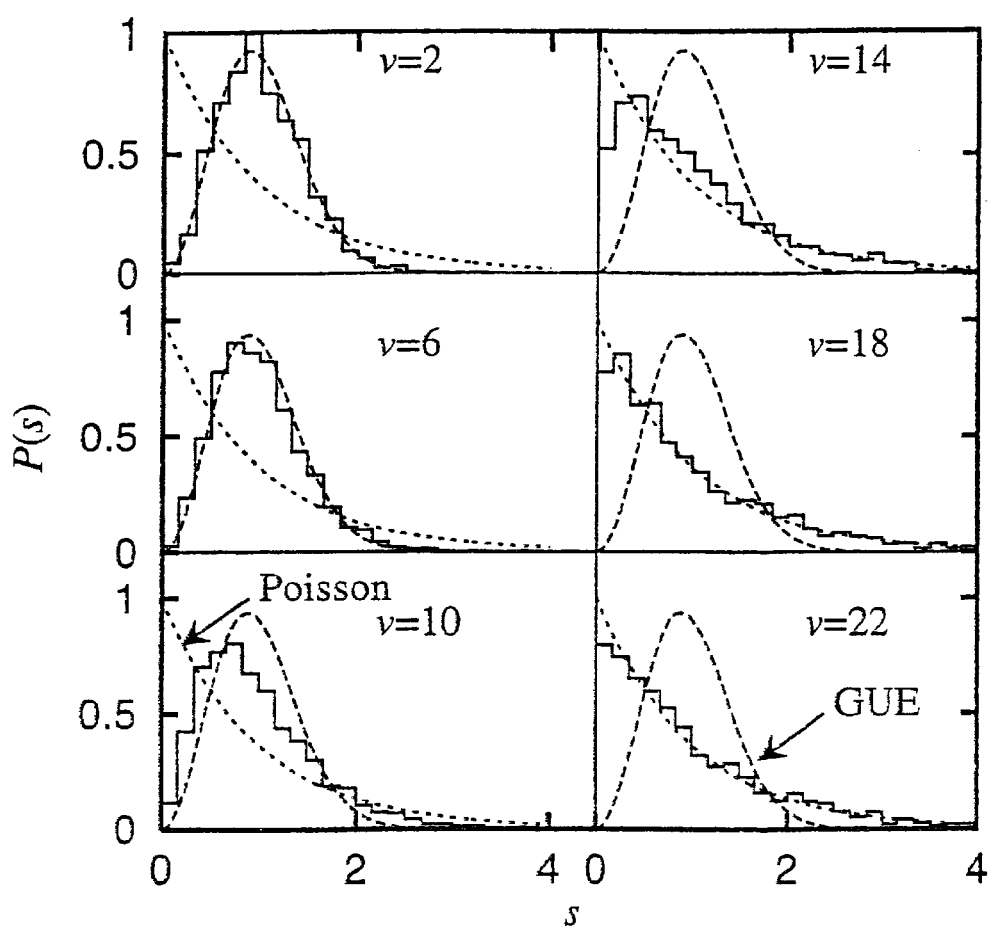
FIG. 89 is a rough diagram that shows quantum level statistics upon changes of V in case of L=10 and s=1 in the 13th embodiment of the invention.
Figure 90:
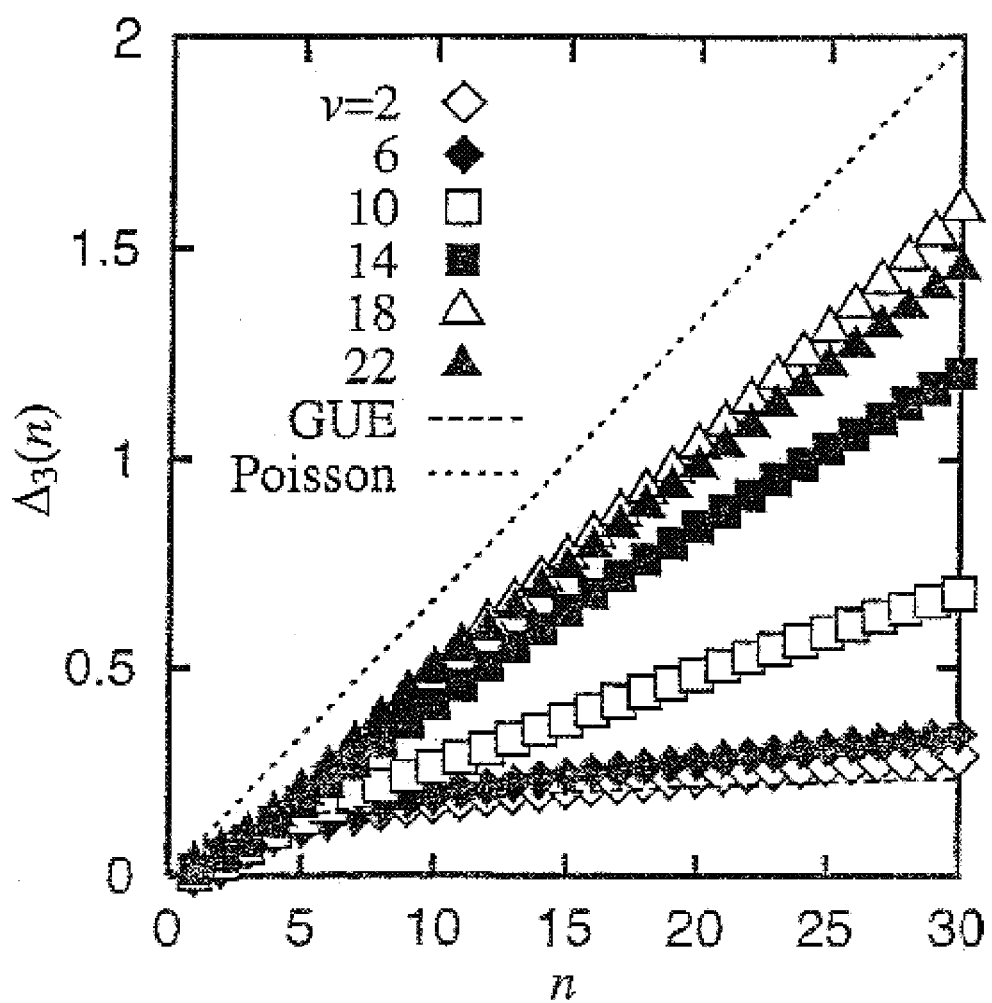
FIG. 90 is a rough diagram that shows quantum level statistics upon changes of V in case of L=10 and s=1 in the 13th embodiment of the invention.
Figure 91:
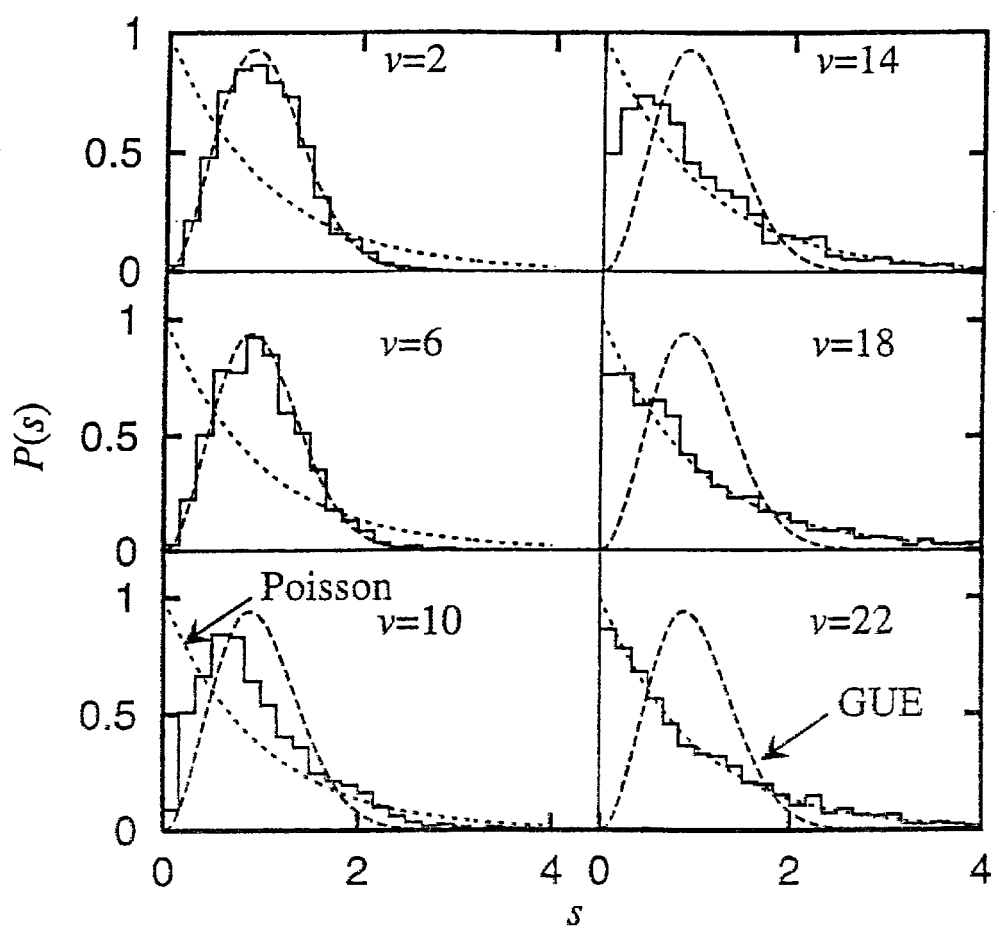
FIG. 91 is a rough diagram that shows quantum level statistics upon changes of V in case of L=20 and s=1 in the 13th embodiment of the invention.
Figure 92:
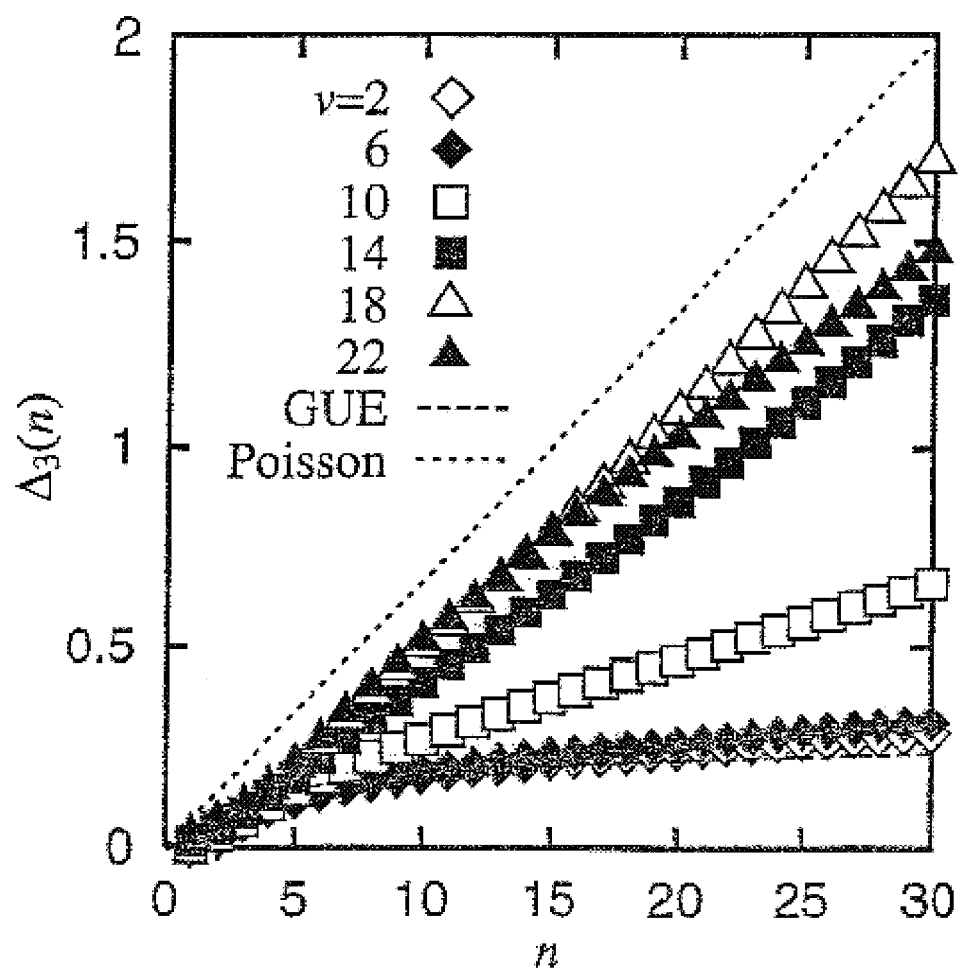
FIG. 92 is a rough diagram that shows quantum level statistics upon changes of V in case of L=20 and s=1 in the 13th embodiment of the invention.

FIG. 87 and FIG. 88 show quantum level statistics of multiply-looped ring structures of L=6 while fixing the inter-layer bonding to s=1 and changing the random potential intensity v. FIG. 89 and FIG. 90 show quantum level statistics of multiply-looped ring structures of L=10 while fixing the inter-layer bonding to s=1 and changing the random potential intensity v. FIG. 91 and FIG. 92 show quantum level statistics of multiply-looped ring structures of L=20 while fixing the inter-layer bonding to s=1 and changing the random potential intensity v. FIGS. 87, 89 and 91 show P(s) whilst FIG. 88, 90 and 92 show $\Delta_3$ statistics values. In each of FIGS. 87 through 92, when v is small, the system is in a metallic state, and the quantum level statistics is that of a quantum chaotic system of GUE. As v increases, the quantum level statistics changes toward the Poisson distribution. This is typical Anderson transition ((34) Phys. Rev. 109, 1492 (1958); (35) Phys. Rev. Lett. 42, 673(1979); (36) Rev. Mod. Phys. 57. 287(1985)).

Through a careful review of the case of v=2, it is confirmed that the chaotic tendency is enhanced as L increases. On the other hand, in case of v=22, as L increases, the system asymptotically changes toward the Poisson distribution. That is, as L increases, the level statistics values of this quantum system become more sensitive to changes of v.

Figure 93:
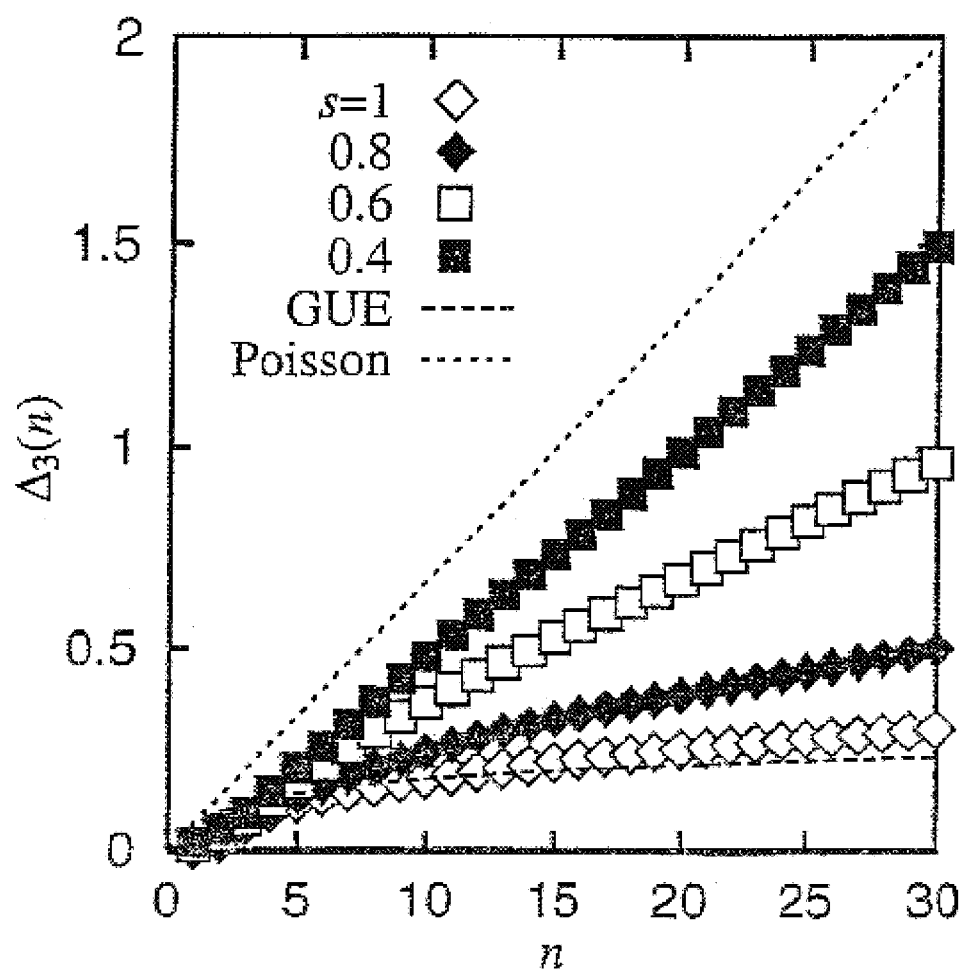
FIG. 93 is a rough diagram that shows quantum level statistics upon changes of s in case of L=6 and v=2 in the 13th embodiment of the invention.
Figure 94:
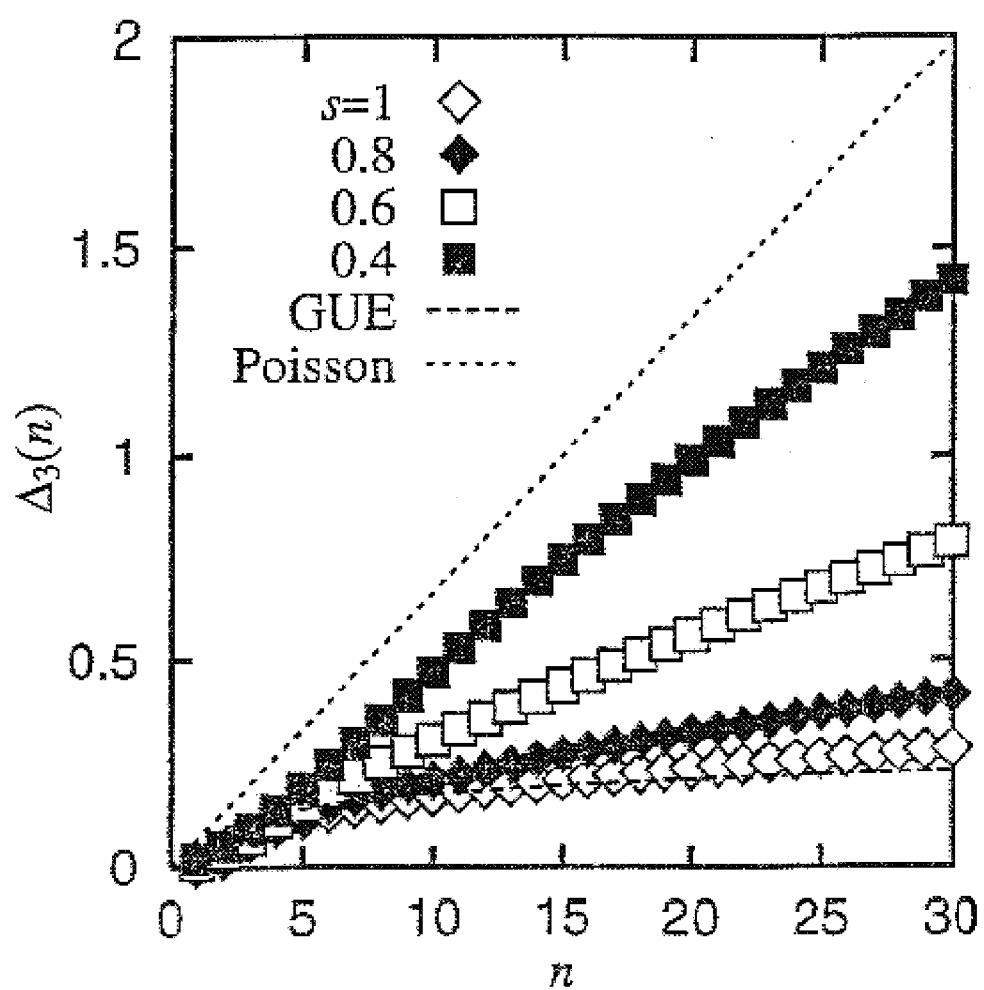
FIG. 94 is a rough diagram that shows quantum level statistics on changes of s in case of L=10 and v=2 in the 13th embodiment of the invention.
Figure 95:
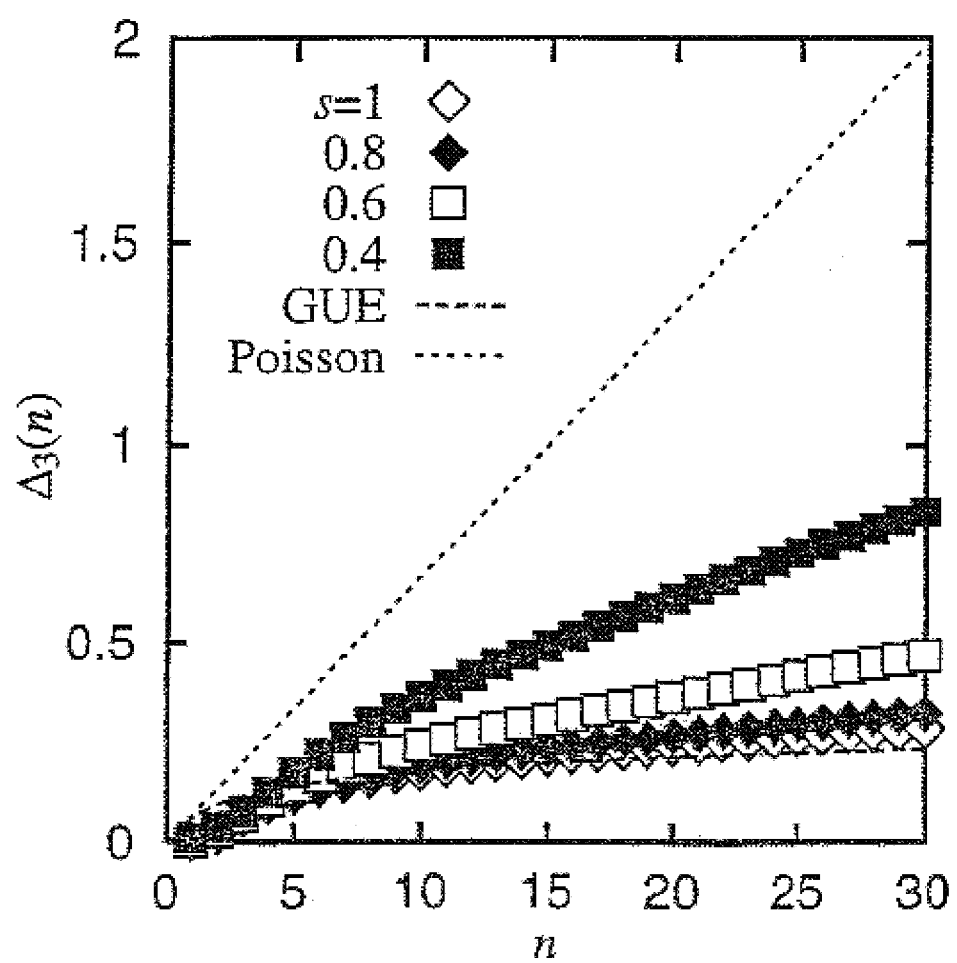
FIG. 95 is a rough diagram that shows quantum level statistics upon changes of s in case of L=20 and v=2 in the 13th embodiment of the invention.

Similarly to the multiply-twisted helix, here is explained is a result of analysis of a system in which the inter-layer bonding intensity s is decreased. While fixing v=2, FIG. 93 shows $\Delta_3$ statistics values of multiply-looped ring structures of L=6, FIG. 94 shows $\Delta_3$ statistics values of multiply-looped ring structures of L=10, and FIG. 95 shows $\Delta_3$ statistics values of multiply-looped ring structures of L=20. When s decreases from 1, the inter-layer bonding becomes weaker, and the spatial dimension reduces. Therefore, it results in enhancing localization. It is appreciated from FIGS. 93 through 95 that the system changes from a quantum chaotic sate to a considerably localized state along with changes from s=1 to s=0.4. The degree of the changes becomes larger as L becomes smaller. This is because, when L is small, because of a small diameter of the basic double ring, this is substantially a one-dimensional tube, but in contrast, when L is large, because of a large diameter of the basic double ring, this itself forms a two-dimensional sheet.

Next explained is a multiply-looped ring structure sys according to the 14th embodiment of the invention. In the 14th embodiment, it is demonstrated that the nature of ferromagnetic transition occurring in a multiply-looped ring structure can be controlled by the turn pitch or parallel movement of inter-layer bonds.

Explained below is a spin system on a multiply-twisted ring in the multiply-looped ring structure according to the 14th embodiment.

Using a ring having L sites in one cycle, multiply-twisted rings are defined hierarchically. Assuming q hierarchies or layers, the total number of sites is $L_q$. The sites are described by a q-dimensional cube.

$$a = (a_1, a_2, a_3 \ldots a_q) \qquad (250)$$

where $a_k$ is an integer that satisfies $1 \leq a_k \leq L$.

Hamiltonian H of this spin system is defined as follows.

$$H = -\sum_{a,b} \lambda_{a,b} S_a \cdot S_b \qquad (251)$$

Here is employed three-dimensional vectors having values at vertices of a regular octahedron. That is, $S_a=(1, 0, 0)$, $(-1, 0, 0)$, $(0, 1, 0)$, $(0, -1, 0)$, $(0, 0, 1)$, $(0, 0, -1)$ are allowable as the spin value. Letting spins be movable only among neighboring sites, $\lambda_{a,b}$ defines their bonding relation. First introduced is the following function.

$$\Xi^{(\pm)}(a,b;k,L) = \begin{cases} 1 & \text{when} \quad b_k - a_k = \pm 1 \\ 1 & \text{when} \quad b_k - a_k = \pm(1-L) \\ 0 & \text{otherwise} \end{cases} \quad (252)$$

This function has been introduced to provide a periodical boundary condition when loops of the period L are formed in the k-th layer. Next, $$\Psi(a,b;k) = \prod_{j=1}^{k-1} \delta(a_j - b_j) \quad (253)$$

is a function that takes 1 only when having the same suffix concerning layers beyond the k-th layer. $\delta(a-b)$ is a delta function defined by $$\delta(a-b) = \begin{cases} 1 & \text{when} \quad a = b \\ 0 & \text{otherwise} \end{cases} \quad (254)$$

Furthermore, by using $$Q(a,b;k,q) = \begin{cases} \prod_{j=2}^{q-k} \delta(a_{k+j} - j)\delta(b_{k+j} - j) & \text{when} \quad q > k+1 \\ 1 & \text{when} \quad q \leq k+1 \end{cases} \quad (255)$$

$$R^{(\pm)}(x;\alpha,L) = \delta\left(\text{mod}\left(x - 1 \pm \frac{\alpha L}{2}, L\right)\right) \quad (256)$$

also introduced is $$\Phi^{(\pm)}(a,b;k,q) = R^{(\mp)}(a_{k+1};\alpha,L)R^{(\pm)}(b_{k+1};\alpha,L)Q(a,b;k,q) \quad (257)$$

$\alpha$ is the quantity corresponding to parallel movement of inter-layer bonds in multiply-twisted helixes. What is analyzed here are multiply-looped ring structures of $\alpha=0$ and multiply-looped ring structures of $\alpha=0.5$ modified by parallel movements. Using these functions, $$\lambda_{a,b} = \lambda_{b,a} = \sum_{\sigma=+,-}\sum_{k=1}^{q}\Xi^{(\sigma)}(a,b;k,L)\Phi^{(\sigma)}(a;k,q)\Psi(a,b;k)s^{q-k} \quad (258)$$

is defined. Hereunder, s=1 is assumed.

For simplicity, in the subsequent procedures, a natural number j is defined as $$j = 1 + \sum_{k=1}^{q}(a_k - 1)L^{q-k} \quad (259)$$

In this manner, sites of the multiply-looped ring structure can be equated with a one-dimensional lattice of $1 \leq j \leq L_q$.

For the purpose of calculating physical values at finite temperatures using statistical mechanics, a distribution function $$Z = \sum_{\{S_p\}} e^{-\beta H} \quad (260)$$

is introduced, where T is the temperature, and $\beta=1/T$ and $k_B=1$ are used. Expected value concerning an arbitrary function $f(S_j)$ of the spin variable is calculated by $$\langle f(S_j) \rangle = \frac{1}{Z}\sum_{\{S_p\}} f(S_j)e^{-\beta H} \quad (261)$$

When n is the total number of sites, expected value of spontaneous magnetization is $$M = \frac{1}{n}\sum_{j=1}^{n}\langle S_j \rangle \quad (262)$$

Spontaneous magnetization is calculated by using the Metropolis method that is one of the Monte Carlo methods. Using 100000 as the Monte Carlo steps, different turn pitches, L=3, 4, 6, 8, 10, 20, were analyzed. For each of them, the following total numbers of sites were used.

| L  | q | n     |
|----|---|-------|
| 3  | 8 | 6561  |
| 4  | 6 | 4096  |
| 6  | 5 | 7776  |
| 8  | 4 | 4096  |
| 10 | 4 | 10000 |
| 20 | 3 | 8000  |

Figure 96:
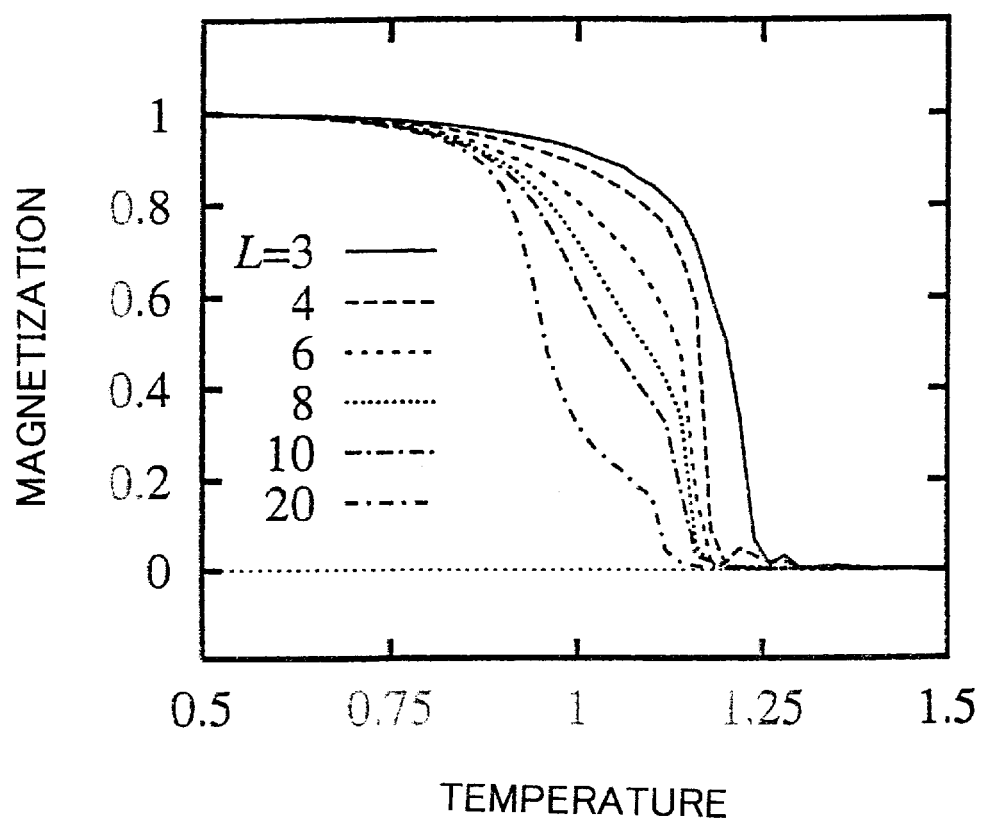
FIG. 96 is a rough diagram that shows spontaneous magnetization obtained by numerical calculation when L is changed in case of α=0 in the 14th embodiment of the invention.
Figure 97:
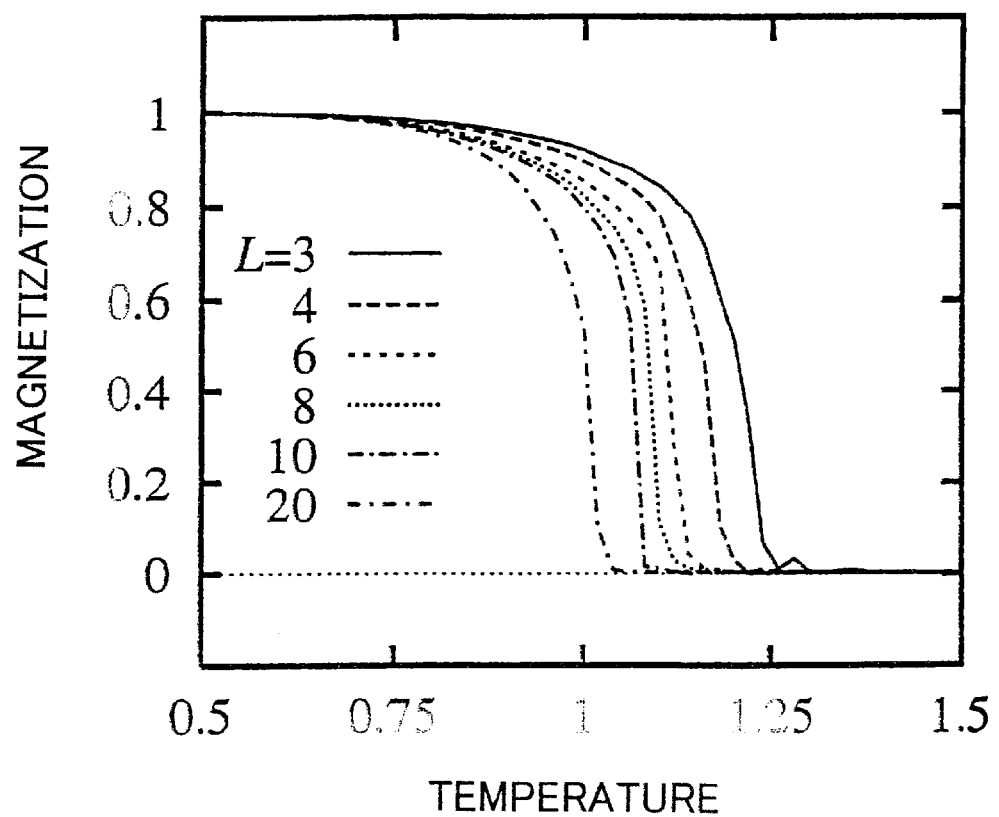
FIG. 97 is a rough diagram that shows spontaneous magnetization obtained by numerical calculation when L is changed in case of α=0.5 in the 14th embodiment of the invention.

FIG. 96 shows spontaneous magnetization in case of $\alpha=0$. Similarly to the ferromagnetic transition in multiply-twisted helixes, critical temperature apparently varies with L. FIG. 97 shows spontaneous magnetization in case of $\alpha=0.5$. A shoulder-like structure observed in FIG. 96 of a large L disappears here, and changes of the phase transition temperature is remarkable. That is, excellent control has been realized. It has been thus confirmed that ferromagnetic transition in multiply-looped ring structures can be controlled by the turn pitch and parallel movements of inter-layer bonds.

Next explained is a multiply-twisted helix according to the 15th embodiment of the invention. In the 15th embodiment, explanation will be made about a helix-based hierarchy of multiple connections in which bonds of $s^k$ in multiply-twisted helixes are bonded with a force s and make up $s^{k-1}$ chains. As will be explained later, it will be demonstrated that, while this system exhibits small dependency of ferromagnetic transition upon the number of turns N and temperature changes of the opposite sign from that of multiply-twisted helixes, it strongly depends on the value of s. Making use of this dependency, physical phenomena appearing in the helix-based hierarchy of multiple connections can be controlled.

First, the multiply-twisted helix (MTH) is reviewed once again. Assuming a one-dimensional lattice, numbers are assigned as q= ..., -1, 0, 1, .... The spin at the q-th site is designated by $S_q$. When Hamiltonian H of the spin system discussed below is defined by $$H = -\sum_{p,q} J_{p,q} S_p \cdot S_q \qquad (263)$$

positional relation between spins is determined by employing as $J_{p,q}$ $$J_{p,q} = J_{q,p} = \begin{cases} 1 & \text{when} \quad |p-q|=1 \\ s & \text{when} \quad |p-q|=N \\ s^2 & \text{when} \quad \mod(p,N)=0 \text{ and } q=p+N^2+f(N) \\ s^3 & \text{when} \quad \mod(p,N^2)=1 \text{ and } q=p+N^3+f(N^2) \\ s^4 & \text{when} \quad \mod(p,N^3)=2 \text{ and } q=p+N^4+f(N^3) \\ \vdots \\ 0 & \text{otherwise} \end{cases} \qquad (264)$$

and a multiply-twisted helix is introduced. mod(a, b) is the remainder as a result of division of a by b.

The average of nearest-neighbor sites in a q-layered structure is obtained as $$\bar{z}_q(N) = 2 + 2 + 2\left(\frac{1}{N} + \frac{1}{N^2} + \ldots + \frac{1}{N^{q-1}}\right) = 4 + 2\frac{1-N^{1-q}}{N-1} \qquad (265)$$

and when $q \to \infty$, $$\bar{z}_\infty(N) = 4 + 2/(N-1) \qquad (266)$$

is obtained.

The helix-based hierarchy of multiple connections (HBHMC) explained in the 15th embodiment is defined as shown below. Assuming a one-dimensional lattice, numbers are assigned as x= ..., −1, 0, 1, .... The spin variable at the x-th lattice point is denoted by S(x).

Hamiltonian $H_1$ of a spiral is defined as follows.

$$H_1 = -\sum_x S(x) \cdot S(x+1) - s \sum_x S(x) \cdot S(x+N) \qquad (267)$$

For the purpose of introducing high-order bonds, sites are added cumulatively. $H_2$ describing secondary bonds is $$H_2 = -s \sum_{\mod(x,N)=0} [S(x) \cdot S_2(x,1) + S_2(x,1) \cdot S(x+N^2+f(N))] \qquad (268)$$

$H_3$ describing tertiary bonds is $$H_3 = -s \sum_{\mod(x,N^2)=1} [S(x) \cdot S_3(x,1) + S_3(x,1) \cdot S_3(x,2) + S_3(x,2) \cdot S(x+N^3+f(N^2))] \qquad (269)$$

$H_4$ describing quaternary bonds is $$H_4 = -s \sum_{\mod(x,N^2)=2} [S(x) \cdot S_4(x,1) + S_4(x,1) \cdot S_4(x,2) + S_4(x,2) \cdot S_4(x,3) + S_4(x,3) \cdot S(x+N^4+f(N^3))] \qquad (270)$$

Generally for $q \geq 2$ $$H_q = -s \sum{}' \left[ S(x) \cdot S_q(x+1) + \left(\sum_{k=1}^{q-2} S_q(x,k) \cdot S_q(x,k+1)\right) + S_q(x,q-1) \cdot S(x+N^q+f(N^{q-1})) \right] \qquad (271)$$

Figure 98A:
FIGS. 98A–C is a rough diagram that shows actual bonding in a helix-based hierarchy of multiple connections according to the 15th embodiment of the invention.
Figure 98B:
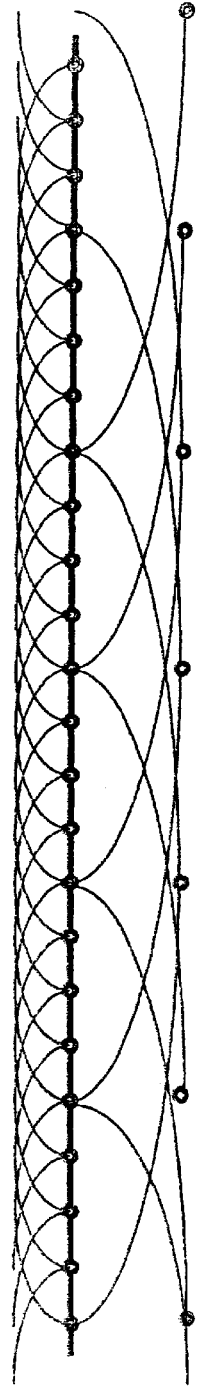
Figure 98C:
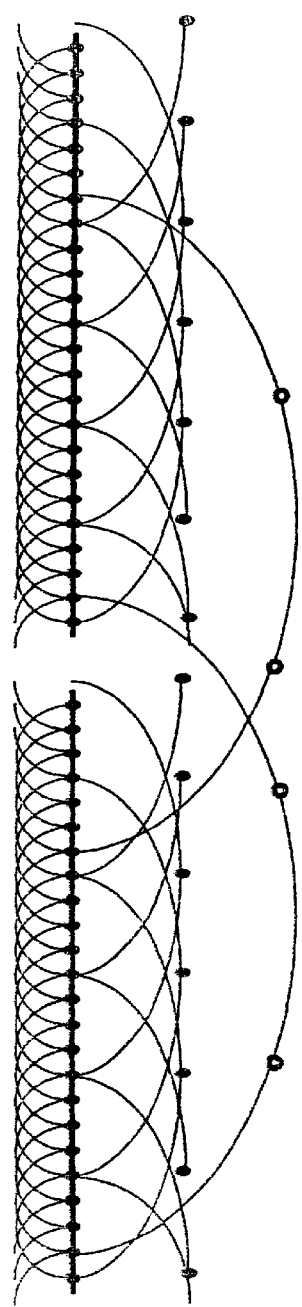

$\Sigma'$, however, is conducted only with x that satisfies mod(x, $N^{q-1}$)=q−2. Using it, Hamiltonian defined by $$H = \sum_{q=1}^\infty H_q \qquad (272)$$

is discussed. This site-to-site relation is shown in FIG. 98.

As to the helix-based hierarchy of multiple connections defined above, here is calculated the expected value of the number of nearest-neighbor sites. Assume here that the main chain spiral is made up of M sites. Regarding this main chain spiral, the expected number of nearest-neighbor sites is the same as that of the multiply-twisted spiral. Assuming q layers, the number of sites added other than the main chain spiral is found to be $$num_q(N) = M\left(\frac{1}{N} + \frac{2}{N^2} + \ldots + \frac{q-1}{N^{q-1}}\right) \qquad (273)$$

This $num_q(N)$ can be calculated by using $$\Gamma = \sum_{m=1}^k mr^m = \frac{1}{(1-r)^2}[r - (k+1)r^{k+1} + kr^{k+2}] \text{ and} \qquad (274)$$

$$num_q(N) = \frac{M}{(N-1)^2}[N + (q-1)N^{1-q} - qN^{2-q}] \qquad (275)$$

is obtained, which results in $$num_\infty(N) = \lim_{q \to \infty} num_q(N) = M\frac{N}{(N-1)^2} \qquad (276)$$

Considering that all of the added sites each have two nearest-neighbor sites, the expected number of nearest-neighbor sites of the entire system is found to be $$\bar{\omega}_\infty(N) = \frac{1}{M + num_\infty(N)}[M\bar{z}_\infty(N) + 2num_\infty(N)] = 4 - \frac{2}{N^2 - N + 1} \qquad (277)$$

Figure 99:
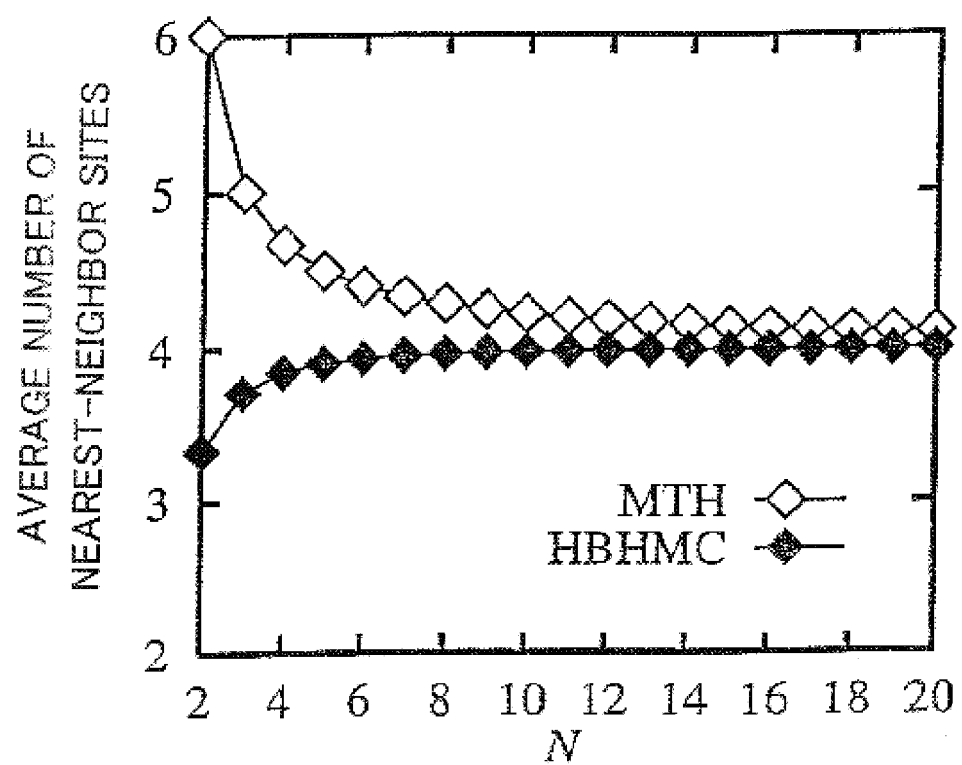
FIG. 99 is a rough diagram that shows changes of the average number of nearest-neighbor sites with N in a helix-based hierarchy of multiple connections and a multiply-twisted helix according to the 15th embodiment of the invention.

FIG. 99 shows $\bar{z}_\infty(N)$ and $\bar{\omega}_\infty(N)$. What should be noted is the dependency on N and that, while $\bar{z}_\infty(N)$ was a decreasing function, $\bar{\omega}_\infty(N)$ is an increasing function. In addition, since the deviation from 4 contains $N^{-2}$, $\bar{\omega}_\infty(N)$ quickly asymptotically approaches 4 and loses dependency on N. From this phenomenon, in ferromagnetic transition expected in the helix-based hierarchy of multiple connections, it is expected that N dependency of the critical temperature oppositely behaves from that of a multiply-twisted helix, and the variation width is presumed to be small. However, this is about a system in which all bonds are equal in force, that is, s=1, and the following simulations demonstrate that the critical temperature can be favorably modulated by changing s.

The helix-based hierarchy of multiple connections analyzed here is made up of M=5000 sites. This spin system is analyzed by Mote Carlo simulation. Here is employed a three-dimensional vector having values at vertices of a regular octahedron. That is, (1, 0, 0), (−1, 0, 0), (0, 1, 0), (0, −1, 0), (0, 0, 1), (0, 0, −1) are allowable as the spin value. For the purpose of calculating physical values at finite temperatures using statistical mechanics, a distribution function $$Z = \sum_{\{S_p\}} e^{-\beta H} \tag{278}$$

is introduced, where T is the temperature, and $\beta=1/T$ and $k_B=1$ are used. Expected value concerning an arbitrary function $f(S_j)$ of the spin variable is calculated by $$\langle f(S_j) \rangle = \frac{1}{Z} \sum_{\{S_p\}} f(S_j) e^{-\beta H} \tag{279}$$

When n is the total number of sites, expected value of spontaneous magnetization is $$M = \frac{1}{n} \sum_{j=1}^{n} \langle S_j \rangle \tag{280}$$

Spontaneous magnetization is calculated by using the Metropolis method that is one of the Monte Carlo methods. 100000 was used as the Monte Carlo steps, and N=3, 4, 6, 8, 10, 20 were analyzed as the turn pitch.

Figure 100:
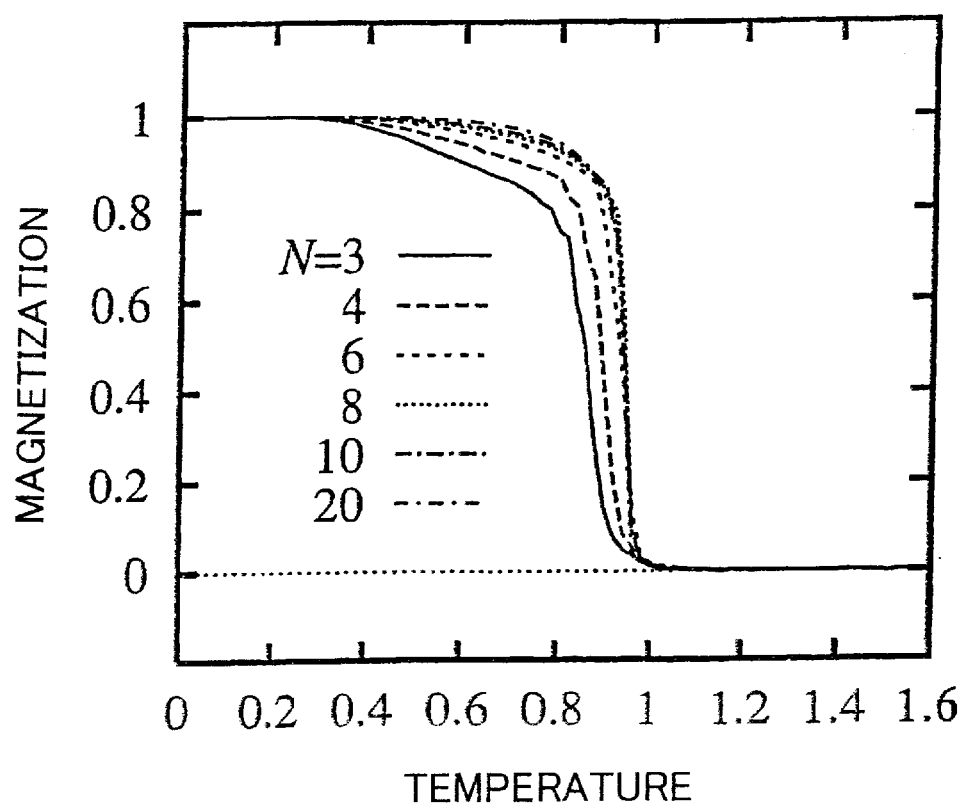
FIG. 100 is a rough diagram that shows spontaneous magnetization obtained by numerical calculation in case of N=3, 4, 6, 8, 10, 20 in the 15th embodiment of the invention.

FIG. 100 shows magnetization curves for various N when fixing s=1. It is first recognized that dependency of the transition temperature for disappearance of spontaneous magnetization upon N is small. Then, a result has been obtained that the transition temperature increases as N increases, as assumed previously.

Figure 101:
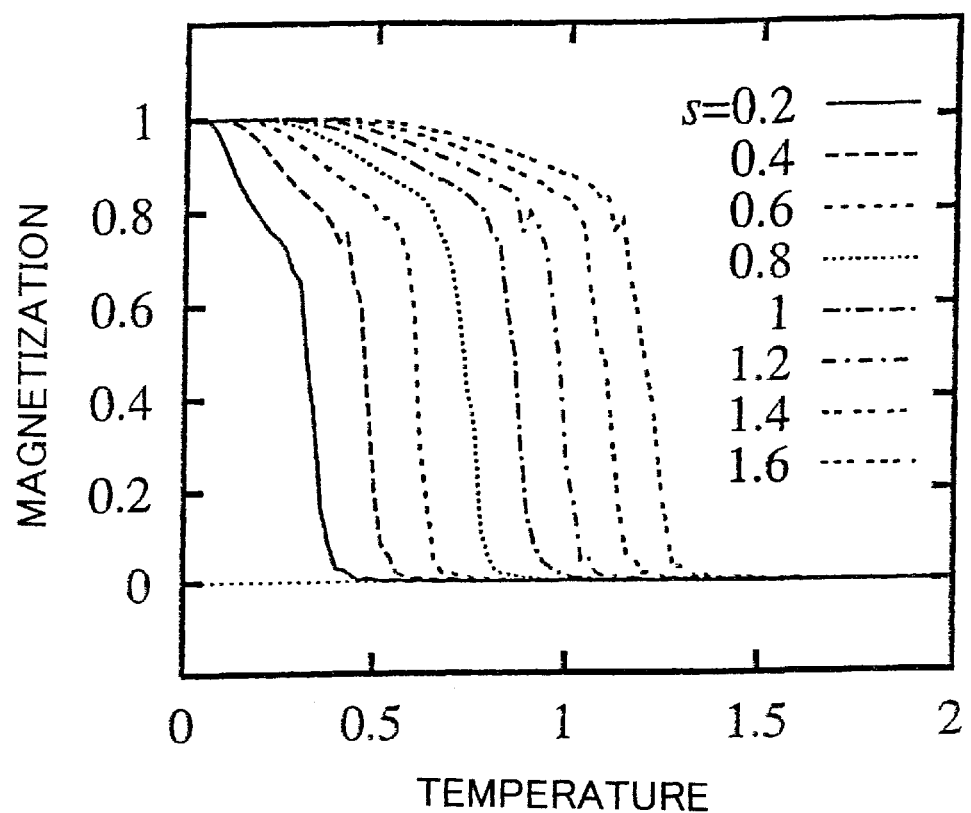
FIG. 101 is a rough diagram that shows spontaneous magnetization obtained by numerical calculation when s is changed in case of N=3 in the 15th embodiment of the invention.
Figure 102:
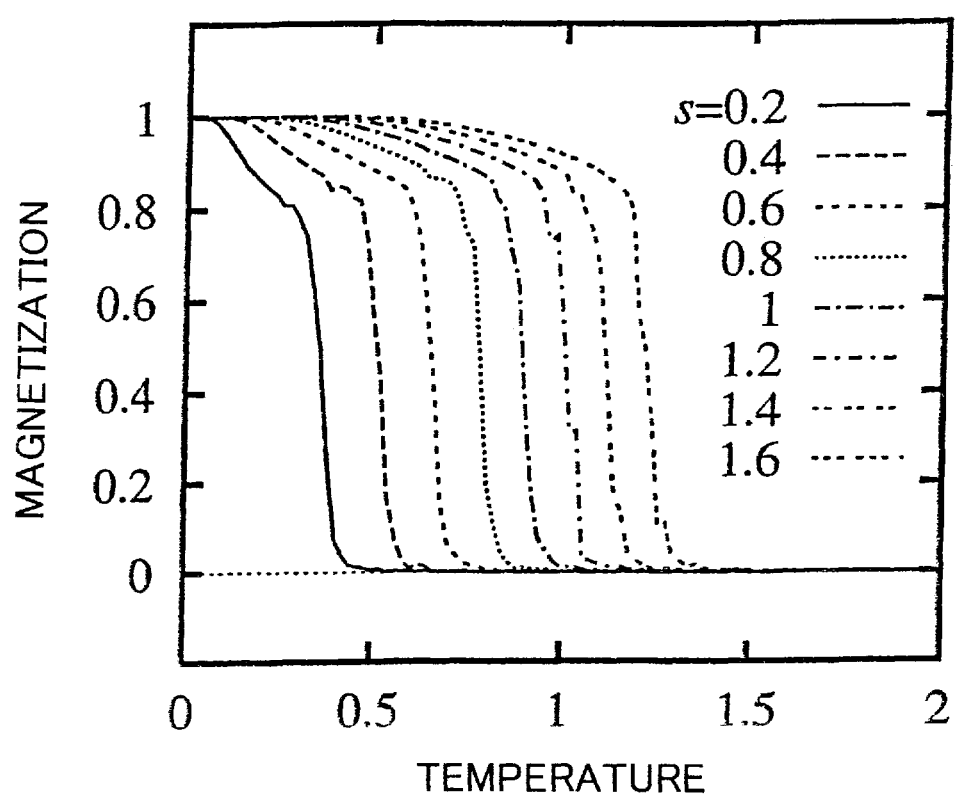
FIG. 102 is a rough diagram that shows spontaneous magnetization obtained by numerical calculation when s is changed in case of N=4 in the 15th embodiment of the invention.
Figure 103:
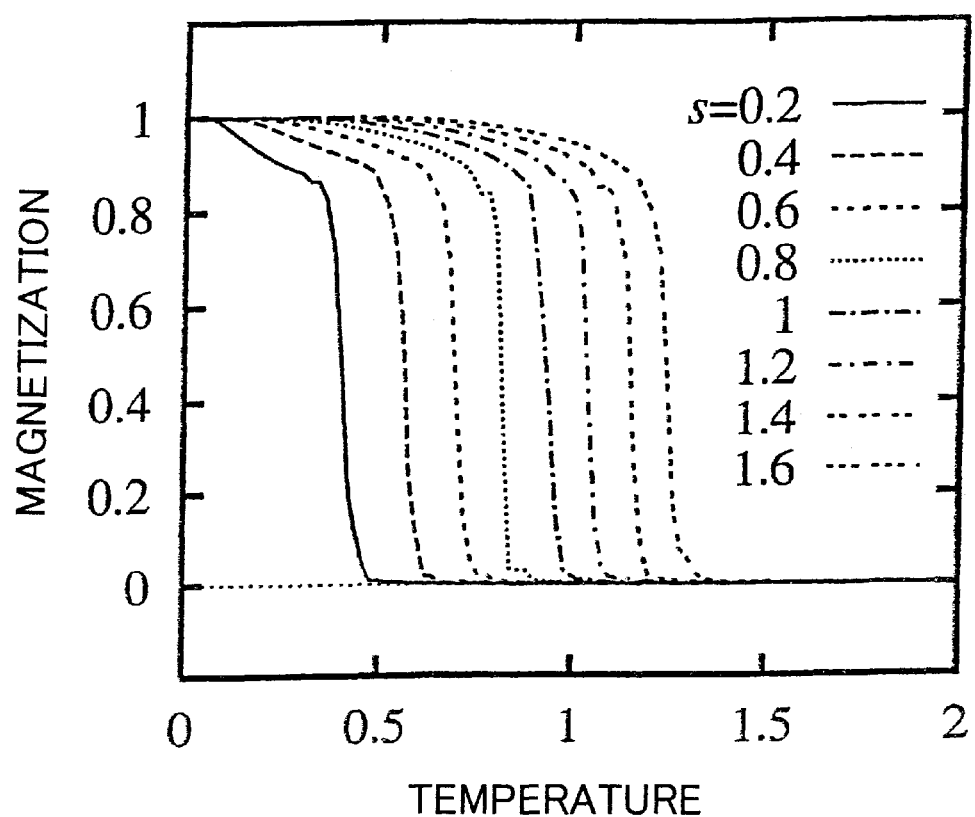
FIG. 103 is a rough diagram that shows spontaneous magnetization obtained by numerical calculation when s is changed in case of N=6 in the 15th embodiment of the invention.
Figure 104:
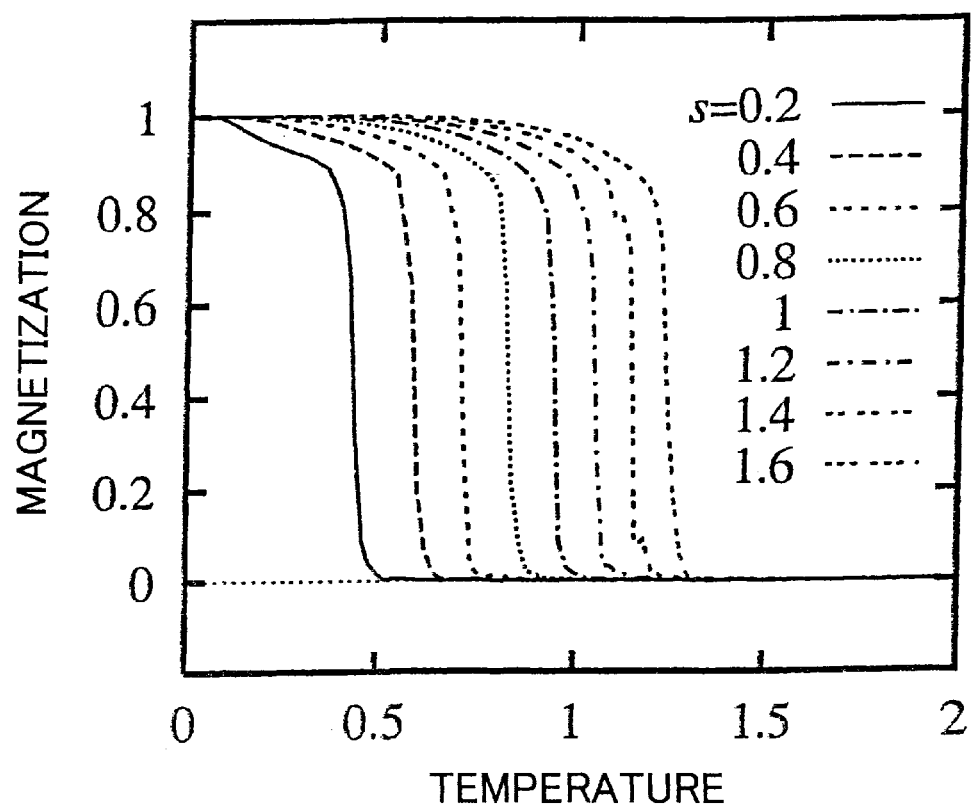
FIG. 104 is a rough diagram that shows spontaneous magnetization obtained by numerical calculation when s is changed in case of N=8 in the 15th embodiment of the invention.
Figure 105:
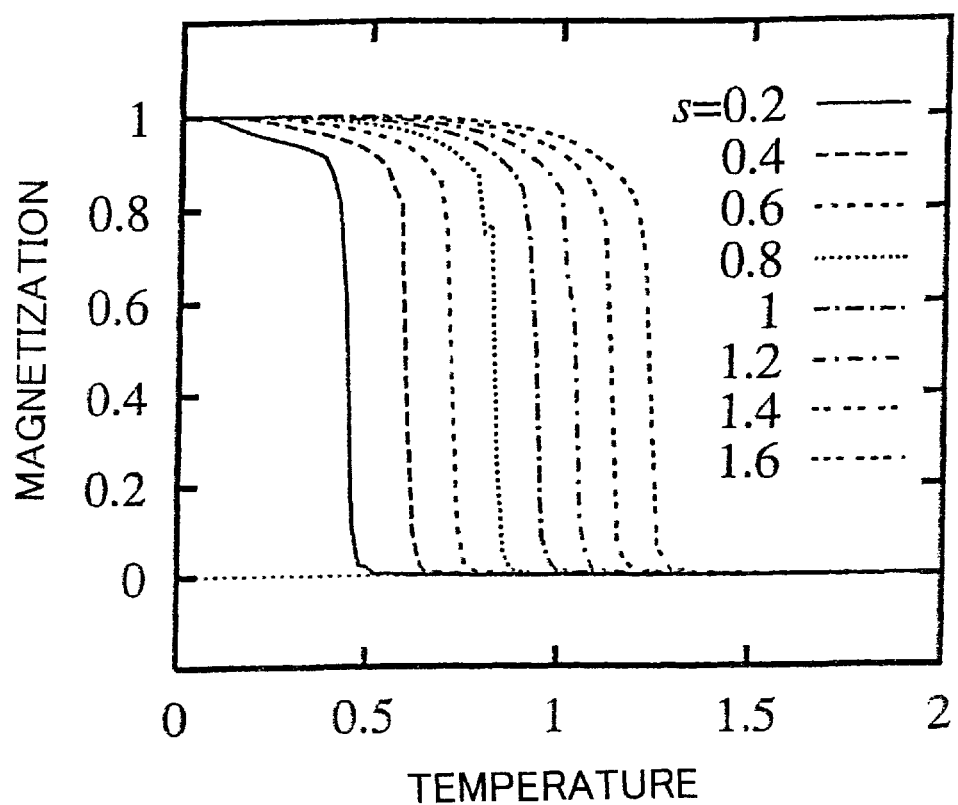
FIG. 105 is a rough diagram that shows spontaneous magnetization obtained by numerical lo calculation when s is changed in case of N=10 in the 15th embodiment of the invention.
Figure 106:
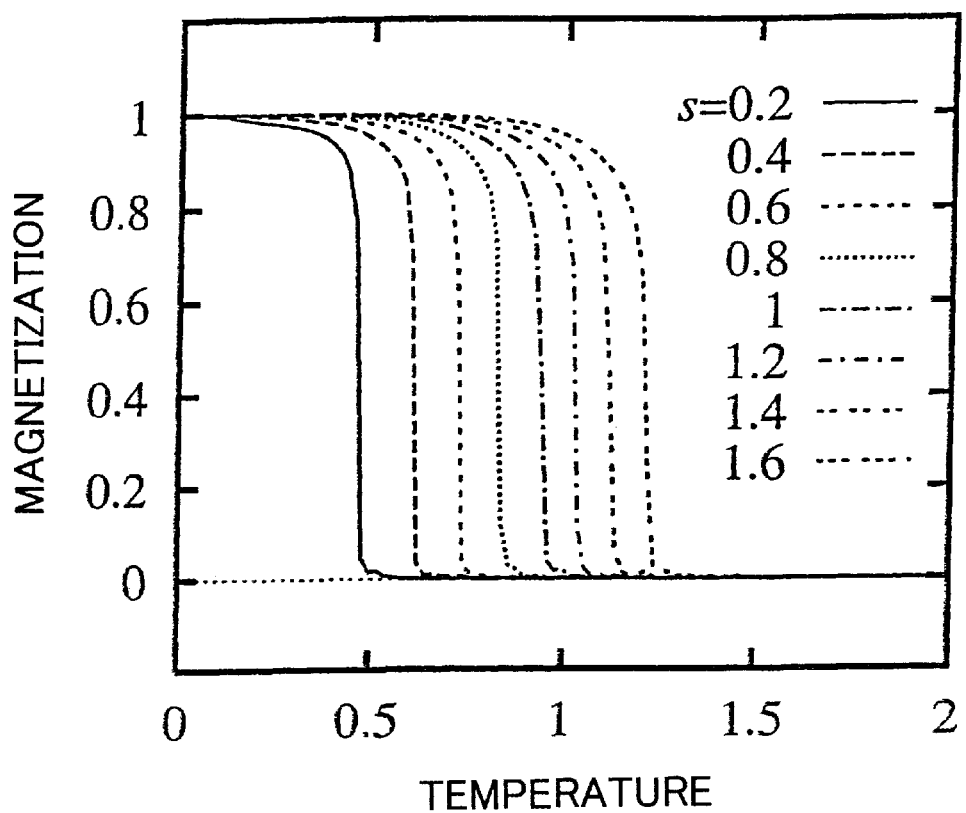
FIG. 106 is a rough diagram that shows spontaneous magnetization obtained by numerical calculation when s is changed in case of N=20 in the 15th embodiment of the invention.

FIGS. 101 through 106 show magnetization curves for various s. FIG. 101 is for N=3, FIG. 102 is for N=4, FIG. 103 is for N=6, FIG. 104 is for N=8, FIG. 105 is for N=10, and FIG. 106 is for N=20. In any of them, it is appreciated that the transition temperature is controlled well by changes of s. It has been confirmed that ferromagnetic materials having wide transition temperatures can be realized by setting the value of s.

Next explained is a helix-based hierarchy of multiple connections according to the 16th embodiment of the invention. In the 16th embodiment, Anderson transitions in helix-based hierarchies of multiple connections are analyzed by using quantum level statistics to demonstrate that wide quantum states from metallic states exhibiting quantum chaos to localized states can be realized. It is demonstrated that electron states do not depend on the number of turns N so much but strongly depends on the value of inter-layer bonds s. Making use of this dependency, physical phenomena appearing in helix-based hierarchies of multiple connections can be controlled.

The helix-based hierarchies of multiple connections explained in the 16th embodiment are defined as shown below. Assuming a one-dimensional lattice, numbers are assigned as x= ..., −1, 0, 1, .... The operator for generating a quantum at the x-th lattice point is denoted by $\hat{c}^\dagger(x)$. Let this operator satisfy the anticommutation relation $$\{\hat{c}(x), \hat{c}^\dagger(y)\} = \delta_{x,y} \tag{281}$$

This quantum is a fermion having no free spin freedom. This corresponds to analysis of an electron in a solid in which spin orbit interaction can be disregarded.

The Hamiltonian $\hat{H}_1$ of spirals is defined as $$\hat{H}_1 = -t \sum_x \hat{c}^\dagger(x)\hat{c}(x+1) - s \sum_x \hat{c}^\dagger(x)\hat{c}(x+N) + \sum_x v_x \hat{c}^\dagger(x)\hat{c}(x) + H.C. \tag{282}$$

For the purpose of introducing high-order bonds, sites are added cumulatively. $\hat{H}_2$ describing secondary bonds is $$\hat{H}_2 = -s \sum_{\mathrm{mod}(x,N)=0} \left[ \hat{c}^\dagger(x)\hat{\phi}_2(x,1) + \hat{\phi}_2^\dagger(x,1)\hat{c}(x+N^2+f(N)) \right] + H.C. \tag{283}$$

$\hat{H}_3$ describing tertiary bonds is $$\hat{H}_3 = -s \sum_{\mathrm{mod}(x,N^2)=1} \left[ \hat{c}^\dagger(x)\hat{\phi}_3(x,1) + \hat{\phi}_3^\dagger(x,1)\hat{\phi}_3(x,2) + \hat{\phi}_3^\dagger(x,2)\hat{c}(x+N^3+f(N^2)) \right] + H.C. \tag{284}$$

$\hat{H}_4$ describing quaternary bonds is $$\hat{H}_4 = -s \sum_{\mathrm{mod}(x,N^2)=2} \left[ \hat{c}^\dagger(x)\hat{\phi}_4(x,1) + \hat{\phi}_4^\dagger(x,1)\hat{\phi}_4(x,2) + \hat{\phi}_4^\dagger(x,2)\hat{\phi}_4(x,3) + \hat{f}^\dagger(x,3)\hat{c}(x+N^4+f(N^3)) \right] + H.C. \tag{285}$$

Generally for $q \geq 2$ $$\hat{H}_q = -s \sum{}' \left[ \hat{c}^\dagger(x)\hat{\phi}_q(x,1) + \left( \sum_{k=1}^{q-2} \hat{\phi}_q^\dagger(x,k)\hat{\phi}_q(x,k+1) \right) + \hat{\phi}_q^\dagger(x,q-1)\hat{c}(x+N^q+f(N^{q-1})) \right] + H.C. \tag{286}$$

$\Sigma'$, however, is conducted only with x that satisfies mod(x, $N^{q-1}$)=q−2. Using it, the Hamiltonian defined by $$\hat{H} = \sum_{q=1}^{\infty} \hat{H}_q \tag{287}$$

will be discussed.

The helix-based hierarchy of multiple connections analyzed here is made up of a main chain of 5000 sites. Since it also includes other sites introduced to form inter-layer bonds, the total number of sites is large. The total number of sites M for each N is as shown below.

| N | M |
| --- | --- |
| 3 | 8684 |
| 4 | 7168 |
| 6 | 6150 |
| 8 | 5769 |
| 10 | 5573 |
| 20 | 5231 |

Further introduced is $$f(x) = -\text{int}\left(\frac{x}{2}\right) \quad (288)$$

where int(x) is the maximum integer that does not exceed x. The second term of the Hamiltonian is the term of the random potential. For each site, the random variable $$-\frac{v}{2} < v_x < \frac{v}{2} \quad (289)$$

is generated to form the Hamiltonian. The variable breadth v of the random potential is useful as a parameter determining the degree of the randomness. Here, N, which determines the turn pitch of multiply-twisted spirals, s, which determines the inter-layer bonding force, and v, which determines the intensity of the random potential, are varied as parameters.

When eigen energy of the Hamiltonian $\hat{H}$ is $\epsilon_m$, and the eigen vector is $|m>$, then $$\hat{H}|m> = \epsilon_m|m> \quad (290)$$

where m=1, 2, ..., M. First, M quantum levels $\epsilon_m$ are standardized such that their nearest-neighbor level spacing becomes 1 in average. The density of states of the system is defined by $$\rho(\varepsilon) = \frac{1}{M}\sum_{m=1}^{M}\delta(\varepsilon - \varepsilon_m) \quad (291)$$

and its staircase function $$\lambda(\epsilon) = \int_{-\infty}^{\epsilon} d\eta \rho(\eta) \quad (292)$$

is calculated. The staircase function obtained is converted by using a procedure called "unfolding" such that the density of states becomes constant in average. Using the quantum level obtained in this manner, the nearest-neighbor level spacing distribution P(s) and the $\Delta_3$ statistics of Dyson and Mehta are calculated as quantum level statistics. For the calculation of the quantum level statistics, here are used 1501 levels in total including 750 levels above and 750 levels below the band center. As taught by Literatures (32) and (33), by using these statistics, it can be detected whether quantum chaos has been generated or not. It is also known that a quantum chaotic system is sensitive to perturbation from outside similarly to the classical chaotic system, and analysis of quantum chaos is important as a polestar of designs of non-linear materials.

In case of an integrable system, nearest-neighbor level spacing distribution P(s) and $\Delta_3$ statistics are those of Poisson Distribution $$P_P(s) = e^{-s} \quad (293)$$

$$\Delta_3(n) = \frac{n}{15} \quad (294)$$

If the system currently reviewed exhibits quantum chaos, it becomes GOE distribution $$P_{GOE}(s) = \frac{\pi s}{2}e^{-\pi s^2/4} \quad (295)$$

$$\Delta_3(n) = \frac{1}{\pi^2}\left[\log(2\pi n) + \gamma - \frac{\pi^2}{8} - \frac{5}{4}\right] + O(n^{-1}) \quad (296)$$

where γ is the Euler's constant.

Figure 107:
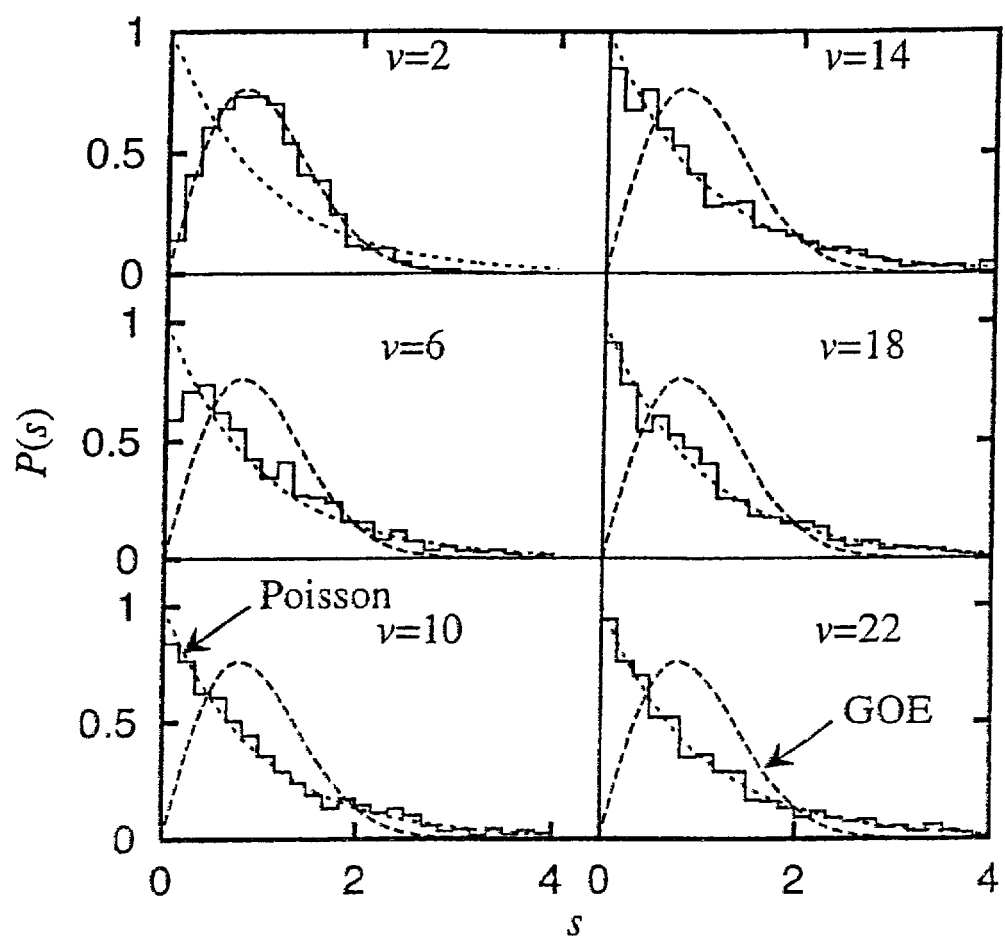
FIG. 107 is a rough diagram that shows quantum level statistics upon changes of v in case of N=10 and s=1 in the 16th embodiment of the invention.
Figure 108:
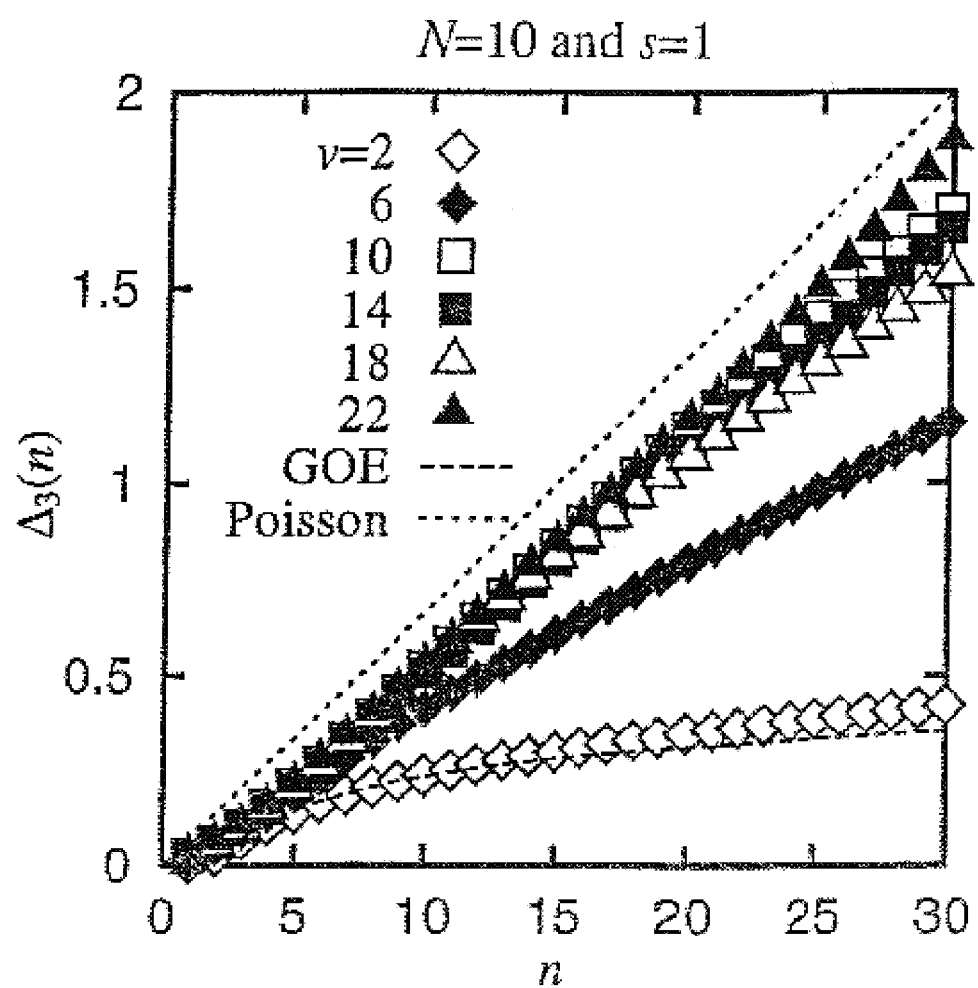
FIG. 108 is a rough diagram that shows quantum level statistics upon changes of v in case of N=10 and s=1 in the 16th embodiment of the invention.

FIG. 107 and FIG. 108 show quantum level statistics of helix-based hierarchies of multiple connections of N=10 while fixing the inter-layer bonding to s=1 and changing the random potential intensity v. FIG. 107 shows P(s) whilst FIG. 108 shows $\Delta_3$ statistics values. In both statistics values, the system is in a quantum chaotic state when v is small, but as v increases, it changes to a localized state described by the Poisson distribution, and shows the existence of Anderson transition.

Figure 109:
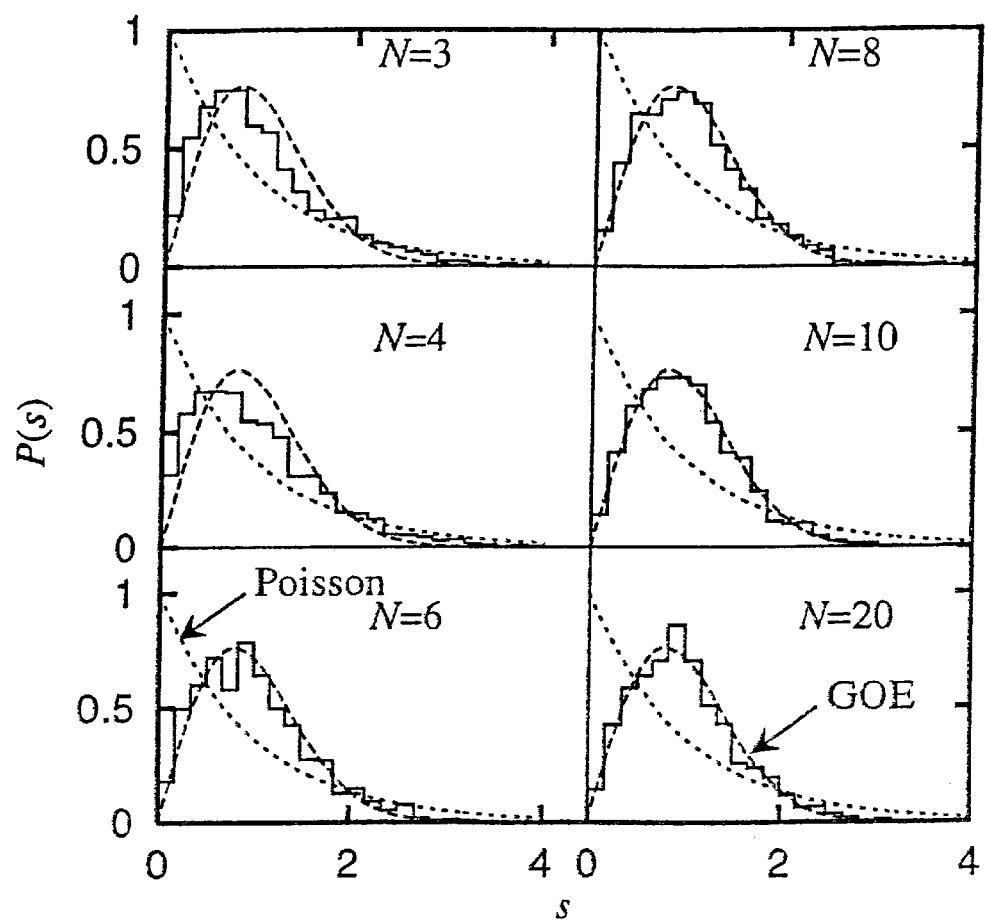
FIG. 109 is a rough diagram that shows quantum level statistics upon changes of N in case of v=2 and s=1 in the 16th embodiment of the invention.
Figure 110:
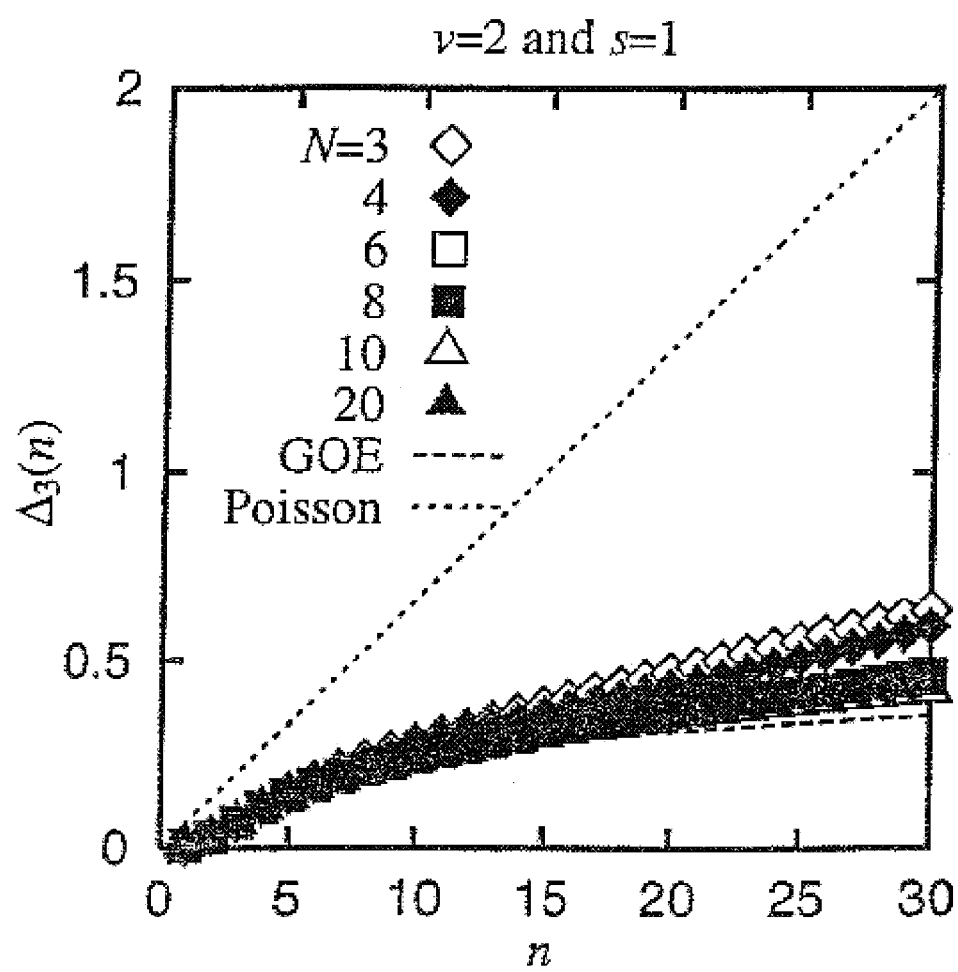
FIG. 110 is a rough diagram that shows quantum level statistics upon changes of N in case of v=2 and s=1 in the 16th embodiment of the invention.

In FIGS. 109 and 110, calculation is conducted by using various values of N while fixing s=1 and v=2. FIG. 109 shows P(s) while FIG. 110 shows $\Delta_3$ statistics values. Since the weak random potential of v=2 is introduced, a quantum-chaotic metallic state is observed. It is appreciated that this nature does not depend on N and the quantum level statistics substantially obeys the GOE distribution for each value of N. Thus it must change toward localization if v is increased, so it is appreciated that Anderson transition always exists in the above system and the dimensionality of the system is near three.

Figure 111:
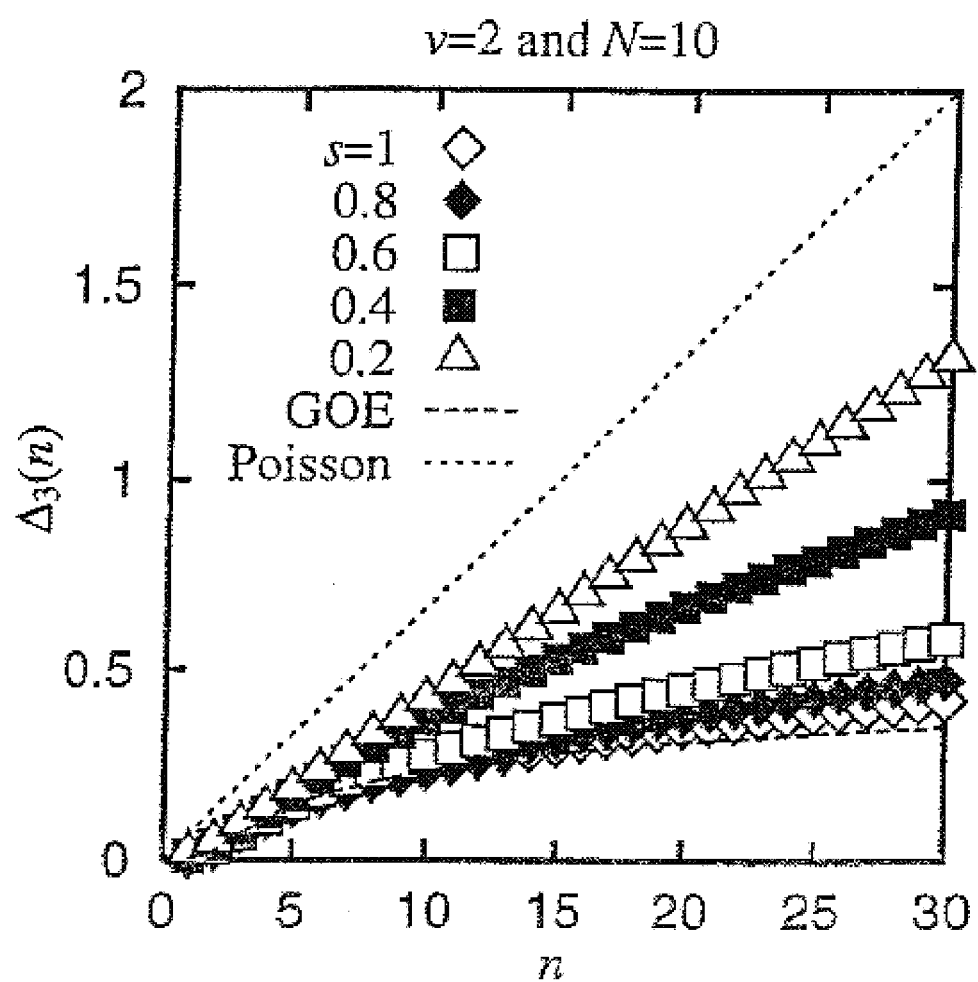
FIG. 111 is a rough diagram that shows quantum level statistics upon changes of s in case of N=10 and v=2 in the 16th embodiment of the invention.

However, it is possible to decrease the helix-based hierarchy of multiple connections by decreasing s. FIG. 111 shows $\Delta_3$ statistics values with helix-based hierarchies of multiple connections of N=10 when changing s as s=1, 0.8, 0.6, 0.4, 0.2 while fixing v=2. Although the random potential is as weak as v=2, as s decreases, $\Delta_3$ asymptotically approaches that of the Poisson distribution. In this kind of systems, since any stronger randomness merely results in enhancing localization, there is no Anderson transition. This is an evidence of a low-dimensionality.

A review has been made about quantum level statistics with helix-based hierarchies of multiple connections having various N, s and v, and it has been confirmed that wide quantum states from metallic states exhibiting quantum chaos to localized states can be realized.

Next explained is a helix-based hierarchy of multiple connections according to the 17th embodiment of the invention. In the 17th embodiment, Mott transitions in helix-based hierarchies of multiple connections are analyzed by using the Green's function method to demonstrate that wide quantum states from Mott insulator states to metallic states can be realized. It is demonstrated that electron states do not depend on the number of turns N so much but strongly depends on the value of inter-layer bonds s. Making use of this dependency, physical phenomena appearing in helix-based hierarchies of multiple connections can be controlled.

The helix-based hierarchies of multiple connections explained in the 17th embodiment are defined as shown below. Assuming a one-dimensional lattice, numbers are assigned as x= ..., −1, 0, 1, ....

The operator for generating an electron of the spin σ at the x-th lattice point is denoted by $\hat{c}_\sigma^\dagger(x)$. Let this operator satisfy the anticommutation relation $$\{\hat{c}_\sigma(x), \hat{c}_\rho^\dagger(y)\} = \delta_{x,y}\delta_{\sigma,\rho} \quad (297)$$

The Hamiltonian $\hat{H}_1$ of spirals is defined as $$\hat{H}_1 = -t\sum_{x,\sigma}\hat{c}_\sigma^\dagger(x)\hat{c}_\sigma(x+1) - s\sum_{x,\sigma}\hat{c}_\sigma^\dagger(x)\hat{c}_\sigma(x+N) + U\sum_x \hat{n}_\uparrow(x)\hat{n}_\downarrow(x) + H.C. \quad (298)$$

where $$\hat{n}_\sigma(x) = \hat{c}_\sigma^\dagger(x)\hat{c}_\sigma(x) \quad (299)$$

is the operator of the number of spin σ electrons, and U is the electron-to-electron interaction intensity. For the purpose of introducing high-order bonds, sites are added cumulatively. $\hat{H}_2$ describing secondary bonds is $$\hat{H}_2 = -s\sum_{mod(x,N)=0}\sum_{\sigma=\uparrow,\downarrow}\left[\hat{c}_\sigma^\dagger(x)\hat{\phi}_{2,\sigma}(x,1) + \hat{\phi}_{2,\sigma}^\dagger(x,1)\hat{c}_\sigma(x+N^2+f(N))\right] + U\sum_{mod(x,N)=0}\hat{n}_{2,\uparrow}(x,1)\hat{n}_{2,\downarrow}(x,1) + H.C. \quad (300)$$

where $$\hat{n}_{2,\sigma}(x,1) = \hat{\phi}_{2,\sigma}^\dagger(x,1)\hat{\phi}_{2,\sigma}(x,1) \quad (301)$$

$\hat{H}_3$ describing tertiary bonds is $$\hat{H}_3 = -s\sum_{mod(x,N^2)=1}\sum_{\sigma=\uparrow,\downarrow}\left[\hat{c}_\sigma^\dagger(x)\hat{\phi}_{3,\sigma}(x,1) + \hat{\phi}_{3,\sigma}^\dagger(x,1)\hat{\phi}_{3,\sigma}(x,2) + \hat{\phi}_{3,\sigma}^\dagger(x,2)\hat{c}_\sigma(x+N^3+f(N^2))\right] + U\sum_{mod(x,N)=0}[\hat{n}_{3,\uparrow}(x,1)\hat{n}_{3,\downarrow}(x,1) + \hat{n}_{3,\uparrow}(x,2)\hat{n}_{3,\downarrow}(x,2)] + H.C. \quad (302)$$

where $$\hat{n}_{3,\sigma}(x,j) = \hat{\phi}_{3,\sigma}^\dagger(x,j)\hat{\phi}_{3,\sigma}(x,j) \quad (303)$$

$\hat{H}_4$ describing quaternary bonds is $$\hat{H}_4 = -s\sum_{mod(x,N^2)=2}\sum_{\sigma=\uparrow,\downarrow}\left[\hat{c}_\sigma^\dagger(x)\hat{\phi}_{4,\sigma}(x,1) + \hat{\phi}_{4,\sigma}^\dagger(x,1)\hat{\phi}_{4,\sigma}(x,2) + \hat{\phi}_{4,\sigma}^\dagger(x,2)\hat{\phi}_{4,\sigma}(x,3) + \hat{\phi}_{4,\sigma}^\dagger(x,3)\hat{c}_\sigma(x+N^4+f(N^3))\right] + U\sum_{mod(x,N)=0}[\hat{n}_{4,\uparrow}(x,1)\hat{n}_{4,\downarrow}(x,1) + \hat{n}_{4,\uparrow}(x,2)\hat{n}_{4,\downarrow}(x,2) + \hat{n}_{4,\uparrow}(x,3)\hat{n}_{4,\downarrow}(x,3)] + H.C. \quad (304)$$

where $$\hat{n}_{4,\sigma}(x,j) = \hat{\phi}_{4,\sigma}^\dagger(x,j)\hat{\phi}_{4,\sigma}(x,j) \quad (305)$$

Generally for $q \geq 2$ $$\hat{H}_q = -s\sum{}'\sum_{\sigma=\uparrow,\downarrow}\left[\hat{c}_\sigma^\dagger(x)\hat{\phi}_{q,\sigma}(x,1) + \sum_{k=1}^{q-2}\hat{\phi}_{q,\sigma}^\dagger(x,1) + \sum_{k=1}^{q-2}\hat{\phi}_{q,\sigma}^\dagger(x,k)\hat{\phi}_{q,\sigma}(x,k+1) + \hat{\phi}_{q,\sigma}(x,q-1)\hat{c}_\sigma(x+N^q+f(N^{q-1}))\right] + U\sum_{k=1}^{q-1}\hat{n}_{q,\uparrow}(x,k)\hat{n}_{q,\downarrow}(x,k) + H.C. \quad (306)$$

$\Sigma'$, however, is conducted only with x that satisfies $mod(x, N^{q-1})=q-2$. Then, $$\hat{n}_{q,\sigma}(x,k) = \hat{\phi}_{q,\sigma}^\dagger(x,k)\hat{\phi}_{q,\sigma}(x,k) \quad (307)$$

was used. Discussed below is $$\hat{H} = \sum_{q=1}^{\infty}\hat{H}_q \quad (308)$$

that is formed by using the Hamiltonians of respective layers defined above

The helix-based hierarchy of multiple connections analyzed here is made up of a main chain of 5000 sites. Since it also includes other sites introduced to form inter-layer bonds, the total number of sites is large. The total number of sites M for each N is as shown below.

| N | M |
|---|---|
| 3 | 8684 |
| 4 | 7168 |
| 6 | 6150 |
| 8 | 5769 |
| 10 | 5573 |
| 20 | 5231 |

Further introduced is $$f(x) = -\text{int}\left(\frac{x}{2}\right) \quad (309)$$

where int(x) is the maximum integer that does not exceed x. Here, N, which determines the turn pitch of multiply-twisted spirals, s, which determines the inter-layer bonding force, and U, which determines the intensity of electron-to-electron interaction, are varied as parameters.

Figure 112:
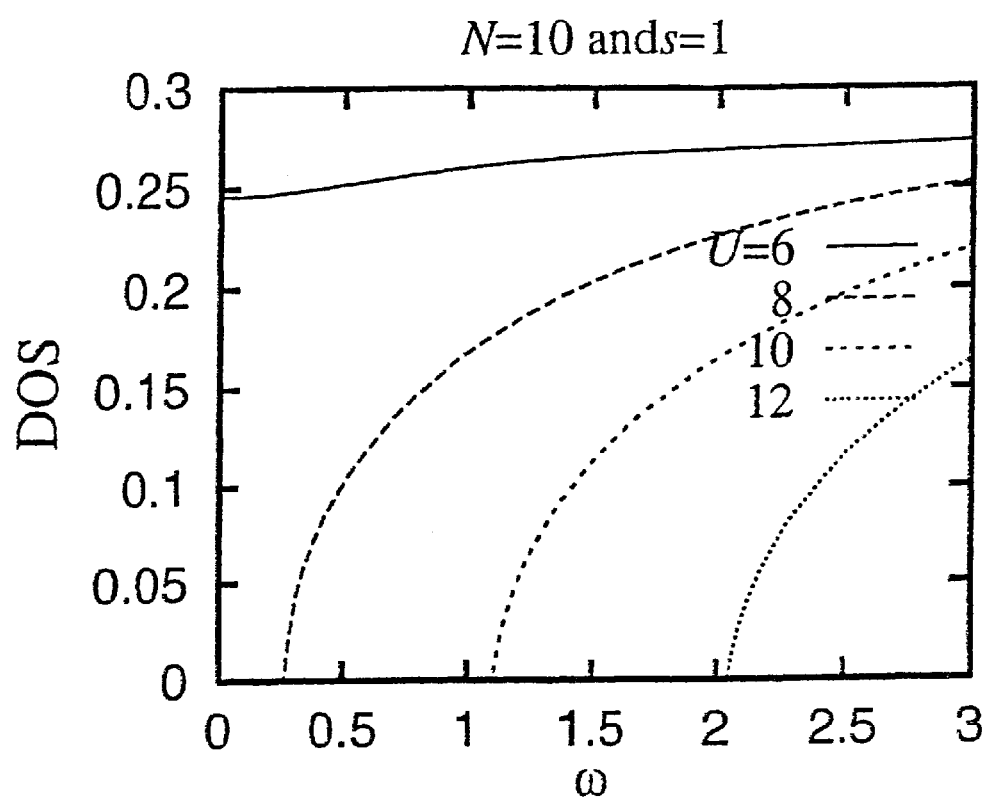
FIG. 112 is a rough diagram that shows a density of states obtained by numerical calculation in case of N=10 and s=1 in the 17th embodiment of the invention.

Here is made a review about half-filled of one electron per site. The density of states of this system can be calculated by using the same method as, for example, the first embodiment. The density of states thus obtained is shown below, and based on it, discussion will be developed. FIG. 112 shows densities of states in helix-based hierarchies of multiple connections of N=10 by fixing the layer-to-layer bonding as s=1 and changing electron-to-electron interaction intensity U. ω=0 is the Fermi energy. If the density of states remains the system is in a metallic phase, and if it disappears, the system is in a Mott insulator phase. In case of U=6, the system is in a metallic phase, and over U=8, the systems are Mott insulators. This is typical Mott transition by changes of intensity of electron-to-electron interaction. In general, the value corresponding to a double the value of ω where the density of states disappears is the Hubbard gap, and it is meant that, as it gets larger, correlation between electrons is intensive.

Figure 113:
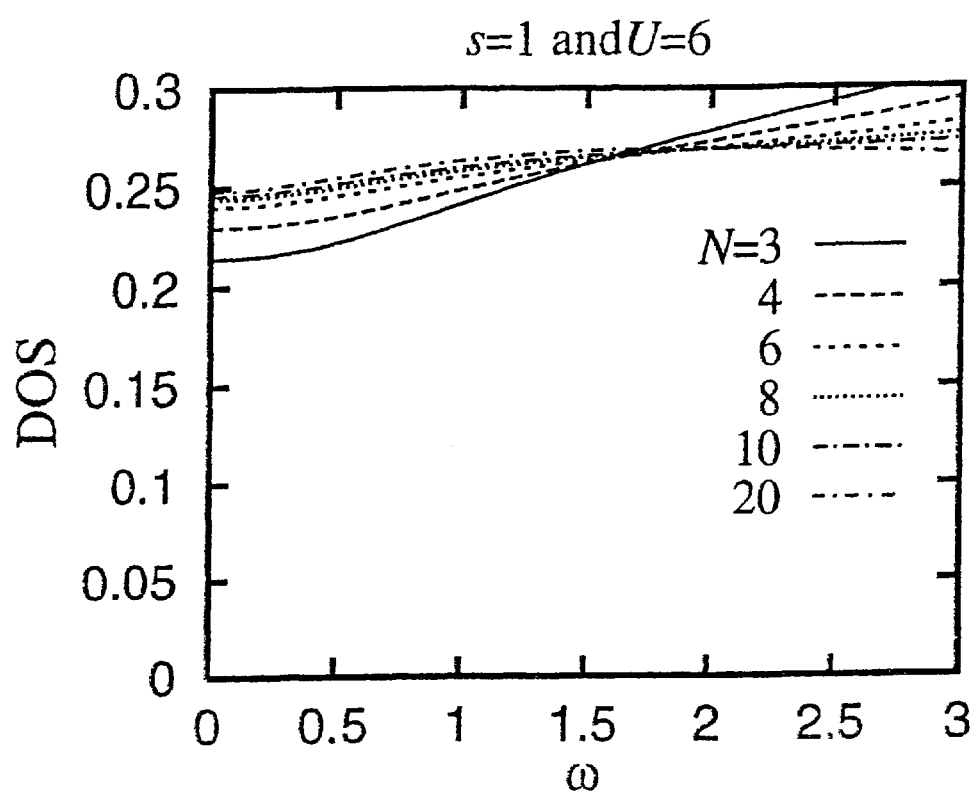
FIG. 113 is a rough diagram that shows a density of states obtained by numerical calculation in case of s=1 and U=12 in the 17th embodiment of the invention.

In FIG. 113, densities of states were calculated for various values of N while fixing s=1 and U=6. It is appreciated from the figure that the dependency of the densities of states upon N is small, the systems for all values of N exhibit a metallic phase. This small dependency on N is the unique nature of helix-based hierarchies of multiple connections, which is observed also in magnetic transition and Anderson transition.

Figure 114:
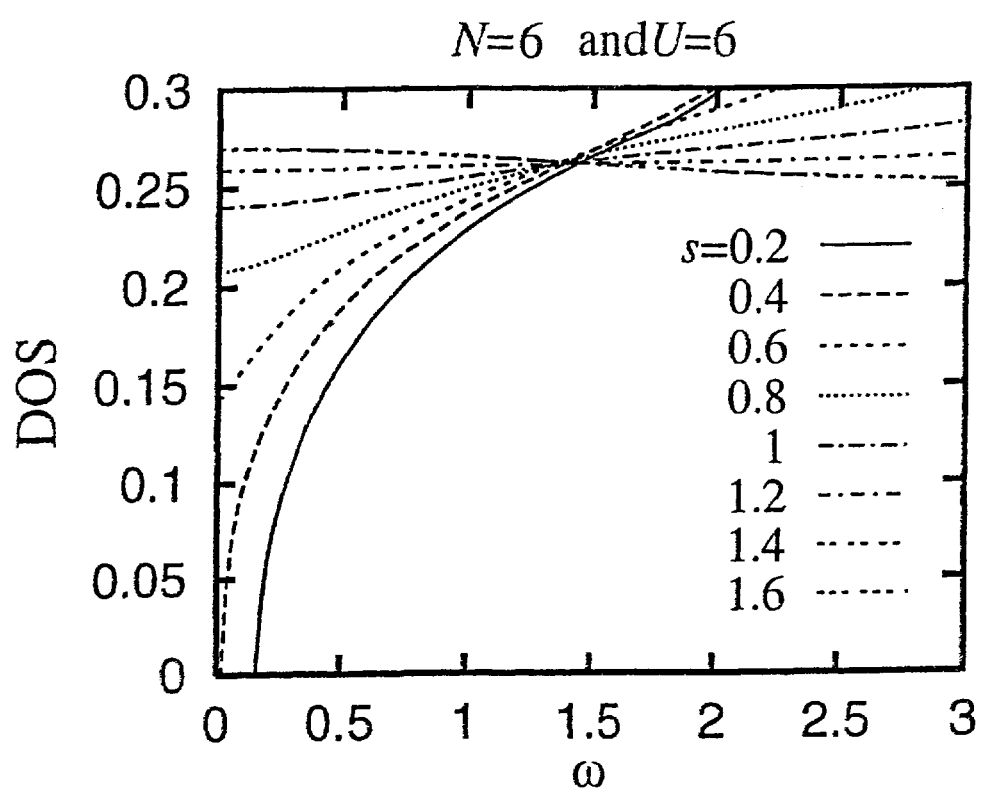
FIG. 114 is a rough diagram that shows a density of states obtained by numerical calculation in case of N=6 and U=6 in the 17th embodiment of the invention.
Figure 115:
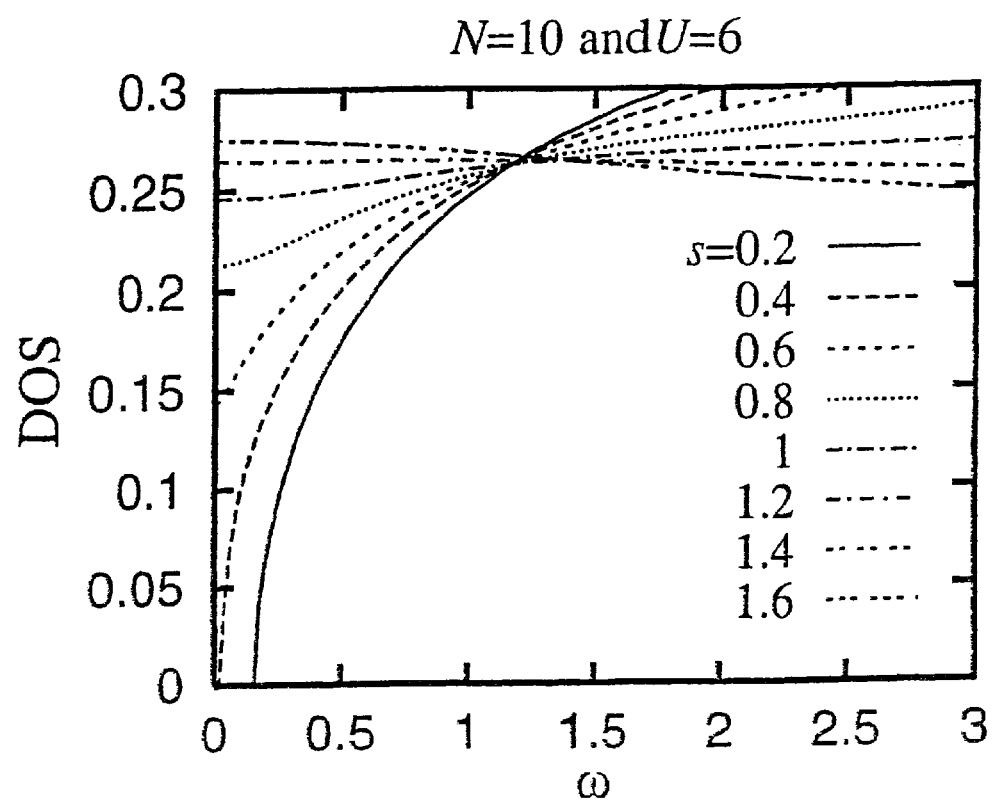
FIG. 115 is a rough diagram that shows a density of states obtained by numerical calculation in case of N=10 and U=6 in the 17th embodiment of the invention.
Figure 116:
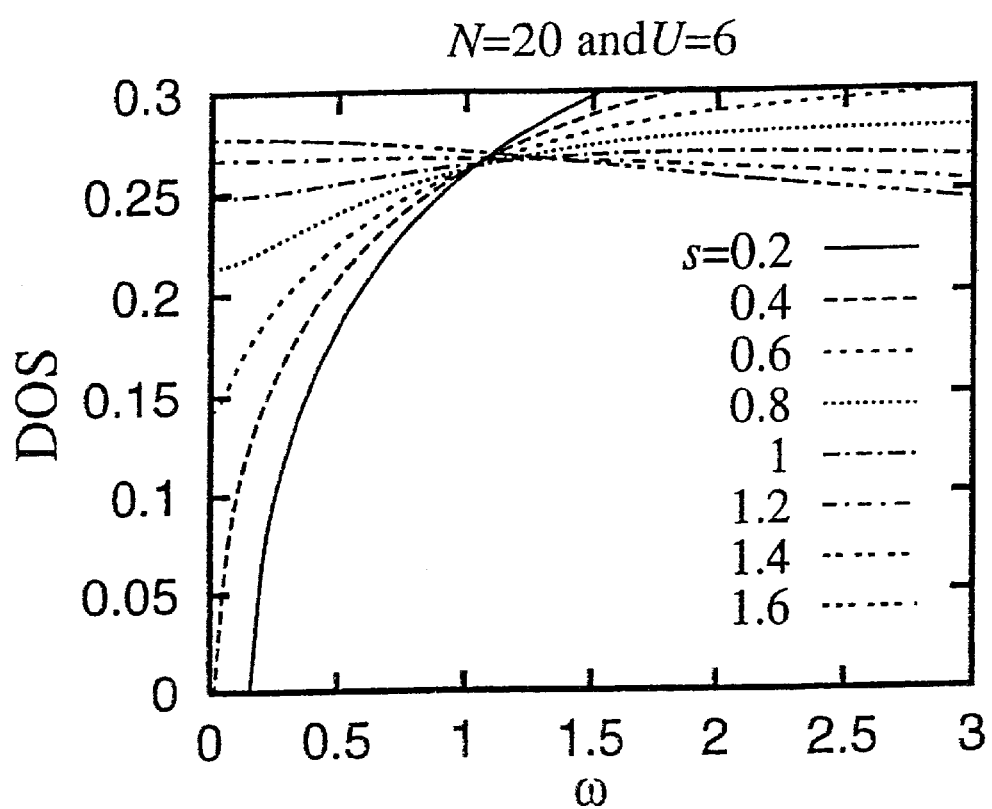
FIG. 116 is a rough diagram that shows a density of states obtained by numerical calculation in case of N=20 and U=6 in the 17th embodiment of the invention.

However, models exhibiting remarkable modulation under control of the value of s also characterize the helix-based hierarchies of multiple connections. FIG. 114 plots densities of states for various s when fixing N=6 and U=6. FIG. 115 plots densities of states for various s when fixing N=10 and U=6. FIG. 116 plots densities of states for various s when fixing N=20 and U=6. It has been confirmed that, as s varies, the density of states under ω=0 changes from a finite to zero and Mott transition has occurred.

A review has been made about Half-filled electron systems in helix-based hierarchies of multiple connections with various N, s and U, and it has been confirmed that wide electron systems from Mott insulators to Metallic states can be realized.

Next explained is a helix-based hierarchy of multiple connections according to the 18th embodiment of the invention. In the 18th embodiment, critical helical spiral structures that are multiple hierarchical structures in which the number of sites does not depend on the number of turns and has generality will be explained. It will be demonstrated that, when layer-to-layer bonding is s=1, critical temperature $T_c$ of ferromagnetic transition does not depend on N. On the other hand, since $T_c$ is remarkably modified by s, making use of this dependency, physical phenomena appearing in the critical spiral structures can be controlled.

There is a structure not depending on N between the multiply-twisted helix explained in the 15th embodiment and the helix-based hierarchy of multiple connections. This structure, i.e. the critical spiral structure, is defined below. Here is defined the Hamiltonian $H_1$ of a spiral as follows.

$$H_1 = -\sum_x S(x) \cdot S(x+1) - s \sum_x S(x) \cdot S(x+N) \quad (310)$$

For the purpose of introducing high-order bonds, sites are added cumulatively. $H_2$ describing secondary bonds is $$H_2 = -s \sum_{mod(x,N)=0} [S(x) \cdot \sigma_2(x) + \sigma_2(x) \cdot S(x + N^2 + f(N))] \quad (311)$$

$H_3$ describing tertiary bonds is $$H_3 = -s \sum_{mod(x,N^2)=1} [S(x) \cdot \sigma_3(x) + \sigma_3(x) \cdot S(x + N^3 + f(N^2))] \quad (312)$$

$H_4$ describing quaternary bonds is $$H_4 = -s \sum_{mod(x,N^2)=2} [S(x) \cdot \sigma_4(x) + \sigma_4(x) \cdot S(x + N^4 + f(N^3))] \quad (313)$$

Generally for $q \geq 2$ $$H_q = -s\Sigma'[S(x) \cdot \sigma_q(x) + \sigma_q(x) \cdot S(x+N^q+f(N^{q-1}))] \quad (314)$$

Figure 117A:
FIGS. 117A–C is a rough diagram that shows actual bonding in a critical spiral structure according to the 18th embodiment of the invention.
Figure 117B:
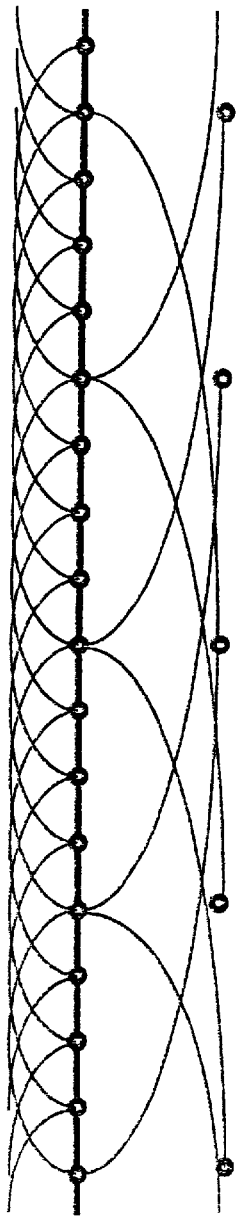
Figure 117C:
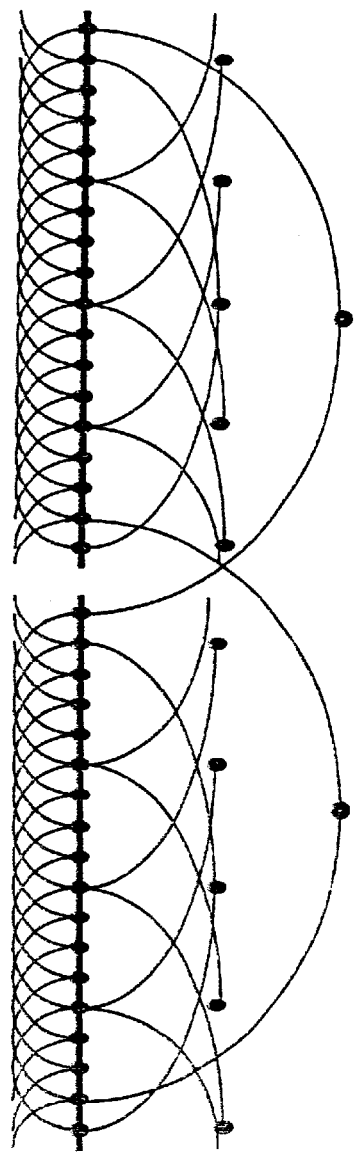

3', however, is conducted only with x that satisfies mod(x, $N^{q-1}$)=q−2. Using it, Hamiltonian defined by $$H = \sum_{q=1}^{\infty} H_q \quad (315)$$

is discussed. This site-to-site relation is shown in FIG. 117.

Assume here that the main chain spiral is made up of M sites. Regarding this main chain spiral, the expected number of nearest-neighbor sites is the same as that of the multiply-twisted helix. Assuming q layers, the number of sites added other than the main chain spiral is found to be $$NUM_q(N) = M\left(\frac{1}{N} + \frac{1}{N^2} + \ldots + \frac{1}{N^{q-1}}\right) \quad (316)$$

This $NUM_q(N)$ can be calculated by using $$\Gamma = \sum_{m=1}^{k} r^m = \frac{1}{r-1}[r^{k+1} - r] \text{ and} \quad (317)$$

$$NUM_q(N) = \frac{M}{N-1}[1 - N^{1-q}] \quad (318)$$

is obtained, which results in $$NUM_\infty = \lim_{q \to \infty} NUM_q(N) = \frac{M}{N-1} \quad (319)$$

Considering that all of the added sites each have two nearest-neighbor sites, the expected number of nearest-neighbor sites of the entire system is found to be $$\overline{\omega}_\infty(N) = \frac{1}{M + NUM_\infty(N)}[Mz_\infty(N) + 2NUM_\infty(N)] = 4 \quad (320)$$

Therefore, the number of nearest-neighbor sites does not depend on N, but it is the general number 4. Therefore, freedom can be integrated by involving spiral structures of lower layers, the system can be regarded as a structure of a critical region, which the involved group acts on. However, this discussion is limited to the case where all bonds have the same intensity, that is, in case of s=1, and the following simulation will demonstrates that, by changing s, the critical temperature can be modulated favorably.

The critical spiral structure analyzed here is made up of $M_0$=7000 sites. The other number $M_1$ of sites introduced to make layer-to-layer bonds for each N is shown below.

| N | M |
|---|---|
| 3 | 3483 |
| 4 | 2315 |
| 6 | 1377 |
| 8 | 977 |
| 10 | 752 |
| 20 | 331 |

Spins of the added sites described by σ are numbered as $\sigma_k$ (k=1, 2, ... $M_1$) hereunder.

This spin system is analyzed by Monte Carlo simulation. As spin freedom, a three-dimensional vector having values at vertices of a regular octahedron is employed. That is, (1, 0, 0), (−1, 0, 0), (0, 1, 0), (0, −1, 0), (0, 0, 1), (0, 0, −1) are allowable as the spin value.

For the purpose of calculating physical values at finite temperatures using statistical mechanics, a distribution function $$Z = \sum_{\{S,\sigma\}} e^{-\beta H} \quad (321)$$

is introduced, where T is the temperature, and $\beta=1/T$ and $k_B=1$ are used. The expected value of spontaneous magnetization is $$M = \frac{1}{M_0}\sum_{x=1}^{M_0} \langle S(x) \rangle + \frac{1}{M_1}\sum_{k=1}^{M_1} \langle \sigma_k \rangle \quad (322)$$

Spontaneous magnetization is calculated by using the Metropolis method that is one of the Monte Carlo methods. 100000 was used as the Monte Carlo steps, and N=3, 4, 6, 8, 10, 20 were analyzed as the turn pitch. As the function f(x) determining the bonds, $$f(x) = -\mathrm{int}\left(\frac{x}{2}\right) \quad (323)$$

was used. int(x) is the maximum integer that does not exceed x.

Figure 118:
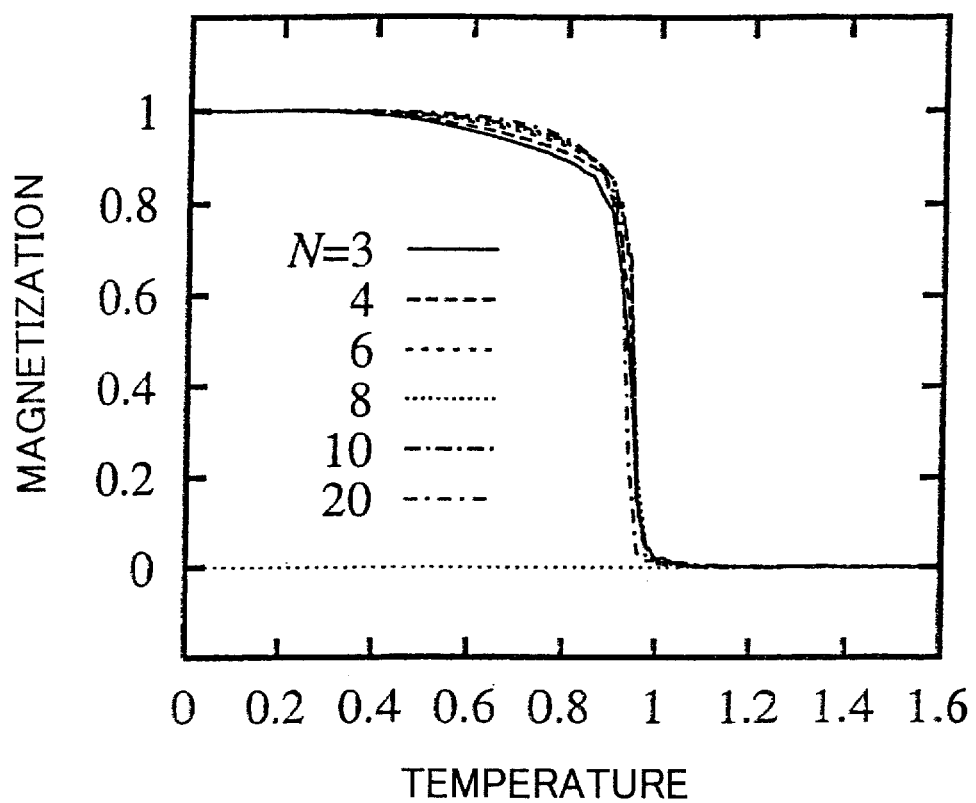
FIG. 118 is a rough diagram that shows spontaneous magnetization obtained by numerical calculation in case of N=3, 4, 6. 8, 10, 20 in the 18th embodiment of the invention.
Figure 119:
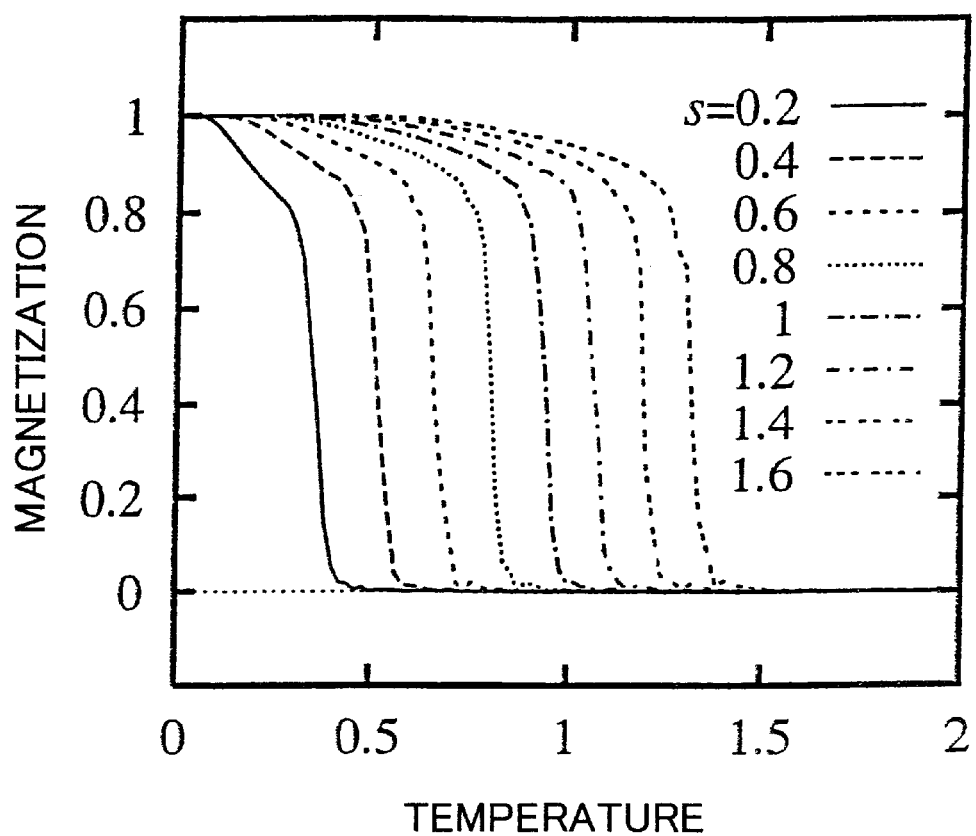
FIG. 119 is a rough diagram that shows spontaneous magnetization obtained by numerical calculation when s is changed in case of N=3 in the 18th embodiment of the invention.
Figure 120:
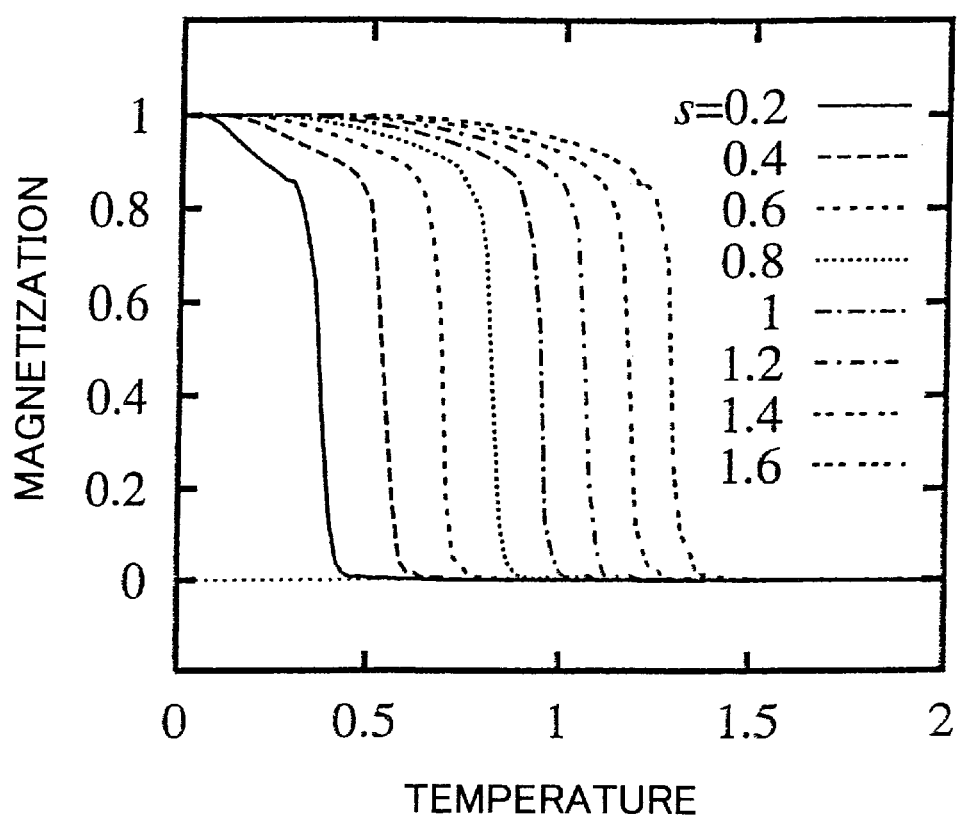
Figure 121:
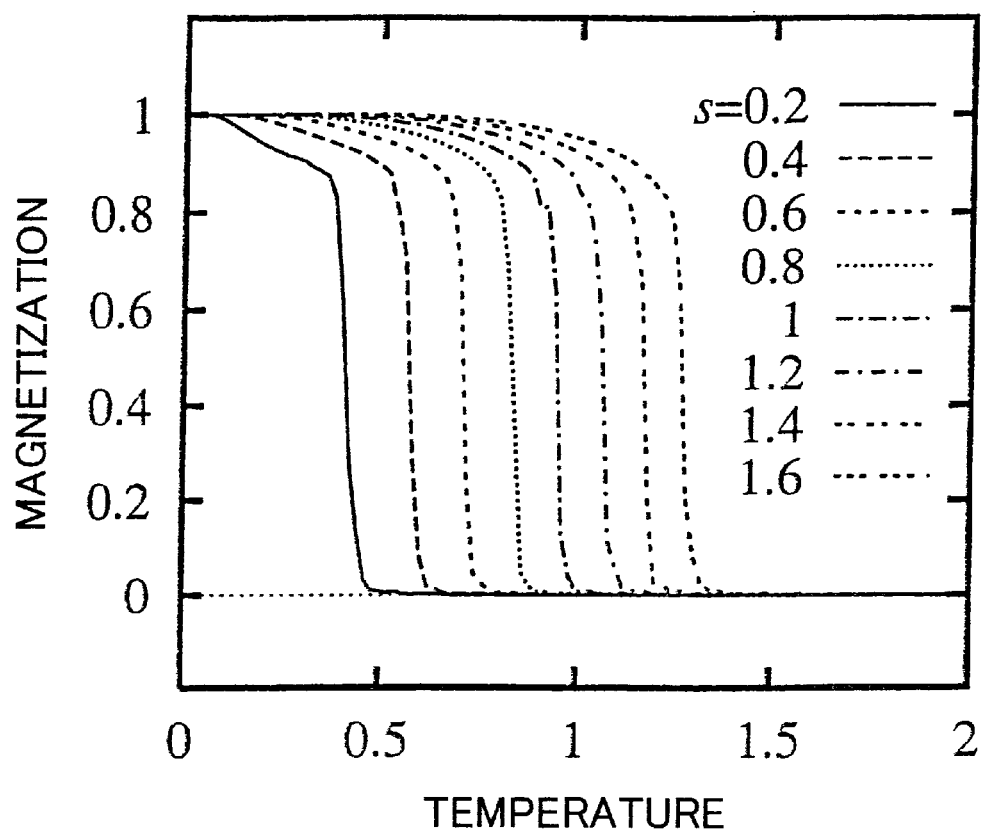
Figure 122:
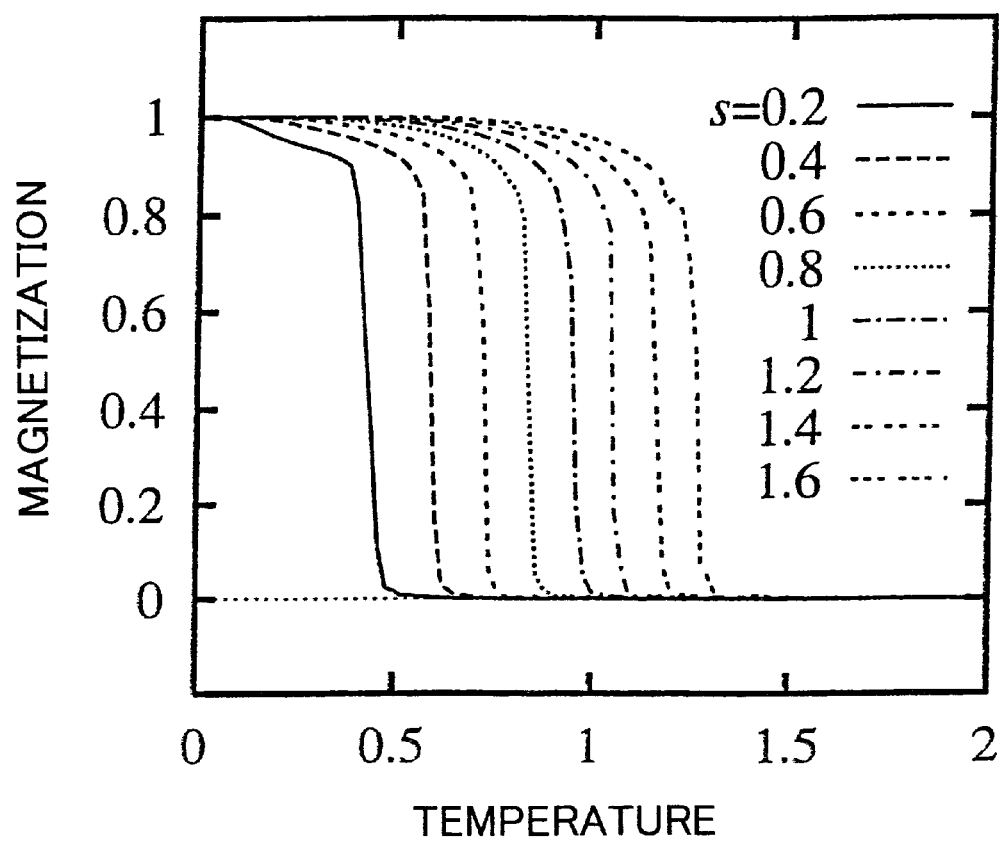
Figure 123:
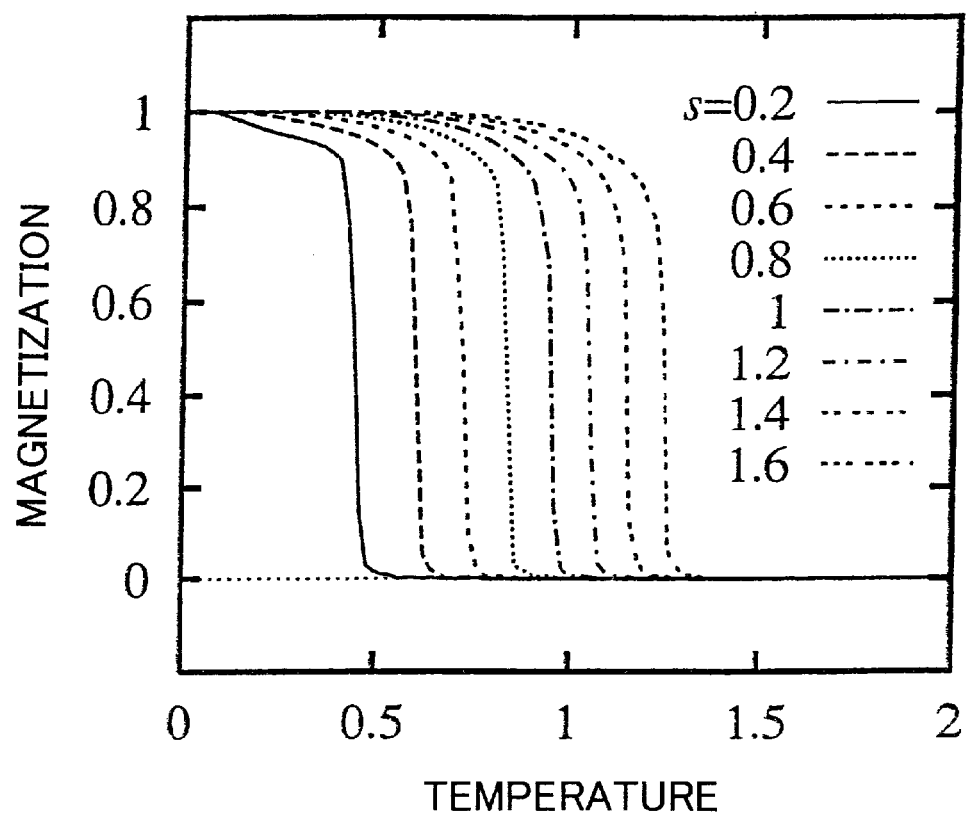
Figure 124:
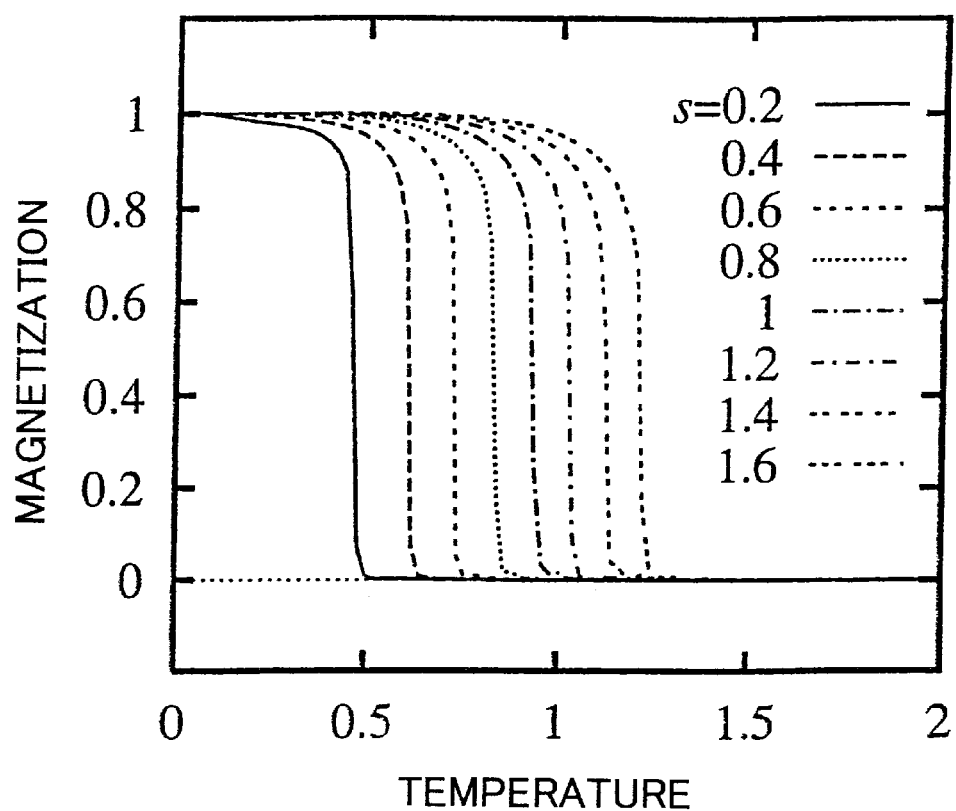

FIG. 118 shows magnetization curves for various N when fixing s=1. It is first appreciated that transition temperature for spontaneous magnetization disappears is the general value that does not depend on N. Behaviors near the critical temperature and magnetization curves depend on N, and it is suggested that the critical index in the critical region, for example, will depend on N.

FIGS. 119 through 124 show magnetization curves for various s. N=3 is used in FIG. 119, N=4 in FIG. 120, N=6 in FIG. 121, N=8 in FIG. 122, N=10 in FIG. 121 and N=20 in FIG. 122. In any of these cases, it is appreciated that transition temperature is favorably controlled by changes of s. It has been confirmed that ferromagnetic materials having wide transition temperature can be realized by setting the value of s.

Next explained is a critical spiral structure according to the 19th embodiment of the invention. In the 19th embodiment, Anderson transitions in critical spiral structures are analyzed by using quantum level statistics to demonstrate that wide quantum states from metallic states exhibiting quantum chaos to localized states can be realized. It is demonstrated that electron states do not depend on the number of turns N so much but strongly depends on the value of inter-layer bonds s. Making use of this dependency, physical phenomena appearing in critical spiral structures can be controlled.

A quantum system in a critical spiral structure is defined. Assuming a one-dimensional lattice, numbers are assigned as x= . . . , -1, 0, 1, . . . . The operator for generating a quantum at the x-th lattice point is denoted by $\hat{c}^\dagger(x)$. Let this operator satisfy the anticommutation relation $$\{\hat{c}(x),\hat{c}^\dagger(y)\}=\delta_{x,y} \quad (324)$$

This quantum is a fermion having no free spin freedom. This corresponds to analysis of an electron in a solid in which spin orbit interaction can be disregarded.

The Hamiltonian $\hat{H}_1$ of spirals is defined as $$\hat{H}_1 = \quad (325)$$
$$-t\sum_x \hat{c}^\dagger(x)\hat{c}(x+1) - s\sum_x \hat{c}^\dagger(x)\hat{c}(x+N) + \sum_x v_x \hat{c}^\dagger(x)\hat{c}(x) + H.C.$$

For the purpose of introducing high-order bonds, sites are added cumulatively. Generally for $q \geq 2$, $$\hat{H}_q = -s\Sigma'[\hat{c}^\dagger(x)\hat{d}_q(x)+\hat{d}_q^\dagger(x)\hat{c}(x+N^q+f(N^{q-1}))]+H.C. \quad (326)$$

3', however, is conducted only with x that satisfies mod(x, $N^{q-1}$)=q-2. The operator $\hat{c}^\dagger(x)$ used here is an operator for generating a quantum at a site added, and it satisfies $$\{\hat{d}_q(x),\hat{d}_p^\dagger(y)\}=\delta_{x,y}\delta_{q,p} \quad (327)$$

and $$\{\hat{c}(x),\hat{d}_p^\dagger(y)\}=0 \quad (328)$$

Using it, the Hamiltonian defined by $$\hat{H} = \sum_{q=1}^{\infty} \hat{H}_q \quad (329)$$

will be discussed.

The critical spiral structure analyzed here is made up of $M_0=7000$ sites. The other number $M_1$ of sites introduced to make layer-to-layer bonds for each N is shown below.

| N | $M_1$ |
|---|---|
| 3 | 3483 |
| 4 | 2315 |
| 6 | 1377 |
| 8 | 977 |
| 10 | 752 |
| 20 | 331 |

Further employed was $$f(x) = -\mathrm{int}\left(\frac{x}{2}\right) \quad (330)$$

int(x) is the maximum integer that does not exceed x. The second term of the Hamiltonian is the term of the random potential. For each site, the random variable $$-\frac{v}{2} < v_x < \frac{v}{2} \quad (331)$$

is generated to form the Hamiltonian. The variable breadth v of the random potential is useful as a parameter determining the degree of the randomness. Here, N, which determines the turn pitch of multiply-twisted spirals, s, which determines the inter-layer bonding force, and v, which determines the intensity of the random potential, are varied as parameters.

When eigen energy of the Hamiltonian $\hat{H}$ is $\epsilon_m$, and the eigen vector is $|m>$, then $$\hat{H}|m>=\epsilon_m|m> \quad (332)$$

where m=1, 2, . . . , n (n=$M_0+M_1$). First, n quantum levels $\epsilon_m$ are standardized such that their nearest-neighbor level spacing becomes 1 in average. The density of states of the system is defined by $$\rho(\varepsilon) = \frac{1}{n}\sum_{m=1}^{n}\delta(\varepsilon - \varepsilon_m) \qquad (333)$$

and its staircase function $$\lambda(\epsilon) = \int_{-\infty}^{\epsilon} d\eta \rho(\eta) \qquad (334)$$

is calculated. The staircase function obtained is converted by using a procedure called "unfolding" such that the density of states becomes constant in average. Using the quantum level obtained in this manner, the nearest-neighbor level spacing distribution P(s) and the $\Delta_3$ statistics of Dyson and Mehta are calculated as quantum level statistics. For the calculation of the quantum level statistics, here are used 1501 levels in total including 750 levels above and 750 levels below the band center. As taught by Literatures (32) and (33), by using these statistics, it can be detected whether quantum chaos has been generated or not. It is also known that a quantum chaotic system is sensitive to perturbation from outside similarly to the classical chaotic system, and analysis of quantum chaos is important as a polestar of designs of non-linear materials.

In case of an integrable system, nearest-neighbor level spacing distribution P(s) and $\Delta_3$ statistics are those of Poisson Distribution $$P_P(s) = e^{-s} \qquad (335)$$

$$\Delta_3(n) = \frac{n}{15} \qquad (336)$$

If the system currently reviewed exhibits quantum chaos, it becomes GOE distribution $$P_{GOE}(s) = \frac{\pi s}{2} e^{-\pi s^2/4} \qquad (337)$$

$$\Delta_3(n) = \frac{1}{\pi^2}\left[\log(2\pi n) + \gamma - \frac{\pi^2}{8} - \frac{5}{4}\right] + O(n^{-1}) \qquad (338)$$

where $\gamma$ is the Euler's constant.

Figure 125:
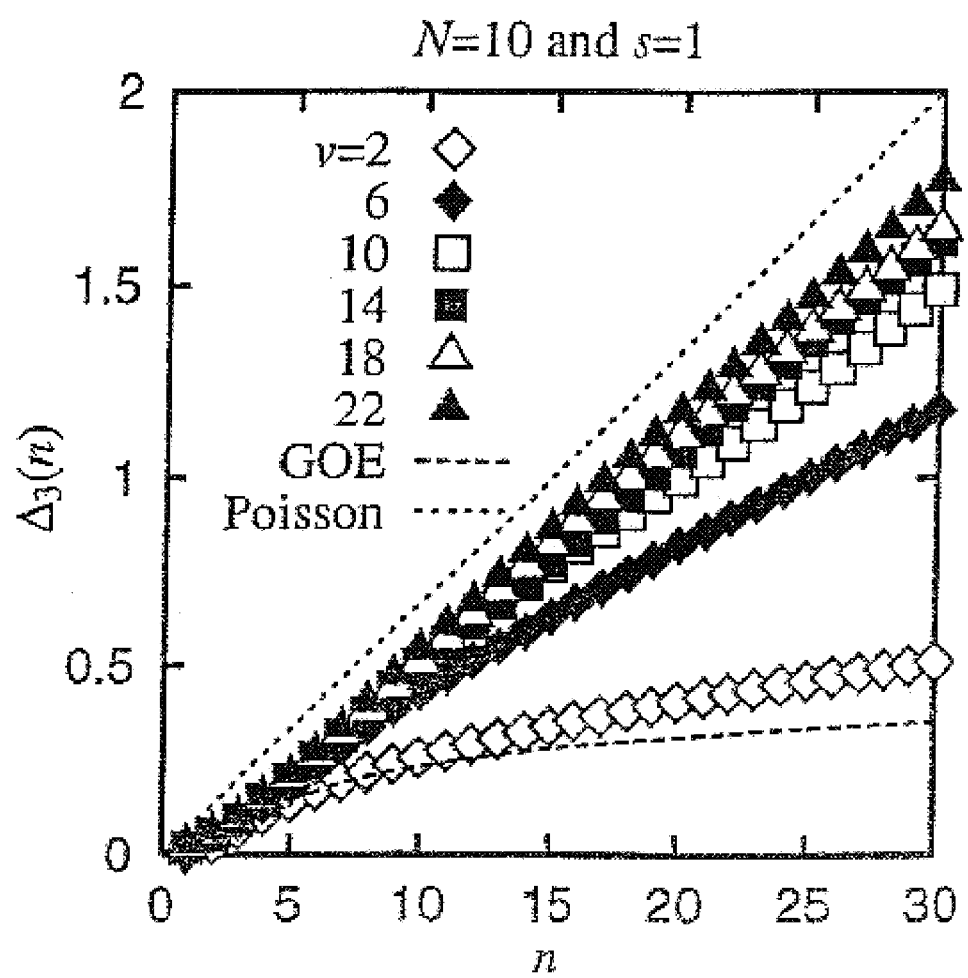
Figure 126:
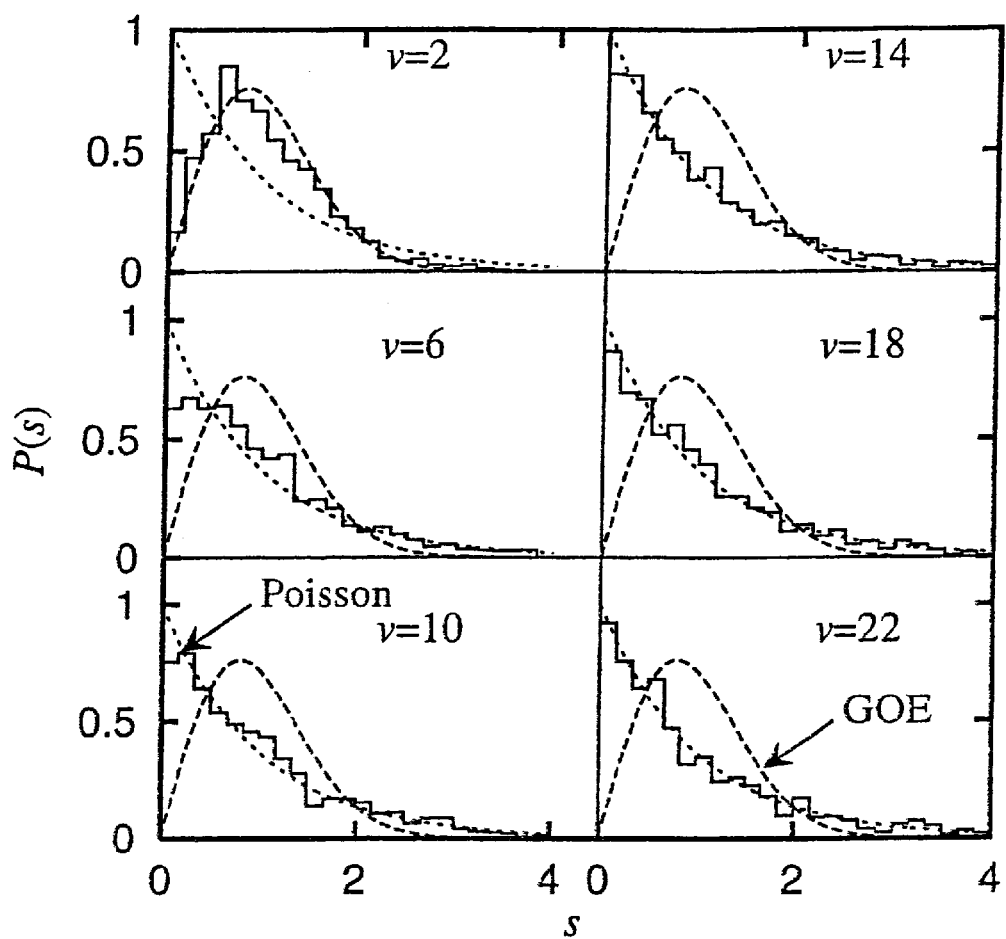

FIG. 125 and FIG. 126 show quantum level statistics of critical spiral structures of N=10 while fixing the inter-layer bonding to s=1 and changing the random potential intensity v. FIG. 125 shows P(s) whilst FIG. 126 shows $\Delta_3$ statistics values. In both statistics values, the system is in a quantum chaotic state when v is small, but as v increases, it changes to a localized state described by the Poisson distribution, and shows the existence of Anderson transition.

Figure 127:
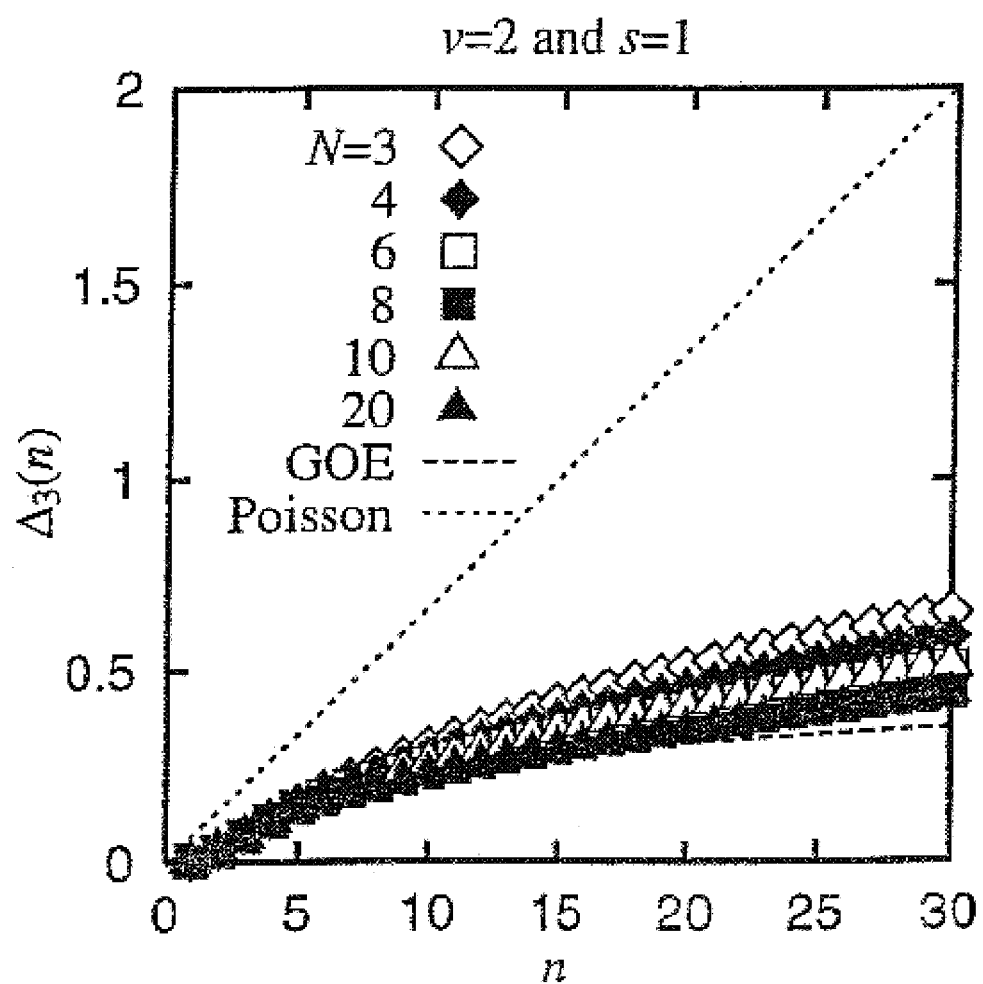
Figure 128:
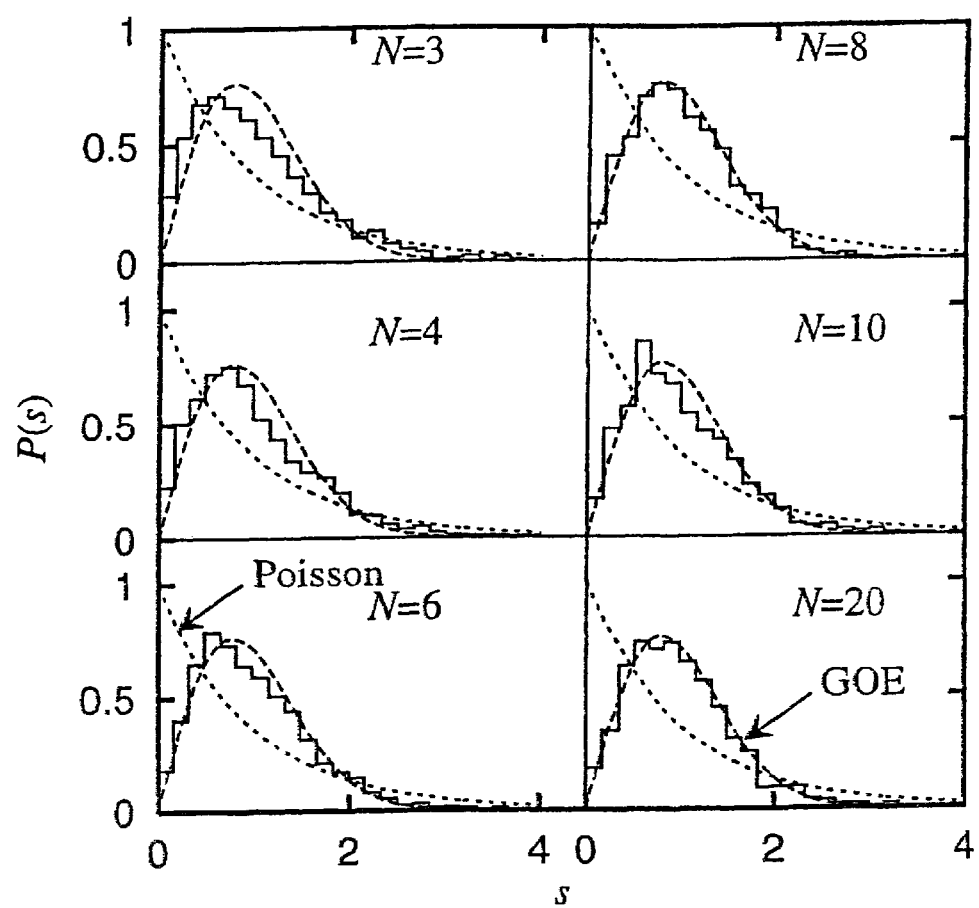

In FIGS. 127 and 128, calculation is conducted by using various values of N while fixing s=1 and v=2. FIG. 127 shows P(s) while FIG. 128 shows $\Delta_3$ statistics values. Since the weak random potential of v=2 is introduced, a quantum-chaotic metallic state is observed. It is appreciated that this nature does not depend on N and the quantum level statistics substantially obeys the GOE distribution for each value of N. Thus it must change toward localization if v is increased, so it is appreciated that Anderson transition always exists in the above system and the dimensionality of the system is near three.

Figure 129:
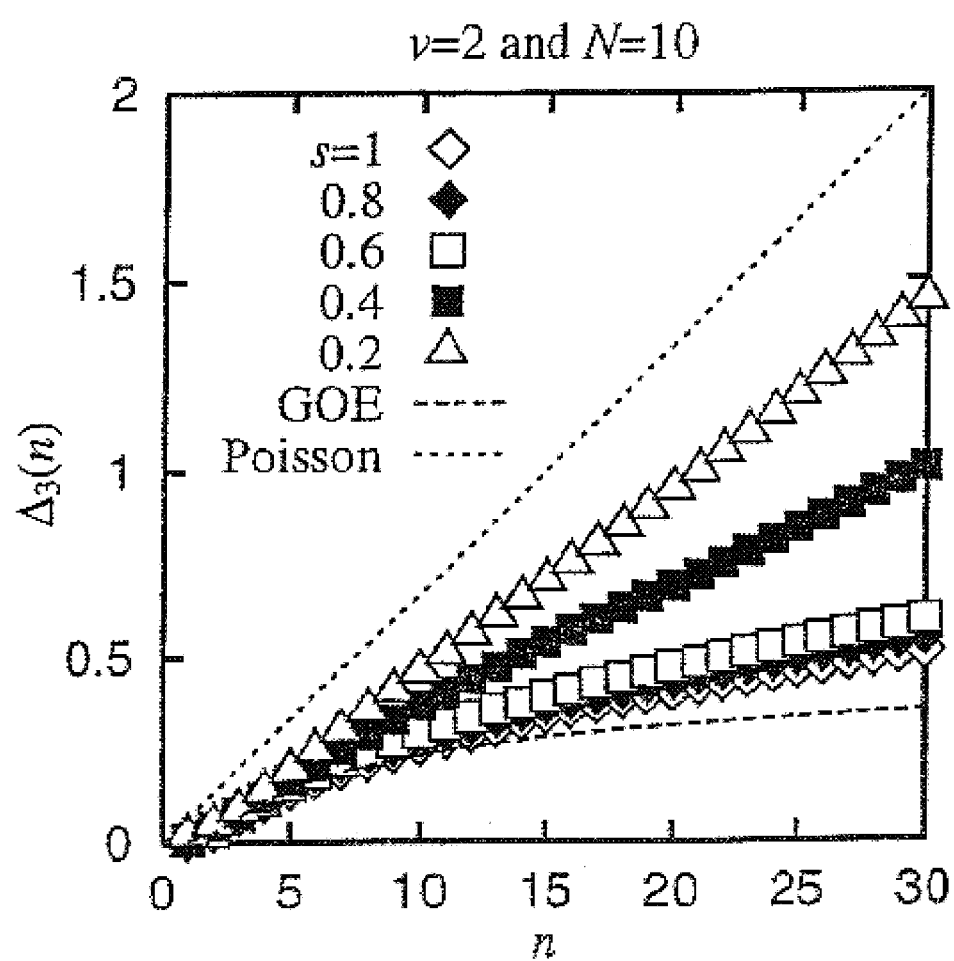

However, it is possible to decrease the critical spiral structure by decreasing s. FIG. 129 shows $\Delta_3$ statistics values with critical spiral structures of N=10 when changing s as s=1, 0.8, 0.6, 0.4, 0.2 while fixing v=2. Although the random potential is as weak as v=2, as s decreases, $\Delta_3$ asymptotically approaches that of the Poisson distribution. In this kind of systems, since any stronger randomness merely results in enhancing localization, there is no Anderson transition. This is an evidence of a low-dimensionality.

A review has been made about quantum level statistics with critical spiral structures having various N, s and v, and it has been confirmed that wide quantum states from metallic states exhibiting quantum chaos to localized states can be realized.

Next explained is a critical spiral structure according to the 20th embodiment of the invention. In the 20th embodiment, Mott transitions in critical spiral structures are analyzed to demonstrate that wide quantum states from Mott insulator states to metallic states can be realized. It is demonstrated that electron states do not depend on the number of turns N so much but strongly depends on the value of inter-layer bonds s. Making use of this dependency, physical phenomena appearing in critical spiral structures can be controlled.

The electron system in a critical spiral structure is defined. Assuming a on-dimensional lattice, numbers are assigned as x= ..., −1, 0, 1, .... The operator for generating an electron of the spin $\sigma$ at the x-th lattice point is denoted by $\hat{c}_\sigma^\dagger(x)$. Let this operator satisfy the anticommutation relation $$\{\hat{c}_\sigma(x), \hat{c}_\rho^\dagger(y)\} = \delta_{x,y}\delta_{\sigma,\rho} \qquad (339)$$

The Hamiltonian $\hat{H}_1$ of spirals is defined as $$\hat{H}_1 = -t\sum_{x,\sigma}\hat{c}_\sigma^\dagger(x)\hat{c}_\sigma(x+1) - \qquad (340)$$

$$s\sum_{x,\sigma}\hat{c}_\sigma^\dagger(x)\hat{c}_\sigma(x+N) + U\sum_{x}\hat{n}_\uparrow(x)\hat{n}_\downarrow(x) + H.C.$$

where $$\hat{n}_\sigma(x) = \hat{c}_\sigma^\dagger(x)\hat{c}_\sigma(x) \qquad (341)$$

is the operator of the number of spin $\sigma$ electrons, and U is the electron-to-electron interaction intensity.

For the purpose of introducing high-order bonds, sites are added cumulatively. Generally for $q \geq 2$, $$\hat{H}_q = -s\Sigma'\sum_{\alpha}\left[\hat{c}_\sigma^\dagger(x)\hat{d}_{q,\sigma}(x) + \hat{d}_{q,\sigma}^\dagger(x)\hat{c}_\sigma(x+N^q+f(N^{q-1}))\right] + \qquad (342)$$

$$U\Sigma' m_{q,\uparrow}(x)\hat{m}_{q,\downarrow}(x) + H.C.$$

$\Sigma'$, however, is conducted only with x that satisfies mod(x, $N^{q-1}$)=q−2. The operator $\hat{c}_{q,\sigma}^\dagger(x)$ used here is an operator for generating an electron of spin $\sigma$ at a site added, and it satisfies $$\{\hat{d}_{q,\sigma}(x), d_{p,\rho}^\dagger(y)\} = \delta_{x,y}\delta_{q,p}\delta_{\sigma,\rho} \qquad (343)$$

and $$\{\hat{c}_\rho(x), d_{p,\sigma}^\dagger(y)\} = 0 \qquad (344)$$

Additionally, the notation $$\hat{m}_{q,\sigma}(x) = \hat{a}_{q,\sigma}^{\dagger}(x)\hat{a}_{q,\sigma}(x) \quad (345)$$

was used. Using them, the Hamiltonian defined by $$\hat{H} = \sum_{q=1}^{\infty} \hat{H}_q \quad (346)$$

will be discussed.

The critical spiral structure analyzed here is made up of a main chain with $M_0=7000$ sites. The other number $M_1$ of sites introduced to make layer-to-layer bonds for each N is shown below.

| N | $M_1$ |
|---|---|
| 3 | 3483 |
| 4 | 2315 |
| 6 | 1377 |
| 8 | 977 |
| 10 | 752 |
| 20 | 331 |

Further employed was $$f(x) = -\text{int}\left(\frac{x}{2}\right) \quad (347)$$

int(x) is the maximum integer that does not exceed x. Here, N, which determines the turn pitch of multiply-twisted spirals, s, which determines the inter-layer bonding force, and v, which determines the intensity of the random potential, are varied as parameters.

Figure 130:
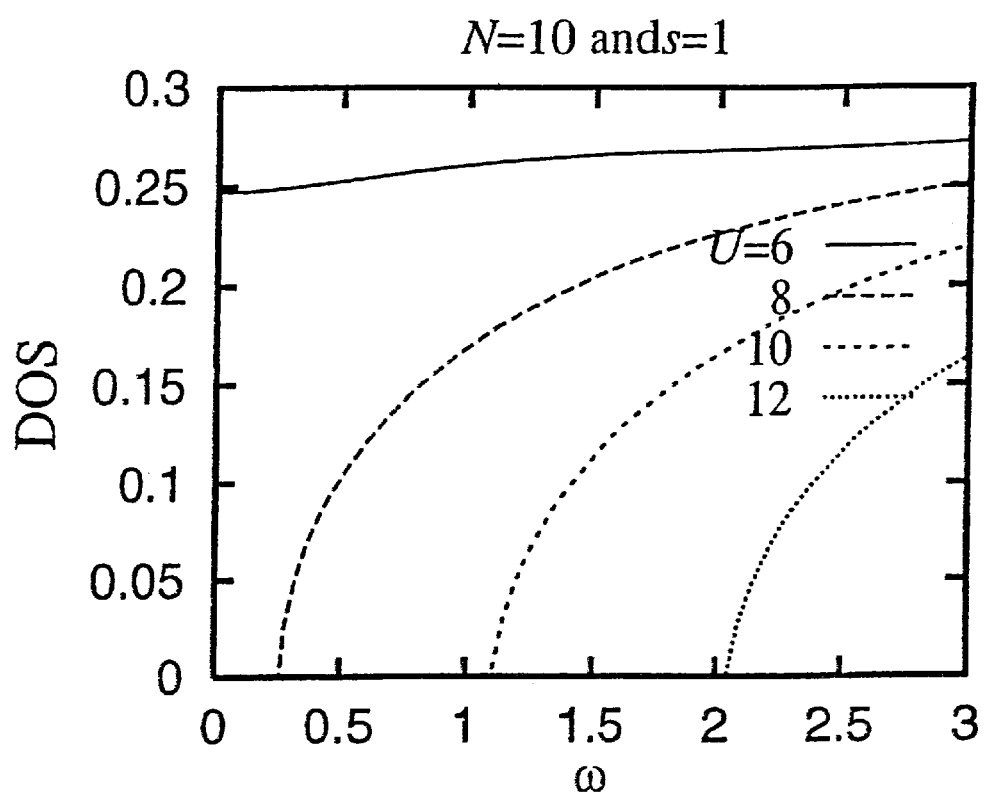

Here is made a review about half-filled of one electron per site. The density of states of this system can be calculated by using the same method as, for example, the first embodiment. The density of states thus obtained is shown below, and based on it, discussion will be developed. FIG. 130 shows densities of states in critical spiral structures of N=10 by fixing the layer-to-layer bonding as s=1 and changing electron-to-electron interaction intensity U. ω=0 is the Fermi energy. If the density of states remains the system is in a metallic phase, and if it disappears, the system is in a Mott insulator phase. In case of U=6, the system is in a metallic phase, and over U=8, the systems are Mott insulators. This is typical Mott transition by changes of intensity of electron-to-electron interaction. In general, the value corresponding to a double the value of ω where the density of states disappears is the Hubbard gap, and it is meant that, as it gets larger, correlation between electrons is intensive.

Figure 131:
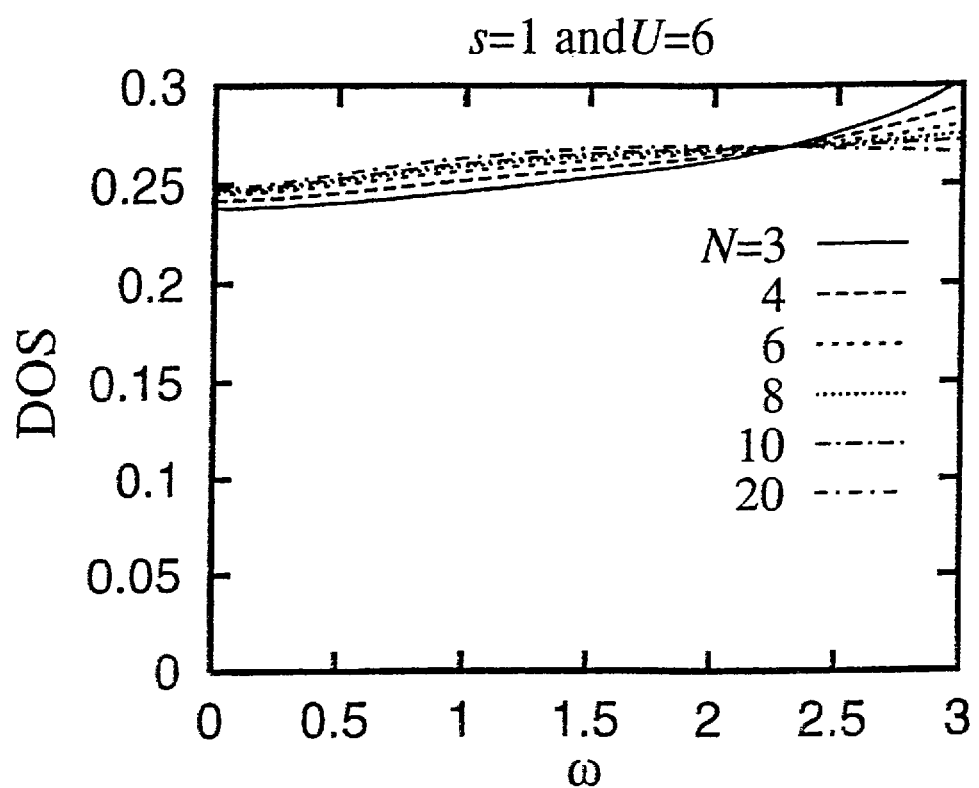

In FIG. 131, densities of states were calculated for various values of N while fixing s=1 and U=6. It is appreciated from the figure that the dependency of the densities of states upon N is small, the systems for all values of N exhibit a metallic phase. This small dependency on N is the unique nature of critical spiral structures, which is observed also in magnetic transition and Anderson transition.

However, models exhibiting remarkable modulation under control of the value of s also characterize the critical spiral structures. FIG. 132 plots densities of states for various s when fixing N=6 and U=6. FIG. 133 plots densities of states for various s when fixing N=10 and U=6. FIG. 134 plots densities of states for various s when fixing N=20 and U=6. It has been confirmed that, as s varies, the density of states under ω=0 changes from a finite to zero and Mott transition has occurred.

A review has been made about Half-filled electron systems in helix-based hierarchies of multiple connections with various N, s and U, and it has been confirmed that wide electron systems from Mott insulators to Metallic states can be realized.

Next explained is the 21st embodiment of the invention. In the 21st embodiment, a manufacturing method of a multiply-looped ring structure of q=2 and N=8, taken as an example, will be explained. Assume that the multiply-looped ring structure is explained by using a cylindrical quantum box by compound semiconductor hetero-junction. Essentially, the same manufacturing method is applicable also to multiply-twisted helices.

That is, in the 21st embodiment, as shown in FIG. 135, a GaAs layer 2 is epitaxially grown on an AlGaAs substrate 1 by, for example, metal-organic chemical vapor deposition (MOCVD). The GaAs layer 2 is grown up to, for example, 10 nm.

After that, a $SiO_2$ film 3 is formed on the GaAs layer 2 by, for example, vacuum evaporation or chemical vapor deposition (CVD). Further formed thereon is a circular resist pattern (not shown) in a ring-shaped arrangement as a whole by, for example, electron beam lithography. Thereafter, using the resist pattern as a mask, the $SiO_2$ film 3 is selectively removed by, for example, reactive ion etching (RIE). The resist pattern is removed thereafter. In this manner, the circular $SiO_2$ film 3 is formed on the GaAs layer 2 in a ring-shaped arrangement as a whole.

Next as shown in FIG. 136, using the $SiO_2$ film 3, the GaAs layer is etched in a direction normal to the substrate surface by, for example, RIE. In the etching process by RIE, a chlorine-based gas is used as the reaction gas (etching gas). This is for the purpose of using the AlGaAs substrate 1 as the etching stop layer to ensure that the GaAs layer 2 is selectively etched.

Next as shown in FIG. 137, using the $SiO_2$ film 3 as a growth mask, an AlGaAs layer 4 is epitaxially grown by, for example. MOCVD to bury portions of the GaAs layer 2 removed by the etching with the AlGaAs layer 4.

Then, after removing the $SiO_3$ film 3 by etching using a hydrofluoric acid, an AlGaAs layer 5 is epitaxially grown on the entire surface as shown in FIG. 138 by, for example, MOCVD. The AlGaAs layer 5 is grown up to the thickness of, for example, 5 nm. Through these steps, a quantum box by AlGaAs/GaAs hetero-junction, which is the element forming the multiply-looped ring structure, is obtained.

Those steps may be repeated while rotating the pattern of the $SiO_2$ film 3 of FIG. 139 by a predetermined value every time to finally obtain the multiply-looped ring structure.

Molecular beam epitaxy (MBE) is also applicable as the growth method other than MOCVD. The shape of the quantum box need not be cylindrical, but any other appropriate shape, such as a quadratic prism, may be used.

Heretofore, embodiments of the invention have been explained specifically; however, the invention is not limited to those embodiments but can be modified in various modes based on the technical concept of the invention.

As described above, according to the invention, it is possible to obtain new highly-functional materials that are complementary with fractal-shaped materials and exhibit new physical properties by making up a one-dimensional structure, spiral structure or ring structure from at least two layers of thinner one-dimension unit structures, spiral unit structure or ring unit structures bonded to each other in at least one site and setting the curvature, turn pitch or number of elements thereof such that the structure exhibits a nature regulated thereby, or by making up a one-dimensional structure, spiral structure or ring structure from thinner one-dimensional unit structures, spiral unit structures or ring unit structures and setting the curvature, turn pitch or number of elements thereof such that the structure has a dimensionality regulated thereby.

DESCRIPTION OF REFERENCE NUMERALS

1 AlGaAs SUBSTRATE
2 GaAs LAYER
3 $SiO_2$ FILM
4 AlGaAs LAYER
5 AlGaAs LAYER

What is claimed is:

1. A multiply-complexed, one dimensional structure comprising a set of complexed structures, wherein:
   (a) the set of complexed structures are arranged in hierarchical order;
   (b) each structure of the set of complexed structures is larger in width than the structure one level below thereto in the hierarchical order;
   (c) each structure of the set of complexed structures is obtained by complexation of the structure one level below thereto in the hierarchical order;
   (d) each structure of the set of complexed structures is one-dimensional;
   (e) each structure of the set of complexed structures has a finite curvature; and
   (f) at least two layers of each of the set of one-dimensional structures are bonded to each other in at least one point.

2. The multiply-complexed one-dimensional structure according to claim 1, wherein the site of at least a bond between at least two layers of at least one of the set of complexed structures is subject to spatial and temporal fluctuation.

3. The multiply-complexed one-dimensional structure according to claim 2 wherein said fluctuation appears in a predetermined pitch.

4. The multiply-complexed one-dimensional structure according to claim 2 wherein said fluctuation is introduced by removing or adding a bond between at least two layers of the one-dimensional structures.

5. The multiply-complexed one-dimensional structure according to claim 2 wherein phase transition occurring therein is controlled by controlling the bonding site between said at least two layers of one-dimensional structures.

6. The multiply-complexed one-dimensional structure according to claim 5 wherein the control of the bonding site between said at least two layers of one-dimensional structures is effected by parallel movement of the bond.

7. The multiply-complexed one-dimensional structure according to claim 1 wherein the bonding itself in said at least one site is made of a linear structure.

8. The multiply-complexed one-dimensional structure according to claim 7 wherein the critical temperature of the ferromagnetic phase transition is dependent on the curvature of the multiply-complexed one-dimensional structure.

9. The multiply-complexed one-dimensional structure according to claim 7 wherein the critical temperature of the ferromagnetic phase transition is regulated by the strength of the bonding.

10. The multiply-complexed one-dimensional structure according to claim 7 wherein quantum chaos is dependent on the curvature of the multiply-complexed one-dimensional structure.

11. The multiply-complexed one-dimensional structure according to claim 7 wherein at least one electron state is dependent on the curvature of the complexed structure.

12. The multiply-complexed one dimensional structure according to claim 11 wherein the phase transition from metal to insulator is dependent on the curvature of the complexed structure.

13. The multiply-complexed one-dimensional structure according to claim 1 wherein the bonding itself in said at least one site is made via an independent element.

14. The multiply-complexed one-dimensional structure according to claim 13 wherein the critical temperature of the ferromagnetic phase transition is regulated by the curvature of the complexed structure.

15. The multiply-complexed one-dimensional structure according to claim 13 wherein one or more physical properties selected from the group consisting of the critical temperature of the ferromagnetic phase transition, the electron states, the metal to insulator phase transition, and the quantum chaos are not changed by minute structural fluctuations of the multiply-complexed one-dimensional structure.

16. The multiply-complexed one-dimensional structure according to claim 13 wherein quantum chaos is dependent on the curvature of the multiply-complexed one-dimensional structure.

17. The multiply-complexed one-dimensional structure according to claim 13 wherein the phase transition from metal to insulator is dependent on the curvature of the complexed structure.

18. The multiply-complexed one-dimensional structure according to claim 13 at least one electron state is dependent on the curvature of the multiply-complexed one-dimensional structure.

19. A functional material comprising a multiply-complexed, one-dimensional structure comprising a set of complexed structures, wherein:
   (a) the set of complexed structures are arranged in hierarchical order;
   (b) each structure of the set of complexed structures is larger in width than the structure one level below thereto in the hierarchical order;
   (c) each structure of the set of complexed structures is obtained by complexation of the structure one level below thereto in the hierarchical order;
   (d) each structure of the set of complexed structures is one-dimensional;
   (e) each structure of the set of complexed structures has a finite curvature; and
   (f) the spatial filling ratio of the multiply-complexed one-dimensional structure can be regulated by setting the curvature of at least one of the set of one-dimensional structures.

20. A multiple-complexed, one-dimensional structure comprising a set of complexed structures, wherein:
   (a) the set of complexed structures are arranged in hierarchical order;
   (b) each structure of the set of complexed structures is larger in width than the structure one level below thereto in the hierarchical order;
   (c) each structure of the set of complexed structures is obtained by complexation of the structure one level below thereto in the hierarchical order;
   (d) each structure of the set of complexed structures is one-dimensional;
   (e) each structure of the set of complexed structures has a finite curvature; and
   (f) one or more of the physical properties selected from the group consisting of the critical temperature of the ferromagnetic phase transition, the electron states, the metal to insulator phase transition, and the quantum chaos is dependent on the curvature of the multiply-complexed one-dimensional structure.

21. The multiply-complexed one-dimensional structure of claim 20, wherein at least one of the set of complexed structures of the set has a value of curvature different from that of at least one of the other complexed structures of the set.

22. The multiply-complexed one-dimensional structure of claim 20, wherein at least one of the set of complexed structures has a predetermined value of curvature that varies according to the position in the sequence of the layers composing the structure.

23. The multiply-complexed one-dimensional structure according to claim 20 wherein the site of at least a bond between at least two layers of at least one of the set of complexed structures is subject to spatial and temporal fluctuation.

24. The multiply-complexed one-dimensional structure according to claim 23 wherein said fluctuation appears in a predetermined pitch.

25. The multiply-complexed one-dimensional structure according to claim 23 wherein said fluctuation is introduced by removing or adding a bond between at least two layers of at least one of the set one-dimensional structures.

26. The multiply-complexed one-dimensional structure according to claim 20 wherein the curvature of at least one of the set of complexed one-dimensional structures is variable.

27. The multiply-complexed one-dimensional structure according to claim 20 wherein the one-dimensional structure that is lowermost in the hierarchy is formed by the complexation of a linear structure having an atom or a cluster of atoms as an element thereof.

28. The multiply-complexed one-dimensional structure according to claim 23 wherein the one-dimensional structure lowermost in the hierarchy is formed of a linear structure having an atom or a cluster of atoms as an element thereof, and the fluctuation is introduced by random absorption or desorption of molecules to or from said linear structure.

29. The multiply-complexed one-dimensional structure according to claim 20 wherein phase transition occurs.

30. The multiply-complexed one-dimensional structure according to claim 20 wherein metal-insulator phase transition occurs.

31. The multiply-complexed one-dimensional structure according to claim 20 characterized in including a portion in a metallic phase and a portion in an insulating phase.

32. The multiply-complexed one-dimensional structure according to claim 20 characterized in including a portion in a metallic phase and a portion in an insulating phase, said portion in an insulating phase being changeable to a metallic phase.

33. The multiply-complexed one-dimensional structure according to claim 20 wherein a phase transition occurring therein is controlled by controlling the bonding site between at least two layers of at least one of the set of one-dimensional structures.

34. The multiply-complexed one-dimensional structure according to claim 33 wherein the control of the bonding site between said at least two layers of one-dimensional structures is effected by parallel movement of the bond.

35. The multiply-complexed one-dimensional structure according to claim 20 wherein ferromagnetic phase transition occurs.

36. The multiply-complexed one-dimensional structure according to claim 35 wherein critical temperature for ferromagnetic transition occurring therein is regulated by setting said curvature.

37. A multiply-complexed, one-dimensional structure comprising a set of complexed structures, wherein:
    (a) the set of complexed structures are arranged in hierarchical order;
    (b) each structure of the set of complexed structures is larger in width than the structure one level below thereto in the hierarchical order;
    (c) each structure of the set of complexed structures is obtained by complexation of the structure one level below thereto in the hierarchical order;
    (d) each structure of the set of complexed structures is one-dimensional;
    (e) each structure of the set of complexed structures has a finite curvature; and
    (f) the dimensionality of the multiply-complexed one-dimensional structure can be regulated by setting the curvature of one or more of the set of one-dimensional structures.

38. The multiply-complexed one-dimensional structure according to claim 37 wherein at least one phase transition occurring therein is controlled by controlling the bonding site between at least two layers of at least one of the set of one-dimensional structures.

39. The multiply-complexed one-dimensional structure according to claim 38 wherein the control of the bonding site between said at least two layers of at least one of the set of one-dimensional structures is effected by parallel movement of the bond.

40. A multiply-complexed, one-dimensional structure comprising a set of complexed structures, wherein:
    (a) the set of complexed structures are arranged in hierarchical order;
    (b) each structure of the set of complexed structures is larger in width than the structure one level below thereto in the hierarchical order;
    (c) each structure of the set of complexed structures is obtained by complexation of the structure one level below thereto in the hierarchical order;
    (d) each structure of the set of complexed structures is one-dimensional;
    (e) each structure of the set of complexed structures has a finite curvature;
    (f) the multi-complexed one-dimensional structure has a random potential resulting from impurities or defects in the structure;
    (g) at least two one-dimensional structures are bonded in at least one site;
    (h) a quantum chaos occurs in the multiply-complexed one-dimensional structure, wherein the quantum chaos is controlled by
        (i) setting the magnitude of the random potential
        (ii) setting the strength of the bonds between avers of at least one of the set of one-dimensional structures
        (iii) setting the curvature of the multiply-complexed one-dimensional structure, or by adding a magnetic impurity
        (iv) inserting a paramagnetic impurity in the multiply-complexed one-dimensional structure.

41. A functional material comprising a multiply-complexed, one-dimensional structure that comprises a set of complexed structures, wherein:
    (a) the set of complexed structures are arranged in hierarchical order;

(b) each structure of the set of complexed structures is larger in width than the structure one level below thereto in the hierarchical order;

(c) each structure of the set of complexed structures is obtained by complexation of the structure one level below thereto in the hierarchical order;

(d) each structure of the set of complexed structures is one-dimensional;

(e) each structure of the set of complexed structures has a finite curvature;

(f) at least two layers of at least one of the set of complex structures are bonded to each other in at least one site.

42. The functional material according to claim 41 wherein there is a spatial or temporal fluctuation in the bonding site between at least two layers of at least one of the set of one-dimensional structures.

43. The functional material according to claim 42 wherein said fluctuation appears in a predetermined pitch.

44. The functional material according to claim 42 wherein said fluctuation is introduced by removing or adding a bond between at least two layers of at least one of the set of one-dimensional structures.

45. The functional material according to claim 41 wherein a phase transition occurring therein is controlled by controlling the bonding site between said at least two layers of at least one of the set of one-dimensional structures.

46. The functional material according to claim 45 wherein the control of the bonding site between at least two layers of at least one of the set of one-dimensional structures is effected by parallel movement of the bond.

47. The functional material according to claim 41 wherein the bonding at least one site is made of a linear structure.

48. The functional material according to claim 47 wherein the critical temperature for ferromagnetic transition occurring therein is regulated.

49. The functional material according to claim 47 wherein critical temperature for ferromagnetic phase transition is regulated by selecting an intensity of the bond between at least two of the layers of at least one of the set of complexated linear structures.

50. The functional material according to claim 47 wherein a quantum chaos occurring therein is dependent on the curvature of the multiple-complexed one-dimensional structure.

51. The functional material according to claim 47 wherein an electron state thereof is dependent on the curvature of the multiply-complexed one-dimensional structure.

52. The functional material according to claim 51 wherein the metal to insulator phase transition is dependent on the curvature of the multiply-complexed one-dimensional structure.

53. The functional material according to claim 41 wherein the bonding in at least one site is made via an independent element.

54. The functional material according to claim 52 wherein the critical temperature for ferromagnetic transition occurring therein is dependent on the curvature of the multiply-complexed one-dimensional structure.

55. The functional material according to claim 53 wherein the critical temperature of the ferromagnetic phase transition, the electron states, the metal to insulator phase transition, and the quantum chaos are not changed by minute structural fluctuations of the multiply-complexed one-dimensional structure.

56. The functional material according to claim 53 wherein a quantum chaos occurring therein is dependent on the curvature of the multiply-complexed one-dimensional structure.

57. The functional material according to claim 53 wherein the metal to insulator phase transition is dependent on the curvature of the multiply-complexed one-dimensional structure.

58. The functional material according to claim 53 wherein an electron state thereof is dependent on the curvature of the multiply-complexed one-dimensional structure.

59. The functional material according to claim 57 wherein the metal to insulator phase transition is dependent on the curvature of the multiple-complexed one-dimensional structure.

60. A functional material including a multiply-complexed, one-dimensional structure comprising a set of complexed structures, wherein:

(a) the set of complexed structures are arranged in hierarchical order;

(b) each structure of the set of complexed structures is larger in width than the structure one level below thereto in the hierarchical order;

(c) each structure of the set of complexed structures is obtained by complexation of the structure one level below thereto in the hierarchical order;

(d) each structure of the set of complexed structures is one-dimensional;

(e) each structure of the set of complexed structures has a finite curvature; and (f) at least one of the physical properties selected from the group consisting of the critical temperature of the ferromagnetic phase transition, the electron states, the metal to insulator phase transition, and the quantum chaos is dependent on the curvature of the multiply-complexed one-dimensional structure.

61. The functional material of claim 60 comprising a multiply-complexed one-dimensional structure wherein at least one of the set of complexed structures has a value of curvature different from that of at least one of the other complexed structures of the set.

62. The functional material of claim 60 comprising a multiply-complexed one-dimensional structure wherein at least one of the set of complexed structures has a predetermined value of curvature that varies according to the position in the sequence of the layers composing the structure.

63. The functional material of claim 60 comprising a multiply-complexed one-dimensional structure wherein the site of at least a bond between at least two layers of at least one of the set of complexed structures is subject to spatial and temporal fluctuation.

64. The functional material according to claim 63 wherein said fluctuation appears in a predetermined pitch.

65. The functional material according to claim 63 wherein said fluctuation is introduced by removing or adding a bond between at least two layers of at least one of the set of one-dimensional structures.

66. The functional material according to claim 60 wherein said curvature is variable.

67. The functional material according to claim 60 wherein the one-dimensional structure that is lowermost in the hierarchy is formed by the complexation of a linear structure having an atom or a cluster of atoms as an element thereof.

68. The functional material according to claim 63 wherein the one-dimensional structure that is lowermost in the hierarchy is formed by the complexation of a linear structure having an atom or a cluster of atoms as an element thereof, and said fluctuation is introduced by random absorption or desorption of molecules to or from said linear structure.

69. The functional material according to claim 60 wherein phase transition occurs.

70. The functional material according to claim 60 wherein metal-insulator phase transition occurs.

71. The functional material according to claim 60 characterized in including a portion in a metallic phase and a portion in an insulating phase.

72. The functional material according to claim 60 characterized in including a portion in a metallic phase and a portion in an insulating phase, said portion in an insulating phase being changeable to a metallic phase.

73. The functional material according to claim 60 wherein phase transition occurring therein is controlled by controlling the bonding site between said at least two layers of one-dimensional structures.

74. The functional material according to claim 73 wherein the control of the bonding site between said at least two layers of one-dimensional structures is effected by parallel movement of the bond.

75. The functional material according to claim 60 wherein ferromagnetic phase transition occurs.

76. The functional material according to claim 75 wherein critical temperature for ferromagnetic transition occurring therein is regulated by setting said curvature.

77. The functional material according to claim 19 wherein a phase transition occurring therein is controlled by controlling the bonding site between at least two layers of at least one of the set of one-dimensional structures.

78. The functional material according to claim 77 wherein the control of the bonding site between at least two layers of at least one of the set of one-dimensional structures is effected by parallel movement of the bond.

* * * * *